US012652949B2

(12) United States Patent
Dai et al.

(10) Patent No.: US 12,652,949 B2
(45) Date of Patent: Jun. 9, 2026

(54) ELECTROLUMINESCENT DEVICE

(71) Applicant: BEIJING SUMMER SPROUT TECHNOLOGY CO., LTD., Beijing (CN)

(72) Inventors: Zhihong Dai, Beijing (CN); Qiang Wang, Beijing (CN); Le Wang, Beijing (CN); Han Zhang, Beijing (CN); Junfei Wang, Beijing (CN); Menglan Xie, Beijing (CN); Cuifang Zhang, Beijing (CN); Nannan Lu, Beijing (CN); Qi Zhang, Beijing (CN); Dongdong Zhang, Beijing (CN); Xueyu Lu, Beijing (CN); Chuanjun Xia, Beijing (CN); Chi Yuen Raymond Kwong, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 956 days.

(21) Appl. No.: 17/729,472

(22) Filed: Apr. 26, 2022

(65) Prior Publication Data

US 2022/0393116 A1 Dec. 8, 2022

(30) Foreign Application Priority Data

Apr. 30, 2021 (CN) ........................ 202110464195.5

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC .. C07D 487/16; C07D 491/06; C07D 209/94; H10K 85/342; C07F 15/0033
See application file for complete search history.

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |

(Continued)

FOREIGN PATENT DOCUMENTS

| | | |
|---|---|---|
| CN | 109956977 A | 7/2019 |
| CN | 111868210 A | 10/2020 |

(Continued)

OTHER PUBLICATIONS

CN Office Action, including Search Report Mailed on Jun. 18, 2024 for CN Application No. 202110464195, 25 page(s).

(Continued)

*Primary Examiner* — Michael M Dollinger
(74) *Attorney, Agent, or Firm* — Workman Nydegger

(57) ABSTRACT

Provided is an electroluminescent device. The organic electroluminescent device comprises an anode, a cathode and an organic layer disposed between the anode and the cathode, where the organic layer comprises a first compound having a structure of H-$L_1$-E and a second compound having a general formula of $M(L_a)_m(L_b)_n(L_c)_q$, and the device has at least one maximum emission wavelength greater than 630 nm. Such a new material composition consisting of the first compound and the second compound can be used in a light-emitting layer of the electroluminescent device. The new material composition can achieve the emission of deep red light in the device, significantly reduce a drive voltage of the device while significantly improving device efficiency and/or a device lifetime, and provide better device performance. Further provided is a display assembly.

35 Claims, 2 Drawing Sheets

(51) Int. Cl.
*C09K 11/06* (2006.01)
*H10K 50/11* (2023.01)
*H10K 101/10* (2023.01)
*H10K 101/30* (2023.01)

(52) U.S. Cl.
CPC ................. *C09K 2211/1033* (2013.01); *C09K 2211/185* (2013.01); *H10K 50/11* (2023.02); *H10K 2101/10* (2023.02); *H10K 2101/30* (2023.02)

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,728,137 | B2 * | 6/2010 | Stossel | C07D 213/30 546/3 |
| 7,968,146 | B2 | 6/2011 | Wagner et al. | |
| 8,067,099 | B2 * | 11/2011 | Watanabe | H10K 85/342 564/426 |
| 12,156,466 | B2 * | 11/2024 | Wang | C09K 11/06 |
| 2003/0230980 | A1 | 12/2003 | Forrest et al. | |
| 2004/0174116 | A1 | 9/2004 | Lu et al. | |
| 2015/0236277 | A1 * | 8/2015 | Boudreault | C07F 15/0033 257/40 |
| 2015/0349273 | A1 | 12/2015 | Hung et al. | |
| 2016/0359122 | A1 | 12/2016 | Boudreault et al. | |
| 2018/0175306 | A1 | 6/2018 | Dyatkin et al. | |
| 2018/0337340 | A1 * | 11/2018 | Moon | C09K 11/06 |
| 2019/0194234 | A1 | 6/2019 | Xia | |
| 2020/0013965 | A1 * | 1/2020 | Yang | H10K 85/633 |
| 2020/0203631 | A1 | 6/2020 | Gao et al. | |
| 2020/0358011 | A1 | 11/2020 | Lu et al. | |
| 2021/0043848 | A1 * | 2/2021 | Kim | C07D 209/94 |
| 2021/0167297 | A1 | 6/2021 | Wang et al. | |
| 2021/0328153 | A1 | 10/2021 | Zhang et al. | |
| 2022/0109118 | A1 | 4/2022 | Zhang et al. | |
| 2022/0177502 | A1 | 6/2022 | Wang et al. | |
| 2022/0289681 | A1 | 9/2022 | Wang et al. | |
| 2022/0363700 | A1 | 11/2022 | Dai et al. | |
| 2022/0389041 | A1 | 12/2022 | Zhang et al. | |

FOREIGN PATENT DOCUMENTS

| | | | | |
|---|---|---|---|---|
| CN | 111909212 | A | 11/2020 | |
| CN | 112582555 | A * | 3/2021 | H10K 50/12 |
| CN | 113527315 | A | 10/2021 | |
| CN | 113527316 | A | 10/2021 | |
| CN | 113527317 | A | 10/2021 | |
| CN | 113968875 | A | 1/2022 | |
| CN | 114075208 | A | 2/2022 | |
| CN | 114437134 | A | 5/2022 | |
| CN | 115260244 | A | 11/2022 | |
| EP | 4174078 | A1 | 5/2023 | |
| KR | 10-2019-0113589 | A | 10/2019 | |
| KR | 10-2020-0026747 | A | 3/2020 | |
| WO | WO-2019177407 | A1 * | 9/2019 | C07D 209/94 |
| WO | 2020/171630 | A1 | 8/2020 | |

OTHER PUBLICATIONS

KR Office Action Mailed on Jul. 30, 2024 for KR Application No. 10-2022-0053272, 32 page(s).

Tang. C.W. et al., "Organic electroluminescent diodes," Appl. Phys. Lett. vol. 51, 1987, pp. 913-915.

Uoyama et al., "Highly efficient organic light-emitting diodes from delayed fluorescence", Nature, Dec. 2012, vol. 492, 7 Pages.

* cited by examiner

ELECTROLUMINESCENT DEVICE

CROSS-REFERENCE TO RELATED APPLICATION(S)

This application claims priority to Chinese Patent Application No. CN 202110464195.5 filed on Apr. 30, 2021, the disclosure of which is incorporated herein by reference in its entirety.

TECHNICAL FIELD

The present disclosure relates to electronic devices, for example, electroluminescent devices. More particularly, the present disclosure relates to an electroluminescent device comprising a new material composition of a first compound having a structure of $H-L_1-E$ and a second compound having a general formula of $M(L_a)_m(L_b)_n(L_c)_q$ in an organic layer, and the device at least has one maximum emission wavelength greater than 630 nm.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

As the OLED becomes more and more widely applied, new and higher requirements are imposed on a deep red light-emitting material having a wavelength greater than 630 nm and a near-infrared light-emitting material having a long wavelength. For example, in the display industry, the International Telecommunication Union Radiocommunication Sector (ITU-R) issues the Ultra-high Definition Display Color Gamut Standard BT.2020. Since a wider color gamut standard has been proposed, correspondingly, it is necessary to develop a red light-emitting material that is deeper than a currently commercially available material. In the field of biomedicine and other fields, specific long-wavelength light is also required for detection and treatment. A new tumor therapy (photodynamic therapy) uses a laser (630 nm) to radiate a labeled tumor tissue to destroy a cancer tissue precisely. Red light having a wavelength of 660 nm can be absorbed by chlorophyll a to promote photosynthesis, and deep red light (730 nm) can control a whole process of a plant from germination to vegetative growth to flowering. Therefore, the irradiation of light having a particular wavelength is very important for the industrial production of cash crops. In the field of in-vehicle lighting, a latest developed OLED tail light is also made of a deep red material. Other near-infrared light-emitting materials play an important role in special fields such as detection, sensing, optical communication and night vision. Therefore, it is of important practical significance to develop deep red and even near-infrared light-emitting materials and electroluminescent devices thereof. At present, phosphorescent devices have been widely applied to the field of display panels and other fields, but deep red devices tend to have relatively low efficiency. In addition to the properties of the materials themselves, how to combine and select phosphorescent light-emitting materials and host materials directly relates to the luminescence performance of the devices. Therefore, how to select and optimize a combination of the phosphorescent light-emitting materials and the host materials is an important part of related research in the industry.

SUMMARY

The present disclosure aims to provide a new electroluminescent device to solve at least part of the above problems. The electroluminescent device comprises a new material composition consisting of a first compound having a structure of H-$L_1$-E and a second compound having a general formula of $M(L_a)_m(L_b)_n(L_c)_q$ in an organic layer, and the device at least has one maximum emission wavelength greater than 630 nm. Such a new material composition can be used in a light-emitting layer of the electroluminescent device. The new material composition can achieve the emission of deep red light in the device, significantly reduce a drive voltage of the device while significantly improving device efficiency and/or a device lifetime, and provide better device performance.

According to an embodiment of the present disclosure, disclosed is an electroluminescent device comprising:

an anode, a cathode, and an organic layer disposed between the anode and the cathode, wherein the organic layer at least comprises a first compound and a second compound, and the device at least has one maximum emission wavelength greater than 630 nm;

wherein the first compound has a structure of H-$L_1$-E, wherein H has a structure represented by Formula A:

Formula A

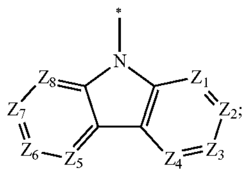

wherein in Formula A, $Z_1$ to $Z_3$ and $Z_6$ to $Z_8$ are, at each occurrence identically or differently, selected from $CR_{z1}$ or N, $Z_4$ and $Z_5$ are, at each occurrence identically or differently, selected from $CR_{z2}$, and two substituents $R_{z2}$ in $Z_4$ and $Z_5$ are joined to form a ring;

$L_1$ is selected from a single bond, substituted or unsubstituted arylene having 6 to 30 carbon atoms, substituted or unsubstituted heteroarylene having 3 to 30 carbon atoms or a combination thereof;

E is selected from substituted or unsubstituted aryl having 6 to 30 carbon atoms or substituted or unsubstituted heteroaryl having 3 to 30 carbon atoms;

$R_{z1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, $R_{z2}$ is, at each occurrence identically or differently, selected from the group consisting of: hydrogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof, and adjacent substituents $R_{z1}$, $R_{z2}$ can be optionally joined to form a ring;

wherein the second compound is a metal complex and has a general formula of $M(L_a)_m(L_b)_n(L_c)_q$, wherein M is selected from a metal with a relative atomic mass greater than 40, $L_a$, $L_b$ and $L_c$ are a first ligand, a second ligand and a third ligand coordinated to the metal M, respectively, m is selected from 1, 2 or 3, n is selected from 0, 1 or 2, q is selected from 0, 1 or 2, and m+n+q equals an oxidation state of the metal M; wherein when m is equal to 2 or 3, a plurality of $L_a$ may be identical or different; when n is equal to 2, two $L_b$ may be identical or different; when q is equal to 2, two $L_c$ may be identical or different;

$L_a$, $L_b$ and $L_c$ can be optionally joined to form a multidentate ligand;

$L_a$ is, at each occurrence identically or differently, selected from a structure represented by any one of Formula 1-1 to Formula 1-14:

Formula 1-1
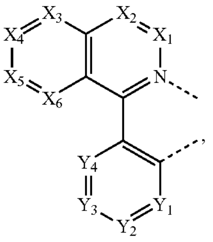
Formula 1-2
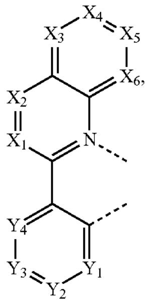
Formula 1-3
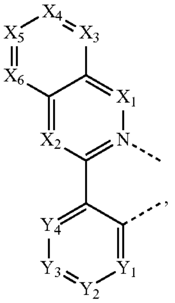
Formula 1-4
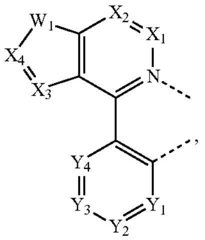
Formula 1-5
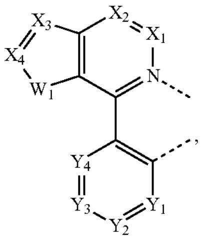
-continued
Formula 1-6
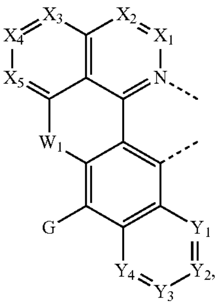
Formula 1-7
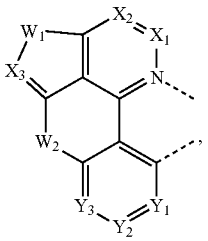
Formula 1-8
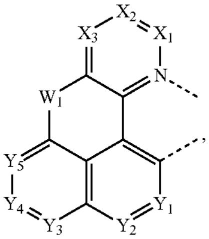
Formula 1-9
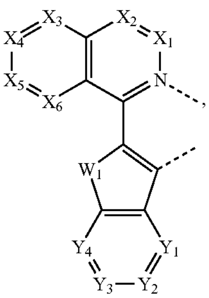
Formula 1-10
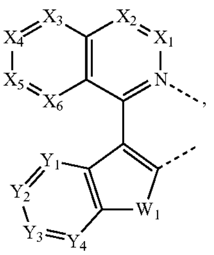

-continued

Formula 1-11

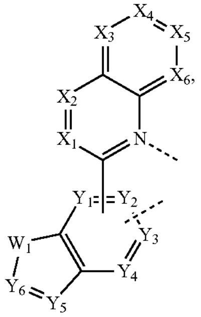

Formula 1-12

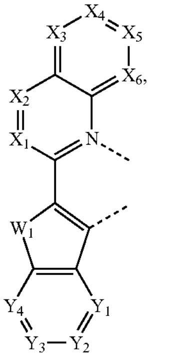

Formula 1-13

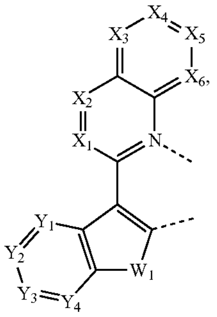

Formula 1-14

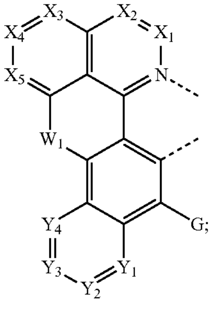

wherein $X_1$ to $X_6$ are, at each occurrence identically or differently, selected from $CR_x$ or N;

$Y_1$ to $Y_6$ are, at each occurrence identically or differently, selected from C, $CR_y$ or N;

$W_1$ and $W_2$ are, at each occurrence identically or differently, selected from $CR_wR_w$, $SiR_wR_w$, $GeR_wR_w$, $NR_w$, $PR_w$, C═O, O, S or Se; wherein when two $R_w$ are present at the same time, the two $R_w$ may be identical or different;

$L_b$ and $L_c$ are, at each occurrence identically or differently, selected from any one of the group consisting of the following structures:

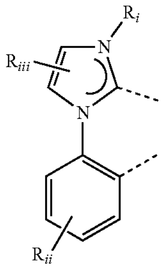 , 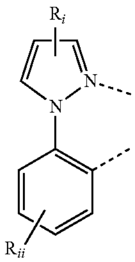 , 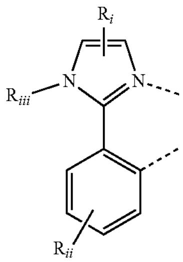 ,

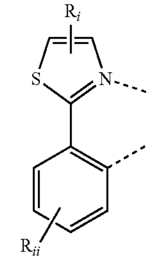 , 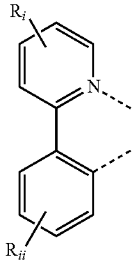 , 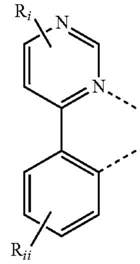 ,

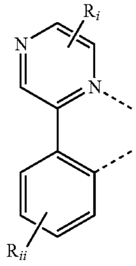 , 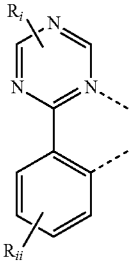 , 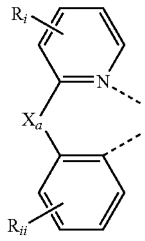 ,

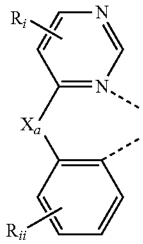 , 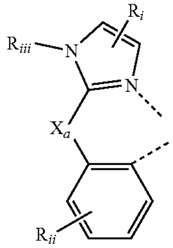 , 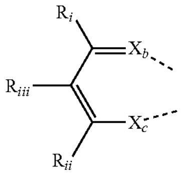 ;

$R_i$, $R_{ii}$ and $R_{iii}$ represent, at each occurrence identically or differently, mono-substitution, multiple substitutions or non-substitution;

$X_a$ is selected from the group consisting of: O, S, Se, $NR_{N1}$ and $CR_{C1}R_{C2}$;

$X_b$ and $X_c$ are, at each occurrence identically or differently, selected from the group consisting of: O, S, Se and $NR_{N2}$;

G, $R_i$, $R_{ii}$, $R_{iii}$, $R_{N1}$, $R_{N2}$, $R_{C1}$, $R_{C2}$, $R_x$, $R_y$ and $R_w$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, adjacent substituents G, $R_x$, $R_y$ and $R_w$ can be optionally joined to form a ring; and adjacent substituents $R_i$, $R_{ii}$, $R_{iii}$, $R_{N1}$, $R_{N2}$, $R_{C1}$ and $R_{C2}$ can be optionally joined to form a ring.

According to another embodiment of the present disclosure, further disclosed is a display assembly including the electroluminescent device in the preceding embodiment.

The electroluminescent device disclosed in the present disclosure comprises the new material composition consisting of the first compound having the structure of H-$L_1$-E and the second compound having the general formula of $M(L_a)_m(L_b)_n(L_c)_q$ in the organic layer, and the device at least has one maximum emission wavelength greater than 630 nm. Such a new material composition can be used in the light-emitting layer of the electroluminescent device. The new material composition can achieve the emission of deep red light in the device, significantly reduce the drive voltage of the device while significantly improve the device efficiency and/or the device lifetime, and provide better device performance.

DETAILED DESCRIPTION

Figure 1:
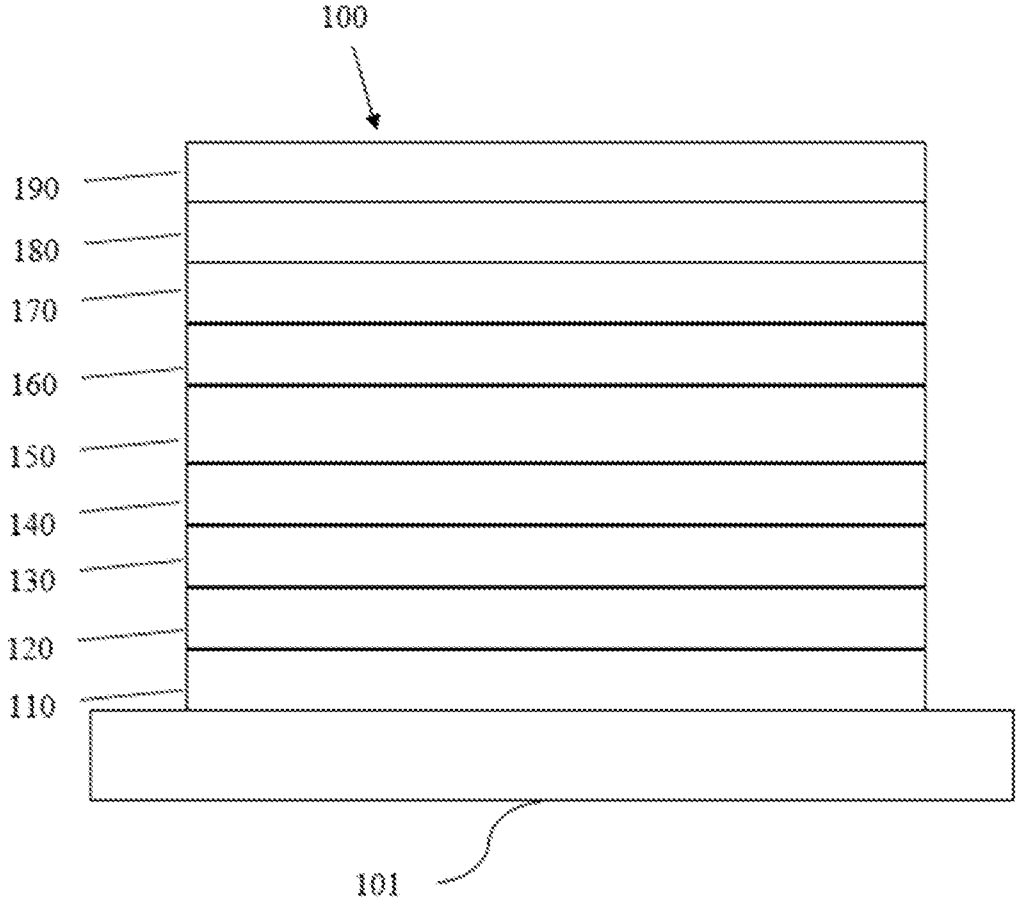
FIG. 1 is a schematic diagram of an organic light-emitting apparatus that may include an electroluminescent device disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
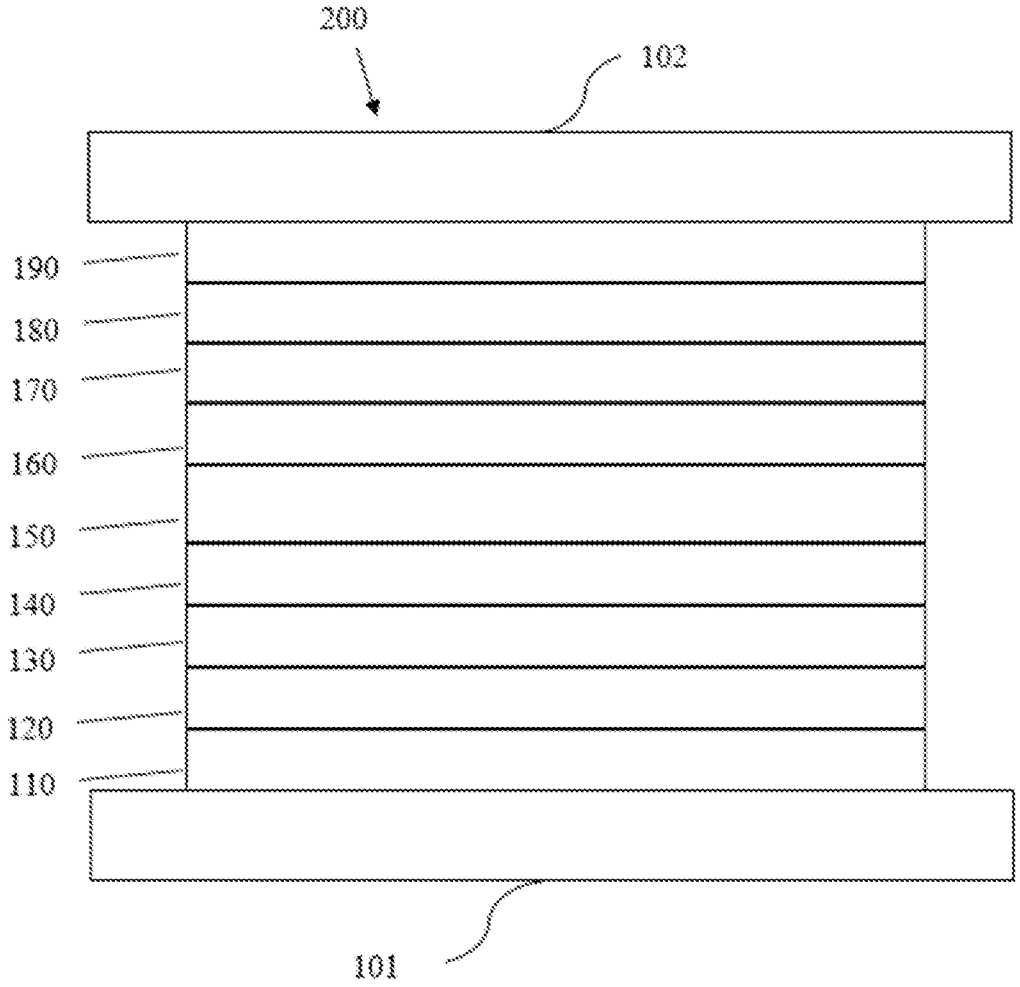
FIG. 2 is a schematic diagram of another organic light-emitting apparatus that may include an electroluminescent device disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AEs-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butyldimethylgermanylmethyl, triethylgermanylmethyl, triethylgermanylethyl, triisopropylgermanylmethyl, triisopropylgermanylethyl, trimethylsilylmethyl, trimethylsilylethyl, trimethylsilylisopropyl, triisopropylsilylmethyl and triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with at least one aryl group. Arylsilyl groups may be those having 6 to 30 carbon atoms, preferably those having 8 to carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, alkylgermanyl, arylgermanyl, amino, acyl, carbonyl, a carboxylic acid group, an ester group, sulfinyl, sulfonyl, and phosphino may be substituted with one or more groups selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl group having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitutions refer to a range that includes di-substitutions, up to the maximum available substitutions. When substitution in the compounds mentioned in the present disclosure represents multiple substitutions (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fused cyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

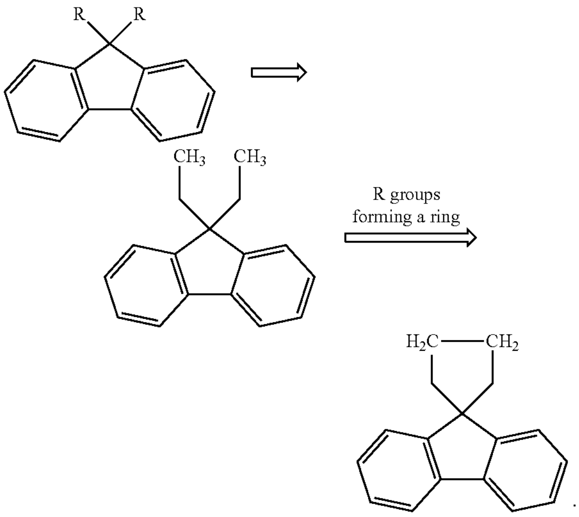

The expression that adjacent substituents can be optionally joined to form a ring is also intended to mean that two substituents bonded to carbon atoms which are directly bonded to each other are joined to each other via a chemical bond to form a ring, which can be exemplified by the following formula:

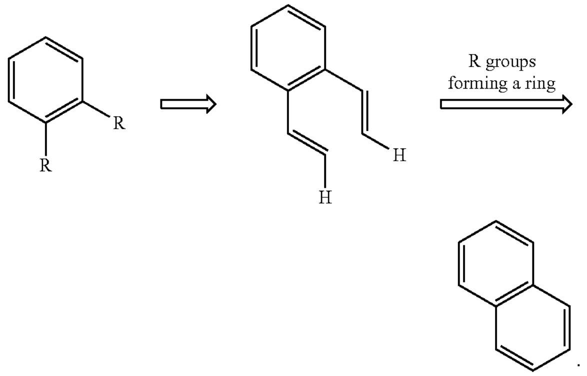

The expression that adjacent substituents can be optionally joined to form a ring is also intended to mean that two substituents bonded to further distant carbon atoms are joined to each other via a chemical bond to form a ring, which can be exemplified by the following formula:

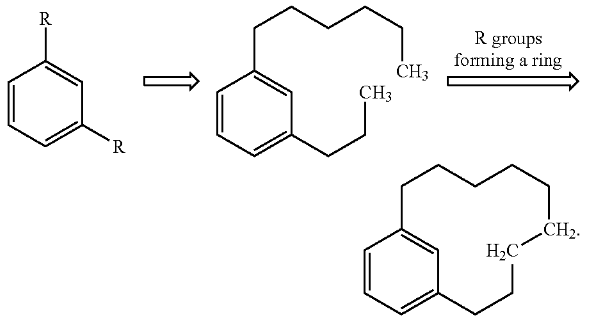

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring.

This is exemplified by the following formula:

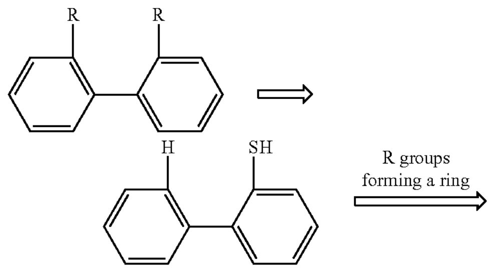

-continued

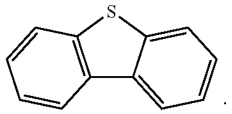

According to an embodiment of the present disclosure, disclosed is an electroluminescent device comprising:

an anode, a cathode, and an organic layer disposed between the anode and the cathode, wherein the organic layer at least comprises a first compound and a second compound, and the device at least has one maximum emission wavelength greater than 630 nm;

wherein the first compound has a structure of H-$L_1$-E, wherein H has a structure represented by Formula A:

Formula A

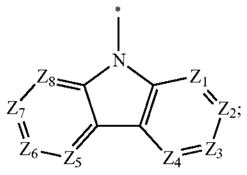

wherein in Formula A, $Z_1$ to $Z_3$ and $Z_6$ to $Z_8$ are, at each occurrence identically or differently, selected from $CR_{z1}$ or N, $Z_4$ and $Z_5$ are, at each occurrence identically or differently, selected from $CR_{z2}$, and two substituents $R_{z2}$ in $Z_4$ and $Z_5$ are joined to form a ring;

$L_1$ is selected from a single bond, substituted or unsubstituted arylene having 6 to 30 carbon atoms, substituted or unsubstituted heteroarylene having 3 to 30 carbon atoms or a combination thereof;

E is selected from substituted or unsubstituted aryl having 6 to 30 carbon atoms or substituted or unsubstituted heteroaryl having 3 to 30 carbon atoms;

$R_{z1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, $R_{z2}$ is, at each occurrence identically or differently, selected from the group consisting of: hydrogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof, and adjacent substituents $R_{z1}$, $R_{z2}$ can be optionally joined to form a ring;

wherein the second compound is a metal complex and has a general formula of $M(L_a)_m(L_b)_n(L_c)_q$, wherein M is selected from a metal with a relative atomic mass greater than 40, $L_a$, $L_b$ and $L_c$ are a first ligand, a second ligand and a third ligand coordinated to the metal M, respectively, m is selected from 1, 2 or 3, n is selected from 0, 1 or 2, q is selected from 0, 1 or 2, and m+n+q equals an oxidation state of the metal M; wherein when m is equal to 2 or 3, a plurality of $L_a$ may be identical or different; when n is equal to 2, two $L_b$ may be identical or different; when q is equal to 2, two $L_c$ may be identical or different;

$L_a$, $L_b$ and $L_e$ can be optionally joined to form a multidentate ligand;

$L_a$ is, at each occurrence identically or differently, selected from a structure represented by any one of Formula 1-1 to Formula 1-14:

Formula 1-1

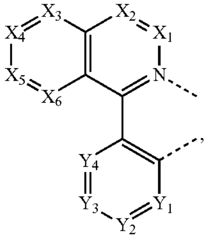

-continued

Formula 1-2

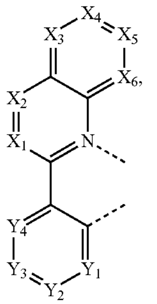

Formula 1-3

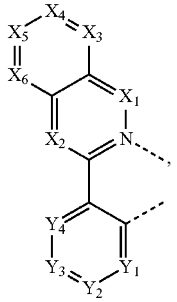

Formula 1-4

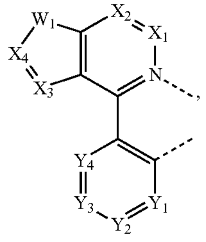

Formula 1-5

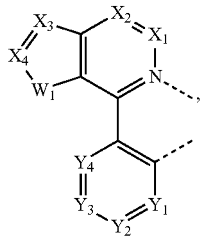

Formula 1-6

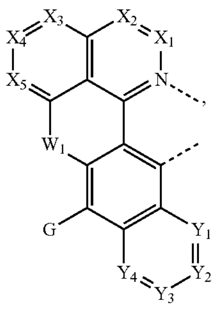

-continued

Formula 1-7

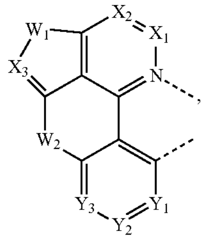

Formula 1-8

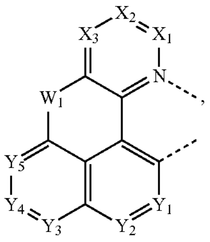

Formula 1-9

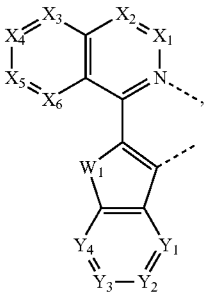

Formula 1-10

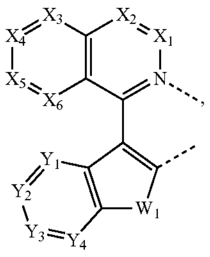

Formula 1-11

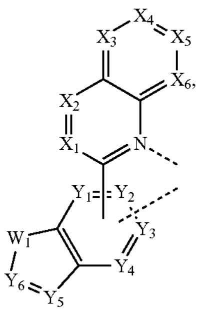

-continued

Formula 1-12

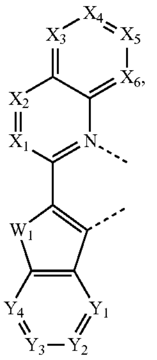

Formula 1-13

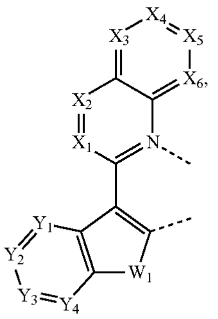

Formula 1-14

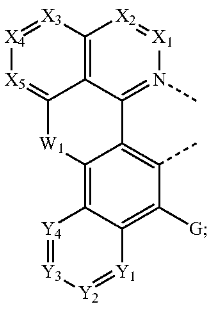

wherein $X_1$ to $X_6$ are, at each occurrence identically or differently, selected from $CR_x$ or N;

$Y_1$ to $Y_6$ are, at each occurrence identically or differently, selected from C, $CR_y$, or N;

$W_1$ and $W_2$ are, at each occurrence identically or differently, selected from $CR_wR_w$, $SiR_wR_w$, $GeR_wR_w$, $NR_w$, $PR_w$, C=O, O, S or Se; wherein when two $R_w$ are present at the same time, the two $R_w$ may be identical or different;

$L_b$ and $L_c$ are, at each occurrence identically or differently, selected from any one of the group consisting of the following structures:

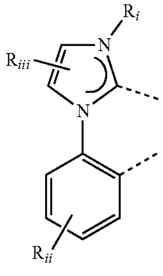
,
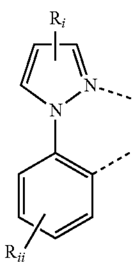
,
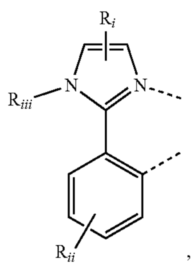
,

-continued

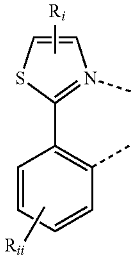 , 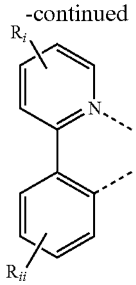 , 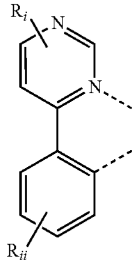 ,

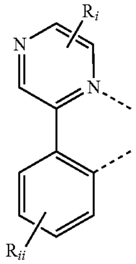 , 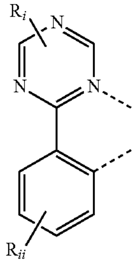 , 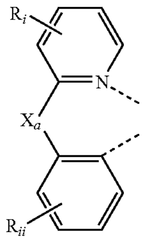 ,

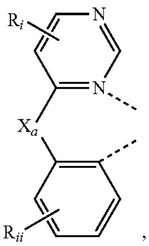 , 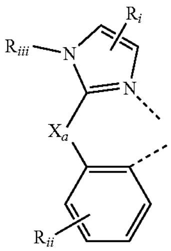 , 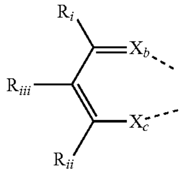 ;

$R_i$, $R_{ii}$ and $R_{iii}$ represent, at each occurrence identically or differently, mono-substitution, multiple substitutions or non-substitution;

$X_a$ is selected from the group consisting of: O, S, Se, $NR_{N1}$ and $CR_{C1}R_{C2}$;

$X_b$ and $X_c$ are, at each occurrence identically or differently, selected from the group consisting of: O, S, Se and $NR_{N2}$;

G, $R_i$, $R_{ii}$, $R_{iii}$, $R_{N1}$, $R_{N2}$, $R_{C1}$, $R_{C2}$, $R_x$, $R_y$ and $R_w$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, adjacent substituents G, $R_x$, $R_y$ and $R_w$ can be optionally joined to form a ring; and adjacent substituents $R_i$, $R_{ii}$, $R_{iii}$, $R_{N1}$, $R_{N2}$, $R_{C1}$ and $R_{C2}$ can be optionally joined to form a ring.

In the present disclosure, the expression that "the device at least has one maximum emission wavelength greater than 630 nm" is intended to mean that the electroluminescent device of the present disclosure may have only one maximum emission wavelength (for example, a red light-emitting device) or may have a plurality of maximum emission wavelengths (for example, a white light-emitting device), wherein at least one maximum emission wavelength is greater than 630 nm. Preferably, the electroluminescent device of the present disclosure at least has one maximum emission wavelength greater than 635 nm, or at least one maximum emission wavelength greater than 640 nm, or at least one maximum emission wavelength greater than 650 nm, or at least one maximum emission wavelength greater than 670 nm.

In this embodiment, the expression that "adjacent substituents $R_{z1}$, $R_{z2}$ can be optionally joined to form a ring" is intended to mean that any one or more of groups of adjacent substituents, such as adjacent substituents $R_{z1}$ in $Z_1$ to $Z_3$, adjacent substituents $R_{z1}$ in $Z_6$ to $Z_8$, substituent $R_{z1}$ in $Z_3$ and substituent $R_{z2}$ in $Z_4$, substituent $R_{z1}$ in $Z_3$ and substituent $R_{z2}$ in $Z_5$, substituent $R_{z1}$ in $Z_6$ and substituent $R_{z2}$ in $Z_4$, and substituent $R_{z1}$ in $Z_6$ and substituent $R_{z2}$ in $Z_5$, can be joined to form a ring. Obviously, it is possible that none of these groups of adjacent substituents are joined to form a ring.

In this embodiment, the expression that "$L_a$, $L_b$ and $L_c$ can be optionally joined to form a multidentate ligand" is intended to mean that any two or three of $L_a$, $L_b$ and $L_c$ can be joined to form a tetradentate ligand or a hexadentate ligand. Obviously, it is possible that none of $L_a$, $L_b$ and $L_c$ are joined to form a multidentate ligand.

In the present disclosure, the expression that "adjacent substituents G, $R_x$, $R_y$ and $R_w$ can be optionally joined to form a ring" is intended to mean that any one or more of groups of adjacent substituents in the structure of $L_a$, such as adjacent substituents $R_x$, adjacent substituents $R_y$, adjacent substituents $R_w$, adjacent substituents G and $R_y$, adjacent substituents G and $R_w$, and adjacent substituents $R_x$ and $R_y$, can be joined to form a ring. Obviously, it is possible that none of these substituents are joined to form a ring. In particular, adjacent substituents $R_x$ and $R_y$ in Formula 1-1 are not joined to form an oxygen heterocycle.

In this embodiment, the expression that "adjacent substituents $R_i$, $R_{ii}$, $R_{iii}$, $R^{N1}$, $R_{N2}$, $R_{C1}$ and $R_{C2}$ can be optionally joined to form a ring" is intended to mean that any one or more of groups of adjacent substituents in the structure of $L_b$ and the structure of $L_c$, such as adjacent substituents $R_i$, adjacent substituents $R_{ii}$, adjacent substituents $R_{iii}$, adjacent substituents $R_i$ and $R_{ii}$, adjacent substituents $R_{ii}$ and $R_{iii}$, adjacent substituents $R_i$ and $R_{iii}$, adjacent substituents $R_i$ and $R_{N1}$, adjacent substituents $R_i$ and $R_{C1}$, adjacent substituents $R_i$ and $R_{C2}$, adjacent substituents $R_{ii}$ and $R_{N1}$, adjacent substituents $R_{iii}$ and $R_{N1}$, adjacent substituents $R_{ii}$ and $R_{C1}$, adjacent substituents $R_{ii}$ and $R_{C2}$, adjacent substituents $R_i$ and $R_{N2}$, adjacent substituents $R_{ii}$ and $R_{N2}$, and adjacent substituents $R_{C1}$ and $R_{C2}$, can be joined to form a ring. Obviously, it is possible that none of these substituents are joined to form a ring.

According to an embodiment of the present disclosure, wherein, in Formula A, the two substituents $R_{z2}$ in $Z_4$ and $Z_5$ are joined to form a ring, and the ring has at least six ring atoms.

According to an embodiment of the present disclosure, wherein, in Formula A, the two substituents $R_{z2}$ in $Z_4$ and $Z_5$ are joined to form a ring, and the ring has at least seven ring atoms.

According to an embodiment of the present disclosure, wherein, in the first compound, H has a structure represented by any one of Formula A-1 to Formula A-8:

Formula A-1

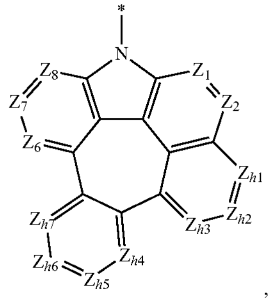

,

Formula A-2

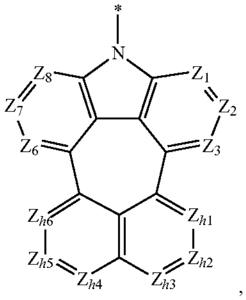

,

Formula A-3

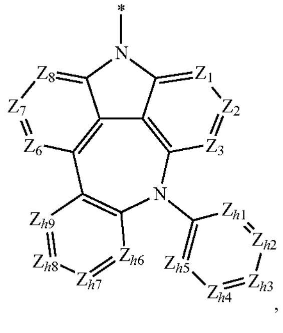

,

Formula A-4

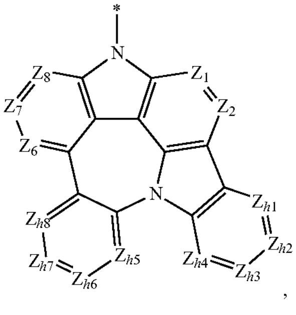

,

-continued

Formula A-5

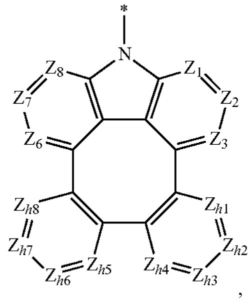

,

Formula A-6

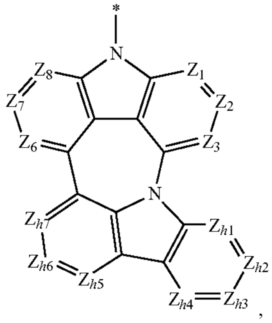

,

Formula A-7

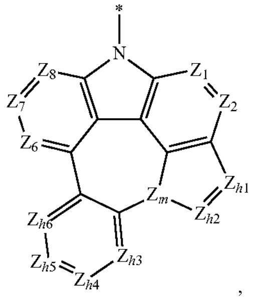

,

Formula A-8

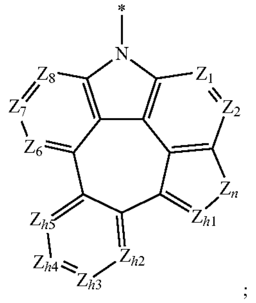

;

wherein in Formula A-1 to Formula A-8, $Z_1$ to $Z_3$ and $Z_6$ to $Z_8$ are, at each occurrence identically or differently, selected from $CR_{z1}$ or N;

$Z_{h1}$ to $Z_{h9}$ are, at each occurrence identically or differently, selected from $CR_{zh}$ or N;

$Z_m$ is selected from $CR_{zm}$ or N;

$Z_n$ is selected from $CR_{zn}R_{zn}$, O, S or $NR_{zn}$; wherein when $Z_n$ is selected from $CR_{zn}R_{zn}$, the two $R_{zn}$ may be identical or different;

$R_{z1}$, $R_{zh}$, $R_{zm}$ and $R_{zn}$ are, at each occurrence identically or differently, selected from the group consisting of: hydrogen, deuterium, halogen, substituted or unsubstituted alkyl having 1 to carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, and adjacent substituents $R_{z1}$, $R_{zh}$, $R_{zm}$, $R_{zn}$ can be optionally joined to form a ring.

In the present disclosure, the expression that "adjacent substituents $R_{z1}$, $R_{zh}$, $R_{zm}$, $R_{zn}$ can be optionally joined to form a ring" is intended to mean that any one or more of groups of adjacent substituents, such as adjacent substituents $R_{z1}$ in $Z_1$ to $Z_3$, adjacent substituents $R_{z1}$ in $Z_6$ to $Z_8$, adjacent substituents $R_{zh}$, adjacent substituents $R_{zh}$ and $R_{zm}$, adjacent substituents $R_{zn}$, and adjacent substituents $R_{zh}$ and $R_{zn}$, can be joined to form a ring. Obviously, it is possible that none of these groups of adjacent substituents are joined to form a ring.

According to an embodiment of the present disclosure, wherein, in Formula A-1 to Formula A-8, $R_{z1}$, $R_{zh}$, $R_{zm}$ and $R_{zn}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, cyano, isocyano, hydroxyl, a sulfanyl group and combinations thereof, and adjacent substituents $R_{z1}$, $R_{zh}$, $R_{zm}$, $R_{zn}$ can be optionally joined to form a ring.

According to an embodiment of the present disclosure, wherein, in the first compound, H has a structure represented by any one of Formula A-1 to Formula A-8:

Formula A-1

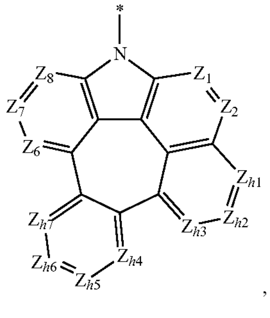

,

-continued

Formula A-2

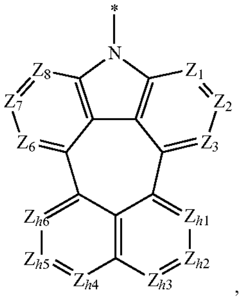

,

Formula A-3

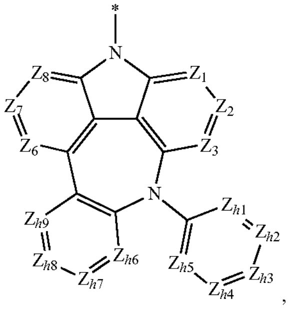

,

Formula A-4

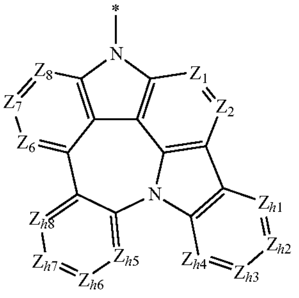

,

Formula A-5

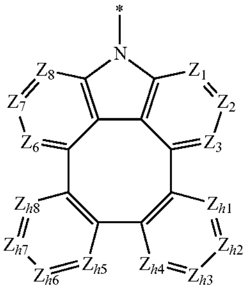

,

Formula A-6

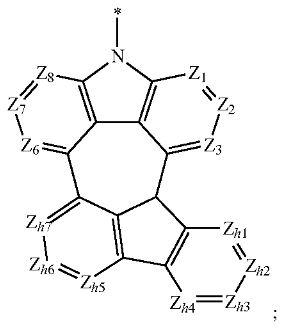

;

-continued

Formula A-7

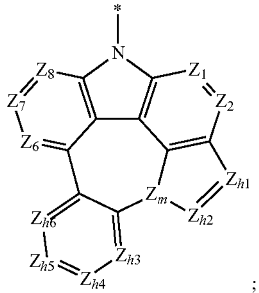

;

Formula A-8

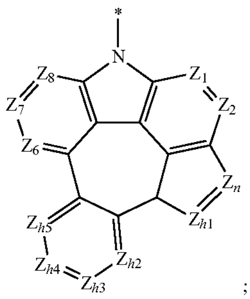

;

wherein in Formula A-1 to Formula A-8, $Z_1$ to $Z_3$ and $Z_6$ to $Z_8$ are, at each occurrence identically or differently, selected from $CR_{z1}$;

$Z_{h1}$ to $Z_{h9}$ are, at each occurrence identically or differently, selected from $CR_{zh}$ or N;

$Z_m$ is selected from N;

$Z_n$ is selected from O, S or $NR_{zn}$;

$R_{z1}$, $R_{zh}$ and $R_{zn}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, and adjacent substituents $R_{z1}$, $R_{zh}$, $R_{zn}$ can be optionally joined to form a ring.

In the present disclosure, the expression that "adjacent substituents $R_{z1}$, $R_{zh}$, $R_{zn}$ can be optionally joined to form a ring" is intended to mean that any one or more of groups of adjacent substituents, such as adjacent substituents $R_{z1}$ in $Z_1$ to $Z_3$, adjacent substituents $R_{z1}$ in $Z_6$ to $Z_8$, adjacent substituents $R_{zh}$, adjacent substituents $R_{zn}$, and adjacent substituents $R_{zh}$ and $R_{zn}$, can be joined to form a ring. Obviously, it is possible that none of these groups of adjacent substituents are joined to form a ring.

According to an embodiment of the present disclosure, wherein, in the first compound, H has a structure represented by any one of Formula A-1 to Formula A-8:

Formula A-1

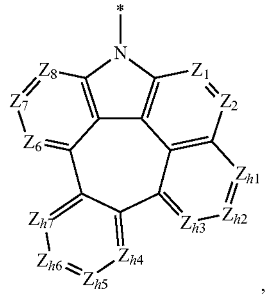

,

Formula A-2

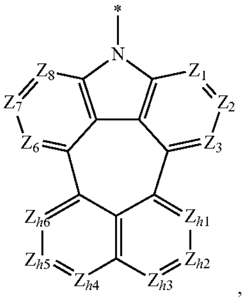

,

Formula A-3

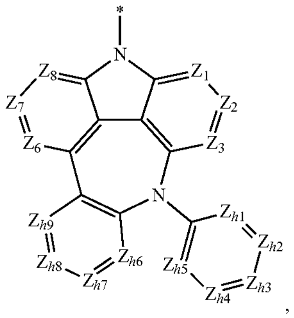

,

Formula A-4

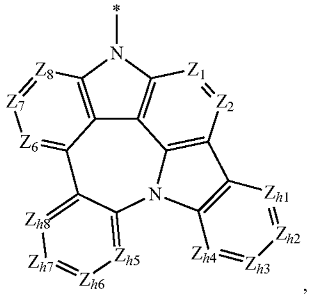

,

-continued

Formula A-5

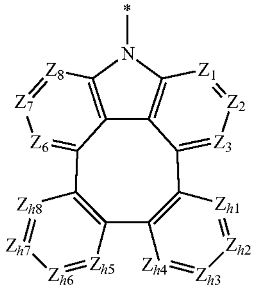

,

Formula A-6

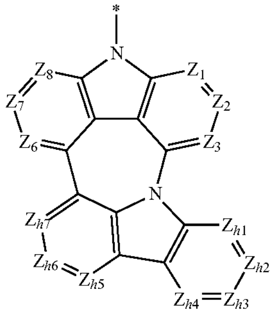

,

Formula A-7

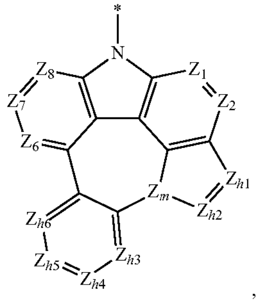

,

Formula A-8

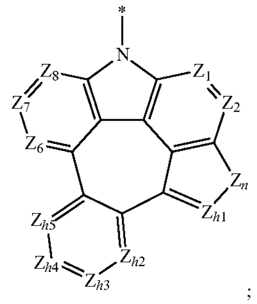

;

wherein in Formula A-1 to Formula A-8, $Z_1$ to $Z_3$ and $Z_6$ to $Z_8$ are, at each occurrence identically or differently, selected from $CR_{z1}$;

$Z_{h1}$ to $Z_{h9}$ are, at each occurrence identically or differently, selected from $CR_{zh}$ or N;

$Z_m$ is selected from N;

$Z_n$ is selected from O, S or $NR_{zn}$;

$R_{z1}$, $R_{zh}$ and $R_{zn}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, cyano, isocyano, hydroxyl, a sulfanyl group and combinations thereof, and adjacent substituents $R_{z1}$, $R_{zh}$, $R_{zn}$ can be optionally joined to form a ring.

According to an embodiment of the present disclosure, wherein, in the first compound, H is selected from the group consisting of the following structures:

H-1

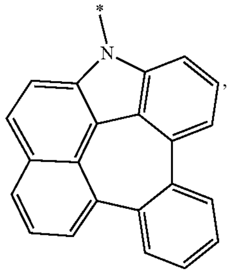

,

H-2

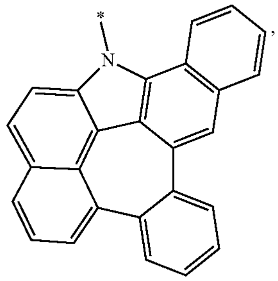

,

H-3

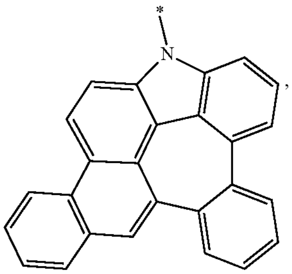

,

H-4

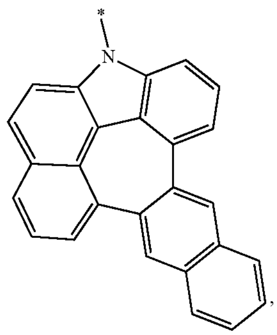

,

-continued
H-5
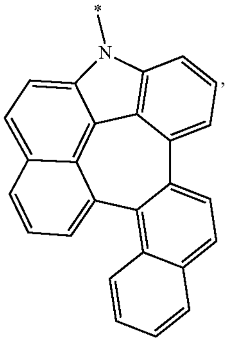,
H-6
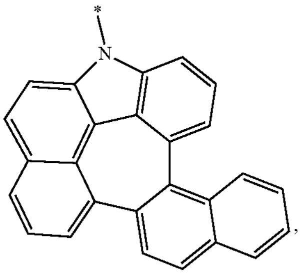,
H-7
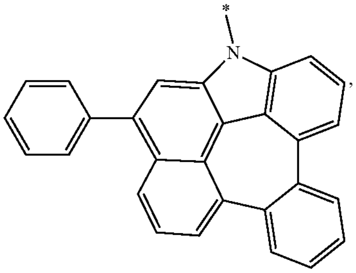,
H-8
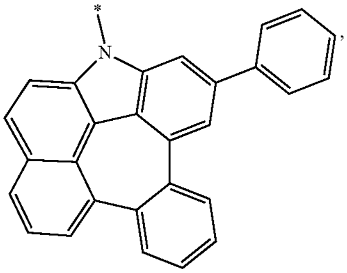,
H-9
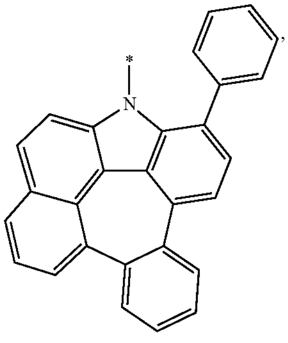,
-continued
H-10
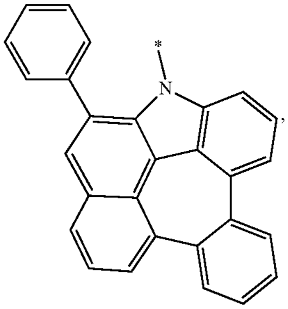,
H-11
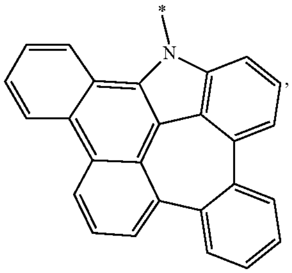,
H-12
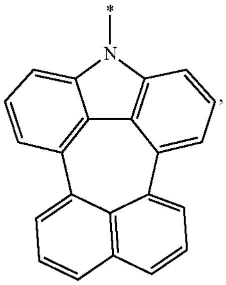,
H-13
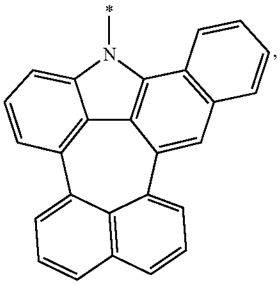,
H-14
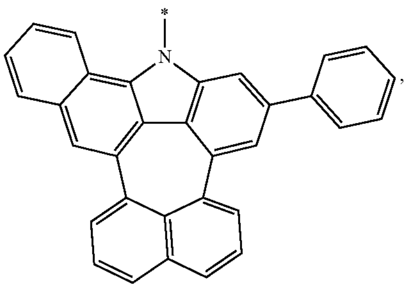, -continued
H-15
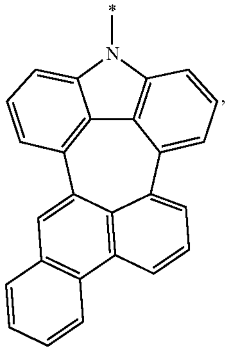
H-16
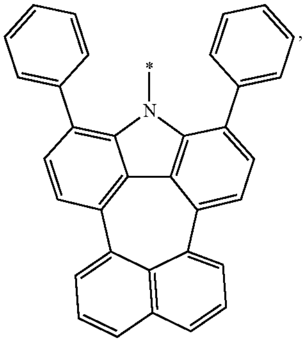
H-17
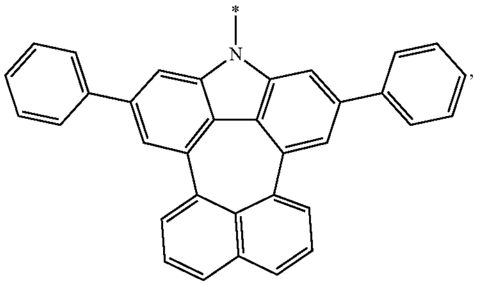
H-18
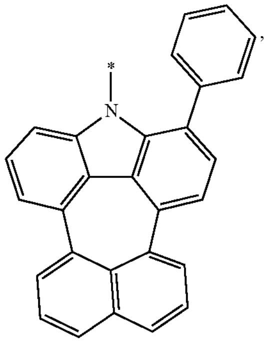
-continued
H-19
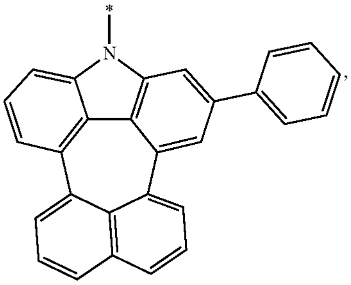
H-20
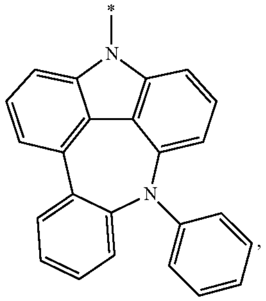
H-21
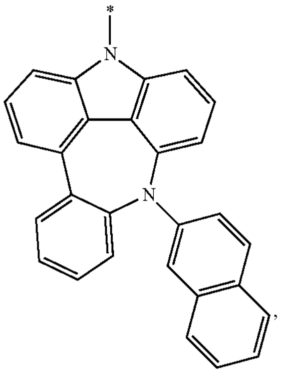
H-22
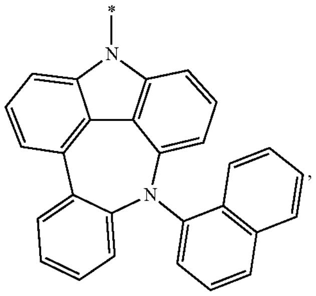

-continued
H-23
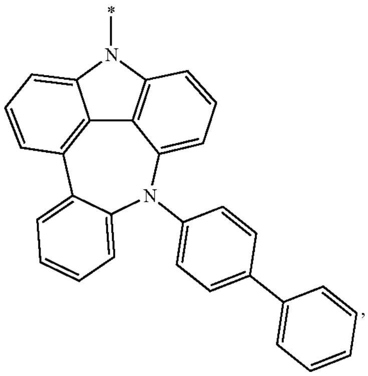
,
H-24
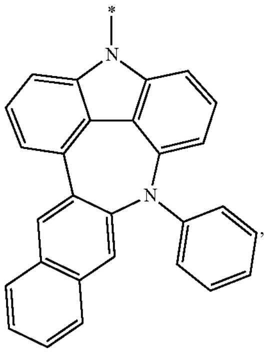
,
H-25
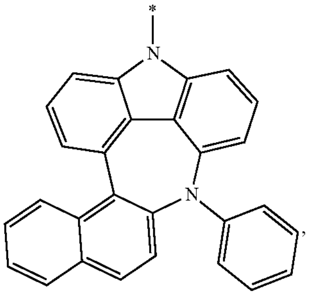
,
H-26
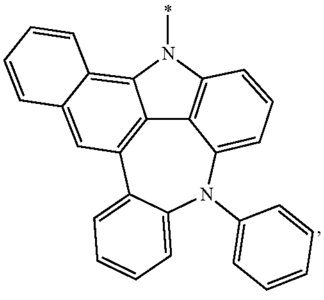
,
H-27
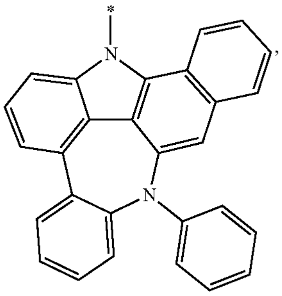
,
-continued
H-28
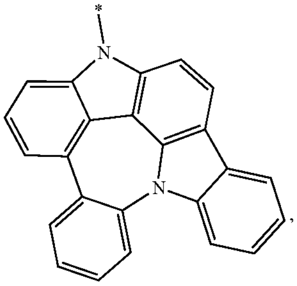
,
H-29
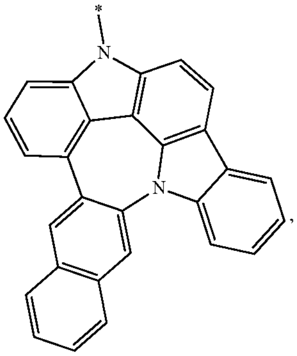
,
H-30
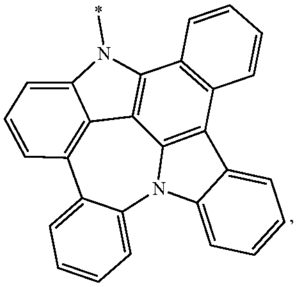
,
H-31
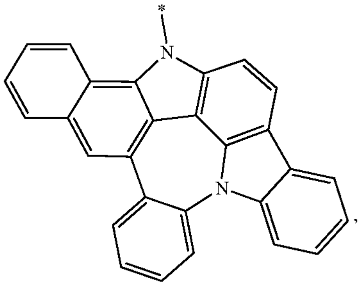
,
H-32
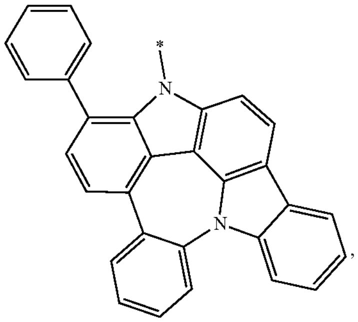
, -continued
H-33
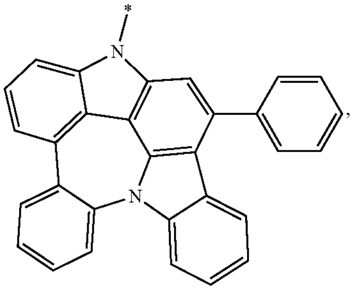,
H-34
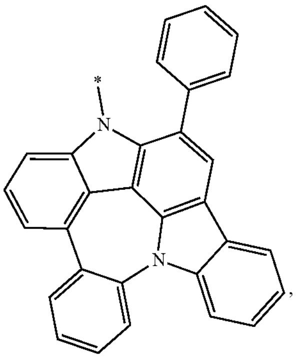,
H-35
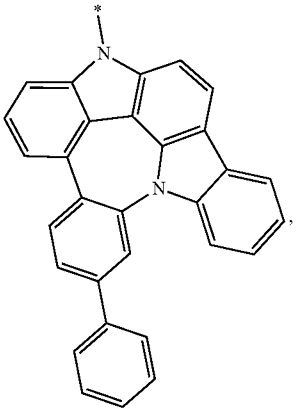,
H-36
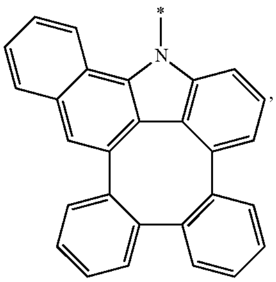,
H-37
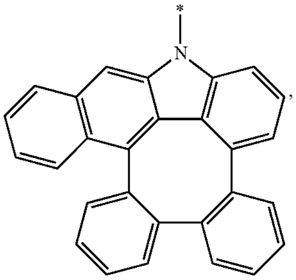,
-continued
H-38
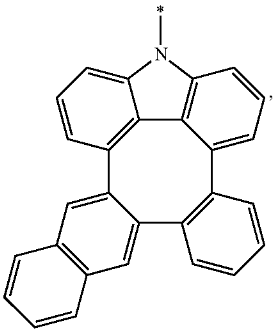,
H-39
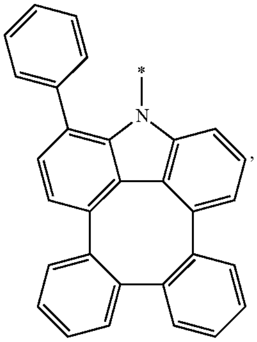,
H-40
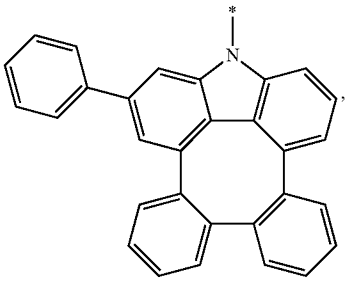,
H-41
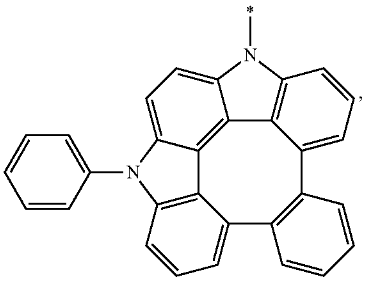, -continued
H-42
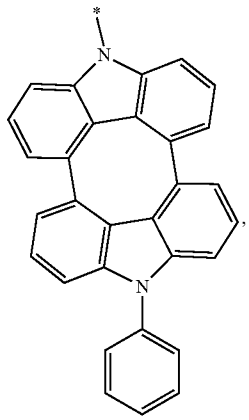
,
H-43
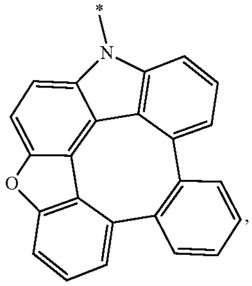
,
H-44
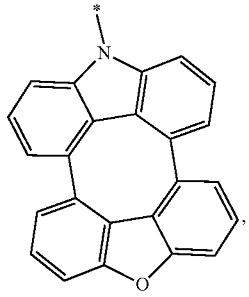
,
H-45
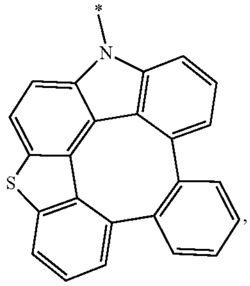
,
H-46
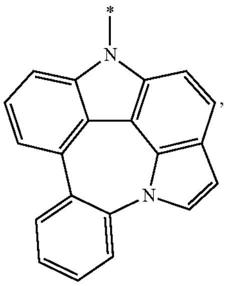
,
-continued
H-47
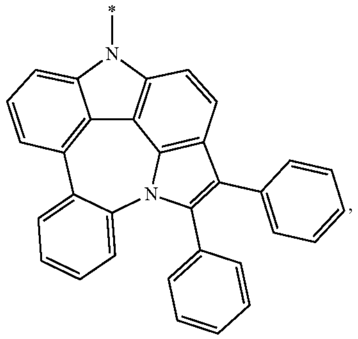
,
H-48
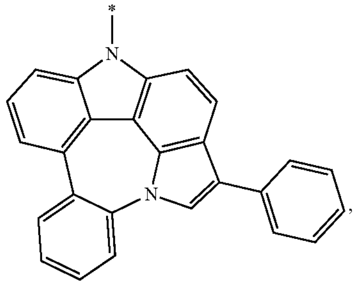
,
H-49
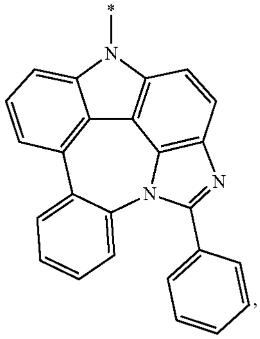
,
H-50
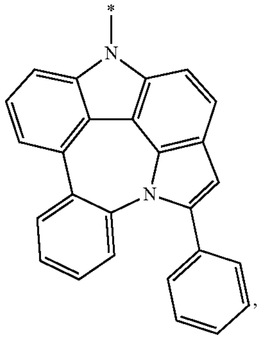
, -continued
H-51
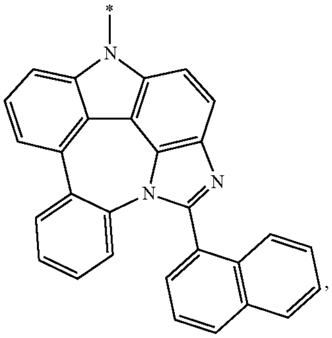
,
H-52
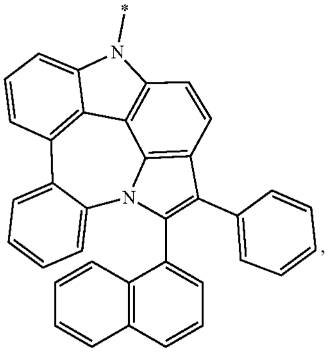
,
H-53
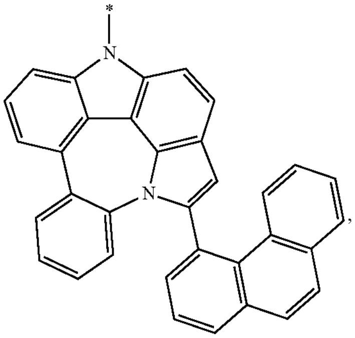
,
H-54
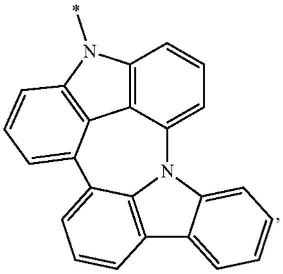
,
H-55
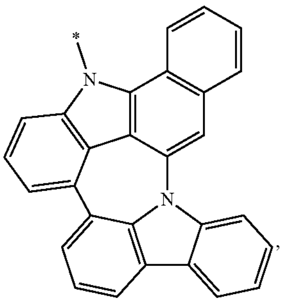
,
-continued
H-56
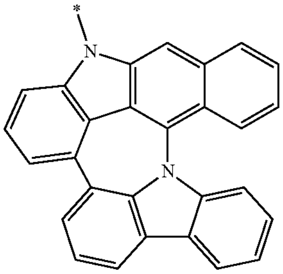
,
H-57
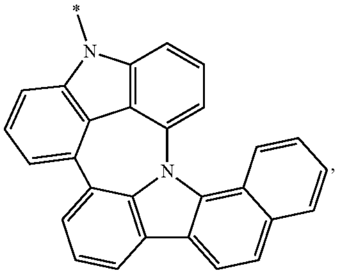
,
H-58
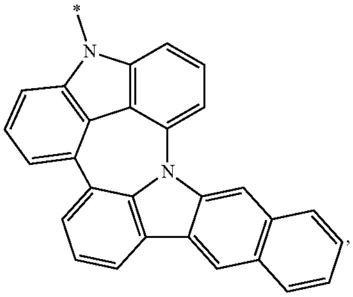
,
H-59
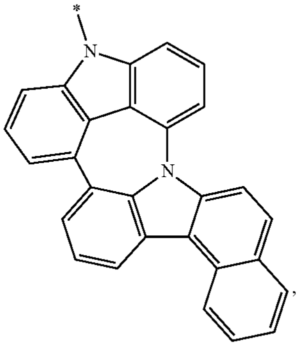
,
H-60
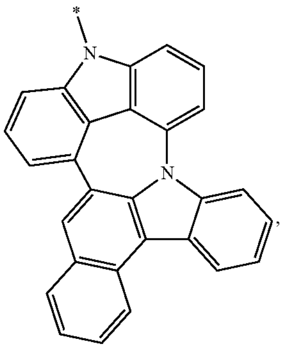
, -continued
H-61
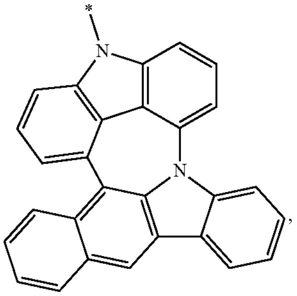
H-62
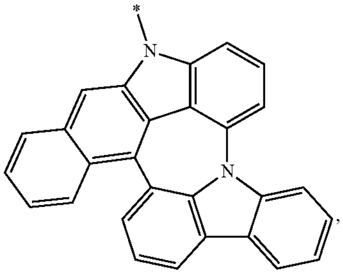
H-63
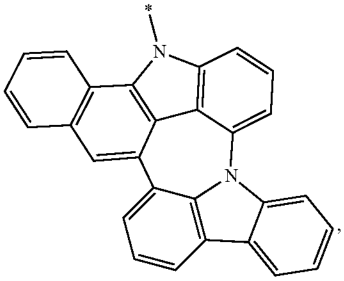
H-64
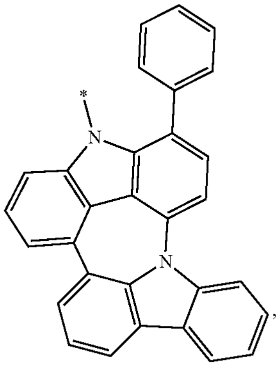
H-65
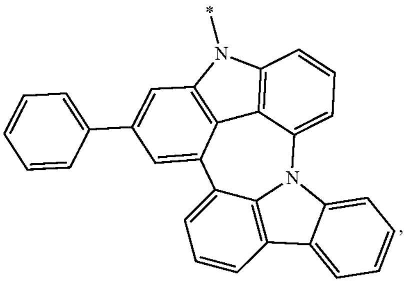
-continued
H-66
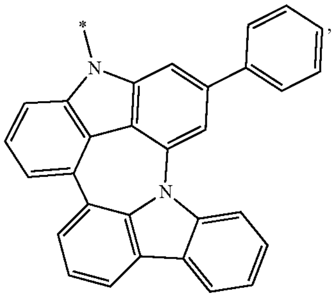
H-67
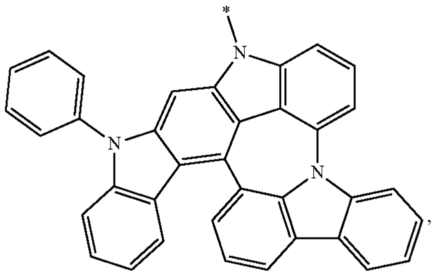
H-68
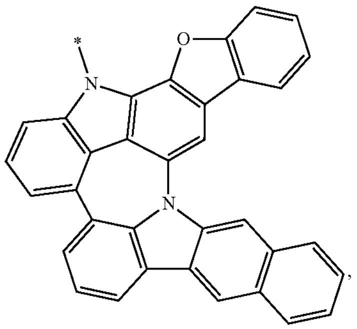
H-69
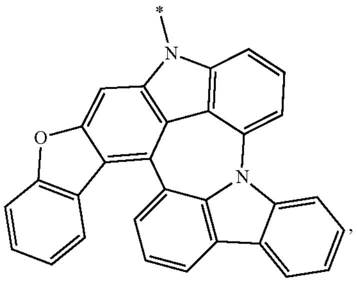
H-70
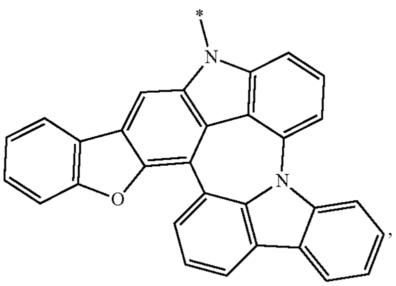

-continued

H-71

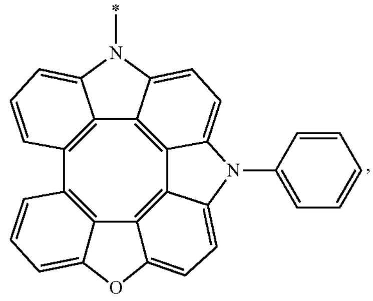,

H-72

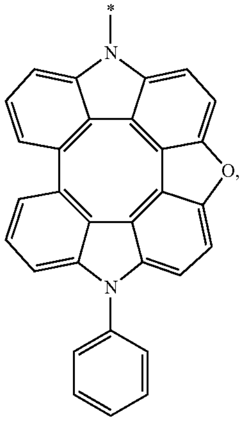

H-73

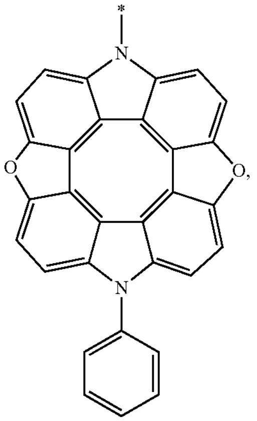

H-74

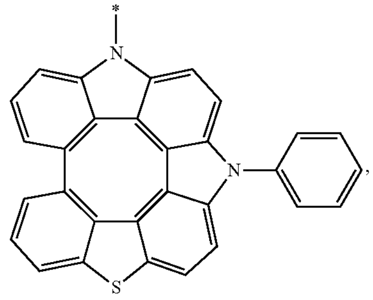,

-continued

H-75

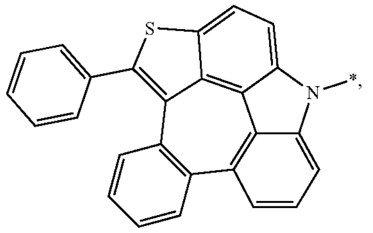

H-76

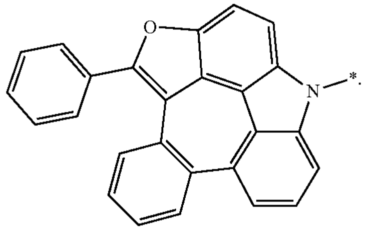

In this embodiment, "*" represents a position where the structure of H is joined to $L_1$.

According to an embodiment of the present disclosure, wherein, hydrogen in the structures of H-1 to H-76 can be partially or fully substituted with deuterium.

According to an embodiment of the present disclosure, wherein, in the first compound, E has a structure represented by Formula E-a or Formula E-b:

Formula E-a

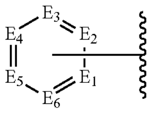

,

Formula E-b

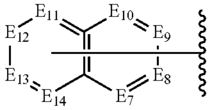

wherein in Formula E-a and Formula E-b, $E_1$ to $E_{14}$ are, at each occurrence identically or differently, selected from C, $CR_e$ or N;

$R_e$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, and adjacent substituents $R_c$ can be optionally joined to form a ring.

In this embodiment, "~~~" represents a position where the structure of E is joined to $L_1$.

In this embodiment, in Formula E-a, one of $E_1$ to $E_6$ is C, and the C is joined to $L_1$; in Formula E-b, one of $E_7$ to $E_{14}$ is C, and the C is joined to $L_1$.

In this embodiment, the expression that "adjacent substituents $R_e$ can be optionally joined to form a ring" is intended to mean that any adjacent substituents $R_e$ can be joined to form a ring. Obviously, it is possible that any adjacent substituents $R_e$ are not joined to form a ring.

According to an embodiment of the present disclosure, wherein, in Formula E-a, at least two of $E_1$ to $E_6$ are N; in Formula E-b, at least two of $E_7$ to $E_{14}$ are N.

According to an embodiment of the present disclosure, wherein, in Formula E-a, three of $E_1$ to $E_6$ are N; in Formula E-b, two of $E_7$ to $E_{10}$ are N.

According to an embodiment of the present disclosure, wherein, in the first compound, E has a structure represented by any one of Formula E-1 to Formula E-10:

Formula E-1

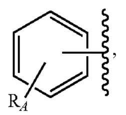

Formula E-2

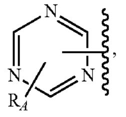

Formula E-3

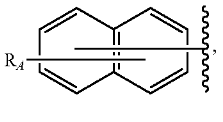

Formula E-4

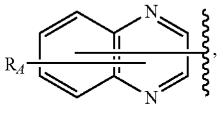

Formula E-5

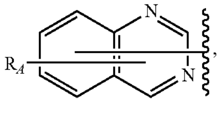

Formula E-6

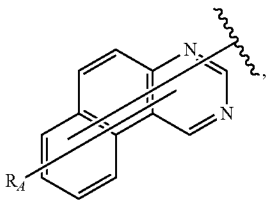

-continued

Formula E-7

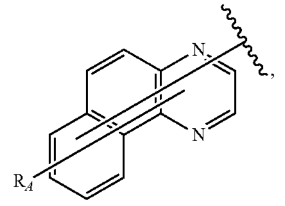

Formula E-8

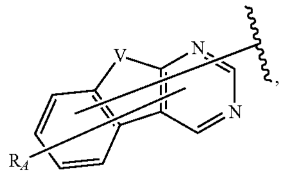

Formula E-9

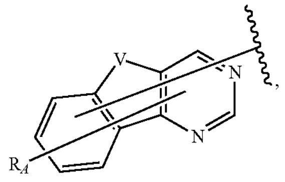

Formula E-10

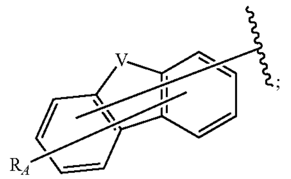

wherein in Formula E-1 to Formula E-10, $R_A$ represents, at each occurrence identically or differently, mono-substitution, multiple substitutions or non-substitution;

V is selected from O, S or Se;

$R_A$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, and adjacent substituents $R_A$ can be optionally joined to form a ring.

In the present disclosure, the expression that "adjacent substituents $R_A$ can be optionally joined to form a ring" is intended to mean that any adjacent substituents $R_A$ can be joined to form a ring. Obviously, it is possible that any adjacent substituents $R_A$ are not joined to form a ring.

In this embodiment, "∿∿∿" represents a position where the structure of E is joined to $L_1$.

According to an embodiment of the present disclosure, wherein, in the first compound, E has a structure represented by any one of Formula E-11 to Formula E-21:

Formula E-11

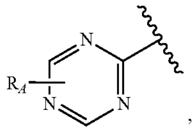

,

Formula E-12

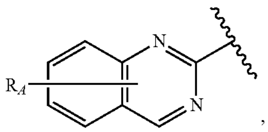

,

Formula E-13

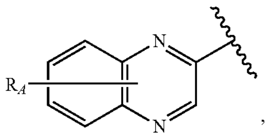

,

Formula E-14

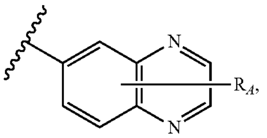

Formula E-15

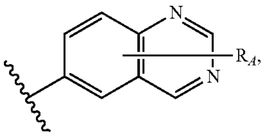

Formula E-16

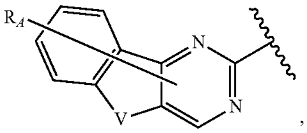

,

Formula E-17

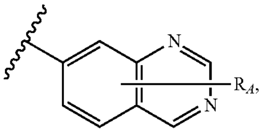

Formula E-18

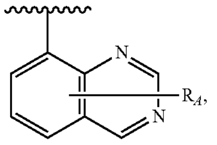

Formula E-19

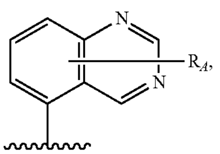

-continued

Formula E-20

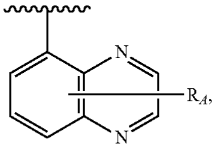

Formula E-21

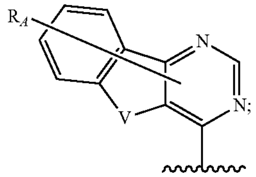

wherein in Formula E-11 to Formula E-21, $R_A$ represents, at each occurrence identically or differently, mono-substitution, multiple substitutions or non-substitution;

V is selected from O, S or Se;

$R_A$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group, a hydroxyl group, a sulfanyl group and combinations thereof, and adjacent substituents $R_A$ can be optionally joined to form a ring.

In this embodiment, "∿∿∿" represents a position where the structure of E is joined to $L_1$.

According to an embodiment of the present disclosure, wherein, in Formula E-1 to Formula E-21, the $R_A$ is, at each occurrence identically or differently, selected from the group consisting of: hydrogen, deuterium, halogen, cyano, hydroxyl, a sulfanyl group, substituted or unsubstituted alkyl having 1 to 20 carbon atoms, substituted or unsubstituted alkenyl having 2 to carbon atoms, substituted or unsubstituted aryl having 6 to 30 carbon atoms, substituted or unsubstituted heteroaryl having 3 to 30 carbon atoms and combinations thereof, and adjacent substituents $R_A$ can be optionally joined to form a ring.

According to an embodiment of the present disclosure, wherein, in Formula E-1 to Formula E-21, the $R_A$ is, at each occurrence identically or differently, selected from the group consisting of: hydrogen, deuterium, fluorine, cyano, hydroxyl, a sulfanyl group, methyl, trideuteromethyl, vinyl, phenyl, biphenyl, naphthyl, 4-cyanophenyl, dibenzofuranyl, dibenzothienyl, triphenylenyl, carbazolyl, 9-phenylcarbazolyl, 9,9-dimethylfluorenyl, pyridyl, phenylpyridyl and combinations thereof, and adjacent substituents $R_A$ can be optionally joined to form a ring.

According to an embodiment of the present disclosure, wherein, at least one $R_A$ is present in Formula E-1 to Formula E-21, and the $R_A$ is, at each occurrence identically or differently, selected from the group consisting of: deuterium, halogen, cyano, hydroxyl, a sulfanyl group, substituted or unsubstituted alkyl having 1 to 20 carbon atoms, substituted or unsubstituted alkenyl having 2 to 20 carbon atoms, substituted or unsubstituted aryl having 6 to carbon atoms, substituted or unsubstituted heteroaryl having 3 to 30 carbon atoms and combinations thereof, and adjacent substituents $R_A$ can be optionally joined to form a ring.

According to an embodiment of the present disclosure, wherein, at least one $R_A$ is present in Formula E-1 to Formula E-21, and the $R_A$ is, at each occurrence identically or differently, selected from the group consisting of: deuterium, halogen, cyano, substituted or unsubstituted alkyl having 1 to 20 carbon atoms, substituted or unsubstituted aryl having 6 to 30 carbon atoms, substituted or unsubstituted heteroaryl having 3 to 30 carbon atoms and combinations thereof, and adjacent substituents $R_A$ can be optionally joined to form a ring.

According to an embodiment of the present disclosure, wherein, at least one $R_A$ is present in Formula E-1 to Formula E-21, and the $R_A$ is, at each occurrence identically or differently, selected from the group consisting of: deuterium, fluorine, cyano, methyl, trideuteramethyl, phenyl, biphenyl, naphthyl, 4-cyanophenyl, dibenzofuranyl, dibenzothienyl, triphenylenyl, carbazolyl, 9-phenylcarbazolyl, 9,9-dimethylfluorenyl, pyridyl, phenylpyridyl and combinations thereof, and adjacent substituents $R_A$ can be optionally joined to form a ring.

According to an embodiment of the present disclosure, wherein, in the first compound, the E is selected from the group consisting of the following structures:

E-1

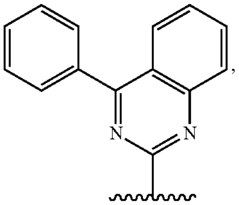,

E-2

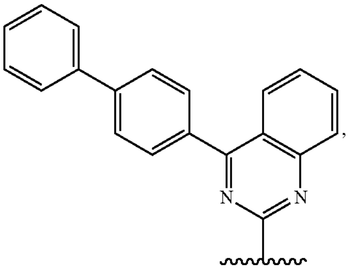,

E-3

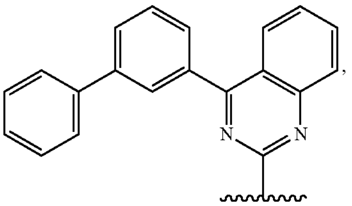,

-continued

E-4

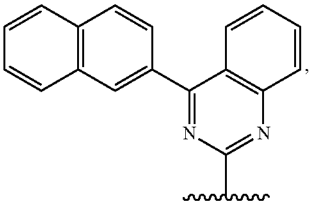,

E-5

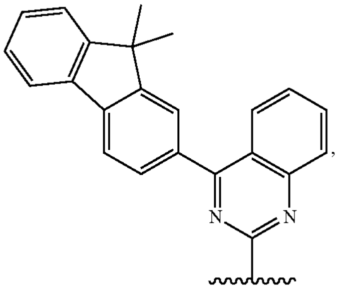,

E-6

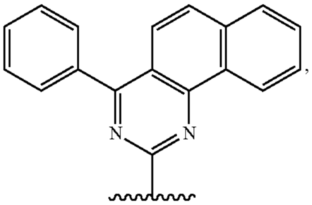,

E-7

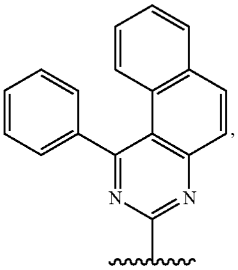,

E-8

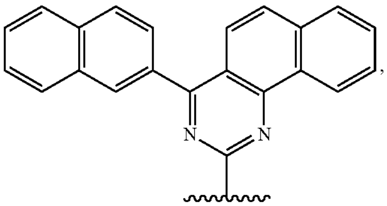,

E-9

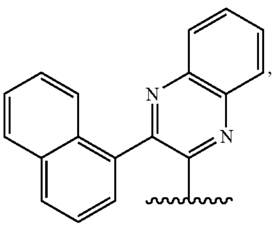,

-continued
E-10
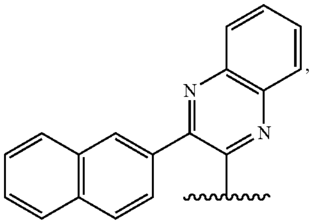
E-11
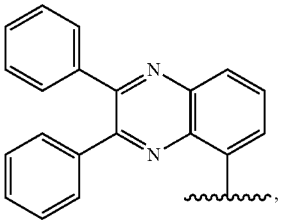
E-12
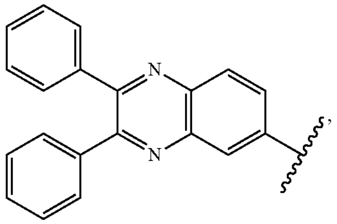
E-13
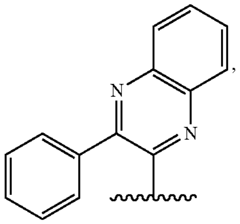
E-14
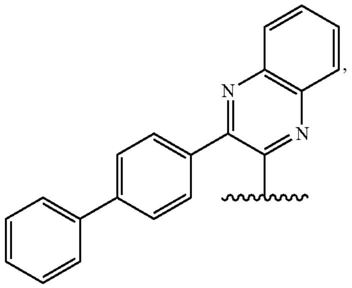
E-15
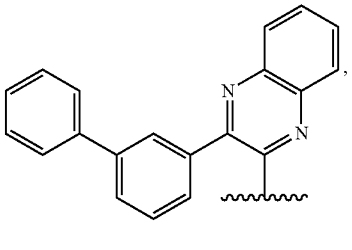
-continued
E-16
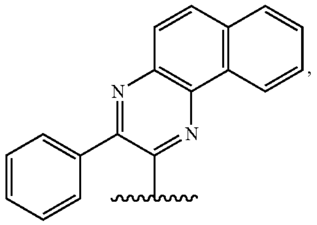
E-17
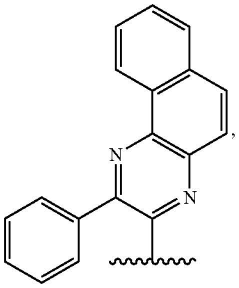
E-18
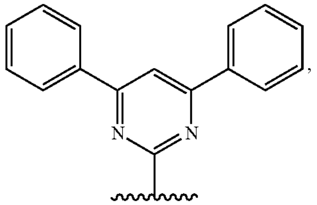
E-19
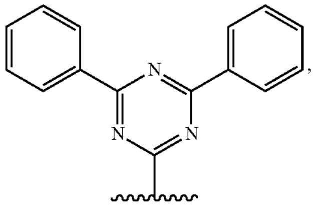
E-20
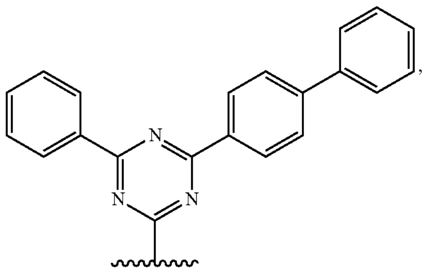
E-21
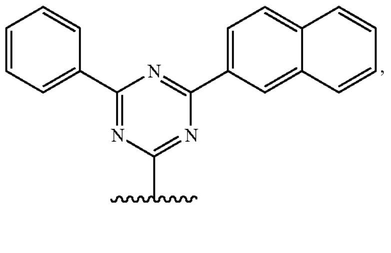

-continued
E-22
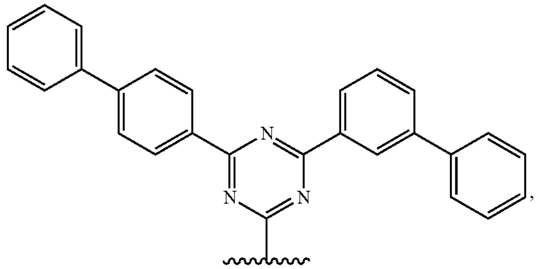,
E-23
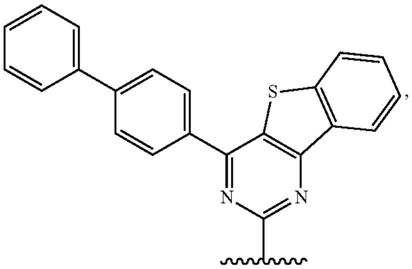,
E-24
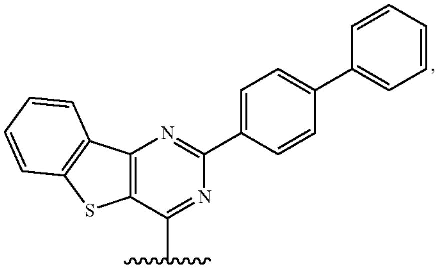,
E-25
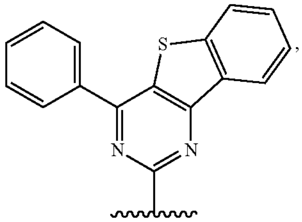,
E-26
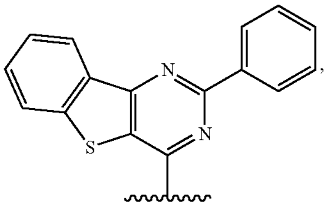,
E-27
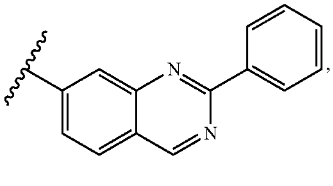,
-continued
E-28
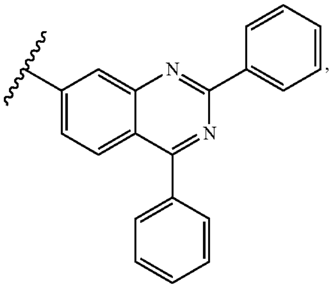,
E-29
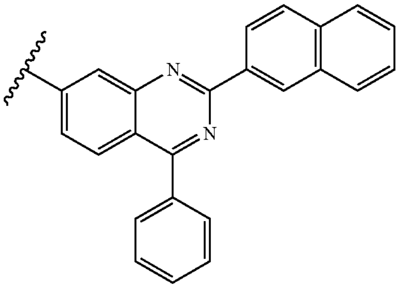,
E-30
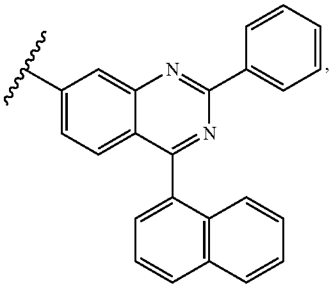,
E-31
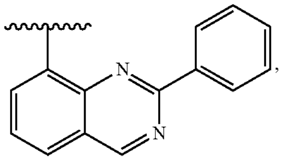,
E-32
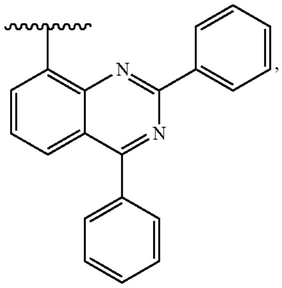,
E-33
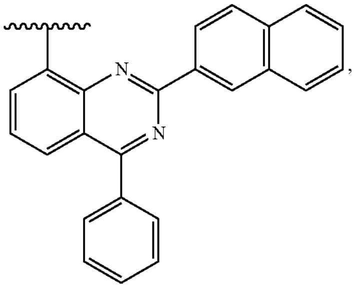, -continued

E-34

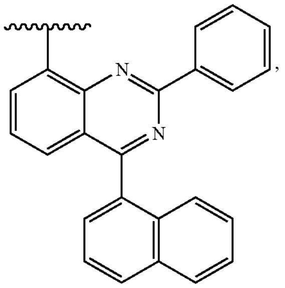

E-35

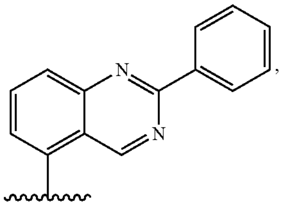

E-36

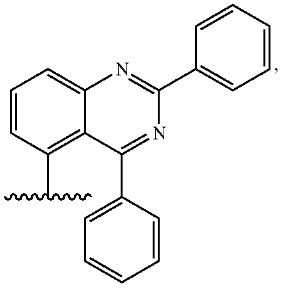

E-37

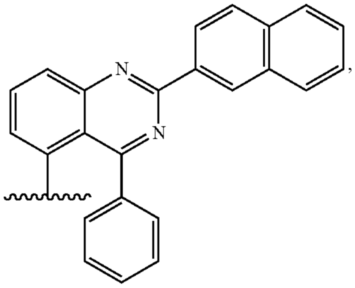

E-38

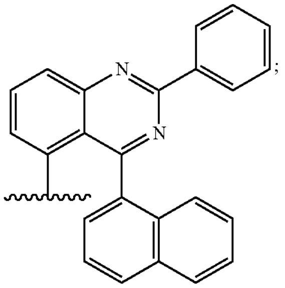

wherein "∿" represents a position where the structure of E is joined to $L_1$.

According to an embodiment of the present disclosure, wherein, the $L_1$ is selected from the group consisting of: a single bond, phenylene, naphthylene, biphenylene, terphenylene, triphenylenylene, pyridylene, dibenzothienylene, dibenzofuranylene and thienylene.

According to an embodiment of the present disclosure, wherein, the $L_1$ is selected from the group consisting of the following structures:

L-0 a single bond,

L-1

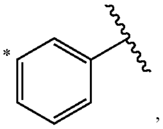

L-2

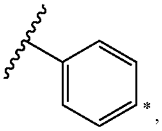

L-3

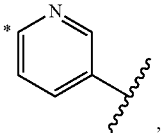

L-4

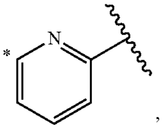

L-5

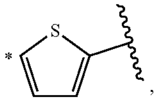

L-6

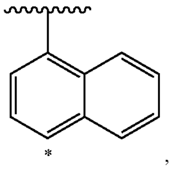

L-7

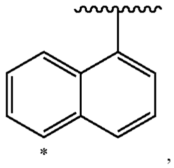

L-8

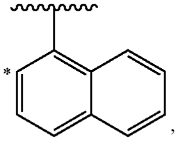

L-9

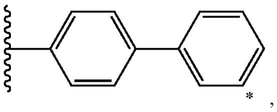

L-10

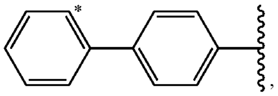

-continued

L-11

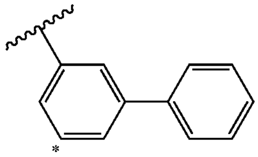
,

L-12

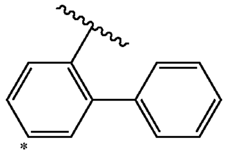
,

L-13

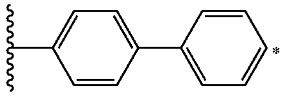
,

L-14

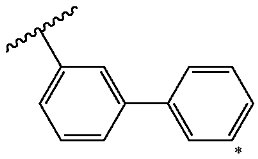
,

L-15

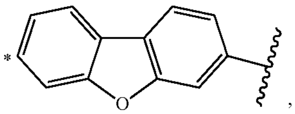
,

L-16

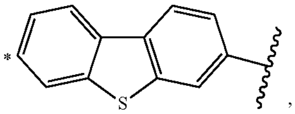
,

L-17

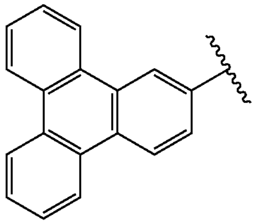
,

L-18

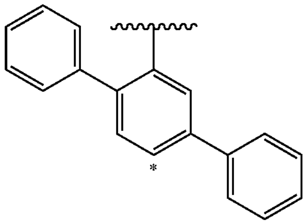
,

L-19

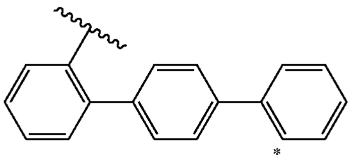
,

-continued

L-20

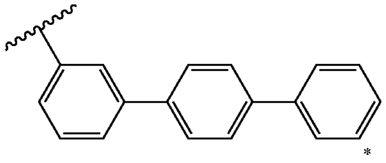
,

L-21

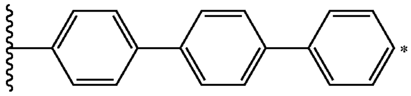
,

L-22

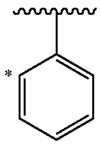
;

wherein “*” represents a position where the structure of $L_1$ is joined to Formula H, and “~” represents a position where the structure of $L_1$ is joined to E.

According to an embodiment of the present disclosure, wherein, hydrogen in the structures of the L-1 to L-22 can be partially or fully substituted with deuterium.

According to an embodiment of the present disclosure, wherein, the first compound has the structure of H-$L_1$-E, wherein the H is selected from any one of the group consisting of H-1 to H-76, the $L_1$ is selected from any one of the group consisting of L-0 to L-22, and the E is selected from any one of the group consisting of E-1 to E-38. Optionally, hydrogen in the structure of the first compound can be partially or fully substituted with deuterium.

According to an embodiment of the present disclosure, wherein, the first compound is selected from the group consisting of Compound 1-1 to Compound 1-249, wherein the specific structures of Compound 1-1 to Compound 1-249 are referred to claim 12.

According to an embodiment of the present disclosure, wherein, hydrogen in Compound 1-1 to Compound 1-249 can be partially or fully substituted with deuterium.

According to an embodiment of the present disclosure, wherein, in Formula 1-1 to Formula 1-14, $X_1$ to $X_6$ are, at each occurrence identically or differently, selected from $CR_x$, and $Y_1$ to $Y_6$ are, at each occurrence identically or differently, selected from C or $CR_y$.

In this embodiment, the expression that “in Formula 1-1 to Formula 1-14, $Y_1$ to $Y_6$ are, at each occurrence identically or differently, selected from C or $CR_y$” is intended to mean that in Formula 1-1 to Formula 1-10 and Formula 1-12 to Formula 1-14, $Y_1$ to $Y_5$ are, at each occurrence identically or differently, selected from $CR_y$; in Formula 1-11, $Y_1$ to $Y_4$ are, at each occurrence identically or differently, selected from C or $CR_y$, and $Y_5$ and $Y_6$ are, at each occurrence identically or differently, selected from $CR_y$.

According to an embodiment of the present disclosure, wherein, in Formula 1-1 to Formula 1-14, at least one of $X_1$ to $X_6$ is selected from N.

According to an embodiment of the present disclosure, wherein, in Formula 1-1 to Formula 1-14, at least one of $X_1$ to $X_3$ is N.

According to an embodiment of the present disclosure, wherein, in Formula 1-1 to Formula 1-14, $X_1$ or $X_2$ is N.

According to an embodiment of the present disclosure, wherein, in Formula 1-1 to Formula 1-14, at least two adjacent substituents $R_y$ in $Y_1$ to $Y_6$ are joined to form a ring.

According to an embodiment of the present disclosure, wherein, the $L_a$ is, at each occurrence identically or differently, selected from a structure represented by any one of Formula 1-1, Formula 1-2, Formula 1-4 to Formula 1-10 and Formula 1-12.

According to an embodiment of the present disclosure, wherein, the $L_a$ is, at each occurrence identically or differently, selected from a structure represented by Formula 1-1, wherein adjacent substituents $R_x$ can be optionally joined to form a ring, and adjacent substituents $R_y$ can be optionally joined to form a ring.

In this embodiment, the expression that "adjacent substituents $R_x$ can be optionally joined to form a ring, and adjacent substituents $R_y$ can be optionally joined to form a ring" is intended to mean that in the structure represented by Formula 1-1, any adjacent substituents $R_x$ can be joined to form a ring, any adjacent substituents $R_y$ can be joined to form a ring and substituents $R_x$ and $R_y$ are not joined to form a ring. Obviously, it is possible that adjacent substituents $R_x$ are not joined to form a ring, and it is also possible that adjacent substituents $R_y$ are not joined to form a ring.

According to an embodiment of the present disclosure, wherein, the $L_a$ is, at each occurrence identically or differently, selected from a structure represented by any one of Formula 1-1, Formula 1-2 and Formula 1-6.

According to an embodiment of the present disclosure, wherein, the $L_a$ is, at each occurrence identically or differently, selected from any one of the group consisting of Formula 1-1-1 to Formula 1-1-4, Formula 1-2-1 to Formula 1-2-5, Formula 1-5-1 to Formula 1-5-4, Formula 1-6-1, Formula 1-6-2, Formula 1-7-1, Formula 1-7-2, Formula 1-8-1, Formula 1-9-1 to Formula 1-9-3, Formula 1-10-1 to Formula 1-10-3 and Formula 1-12-1 to Formula 1-12-3:

Formula 1-1-1

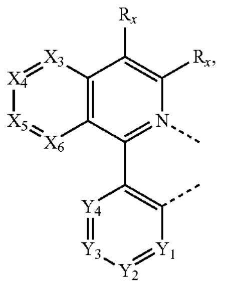

Formula 1-1-2

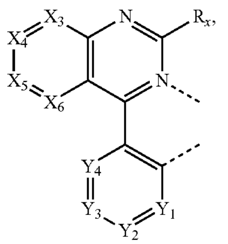

Formula 1-1-3

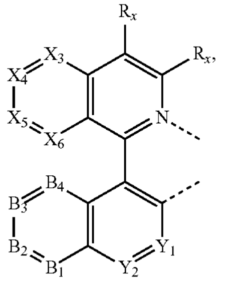

-continued

Formula 1-1-4

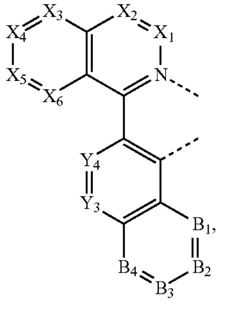

Formula 1-2-1

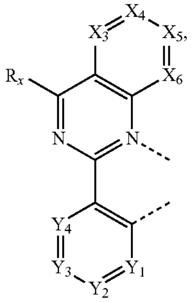

Formula 1-2-2

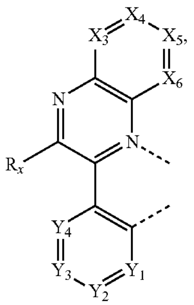

Formula 1-2-3

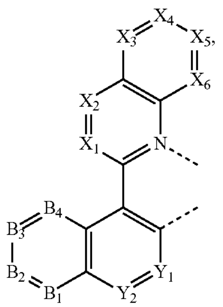

Formula 1-2-4

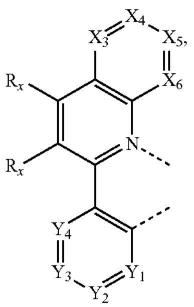

-continued
Formula 1-2-5
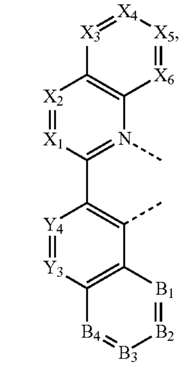
Formula 1-5-1
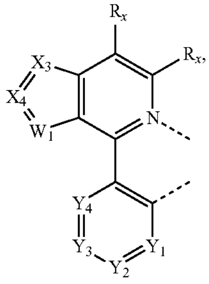
Formula 1-5-2
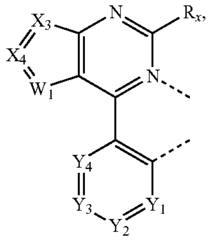
Formula 1-5-3
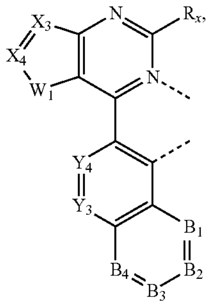
Formula 1-5-4
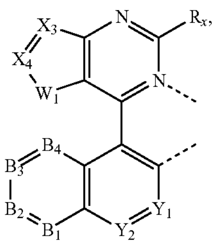
-continued
Formula 1-6-1
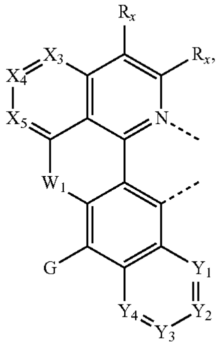
Formula 1-6-2
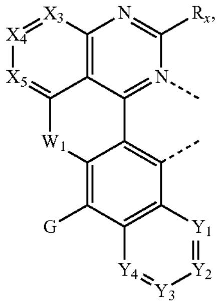
Formula 1-7-1
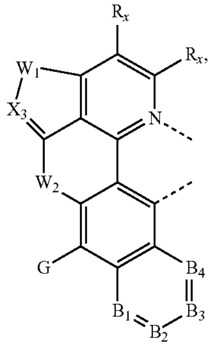
Formula 1-7-2
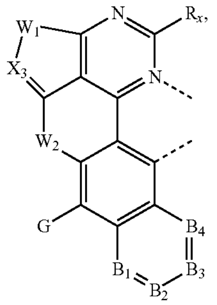
Formula 1-8-1
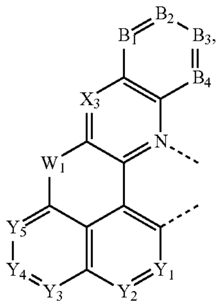

-continued

Formula 1-9-1

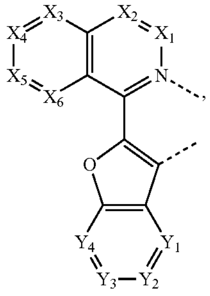

Formula 1-9-2

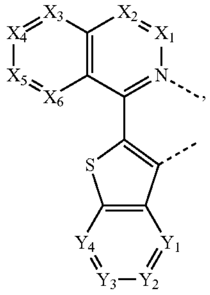

Formula 1-9-3

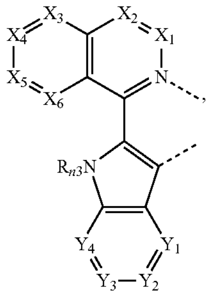

Formula 1-10-1

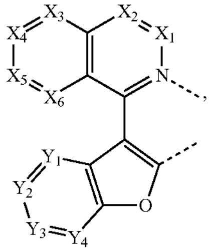

Formula 1-10-2

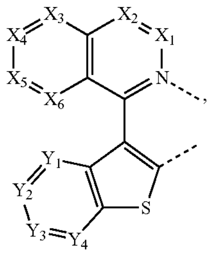

-continued

Formula 1-10-3

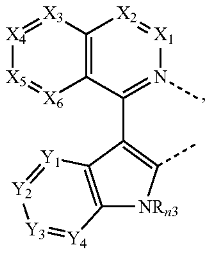

Formula 1-12-1

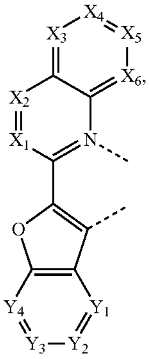

Formula 1-12-2

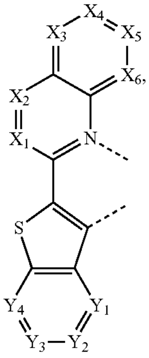

Formula 1-12-3

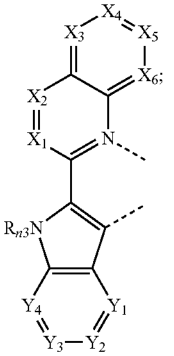

wherein $X_1$ to $X_6$ are, at each occurrence identically or differently, selected from $CR_x$ or N;

$Y_1$ to $Y_5$ are, at each occurrence identically or differently, selected from $CR_y$ or N;

$B_1$ to $B_4$ are, at each occurrence identically or differently, selected from $CR_b$ or N;

$W_1$ and $W_2$ are, at each occurrence identically or differently, selected from $CR_wR_w$, $SiR_wR_w$, $GeR_wR_w$, $NR_w$, $PR_w$, C═O, O, S or Se; wherein when two $R_w$ are present at the same time, the two $R_w$ may be identical or different;

G, $R_x$, $R_y$, $R_w$, $R_b$ and $R_{n3}$ are, at each occurrence identically or differently, selected from the group consisting of: hydrogen, deuterium, halogen, substituted or unsubstituted alkyl having 1 to carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof, in Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, at least one of $X_3$ to $X_n$ is selected from $CR_x$, wherein the $X_n$ corresponds to one of $X_3$ to $X_6$ that has the largest number in any one of Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, cyano, isocyano and combinations thereof;

in Formula 1-6-1 and Formula 1-7-1, G is, at each occurrence identically or differently, selected from the group consisting of: NRR, OR and SR; wherein R is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted aryl having 6 to 30 carbon atoms, substituted or unsubstituted heteroaryl having 3 to 30 carbon atoms and combinations thereof, and adjacent substituents G, $R_x$, $R_y$, $R_b$, $R_w$, $R_{n3}$, R can be optionally joined to form a ring.

In this embodiment, the expression that "adjacent substituents G, $R_x$, $R_y$, $R_b$, $R_w$, $R_{n3}$, R can be optionally joined to form a ring" is intended to mean that any one or more of groups of adjacent substituents, such as adjacent substituents $R_x$, adjacent substituents $R_y$, adjacent substituents $R_x$ and $R_y$, adjacent substituents $R_x$ and $R_b$, adjacent substituents $R_y$ and $R_b$, adjacent substituents $R_w$ and $R_b$, adjacent substituents $R_w$, adjacent substituents $R_x$ and $R_{n3}$, adjacent substituents $R_y$ and $R_{n3}$, adjacent substituents $R_x$ and $R_w$, adjacent substituents $R_y$ and $R_w$, adjacent substituents R, adjacent substituents $R_w$ and G, adjacent substituents $R_y$ and G, and adjacent substituents $R_b$, can be joined to form a ring. Obviously, it is possible that none of these substituents are joined to form a ring.

In the present disclosure, in Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, at least one of $X_3$ to $X_n$ is selected from $CR_x$, wherein the $X_n$ corresponds to one of $X_3$ to $X_6$ that has the largest number in any one of Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, for example, in Formula 1-1-1, the $X_n$ corresponds to $X_6$ of $X_3$ to $X_6$ that has the largest number in Formula 1-1-1, that is, in Formula 1-1-1, at least one of $X_3$ to $X_6$ is selected from $CR_x$. In another example, in Formula 1-5-1, the $X_n$ corresponds to $X_4$ of $X_3$ to $X_6$ that has the largest number in Formula 1-5-1, that is, in Formula 1-5-1, at least one of $X_3$ to $X_4$ is selected from $CR_x$. In another example, in Formula 1-6-1, the $X_n$ corresponds to $X_5$ of $X_3$ to $X_6$ that has the largest number in Formula 1-6-1, that is, in Formula 1-6-1, at least one of $X_3$ to $X_5$ is selected from $CR_x$. In another example, in Formula 1-7-1, the $X_n$ corresponds to $X_3$ of $X_3$ to $X_6$ that has the largest number in Formula 1-7-1, that is, in Formula 1-7-1, $X_3$ is selected from $CR_x$.

According to an embodiment of the present disclosure, wherein, in Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, at least one of $X_3$ to $X_n$ is selected from $CR_x$, wherein the $X_n$ corresponds to one of $X_3$ to $X_6$ that has the largest number in any one of Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, and the $R_x$ is, at each occurrence identically or differently, selected from the group consisting of: halogen, cyano, alkyl having 1 to 20 carbon atoms substituted with at least one cyano or halogen, cycloalkyl having 3 to 20 ring carbon atoms substituted with at least one cyano or halogen, arylalkyl having 7 to 30 carbon atoms substituted with at least one cyano or halogen, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms and combinations thereof.

According to an embodiment of the present disclosure, wherein, in Formula 1-6-1 and Formula 1-7-1, G is, at each occurrence identically or differently, selected from the group consisting of: NRR, OR and SR; wherein R is, at each occurrence identically or differently, selected from the group consisting of: deuterium, substituted or unsubstituted alkyl having 1 to carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, wherein, in Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, at least one of $X_3$ to $X_n$ is selected $CR_x$, wherein the $X_n$ corresponds to one of $X_3$ to $X_6$ that has the largest number in any one of Formula 1-1-1, Formula 1-2-4, Formula 1-2-5, Formula 1-5-1 to Formula 1-5-4, Formula 1-6-1, Formula 1-6-2, Formula 1-7-1 and Formula 1-7-2, and the $R_x$ is, at each occurrence identically or differently, selected from the group consisting of: fluorine, cyano, trifluoromethyl, cyanomethyl, 2,2,2-trifluoroethyl, 2-cyanoisopropyl, 3,3,3-trifluoro-2,2-dimethylpropyl, phenyl, 4-isopropylphenyl, 2,4,6-triisopropylphenyl, pyridyl, 2-isopropylpyridin-5-yl, 2-isopropylpyridin-6-yl, 2-isopropylpyrimidin-4-yl, 2-isopropylpyrimidin-5-yl, 5-isopropylpyrimidin-2-yl, 5-isopropylpyrazin-2-yl, 3,5-di-tert-butyltriazinyl, trimethylsilyl, triethylsilyl, isopropyldimethylsilyl, phenyldimethylsilyl, triphenylsilyl, 1-methylsiletan-1-yl, 1-methylsilolan-1-yl, trimethylgermanyl, phenyldimethylgermanyl and combinations thereof, and in Formula 1-6-1 and Formula 1-7-1, G is, at each occurrence identically or differently, selected from, dimethylamino, diethylamino, diisopropylamino, methylphenylamino, N-pyrrolidinyl, N-morpholinyl, methoxy, ethoxy, isopropoxy, phenoxy, methyl sulfide or phenyl sulfide.

According to an embodiment of the present disclosure, wherein, in Formula 1-1 to Formula 1-14, at least one or two of $X_1$ to $X_6$ are, at each occurrence identically or differently, selected from $CR_x$, and/or at least one or two of $Y_1$ to $Y_6$ are, at each occurrence identically or differently, selected from $CR_y$, wherein $R_x$ and $R_y$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 1-1, Formula 1-3, Formula 1-6, Formula 1-9, Formula 1-10 and Formula 1-14, $X_4$ is, at each occurrence identically or differently, selected from $CR_x$, in Formula 1-2 and Formula 1-11 to Formula 1-13, $X_2$ is, at each occurrence identically or differently, selected from $CR_x$, in Formula 1-4, Formula 1-5, Formula 1-7 and Formula 1-8, $X_3$ is, at each occurrence identically or differently, selected from $CR_x$; and/or in Formula 1-1 to Formula 1-14, $Y_1$ and/or $Y_3$ are/is, at each occurrence identically or differently, selected from $CR_y$; wherein $R_x$ and $R_y$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, in Formula 1-1, Formula 1-3, Formula 1-6, Formula 1-9, Formula 1-10 and Formula 1-14, $X_4$ is, at each occurrence identically or differently, selected from $CR_x$, in Formula 1-2 and Formula 1-11 to Formula 1-13, $X_2$ is, at each occurrence identically or differently, selected from $CR_x$, in Formula 1-4, Formula 1-5, Formula 1-7 and Formula 1-8, $X_3$ is, at each occurrence identically or differently, selected from $CR_x$; and/or in Formula 1-1 to Formula 1-14, $Y_1$ and/or $Y_3$ are/is, at each occurrence identically or differently, selected from $CR_y$; wherein $R_x$ and $R_y$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to carbon atoms, a substituted or unsubstituted heterocyclic group having 3 to 20 ring atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, cyano, isocyano, hydroxyl, a sulfanyl group and combinations thereof.

According to an embodiment of the present disclosure, wherein, in Formula 1-1, Formula 1-3, Formula 1-6, Formula 1-9, Formula 1-10 and Formula 1-14, $X_4$ is, at each occurrence identically or differently, selected from $CR_x$, in Formula 1-2 and Formula 1-11 to Formula 1-13, $X_2$ is, at each occurrence identically or differently, selected from $CR_x$, in Formula 1-4, Formula 1-5, Formula 1-7 and Formula 1-8, $X_3$ is, at each occurrence identically or differently, selected from $CR_x$; and/or in Formula 1-1 to Formula 1-14, $Y_1$ and/or $Y_3$ are/is, at each occurrence identically or differently, selected from $CR_y$; wherein $R_x$ and $R_y$ are, at each occurrence identically or differently, selected from the group consisting of: deuterium, fluorine, methyl, ethyl, isopropyl, t-butyl, cyclopentyl, cyclohexyl, cyano, trifluoromethyl, cyanomethyl, 2,2,2-trifluoroethyl, 2-cyanoisopropyl, 3,3,3- trifluoro-2,2-dimethylpropyl, phenyl, 4-isopropylphenyl, 2,4,6-triisopropylphenyl, pyridyl, 2-isopropylpyridin-5-yl, 2-isopropylpyridin-6-yl, 2-isopropylpyrimidin-4-yl, 2-isopropylpyrimidin-5-yl, 5-isopropylpyrimidin-2-yl, 5-isopropylpyrazin-2-yl, 3,5-di-tert-butyltriazinyl, trimethylsilyl, triethylsilyl, isopropyldimethylsilyl, phenyldimethylsilyl, triphenylsilyl, 1-methylsiletan-1-yl, 1-methylsilolan-1-yl and combinations thereof.

According to an embodiment of the present disclosure, wherein, $W_1$ is, at each occurrence identically or differently, selected from C═O, O or S.

According to an embodiment of the present disclosure, wherein, $L_a$ is, at each occurrence identically or differently, selected from the group consisting of $L_{a1}$ to $L_{a673}$, wherein the specific structures of $L_{a1}$ to $L_{a673}$ are referred to claim 20.

According to an embodiment of the present disclosure, wherein, hydrogen in the structures of $L_{a1}$ to $L_{a673}$ can be partially or fully substituted with deuterium.

According to an embodiment of the present disclosure, wherein, the metal M is selected from Ir, Rh, Re, Os, Pt, Au or Cu.

According to an embodiment of the present disclosure, wherein, M is selected from Ir or Pt.

According to an embodiment of the present disclosure, wherein, M is Ir.

According to an embodiment of the present disclosure, wherein, $L_b$ has the following structure:

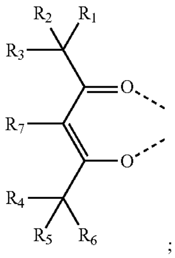
;

$R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof; and adjacent substituents $R_1$, $R_2$, $R_3$, $R_4$, $R_5$, $R_6$, $R_7$ can be optionally joined to form a ring.

In the present disclosure, the expression that "adjacent substituents $R_1$, $R_2$, $R_3$, $R_4$, $R_5$, $R_6$, $R_7$ can be optionally joined to form a ring" is intended to mean that any one or more of groups of adjacent substituents, such as adjacent substituents $R_1$ and $R_2$, adjacent substituents $R_2$ and $R_3$, adjacent substituents $R_1$ and $R_3$, adjacent substituents $R_4$ and $R_5$, adjacent substituents $R_5$ and $R_6$, adjacent substituents $R_4$ and $R_6$, adjacent substituents $R_1$ and $R_7$, adjacent substituents $R_2$ and $R_7$, adjacent substituents $R_3$ and $R_7$, adjacent substituents $R_4$ and $R_7$, adjacent substituents $R_5$ and $R_7$, and adjacent substituents $R_6$ and $R_7$, can be joined to form a ring. Obviously, it is possible that none of these substituents are joined to form a ring.

According to an embodiment of the present disclosure, wherein, $L_b$ is, at each occurrence identically or differently, selected from the following structure:

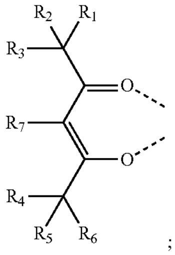
;

wherein at least one of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof, and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein, $L_b$ is, at each occurrence identically or differently, selected from the following structure:

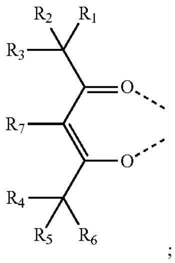
;

wherein at least two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof, and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein, $L_b$ is, at each occurrence identically or differently, selected from the following structure:

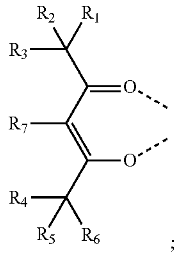
;

wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof, and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

According to an embodiment of the present disclosure, wherein, the second compound has the following structure:

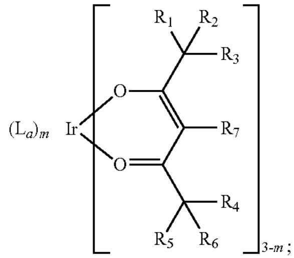
;

wherein m is 1 or 2;

$R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof; and adjacent substituents $R_1$, $R_2$, $R_3$, $R_4$, $R_5$, $R_6$, $R_7$ can be optionally joined to form a ring.

According to an embodiment of the present disclosure, wherein, the second compound has the following structure:

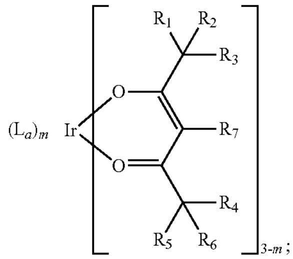
;

wherein m is 1 or 2;

at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof, and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof, and adjacent substituents $R_1$, $R_2$, $R_3$, $R_4$, $R_5$, $R_6$, $R_7$ can be optionally joined to form a ring.

According to an embodiment of the present disclosure, wherein, the second compound has the following structure:

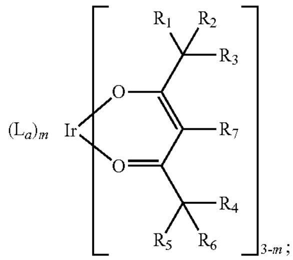
;

wherein m is 1 or 2;

at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof, and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof, and adjacent substituents $R_1$, $R_2$, $R_3$, $R_4$, $R_5$, $R_6$, $R_7$ can be optionally joined to form a ring.

According to an embodiment of the present disclosure, wherein, $L_b$ is, at each occurrence identically or differently, selected from the group consisting of $L_{b1}$ to $L_{b322}$, wherein the specific structures of $L_{b1}$ to $L_{b322}$ are referred to claim 23.

According to an embodiment of the present disclosure, wherein, $L_{c1}$ is, at each occurrence identically or differently, selected from the group consisting of $L_{c1}$ to $L_{c180}$, wherein the specific structures of $L_{c1}$ to $L_{c180}$ are referred to claim 23.

According to an embodiment of the present disclosure, wherein, the second compound is an Ir complex and has a structure represented by any one of $Ir(L_a)(L_b)(L_c)$, $Ir(L_a)_2(L_b)$, $Ir(L_a)_2(L_c)$ and $Ir(L_a)(L_c)_2$; when the second compound has a structure of $Ir(L_a)(L_b)(L_c)$, $L_a$ is selected from any one of the group consisting of $L_{a1}$ to $L_{a673}$, $L_b$ is selected from any one of the group consisting of $L_{b1}$ to $L_{b322}$, and $L_c$ is selected from any one of the group consisting of $L_{c1}$ to $L_{c180}$; when the second compound has a structure of $Ir(L_a)_2L_b$, $L_a$ is selected from any one or two of the group consisting of $L_{a1}$ to $L_{a673}$, and $L_b$ is selected from any one of the group consisting of $L_{b1}$ to $L_{b322}$; when the second compound has a structure of $Ir(L_a)_2(L_c)$, $L_a$ is selected from any one or two of the group consisting of $L_{a1}$ to $L_{a673}$, and $L_e$ is selected from any one of the group consisting of $L_{c1}$ to $L_{c180}$; when the second compound has a structure of $Ir(L_a)(L_c)_2$, $L_a$ is selected from any one of the group consisting of $L_{a1}$ to $L_{a673}$, and $L_e$ is selected from any one or two of the group consisting of $L_{c1}$ to $L_{c180}$.

According to an embodiment of the present disclosure, wherein, the second compound is selected from the group consisting of Compound 1 to Compound 330, wherein the specific structures of Compound 1 to Compound 330 are referred to claim 24.

According to an embodiment of the present disclosure, wherein, the organic layer is a light-emitting layer, the first compound is a host material, and the second compound is a light-emitting material.

According to an embodiment of the present disclosure, wherein, the device emits red light or white light.

According to an embodiment of the present disclosure, wherein, the device at least has one maximum emission wavelength greater than 635 nm.

According to an embodiment of the present disclosure, wherein, the device at least has one maximum emission wavelength greater than 640 nm.

According to another embodiment of the present disclosure, further disclosed is a display assembly including the electroluminescent device in any one of the preceding embodiments.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, a combination of the first compound and the second compound disclosed herein may be used in combination with a wide variety of emissive dopants, hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

The first compound used in the present disclosure may be commercially available or may be obtained with reference to the preparation method in the related art or may be easy to prepare and obtain with reference to Patent Publication Nos./Application Nos. US20180337340A1, CN111868210A, CN202010285016.7, CN202010268985.1, CN202010285026.0, CN202010720191.4 and CN202010825242.X. The second compound used in the present disclosure may be commercially available or may be obtained with reference to the preparation method in the related art, for example, may be easy to prepare and obtain with reference to Patent Publication Nos./Application Nos. CN109956977A, CN111909212A, CN202011219604.7 and CN202110348602.6, or may be prepared and obtained with reference to the examples described below.

MATERIAL SYNTHESIS EXAMPLE

The method for preparing a second compound in the present disclosure is not limited herein. Typically, the following compounds are used as examples without limitations, and synthesis routes and preparation methods thereof are described below.

Synthesis Example 1: Synthesis of Compound 313

Step 1: Synthesis of Intermediate 3

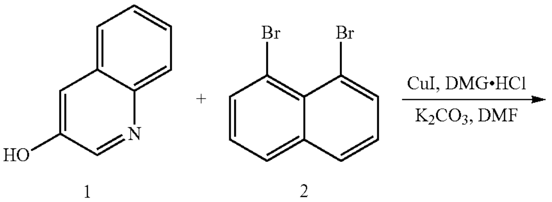

1 2

-continued

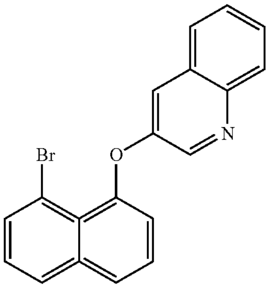

3

Intermediate 1 (9.10 g, 62.69 mmol), Intermediate 2 (23.30 g, 81.50 mmol), cuprous iodide (0.60 g, 3.13 mmol), N,N-dimethylglycine hydrochloride (DMG HCl) (0.44 g, 3.13 mmol) and potassium carbonate (21.66 g, 156.73 mmol) were dissolved in N,N-dimethylformamide (100 mL). Then, under nitrogen protection, the reaction was heated to 100° C., stirred for 20 h, and cooled to room temperature. Ethyl acetate was added to the reaction system, liquids were separated, and the aqueous phase was extracted with ethyl acetate. The organic phases were combined and dried, and the solvents were removed in vacuo to obtain the crude product. The crude product was isolated through silica gel column chromatography (using the eluents of ethyl acetate:petroleum ether=1:10, v/v) to obtain Intermediate 3 (16.00 g, with a yield of 73%).

Step 2: Synthesis of Intermediate 4

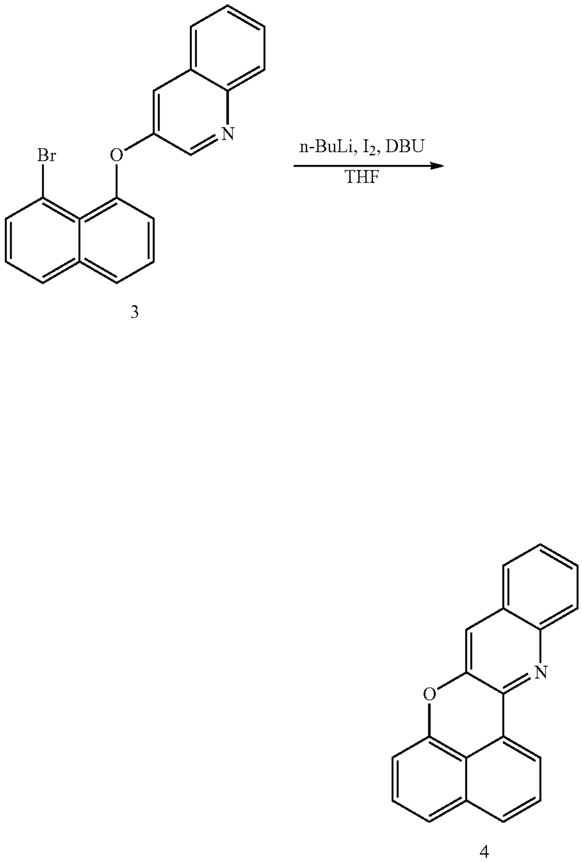

Intermediate 3 (4.00 g, 11.42 mmol) was dissolved in 40 mL of ultra-dry tetrahydrofuran, and in a nitrogen atmosphere, a solution of n-butyl lithium (12.56 mmol, 2 M/L, 6.3 mL) was slowly added dropwise at −76° C. and stirred for 2.5 h. After the raw materials were reacted completely, the reaction was quenched with water and warmed to 0° C. The reaction system was added with elemental iodine (3.50 μg, 13.7 mmol) and 1,8-diazabicyclo[5.4.0]undec-7-ene (DBU) (4.35 g, 28.55 mmol), stirred at room temperature for 3 h, and filtered to obtain the crude product. The crude product was isolated through column chromatography (PE: EA=50:1) to obtain Intermediate 4 as a yellow liquid (2.77 g, with a yield of 90%).

Step 3: Synthesis of an Iridium Dimer

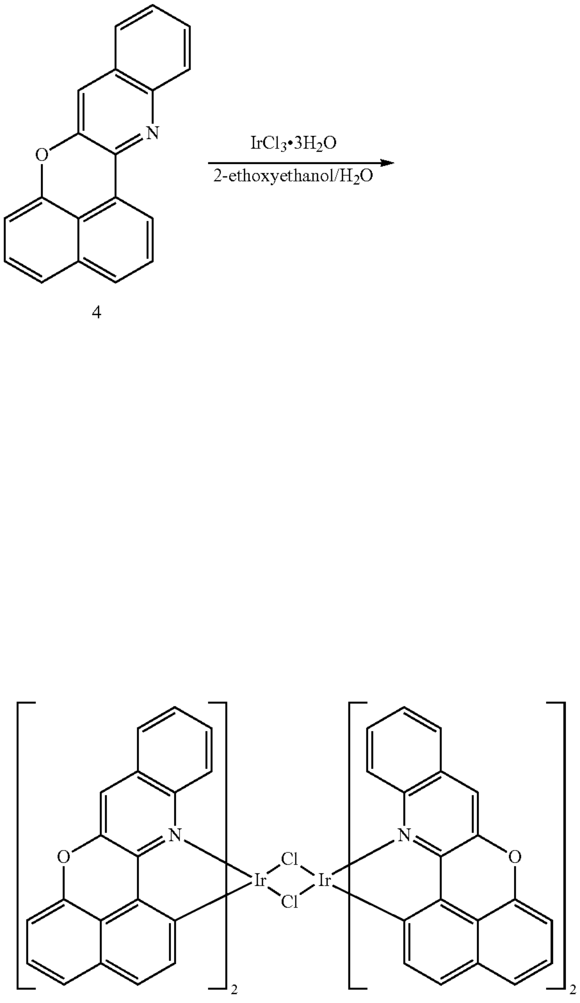

A mixture of Intermediate 4 (3.97 g, 14.75 mmol), iridium trichloride trihydrate (1.30 g, 3.69 mmol), 2-ethoxyethanol (48 mL) and water (16 mL) was refluxed in a nitrogen atmosphere for 40 h. The solution was cooled to room temperature and filtered to obtain an iridium dimer (3.10 g) which was directly used in the next step without further purification.

Step 4: Synthesis of Compound 313

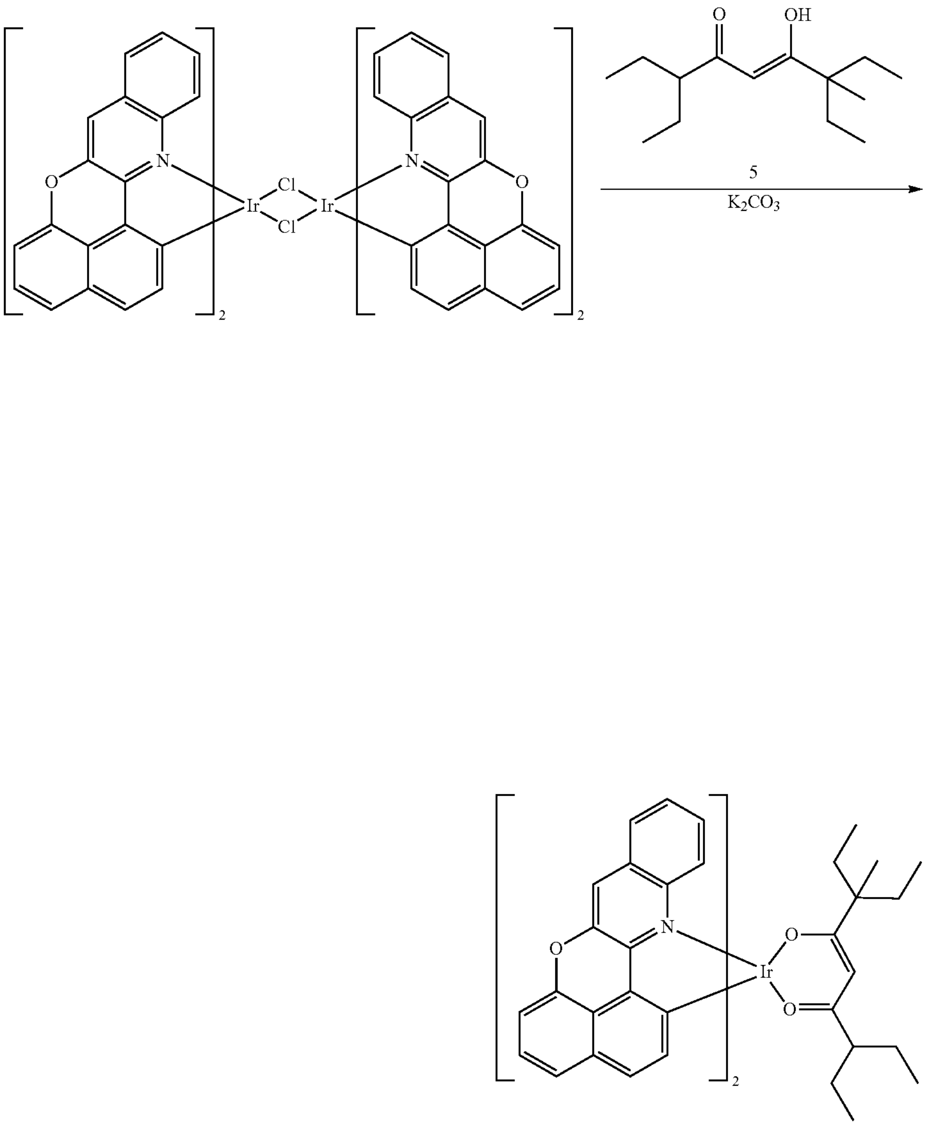

The iridium dimer obtained in step 3, Intermediate 5 (2.09 g, 9.23 mmol) and potassium carbonate (2.55 g, 18.45 mmol) were added to a reaction tube containing 20 mL of dichloromethane and heated to 60° C. and reacted for 24 h under nitrogen protection. Then, the system was poured into a funnel filled with Celite to be filtered, and the filter cake was washed with ethanol. The filter cake was added with dichloromethane and the filtrate was collected. Ethanol was added and the resulting solution was concentrated but not to dryness and filtered to obtain Compound 313 (1.35 g) with a two-step yield of 38.3%. The structure of the product was confirmed through LC-MS as the target product with a molecular weight of 954.3.

Synthesis Example 2: Synthesis of Compound 309

Step 1: Synthesis of an Iridium Dimer

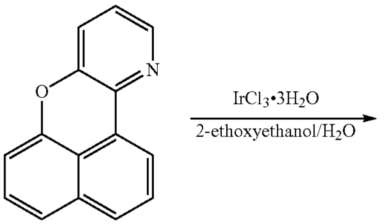

6

-continued

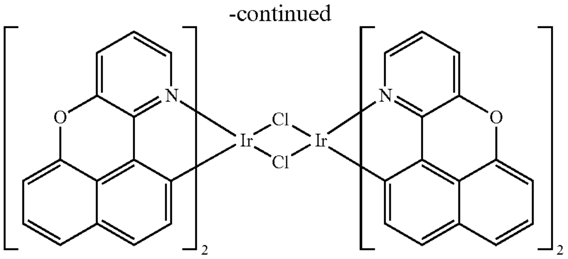

A mixture of Intermediate 6 (1.5 g, 6.80 mmol), iridium trichloride trihydrate (0.60 g, 1.70 mmol), 2-ethoxyethanol (18 mL) and water (6 mL) was refluxed in a nitrogen atmosphere for 40 h. The solution was cooled to room temperature and filtered to obtain an iridium dimer (0.80 g) which was directly used in the next step without further purification.

Step 2: Synthesis of Compound 309

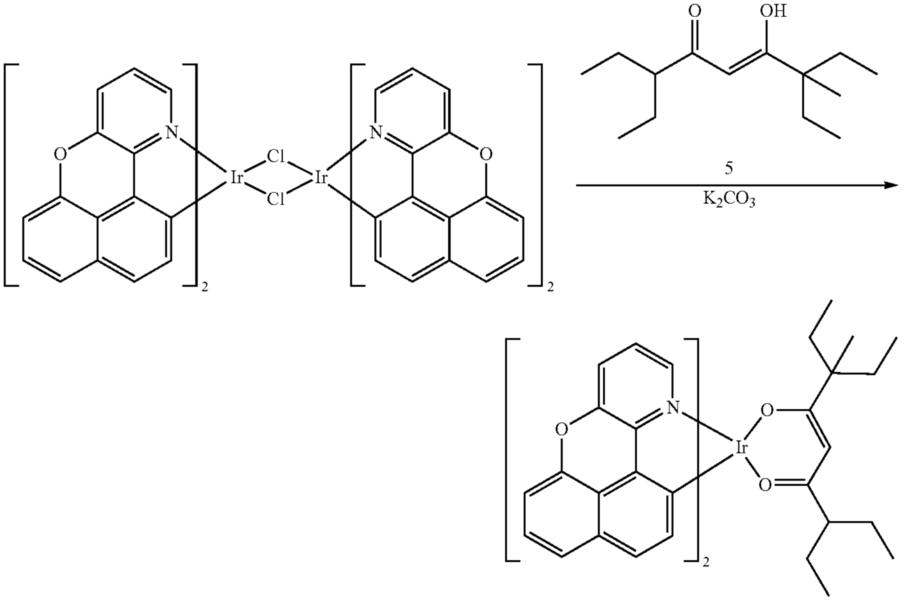

The iridium dimer obtained in step 1, Intermediate 5 (0.36 g, 1.50 mmol) and potassium carbonate (0.83 g, 6.00 mmol) were added to a reaction tube containing 20 mL of dichloromethane and heated to 60° C. and reacted for 40 h under nitrogen protection. Then, the system was poured into a funnel filled with Celite to be filtered and washed with ethanol. The filter cake was added with dichloromethane and the filtrate was collected. Ethanol was added and the resulting solution was concentrated but not to dryness and filtered to obtain Compound 309 (0.36 g) with a two-step yield of 25.0%. The structure of the product was confirmed through LC-MS as the target product with a molecular weight of 854.3.

Synthesis Example 3: Synthesis of Compound 156

Step 1: Synthesis of an Iridium Dimer

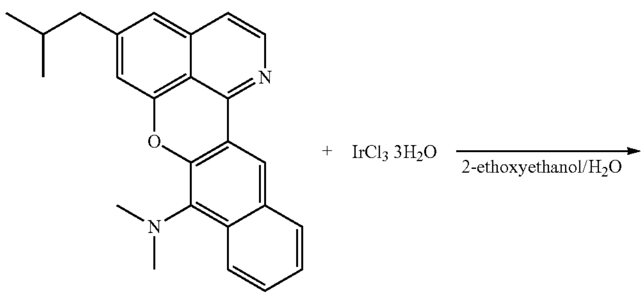

7

-continued

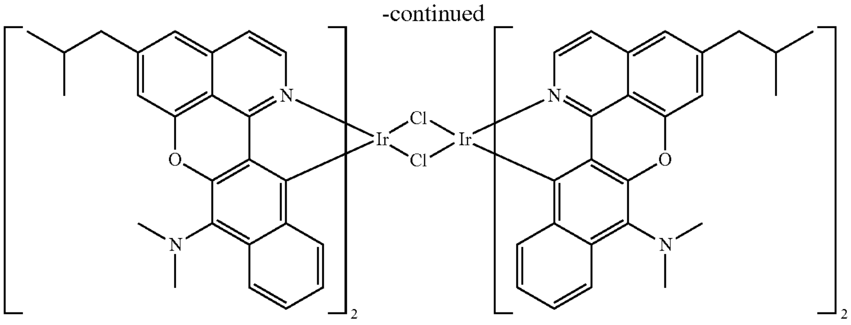

A mixture of Intermediate 7 (1.5 g, 4.2 mmol), iridium trichloride trihydrate (427 mg, 1.2 mmol), 2-ethoxyethanol (12 mL) and water (4 mL) was refluxed in a nitrogen atmosphere for 24 h. The solution was cooled to room temperature and filtered to obtain an iridium dimer as a red solid which was directly used in the next step without further purification.

Step 2: Synthesis of Compound 156

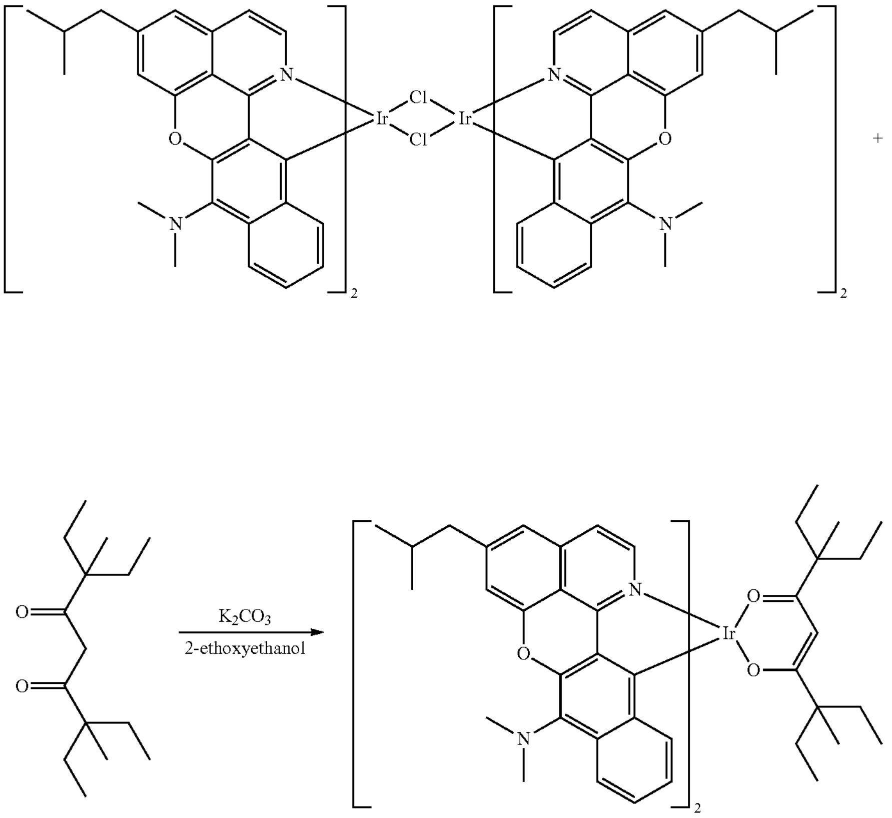

The iridium dimer obtained in the previous step, 3,7-diethyl-3,7-dimethylnonane-4,6-dione (580 mg, 2.4 mmol) and potassium carbonate (0.83 g, 6.04 mmol) were dissolved in ethoxyethanol (16 mL) and reacted at 40° C. for 24 h under nitrogen protection. Then, the system was poured into a funnel filled with Celite to be filtered and washed with ethanol. The obtained solids were added with dichloromethane and the filtrate was collected. Ethanol was added and the resulting solution was concentrated but not to dryness. The solution was filtered to obtain Compound 156 (940 mg) with a yield of 66%. The structure of the compound was confirmed through LC-MS as the target product with a molecular weight of 1166.5.

Synthesis Example 4: Synthesis of Compound 319

Step 1: Synthesis of Intermediate 9

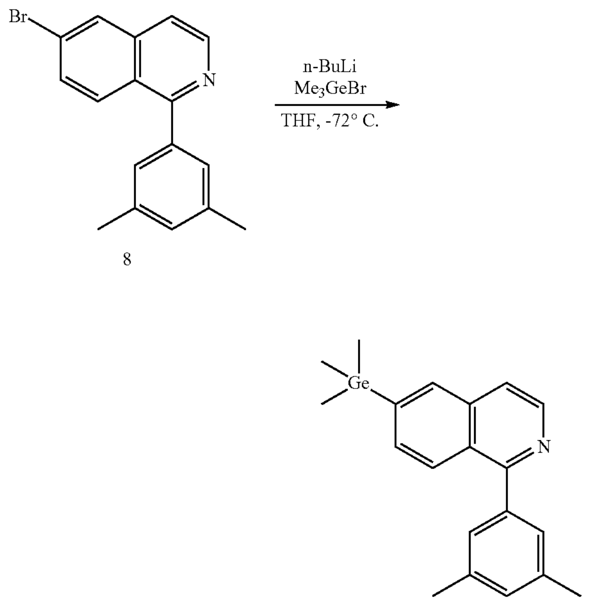

8

9

Intermediate 8 (2 g, 6.97 mmol) was dissolved in tetrahydrofuran (THF) (20 mL), and the reaction system was purged with nitrogen three times. The reaction flask was placed in a dry ice-ethanol system and cooled to −72° C. n-BuLi (3.34 mL, 8.36 mmol, 2.5 M) was slowly added dropwise to the system, and after the dropwise addition, the system was kept at a low temperature and reacted for 1.5 h. Then, trimethylgermanium bromide (1.65 g, 8.71 mmol) was added dropwise to the system, and after the dropwise addition, the system was slowly returned to room temperature and reacted overnight. After thin-layer chromatography (TLC) detected that the system was reacted completely, the reaction was quenched with water, a THF layer was separated, and the aqueous phase was extracted with EA three times. The organic phases were combined, dried, subjected to rotary evaporation and purified through column chromatography to obtain a colorless oily liquid Intermediate 9 (1.7 g, with a yield of 69.7%).

Step 2: Synthesis of an Iridium Dimer

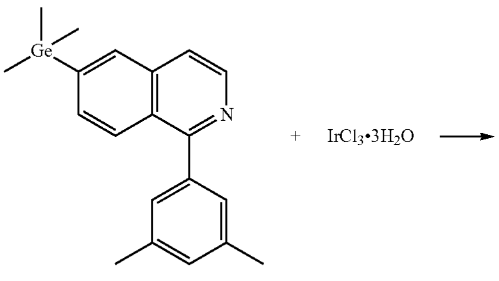

9

-continued

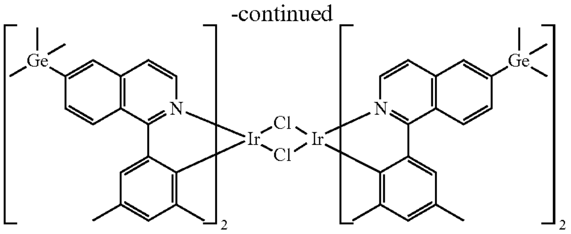

A mixture of Intermediate 9 (1.4 g, 3.99 mmol), iridium trichloride trihydrate (0.40 g, 1.14 mmol), 2-ethoxyethanol (15 mL) and water (5 mL) was refluxed in a nitrogen atmosphere for 24 h. The solution was cooled to room temperature and filtered to obtain a solid. The obtained solid was washed with methanol many times and dried to obtain an iridium dimer (0.68 g, 63%) which was directly used in the next step without further purification.

Step 3: Synthesis of Compound 319

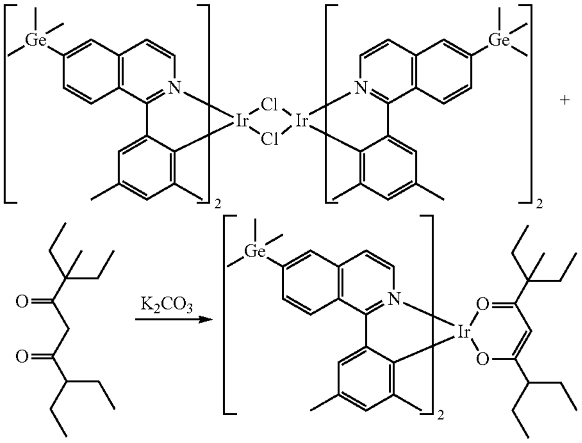

A mixture of the iridium dimer (0.68 g, 0.36 mmol) obtained in step 2, 3,7-diethyl-3-methyl nonane-4,6-dione (0.33 g, 1.46 mmol), $K_2CO_3$ (0.50 g, 3.6 mmol) and 2-ethoxyethanol (20 mL) was stirred at 50° C. for 24 h. The reaction system was reacted completely and naturally cooled to room temperature, and the deposit was filtered through Celite and washed with ethanol. The obtained solids were added with dichloromethane and the filtrate was collected. Ethanol was added and the resulting solution was concentrated but not to dryness. The solution was filtered to obtain a red crude product. The crude product was dissolved in DCM (20 mL), and MeOH (32 mL) was slowly added dropwise to the system. After the dropwise addition, the system was stirred at room temperature for 1 h, and a solid was precipitated and filtered to obtain Compound 319 (0.58 g, 0.52 mmol). The structure of the compound was confirmed through LC-MS as the target product with a molecular weight of 1118.3.

Those skilled in the art will appreciate that the above preparation methods are merely exemplary. Those skilled in the art can obtain other structures of the second compound of the present disclosure through the modifications of the preparation methods.

The method for preparing an electroluminescent device is not limited. The preparation methods in the following example are merely examples and not to be construed as limitations. Those skilled in the art can make reasonable improvements on the preparation methods in the following examples based on the related art. Exemplarily, the proportions of various materials in a light-emitting layer are not particularly limited. Those skilled in the art can reasonably select the proportions within a certain range based on the related art. For example, taking the total weight of the materials in the light-emitting layer as reference, a host material may account for 80% to 99% and a light-emitting material may account for 1% to 20%; or the host material may account for 90% to 98% and the light-emitting material may account for 2% to 10%. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

Device Example 1.1

First, a glass substrate having an indium tin oxide (ITO) anode with a thickness of 120 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to Angstroms per second and a vacuum degree of about $10^{-8}$ torr. Compound HI was used as a hole injection layer (HIL) with a thickness of 100 Å. Compound HT was used as a hole transporting layer (HTL) with a thickness of 400 Å. Compound EB was used as an electron blocking layer (EBL) with a thickness of 50 Å. Then, Compound 115 as a dopant material and Compound 1-34 as a host material were co-deposited (at a weight ratio of 2:98) as an emissive layer (EML) with a thickness of 400 Å. Compound HB was used as a hole blocking layer (HBL) with a thickness of 50 Å. On the HBL, Compound ET and 8-hydroxyquinolinolato-lithium (Liq) were co-deposited (at a weight ratio of 40:60) as an electron transporting layer (ETL) with a thickness of 350 Å. Finally, Liq was deposited as an electron injection layer with a thickness of 1 nm, and Al was deposited as a cathode with a thickness of 120 nm. The device was transferred back to the glovebox and encapsulated with a glass lid and a moisture getter to complete the device.

Device Example 1.2

The implementation mode in Device Example 1.2 was the same as that in Device Example 1.1, except that in the EML, Compound 1-34 was replaced with Compound 1-35 as the host material.

Device Example 1.3

The implementation mode in Device Example 1.3 was the same as that in Device Example 1.1, except that in the EML, Compound 1-34 was replaced with Compound 1-39 as the host material.

Device Example 1.4

The implementation mode in Device Example 1.4 was the same as that in Device Example 1.1, except that in the EML, Compound 115 was replaced with Compound 118 as the dopant material.

Device Example 1.5

The implementation mode in Device Example 1.5 was the same as that in Device Example 1.1, except that in the EML, Compound 115 was replaced with Compound 119 as the dopant material.

Device Comparative Example 1

The implementation mode in Device Comparative Example 1 was the same as that in Device Example 1.1, except that in the EML, Compound 1-34 was replaced with Compound H1 as the host material.

Device Example 2.1

The implementation mode in Device Example 2.1 was the same as that in Device Example 1.1, except that in the EML, Compound 115 was replaced with Compound 91 as the dopant material.

Device Example 2.2

The implementation mode in Device Example 2.2 was the same as that in Device Example 2.1, except that in the EML, Compound 1-34 was replaced with Compound 1-17 as the host material.

Device Example 2.3

The implementation mode in Device Example 2.3 was the same as that in Device Example 2.1, except that in the EML, Compound 1-34 was replaced with Compound 1-39 as the host material.

Device Example 2.4

The implementation mode in Device Example 2.4 was the same as that in Device Example 2.1, except that in the EML, Compound 1-34 was replaced with Compound 1-35 as the host material.

Device Example 2.5

The implementation mode in Device Example 2.5 was the same as that in Device Example 1.1, except that in the EML, Compound 115 was replaced with Compound 100 as the dopant material.

Device Comparative Example 2

The implementation mode in Device Comparative Example 2 was the same as that in Device Example 2.1, except that in the EML, Compound 1-34 was replaced with Compound H1 as the host material.

Device Example 3

The implementation mode in Device Example 3 was the same as that in Device Example 2.2, except that in the EML, Compound 91 was replaced with Compound 132 as the dopant material.

Device Comparative Example 3

The implementation mode in Device Comparative Example 3 was the same as that in Device Example 3, except that in the EML, Compound 1-17 was replaced with Compound H1 as the host material.

Device Example 4

The implementation mode in Device Example 4 was the same as that in Device Example 1.1, except that in the EML, Compound 115 was replaced with Compound 313 as the dopant material.

Device Comparative Example 4

The implementation mode in Device Comparative Example 4 was the same as that in Device Example 4, except that in the EML, Compound 1-34 was replaced with Compound H1 as the host material.

Device Example 5

The implementation mode in Device Example 5 was the same as that in Device Example 1.1, except that in the EML, Compound 115 was replaced with Compound 309 as the dopant material.

Device Comparative Example 5

The implementation mode in Device Comparative Example 5 was the same as that in Device Example 5, except that in the EML, Compound 1-34 was replaced with Compound H1 as the host material.

Device Example 6

The implementation mode in Device Example 6 was the same as that in Device Example 1.1, except that in the EML, Compound 115 was replaced with Compound 175 as the dopant material.

Device Comparative Example 6

The implementation mode in Device Comparative Example 6 was the same as that in Device Example 6, except that in the EML, Compound 1-34 was replaced with Compound H1 as the host material.

Device Example 7

The implementation mode in Device Example 7 was the same as that in Device Example 2.2, except that in the EML, Compound 91 was replaced with Compound 156 as the dopant material.

Device Example 8

The implementation mode in Device Example 8 was the same as that in Device Example 2.1, except that in the EML, Compound 91 was replaced with Compound 319 as the dopant material.

Device Example 9

The implementation mode in Device Example 9 was the same as that in Device Example 2.1, except that in the EML, Compound 91 was replaced with Compound 329 as the dopant material.

Device Example 10

The implementation mode in Device Example 10 was the same as that in Device Example 2.1, except that in the EML, Compound 91 was replaced with Compound 326 as the dopant material.

Device Comparative Example 7

The implementation mode in Device Comparative Example 7 was the same as that in Device Example 7, except that in the EML, Compound 1-17 was replaced with Compound H1 as the host material.

Device Comparative Example 8

The implementation mode in Device Comparative Example 8 was the same as that in Device Example 2.2, except that in the EML, Compound 91 was replaced with Compound RD-A as the dopant material.

Device Comparative Example 9

The implementation mode in Device Comparative Example 9 was the same as that in Device Example 2.1, except that in the EML, Compound 91 was replaced with Compound RD-A as the dopant material.

Device Comparative Example 10

The implementation mode in Device Comparative Example 10 was the same as that in Device Example 2.4, except that in the EML, Compound 91 was replaced with Compound RD-A as the dopant material.

The structures and thicknesses of layers of the devices are shown in the following table. A layer using more than one material is obtained by doping different compounds at their weight ratio as recorded.

TABLE 1

Device structures in device examples and device comparative examples

| Device No. | HIL | HTL | EBL | EML | HBL | ETL |
|---|---|---|---|---|---|---|
| Example 1.1 | Compound HI (100 Å) | Compound HT (400 Å) | Compound EB (50 Å) | Compound 1-34:Compound 115 (98:2) (400 Å) | Compound HB (50 Å) | Compound ET:Liq (40:60) (350 Å) |

TABLE 1-continued

| Device structures in device examples and device comparative examples | | | | | | |
|---|---|---|---|---|---|---|
| Device No. | HIL | HTL | EBL | EML | HBL | ETL |
| Example 1.2 | Compound HI (100 Å) | Compound HT (400 Å) | Compound EB (50 Å) | Compound 1-35:Compound 115 (98:2) (400 Å) | Compound HB (50 Å) | Compound ET:Liq (40:60) (350 Å) |
| Example 1.3 | Compound HI (100 Å) | Compound HT (400 Å) | Compound EB (50 Å) | Compound 1-39:Compound 115 (98:2) (400 Å) | Compound HB (50 Å) | Compound ET:Liq (40:60) (350 Å) |
| Example 1.4 | Compound HI (100 Å) | Compound HT (400 Å) | Compound EB (50 Å) | Compound 1-34:Compound 118 (98:2) (400 Å) | Compound HB (50 Å) | Compound ET:Liq (40:60) (350 Å) |
| Example 1.5 | Compound HI (100 Å) | Compound HT (400 Å) | Compound EB (50 Å) | Compound 1-34:Compound 119 (98:2) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound H1:Compound 115 (98:2) (400 Å) | Compound HB (50 Å) | Compound ET:Liq (40:60) (350 Å) |
| Example 2.1 | Compound HI (100 Å) | Compound HT (400 Å) | Compound EB (50 Å) | Compound 1-34:Compound 91 (98:2) (400 Å) | Compound HB (50 Å) | Compound ET:Liq (40:60) (350 Å) |
| Example 2.2 | Compound HI (100 Å) | Compound HT (400 Å) | Compound EB (50 Å) | Compound 1-17:Compound 91 (98:2) (400 Å) | Compound HB (50 Å) | Compound ET:Liq (40:60) (350 Å) |
| Example 2.3 | Compound HI (100 Å) | Compound HT (400 Å) | Compound EB (50 Å) | Compound 1-39:Compound 91 (98:2) (400 Å) | Compound HB (50 Å) | Compound ET:Liq (40:60) (350 Å) |
| Example 2.4 | Compound HI (100 Å) | Compound HT (400 Å) | Compound EB (50 Å) | Compound 1-35:Compound 91 (98:2) (400 Å) | Compound HB (50 Å) | Compound ET:Liq (40:60) (350 Å) |
| Example 2.5 | Compound HI (100 Å) | Compound HT (400 Å) | Compound EB (50 Å) | Compound 1-34:Compound 100 (98:2) (400 Å) | Compound HB (50 Å) | Compound ET:Liq (40:60) (350 Å) |
| Comparative Example 2 | Compound HI (100 Å) | Compound HT (400 Å) | Compound EB (50 Å) | Compound H1:Compound 91 (98:2) (400 Å) | Compound HB (50 Å) | Compound ET:Liq (40:60) (350 Å) |
| Example 3 | Compound HI (100 Å) | Compound HT (400 Å) | Compound EB (50 Å) | Compound l-17:Compound 132 (98:2) (400 Å) | Compound HB (50 Å) | Compound ET:Liq (40:60) (350 Å) |
| Comparative Example 3 | Compound HI (100 Å) | Compound HT (400 Å) | Compound EB (50 Å) | Compound H1:Compound 132 (98:2) (400 Å) | Compound HB (50 Å) | Compound ET:Liq (40:60) (350 Å) |
| Example 4 | Compound HI (100 Å) | Compound HT (400 Å) | Compound EB (50 Å) | Compound 1-34:Compound 313 (98:2) (400 Å) | Compound HB (50 Å) | Compound ET:Liq (40:60) (350 Å) |
| Comparative Example 4 | Compound HI (100 Å) | Compound HT (400 Å) | Compound EB (50 Å) | Compound H1:Compound 313 (98:2) (400 Å) | Compound HB (50 Å) | Compound ET:Liq (40:60) (350 Å) |
| Example 5 | Compound HI (100 Å) | Compound HT (400 Å) | Compound EB (50 Å) | Compound l-34:Compound 309 (98:2) (400 Å) | Compound HB (50 Å) | Compound ET:Liq (40:60) (350 Å) |

TABLE 1-continued

| Device structures in device examples and device comparative examples | | | | | | |
|---|---|---|---|---|---|---|
| Device No. | HIL | HTL | EBL | EML | HBL | ETL |
| Comparative Example 5 | Compound HI (100 Å) | Compound HT (400 Å) | Compound EB (50 Å) | Compound H1:Compound 309 (98:2) (400 Å) | Compound HB (50 Å) | Compound ET:Liq (40:60) (350 Å) |
| Example 6 | Compound HI (100 Å) | Compound HT (400 Å) | Compound EB (50 Å) | Compound 1-34:Compound 175 (98:2) (400 Å) | Compound HB (50 Å) | Compound ET:Liq (40:60) (350 Å) |
| Comparative Example 6 | Compound HI (100 Å) | Compound HT (400 Å) | Compound EB (50 Å) | Compound H1:Compound 175 (98:2) (400 Å) | Compound HB (50 Å) | Compound ET:Liq (40:60) (350 Å) |
| Example 7 | Compound HI (100 Å) | Compound HT (400 Å) | Compound EB (50 Å) | Compound l-17:Compound 156 (98:2) (400 Å) | Compound HB (50 Å) | Compound ET:Liq (40:60) (350 Å) |
| Example 8 | Compound HI (100 Å) | Compound HT (400 Å) | Compound EB (50 Å) | Compound 1-34:Compound 319 (98:2) (400 Å) | Compound HB (50 Å) | Compound ET:Liq (40:60) (350 Å) |
| Example 9 | Compound HI (100 Å) | Compound HT (400 Å) | Compound EB (50 Å) | Compound l-34:Compound 329 (98:2) (400 Å) | Compound HB (50 Å) | Compound ET:Liq (40:60) (350 Å) |
| Example 10 | Compound HI (100 Å) | Compound HT (400 Å) | Compound EB (50 Å) | Compound 1-34:Compound 326 (98:2) (400 Å) | Compound HB (50 Å) | Compound ET:Liq (40:60) (350 Å) |
| Comparative Example 7 | Compound HI (100 Å) | Compound HT (400 Å) | Compound EB (50 Å) | Compound H1:Compound 156 (98:2) (400 Å) | Compound HB (50 Å) | Compound ET:Liq (40:60) (350 Å) |
| Comparative Example 8 | Compound HI (100 Å) | Compound HT (400 Å) | Compound EB (50 Å) | Compound l-17:Compound RD-A (98:2) (400 Å) | Compound HB (50 Å) | Compound ET:Liq (40:60) (350 Å) |
| Comparative Example 9 | Compound HI (100 Å) | Compound HT (400 Å) | Compound EB (50 Å) | Compound 1-34:Compound RD-A (98:2) (400 Å) | Compound HB (50 Å) | Compound ET:Liq (40:60) (350 Å) |
| Comparative Example 10 | Compound HI (100 Å) | Compound HT (400 Å) | Compound EB (50 Å) | Compound 1-35:Compound RD-A (98:2) (400 Å) | Compound HB (50 Å) | Compound ET:Liq (40:60) (350 Å) |

The structures of the materials used in the devices are shown as follows:

Compound HI

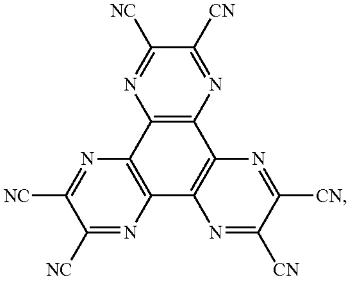

-continued

Compound HT

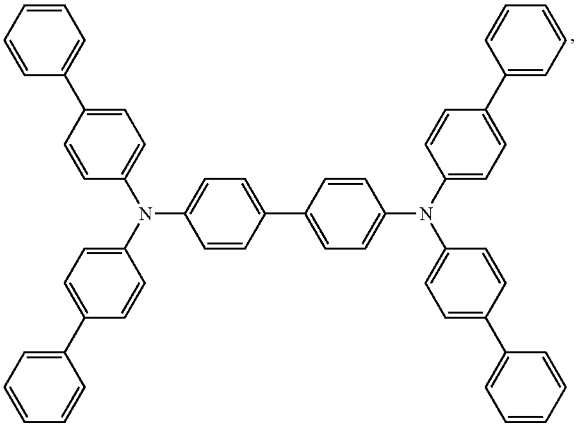

Compound EB
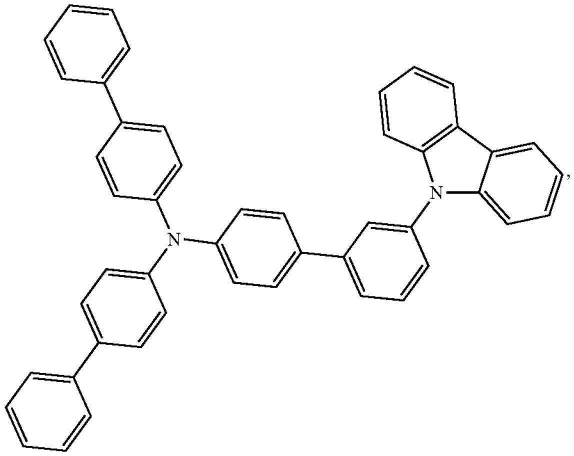
Compound ET
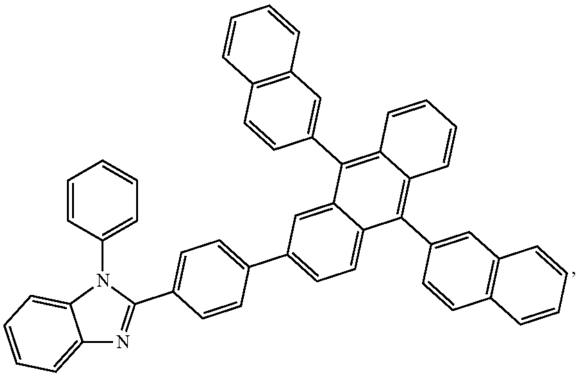
Compound HB
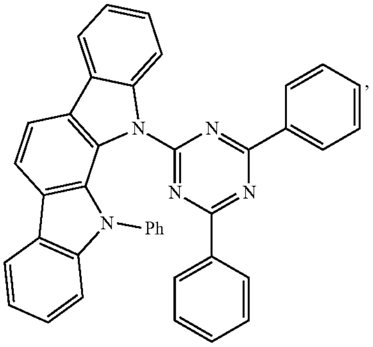
Compound 115
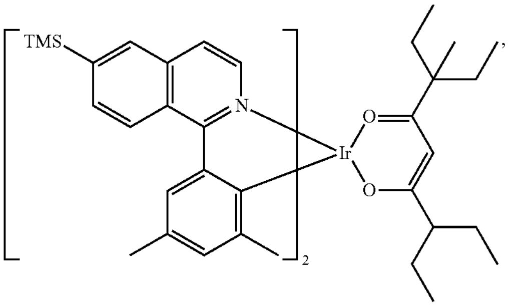
Compound 118
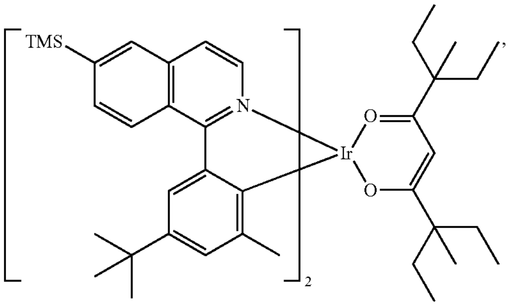
Compound 119
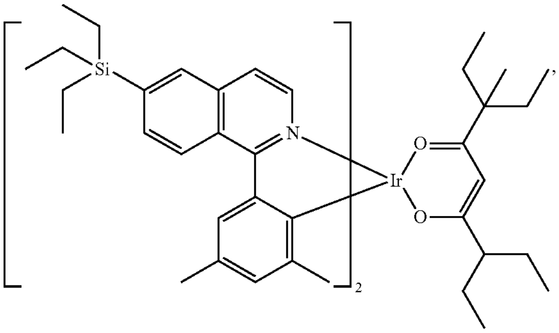
Compound 91
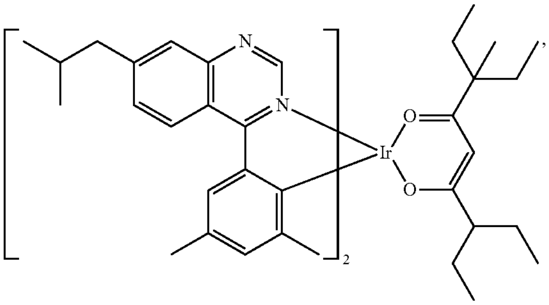
Compound 100
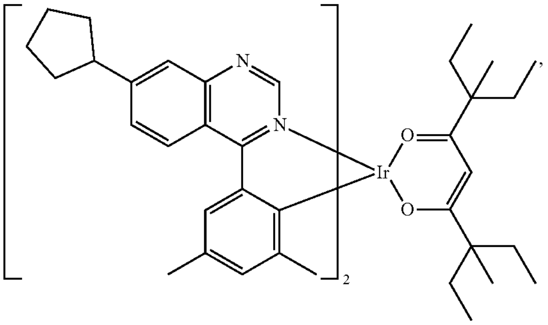

-continued
Compound 132
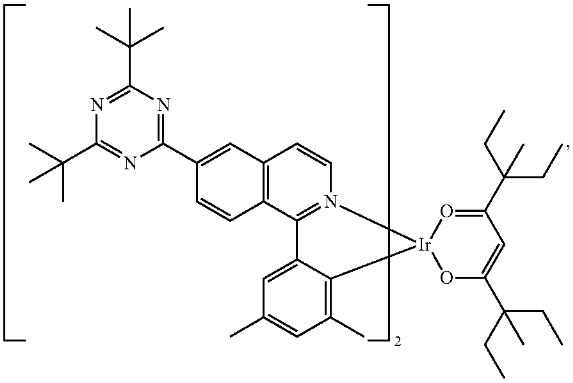
Compound 175
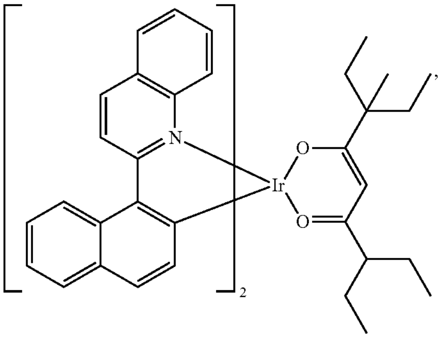
Compound 313
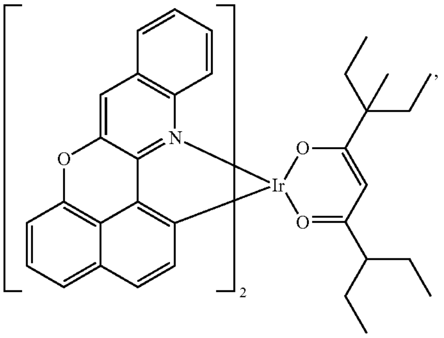
Compound 309
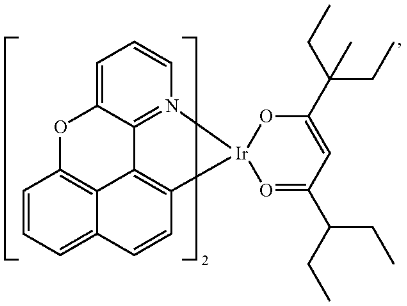
-continued
Compound 156
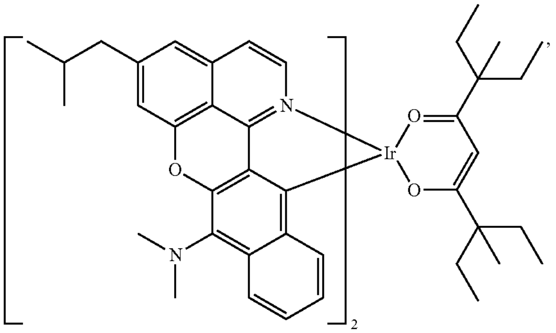
Compound 319
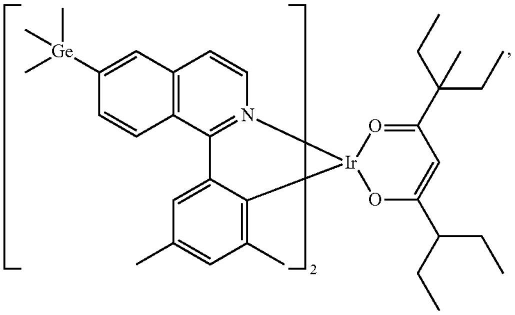
Compound 329
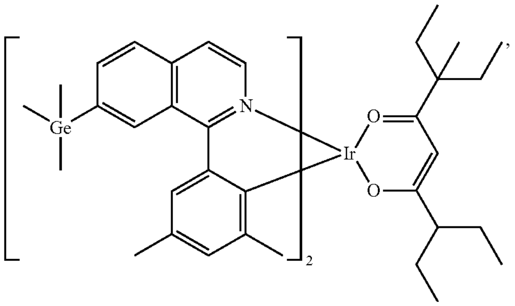
Compound 326
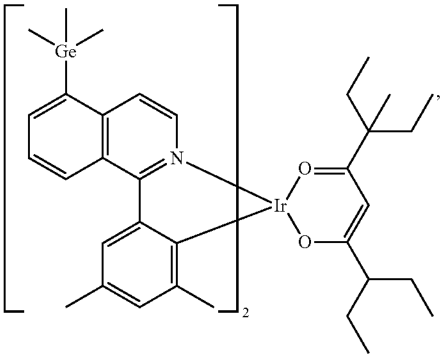

-continued

Compound RD-A

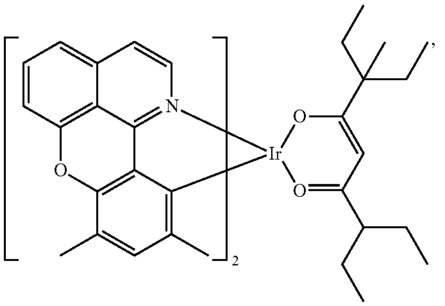

H1

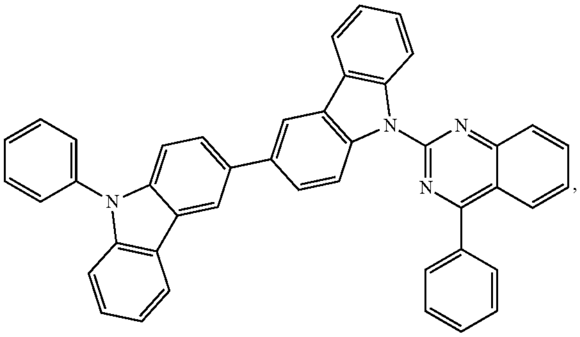

1-34

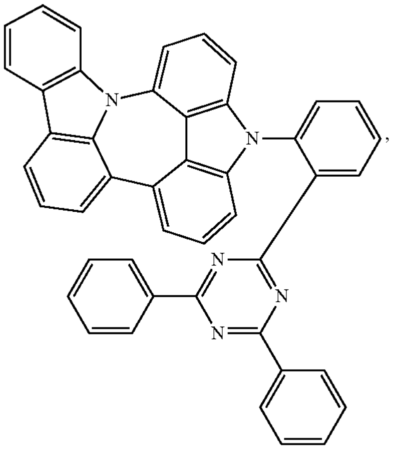

1-17

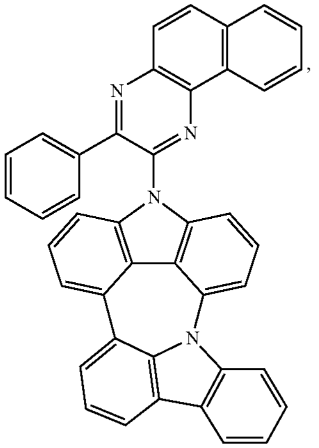

-continued 1-35

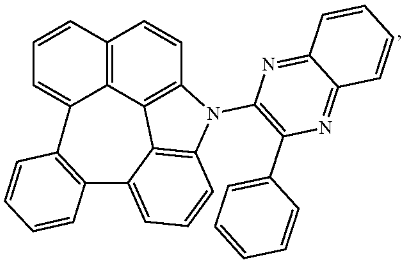

1-39

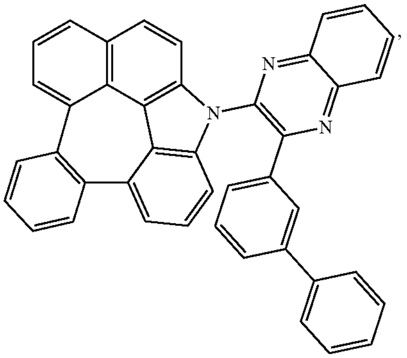

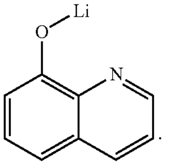

Liq

The maximum emission wavelength $\lambda_{max}$ (nm), voltage and external quantum efficiency (EQE) in Example 1.1 to Example 1.5 and Comparative Example 1 were measured at a current density of 15 $mA/cm^2$. In order to show the comparison of the data more intuitively, the voltage data and external quantum efficiency data in Comparative Example 1 were both set to 1.00, and the voltage and external quantum efficiency in other examples were converted relative to the corresponding data in Comparative Example 1. The related data and the conversion results are shown in Table 2.

TABLE 2

| | Device data | | |
|---|---|---|---|
| Device No. | $\lambda_{max}$ (nm) | Voltage | EQE |
| Example 1.1 | 640 | 0.81 | 1.08 |
| Example 1.2 | 640 | 0.76 | 1.07 |
| Example 1.3 | 640 | 0.85 | 1.09 |
| Example 1.4 | 636 | 0.77 | 1.08 |
| Example 1.5 | 639 | 0.83 | 1.09 |
| Comparative Example 1 | 638 | 1.00 | 1.00 |

The maximum emission wavelength $\lambda_{max}$ (nm), voltage and EQE in Example 2.1 to Example 2.5 and Comparative Example 2 were measured at a current density of 15 $mA/cm^2$, and the lifetime (LT97) in Example 2.1 to Example 2.5 and Comparative Example 2 were measured at a current density of 80 $mA/cm^2$. In order to show the comparison of the data more intuitively, the voltage, EQE and lifetime in Comparative Example 2 were all set to 1.00, and the voltage, EQE and lifetime in other examples were converted relative to the corresponding data in Comparative Example 2. The related data and the conversion results are shown in Table 3.

TABLE 3

| Device data | | | | |
|---|---|---|---|---|
| Device No. | $\lambda_{max}$ (nm) | Voltage | EQE | LT97 |
| Example 2.1 | 654 | 0.91 | 1.13 | 1.68 |
| Example 2.2 | 654 | 0.93 | 1.21 | 1.73 |
| Example 2.3 | 654 | 0.94 | 1.19 | 1.23 |
| Example 2.4 | 654 | 0.87 | 1.24 | 1.73 |
| Example 2.5 | 654 | 0.90 | 1.13 | 1.73 |
| Comparative Example 2 | 653 | 1.00 | 1.00 | 1.00 |

The maximum emission wavelength $\lambda_{max}$ (nm), voltage and EQE in Example 3 and Comparative Example 3 were measured at a current density of 15 mA/$cm^2$, and the lifetime (LT97) in Example 3 and Comparative Example 3 were measured at a current density of 80 mA/$cm^2$. In order to show the comparison of the data more intuitively, the voltage, EQE and lifetime in Comparative Example 3 were all set to 1.00, and the voltage, EQE and lifetime in Example 3 were converted relative to the corresponding data in Comparative Example 3. The related data and the conversion results are shown in Table 4.

TABLE 4

| Device data | | | | |
|---|---|---|---|---|
| Device No. | $\lambda_{max}$ (nm) | Voltage | EQE | LT97 |
| Example 3 | 688 | 0.79 | 1.22 | 2.10 |
| Comparative Example 3 | 682 | 1.00 | 1.00 | 1.00 |

The maximum emission wavelength $\lambda_{max}$ (nm), voltage and EQE in Example 4 and Comparative Example 4 were measured at a current density of 15 mA/$cm^2$. In order to show the comparison of the data more intuitively, the voltage and EQE in Comparative Example 4 were both set to 1.00, and the voltage and EQE in Example 4 were converted relative to the corresponding data in Comparative Example 4. The related data and the conversion results are shown in Table 5.

TABLE 5

| Device data | | | |
|---|---|---|---|
| Device No. | $\lambda_{max}$ (nm) | Voltage | EQE |
| Example 4 | 690 | 0.61 | 2.04 |
| Comparative Example 4 | 688 | 1.00 | 1.00 |

The maximum emission wavelength $\lambda_{max}$ (nm), voltage and EQE in Example 5 and Comparative Example 5 were measured at a current density of 15 mA/$cm^2$. In order to show the comparison of the data more intuitively, the voltage and EQE in Comparative Example 5 were both set to 1.00, and the voltage and EQE in Example 5 were converted relative to the corresponding data in Comparative Example 5. The related data and the conversion results are shown in Table 6.

TABLE 6

| Device data | | | |
|---|---|---|---|
| Device No. | $\lambda_{max}$ (nm) | Voltage | EQE |
| Example 5 | 645 | 0.56 | 1.46 |
| Comparative Example 5 | 643 | 1.00 | 1.00 |

The maximum emission wavelength $\lambda_{max}$ Xmx (nm), voltage and EQE in Example 6 and Comparative Example 6 were measured at a current density of 15 mA/$cm^2$. In order to show the comparison of the data more intuitively, the voltage and EQE in Comparative Example 6 were both set to 1.00, and the voltage and EQE in Example 6 were converted relative to the corresponding data in Comparative Example 6. The related data and the conversion results are shown in Table 7.

TABLE 7

| Device data | | | |
|---|---|---|---|
| Device No. | $\lambda_{max}$ (nm) | Voltage | EQE |
| Example 6 | 637 | 0.62 | 2.59 |
| Comparative Example 6 | 635 | 1.00 | 1.00 |

From the data in Table 2 to Table 7, it can be seen that each of the devices using the first compound and the second compound of the present disclosure can emit deep red light (630 nm or more), and each of the devices in the examples has a red-shifted maximum emission wavelength relative to those of the comparative examples, thereby emitting deeper red light. Further, more importantly, in terms of device performance, the first compound and the second compound selected in the present disclosure can also significantly improve the device performance, such as device efficiency, voltage and/or lifetime. Compared to Comparative Example 1, the EQE of Example 1.1 to Example 1.5 is improved by 8%, 7%, 9%, 8% and 9%, respectively, and the voltages are significantly reduced by 19%, 24%, 15%, 23% and 17%, respectively. Compared to Comparative Example 2, the EQE of Example 2.1 to Example 2.5 is significantly improved by 13%, 21%, 19%, 24% and 13%, respectively, the voltages are reduced by 9%, 7%, 6%, 13% and 10%, respectively, and the lifetimes are significantly improved by 68%, 73%, 23%, 73% and 73%, respectively. Compared to Comparative Example 3, the EQE of Example 3 is improved by 22%, and the voltage is reduced by 21%. More importantly, compared to Comparative Example 3, the lifetime of Example 3 is significantly improved by 2.1 times. Compared to Comparative Example 4, the voltage of Example 4 is significantly reduced by 39%, and the EQE is improved more significantly, which has a doubled improvement. Compared to Comparative Example 5, the EQE of Example 5 is significantly improved by 46%, and the voltage is significantly reduced by 44%. Compared to Comparative Example 6, the voltage of Example 6 is significantly reduced by 38%, and the EQE is significantly improved, which is improved by nearly 2.6 times.

From the above comparison of the specific data, it can be clearly seen that using a combination of the first compound and the second compound selected in the present disclosure can generally enable the device to have a red-shifted maximum emission wavelength and emit deeper red light. More importantly, in deep red color, the drive voltage of the device can be significantly reduced while the EQE and/or lifetime of the device can be significantly improved. In the examples, the maximum improvement of the EQE is up to nearly 2.6 times, and the maximum reduction of the drive voltage is up to 44%. These results prove that the electroluminescent device of the present disclosure using the combination of the first compound and the second compound has a great advantage.

The maximum emission wavelength $\lambda_{max}$ (nm) and voltage in Example 7 and Comparative Example 7 were measured at a current density of 15 mA/cm$^2$. The lifetime (LT97) in Example 7 and Comparative Example 7 were measured at a current density of 80 mA/cm$^2$. In order to show the comparison of the data more intuitively, the voltage data and lifetime data in Comparative Example 7 were both set to 1.00, and the voltage and lifetime in Example 7 were converted relative to the corresponding data in Comparative Example 7. The related data and the conversion results are shown in Table 8.

TABLE 8

| Device data | | | |
|---|---|---|---|
| Device No. | $\lambda_{max}$ (nm) | Voltage | LT97 |
| Example 7 | 673 | 0.80 | 2.00 |
| Comparative Example 7 | 671 | 1.00 | 1.00 |

Compared to Comparative Example 7, Example 7 has a maximum emission wavelength red-shifted by 2 nm. More importantly, the device lifetime of Example 7 has a doubled improvement, and the drive voltage is reduced by 20%. Again, it proves that the first compound and the second compound selected in the present disclosure have excellent performance in a deep red device.

The EQE in Example 1.1, Example 2.1, Example 6, Example 8 to Example 10 and Comparative Example 9 was measured at a current density of 15 mA/cm$^2$. In order to show the comparison of the data more intuitively, the EQE in Comparative Example 9 was set to 1.00, and the EQE in other examples was converted relative to the corresponding data in Comparative Example 9. The related data and the conversion results are shown in Table 9.

TABLE 9

| Device data | | |
|---|---|---|
| Device No. | $\lambda_{max}$ (nm) | EQE |
| Example 1.1 | 640 | 4.53 |
| Example 2.1 | 654 | 3.43 |
| Example 6 | 637 | 2.41 |
| Example 8 | 637 | 4.39 |
| Example 9 | 633 | 4.16 |
| Example 10 | 633 | 4.25 |
| Comparative Example 9 | 568 | 1.00 |

The EQE in Example 1.2, Example 2.4 and Comparative Example 10 was measured at a current density of 15 mA/cm$^2$. In order to show the comparison of the data more intuitively, the EQE in Comparative Example 10 was set to 1.00, and the EQE in other examples was converted relative to the corresponding data in Comparative Example 10. The related data and the conversion results are shown in Table 10.

TABLE 10

| Device data | | |
|---|---|---|
| Device No. | $\lambda_{max}$ (nm) | EQE |
| Example 1.2 | 640 | 5.27 |
| Example 2.4 | 654 | 4.49 |
| Comparative Example 10 | 568 | 1.00 |

The EQE in Example 2.2, Example 3, Example 7 and Comparative Example 8 was measured at a current density of 15 mA/cm$^2$. In order to show the comparison of the data more intuitively, the EQE in Comparative Example 8 was set to 1.00, and the EQE in other examples was converted relative to the corresponding data in Comparative Example 8. The related data and the conversion results are shown in Table 11.

TABLE 11

| Device data | | |
|---|---|---|
| Device No. | $\lambda_{max}$ (nm) | EQE |
| Example 2.2 | 654 | 4.79 |
| Example 3 | 688 | 3.59 |
| Example 7 | 673 | 2.14 |
| Comparative Example 8 | 568 | 1.00 |

A combination of the first compound and the dopant material Compound RD-A selected in the present disclosure is used in the light-emitting layers of Comparative Example 8 to Comparative Example 10. From the comparison of the data in Table 9 to Table 11, it can be seen that when the first compound selected in the present disclosure is used in combination with the second compound, the device can emit deep red light and has a maximum emission wavelength very significantly red-shifted relative to the comparative examples (the lowest is 65 nm, Example 9 Vs. Comparative Example 9). More importantly, in terms of device performance, compared to comparative examples, the device efficiency in the examples has been significantly improved, which is generally more than doubled and even up to 5.27 times of that in the comparative examples. Again, it proves that the first compound and the second compound selected in the present disclosure have excellent performance in a deep red device.

To conclude, the combination of the first compound and the second compound selected in the present disclosure can achieve the emission of deep red light (more than 630 nm), exhibit excellent device performance in the device, and significantly reduce the drive voltage of the device while significantly improving the device efficiency and/or the device lifetime. It proves that the combination of the first compound and the second compound has an excellent application prospect.

It is to be understood that various embodiments described herein are merely illustrative and not intended to limit the scope of the present disclosure. Therefore, it is apparent to the persons skilled in the art that the present disclosure as claimed may include variations of specific embodiments and preferred embodiments described herein. Many of the materials and structures described herein may be replaced with other materials and structures without departing from the spirit of the present disclosure. It is to be understood that various theories as to why the present disclosure works are not intended to be limiting.

What is claimed is:

1. An electroluminescent device comprising:

an anode, a cathode, and an organic layer disposed between the anode and the cathode, wherein the organic layer at least comprises a first compound and a second compound, and the device at least has one maximum emission wavelength greater than 630 nm;

wherein the first compound has a structure of H-$L_1$-E, wherein H has a structure represented by Formula A:

Formula A

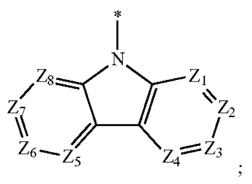

;

wherein in Formula A, $Z_1$ to $Z_3$ and $Z_6$ to $Z_8$ are, at each occurrence identically or differently, selected from $CR_{z1}$ or N, $Z_4$ and $Z_5$ are, at each occurrence identically or differently, selected from $CR_{z2}$, and two substituents $R_{z2}$ in $Z_4$ and $Z_5$ are joined to form a ring;

$L_1$ is selected from a single bond, substituted or unsubstituted arylene having 6 to 30 carbon atoms, substituted or unsubstituted heteroarylene having 3 to 30 carbon atoms or a combination thereof;

E is selected from substituted or unsubstituted aryl having 6 to 30 carbon atoms or substituted or unsubstituted heteroaryl having 3 to 30 carbon atoms;

$R_{z1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_{z2}$ is, at each occurrence identically or differently, selected from the group consisting of: hydrogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof; and adjacent substituents $R_{z1}$, $R_{z2}$ can be optionally joined to form a ring;

wherein the second compound is a metal complex and has a general formula of $M(L_a)_m(L_b)_n$, wherein M is selected from a metal with a relative atomic mass greater than 40, $L_a$, $L_b$ are a first ligand and a second ligand coordinated to the metal M, respectively, m is selected from 1, 2 or 3, n is selected from 0, 1 or 2, and m+n equals an oxidation state of the metal M; wherein when m is equal to 2 or 3, a plurality of $L_a$ may be identical or different; when n is equal to n to 2, two $L_b$ may be identical or different;

$L_a$, $L_b$ can be optionally joined to form a multidentate ligand;

$L_a$ is, at each occurrence identically or differently, selected from a structure represented by any one of Formula 1-1-1, Formula 1-1-3, Formula 1-1-4, Formula 1-2-5, Formula 1-4 to Formula 1-14:

Formula 1-1

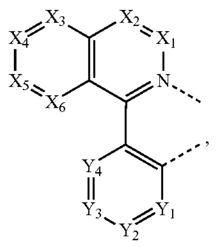

Formula 1-2

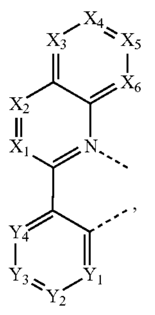

-continued
Formula 1-3
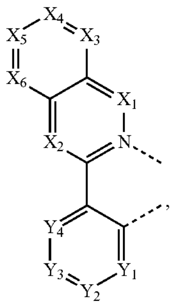
Formula 1-4
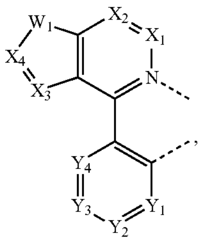
Formula 1-5
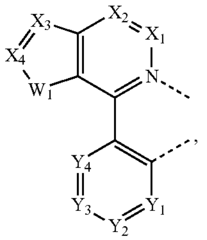
Formula 1-6
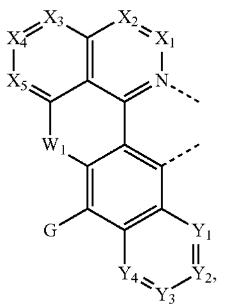
Formula 1-7
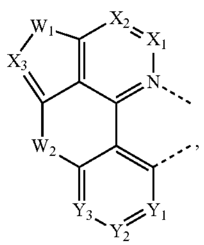
Formula 1-8
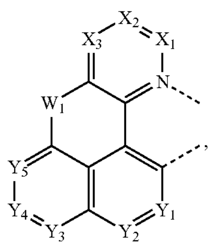
-continued
Formula 1-9
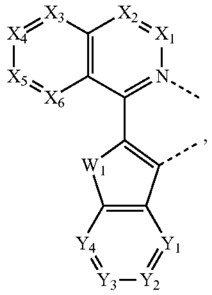
Formula 1-10
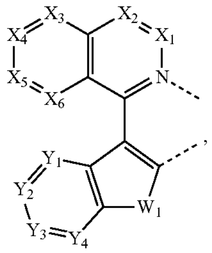
Formula 1-11
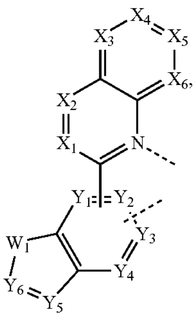
Formula 1-12
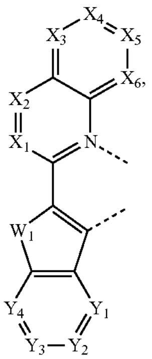
Formula 1-13
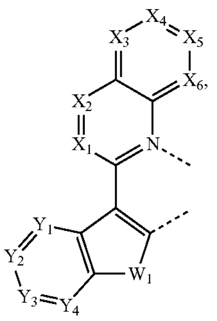

-continued

Formula 1-14

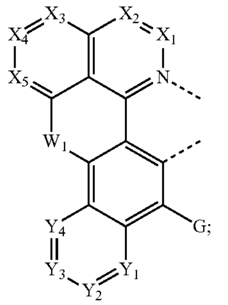

wherein in Formula 1-1-1, $X_3$ to $X_6$ are, at each occurrence identically or differently, selected from $CR_x$;

in Formula 1-1-3, Formula 1-1-4, Formula 1-2-5, Formula 1-4 to Formula 1-14, $X_1$ to $X_6$ are, at each occurrence identically or differently, selected from $CR_x$ or N;

$Y_1$ to $Y_6$ are, at each occurrence identically or differently, selected from C, $CR_y$ or N;

$B_1$ to $B_4$ are, at each occurrence identically or differently, selected from $CR_b$ or N;

$W_1$ and $W_2$ are, at each occurrence identically or differently, selected from $SiR_wR_w$, $GeR_wR_w$, $PR_w$, O, S or Se; wherein when two $R_w$ are present at the same time, the two $R_w$ may be identical or different;

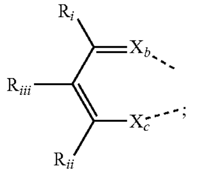

$R_i$, $R_{ii}$ and $R_{iii}$ represent, at each occurrence identically or differently, mono-substitution, multiple substitutions or non-substitution;

$X_b$ and $X_c$ are, at each occurrence identically or differently, selected from the group consisting of: O, S, Se and $NR_{N2}$;

G, $R_i$, $R_{ii}$, $R_{ii}$, $RN_2$, $R_b$, $R_x$, $R_y$ and $R_w$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

in Formula 1-1-1, Formula 1-2-5, at least one of $X_3$ to $X_6$ is selected from $CR_x$, and the $R_x$ is, at each occurrence identically or differently, selected from the group consisting of: alkyl having 1 to 20 carbon atoms substituted with at least one cyano arylalkyl having 7 to 30 carbon atoms substituted with at least one cyano or halogen, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms and combinations thereof;

adjacent substituents G, $R_x$, $R_y$ and $R_w$ can be optionally joined to form a ring; and adjacent substituents $R_i$, $R_{ii}$, $R_{iii}$, and $R_{N2}$; can be optionally joined to form a ring.

2. The electroluminescent device according to claim 1, wherein in Formula A, the two substituents $R_{z2}$ in $Z_4$ and $Z_5$ are joined to form a ring, and the ring has at least six ring atoms.

3. The electroluminescent device according to claim 1, wherein in the first compound, the H has a structure represented by any one of Formula A-1 to Formula A-8:

Formula A-1

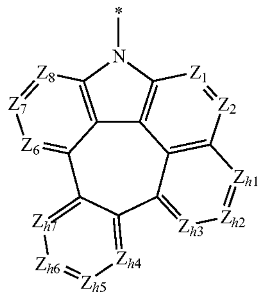

,

Formula A-2

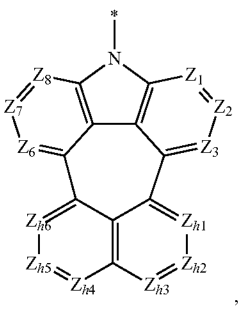

,

-continued

Formula A-3

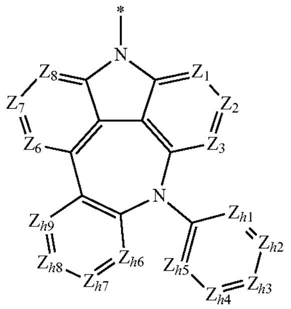

,

Formula A-4

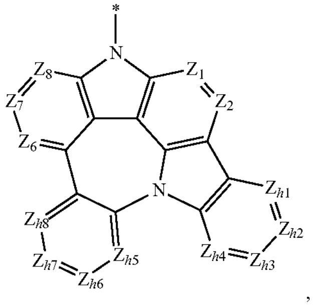

,

Formula A-5

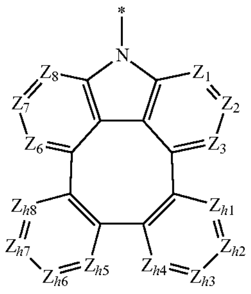

,

Formula A-6

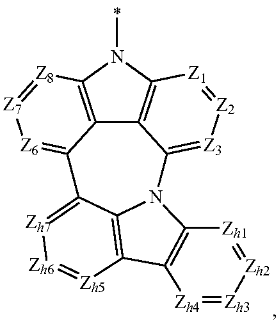

,

Formula A-7

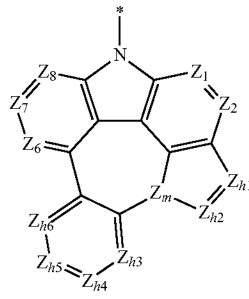

,

-continued

Formula A-8

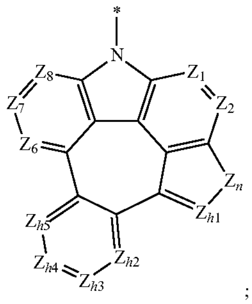

;

wherein in Formula A-1 to Formula A-8, $Z_1$ to $Z_3$ and $Z_6$ to $Z_8$ are, at each occurrence identically or differently, selected from $CR_{z1}$ or N;

$Z_{h1}$ to $Z_{h9}$ are, at each occurrence identically or differently, selected from $CR_{zh}$ or N;

$Z_m$ is selected from $CR_{zm}$ or N;

$Z_n$ is selected from $CR_{zn}R_{zn}$, O, S or $NR_{zn}$; wherein when $Z_n$ is selected from $CR_{zn}R_{zn}$, two $R_{zn}$ may be identical or different;

$R_{z1}$, $R_{zh}$, $R_{zm}$ and $R_{zn}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_{z1}$, $R_{zh}$, $R_{zm}$, $R_{zn}$ can be optionally joined to form a ring.

4. The electroluminescent device according to claim 3, wherein in Formula A-1 to Formula A-8, $R_{z1}$, $R_{zh}$, $R_{zm}$ and $R_{zn}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, a cyano group, an isocyano group, a hydroxyl group, a sulfanyl group and combinations thereof; and
adjacent substituents $R_{z1}$, $R_{zh}$, $R_{zm}$, $R_{zn}$ can be optionally joined to form a ring.
5. The electroluminescent device according to claim 1, wherein the H is selected from the group consisting of the following structures:
H-1
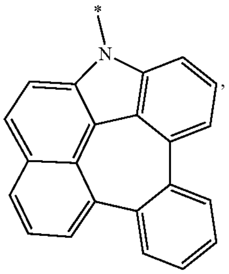
H-2
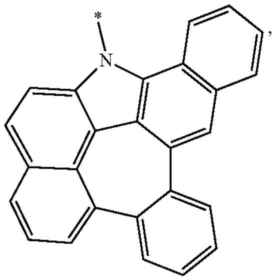
H-3
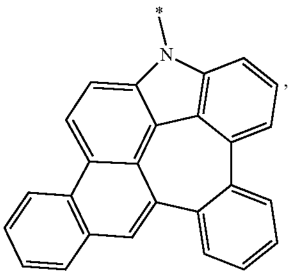
H-4
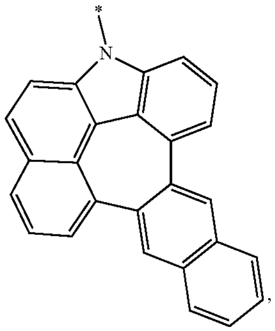
-continued
H-5
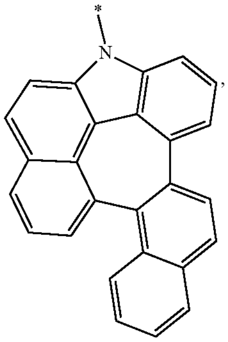
H-6
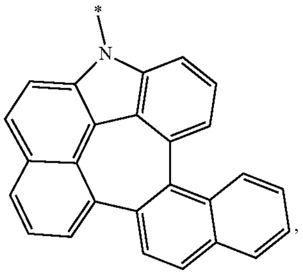
H-7
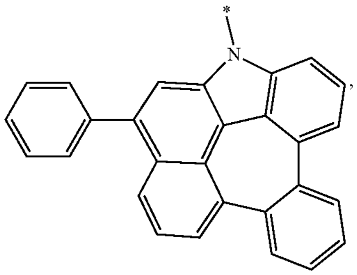
H-8
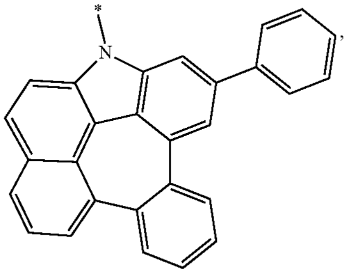
H-9
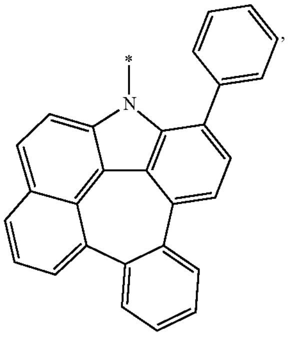

-continued
H-10
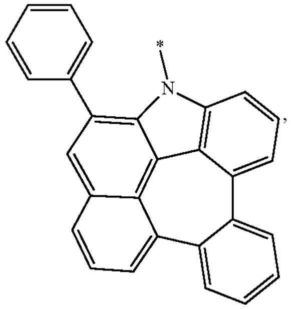
H-11
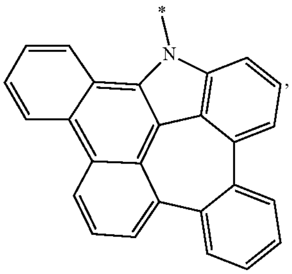
H-12
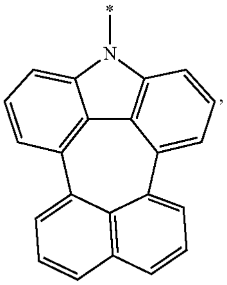
H-13
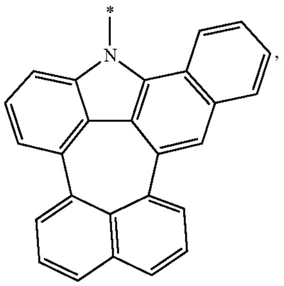
H-14
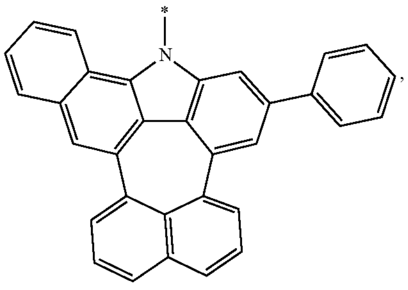
-continued
H-15
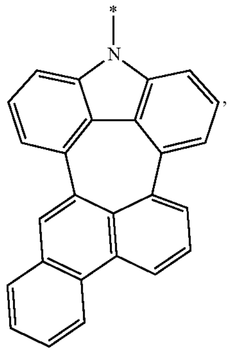
H-16
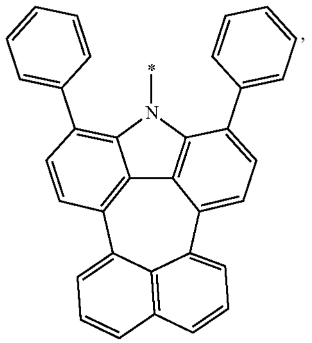
H-17
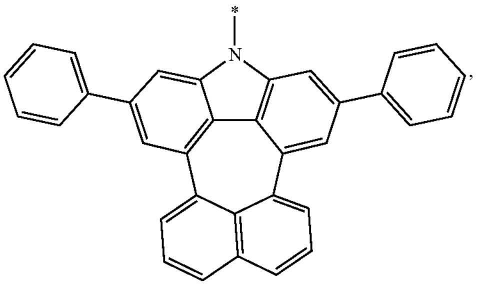
H-18
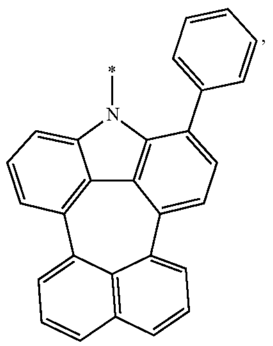
H-19
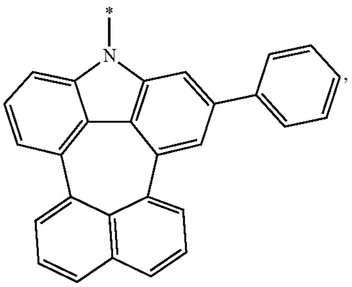

-continued
H-20
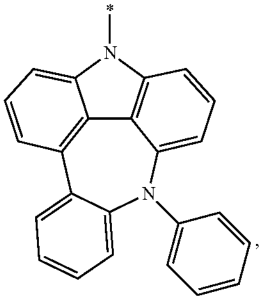
,
H-21
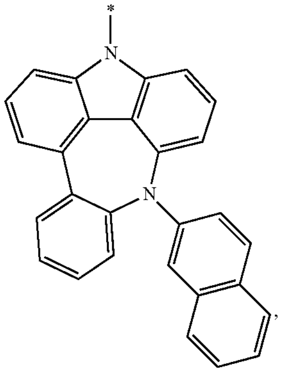
,
H-22
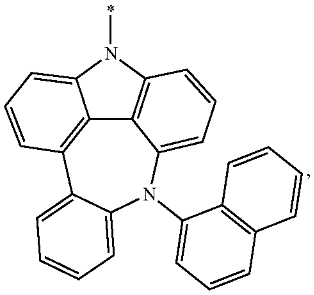
,
H-23
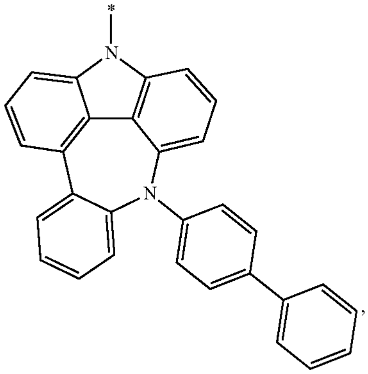
,
-continued
H-24
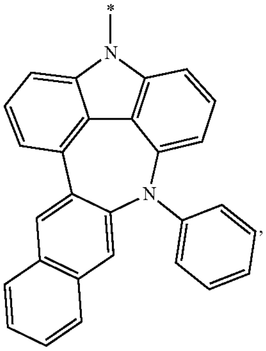
,
H-25
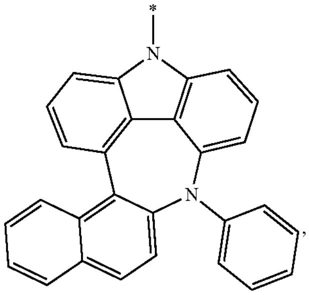
,
H-26
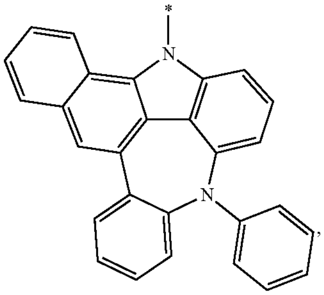
,
H-27
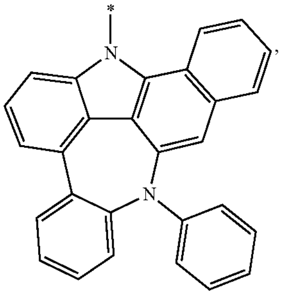
,
H-28
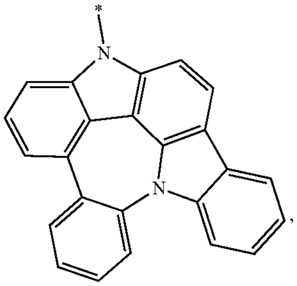
, -continued
H-29
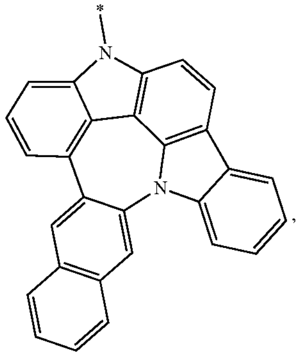
H-30
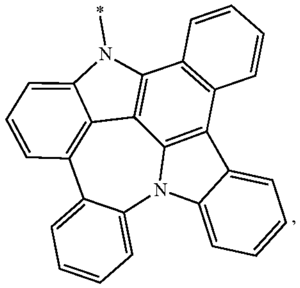
H-31
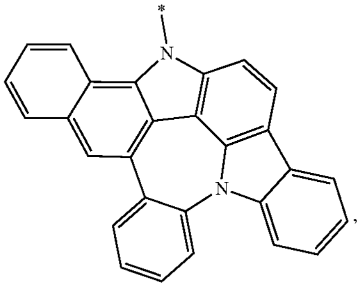
H-32
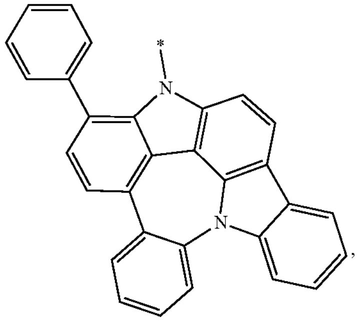
H-33
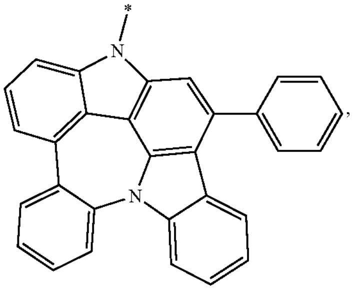
-continued
H-34
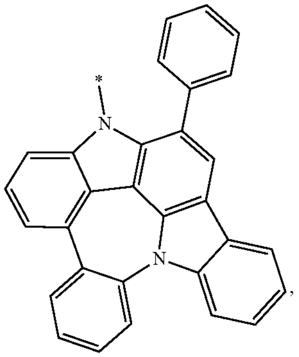
H-35
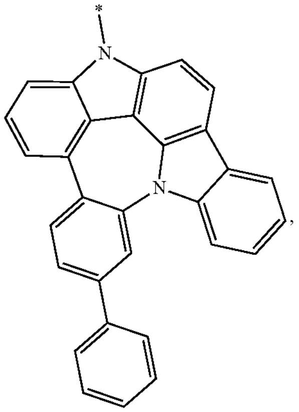
H-36
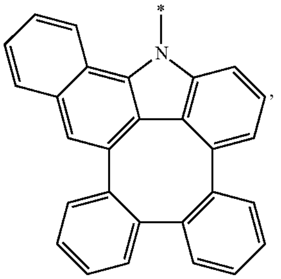
H-37
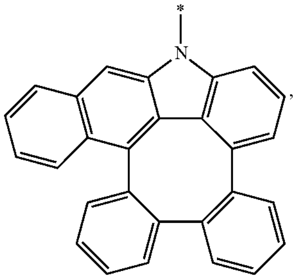

-continued
H-38
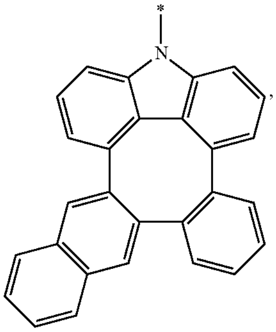
H-39
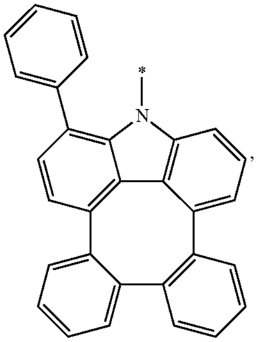
H-40
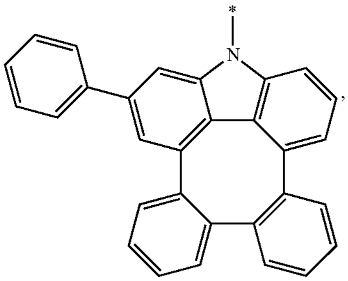
H-41
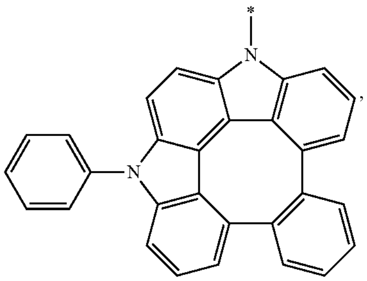
-continued
H-42
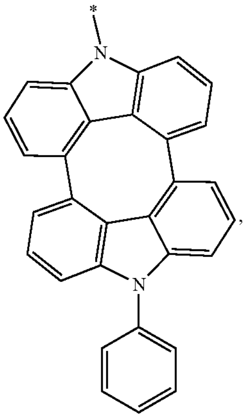
H-43
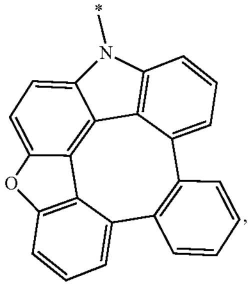
H-44
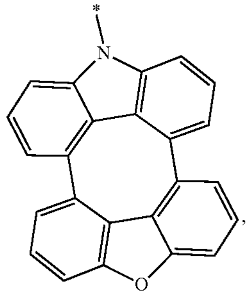
H-45
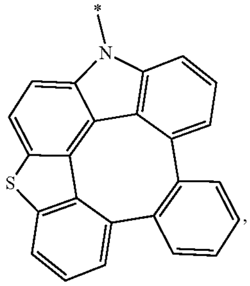
H-46
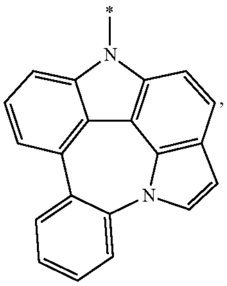

-continued
H-47
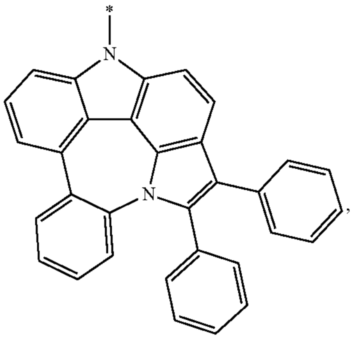,
H-48
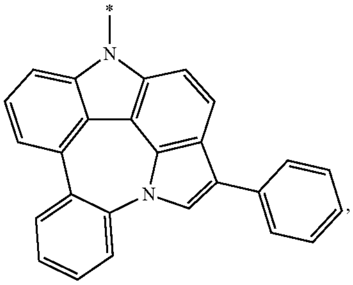,
H-49
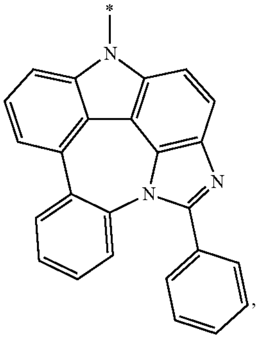,
H-50
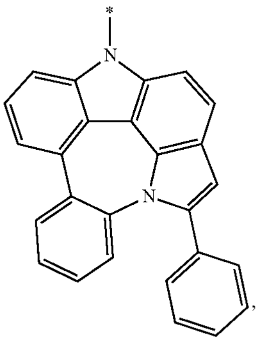,
-continued
H-51
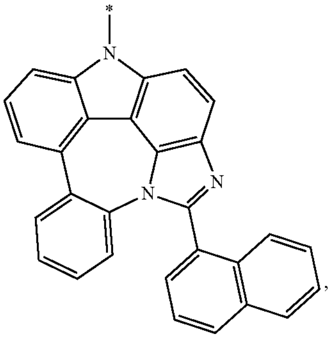,
H-52
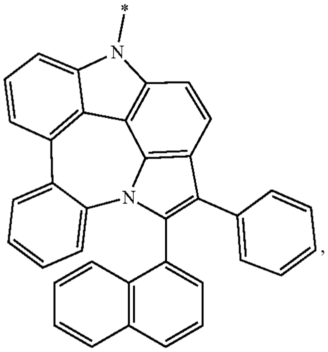,
H-53
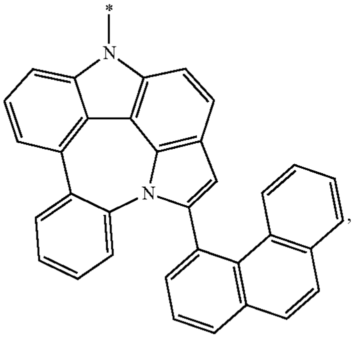,
H-54
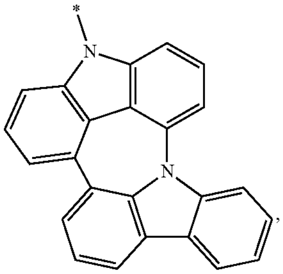,
H-55
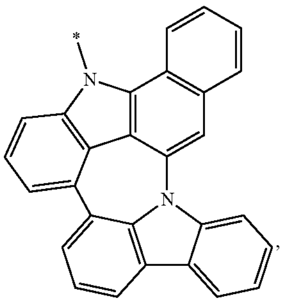, -continued
H-56
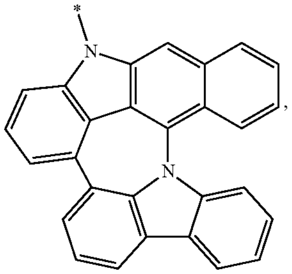
H-57
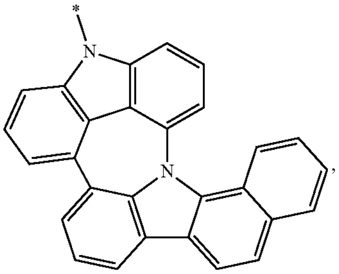
H-58
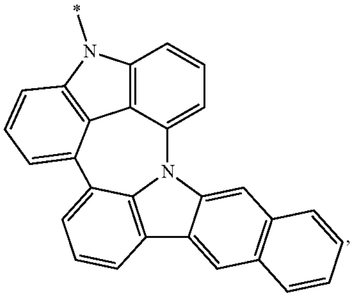
H-59
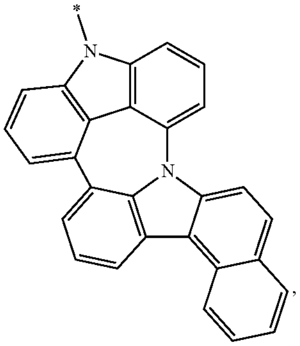
H-60
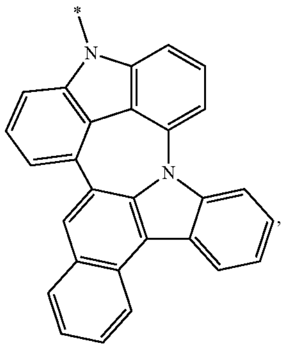
-continued
H-61
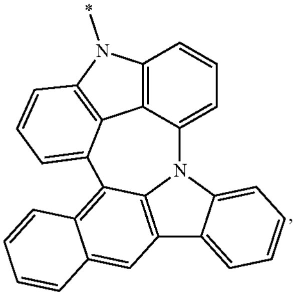
H-62
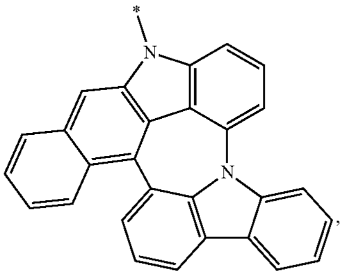
H-63
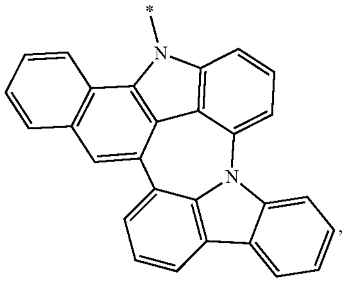
H-64
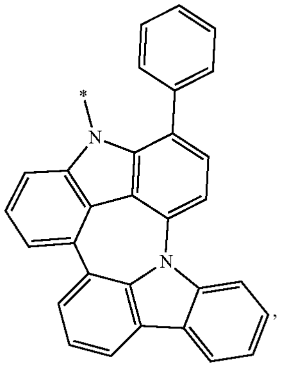
H-65
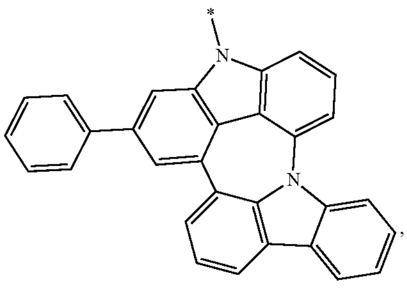

-continued
H-66
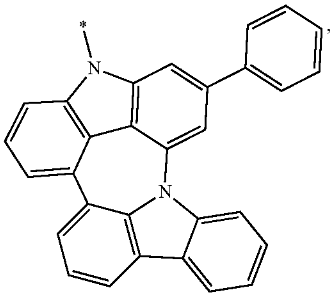
H-67
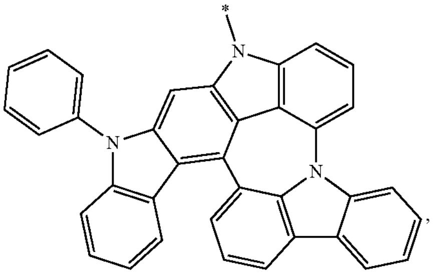
H-68
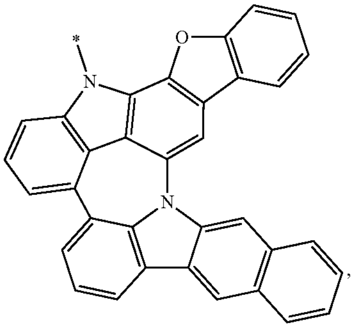
H-69
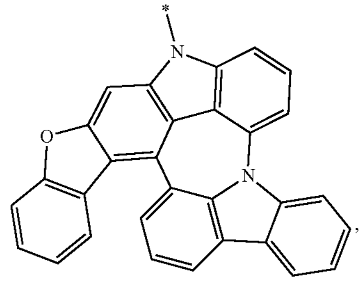
H-70
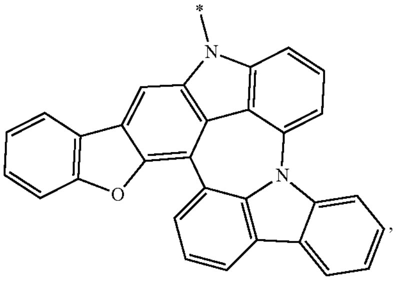
-continued
H-71
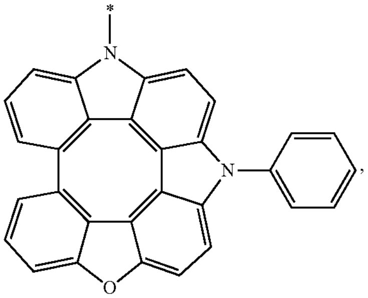
H-72
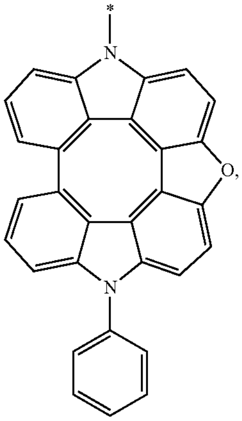
H-73
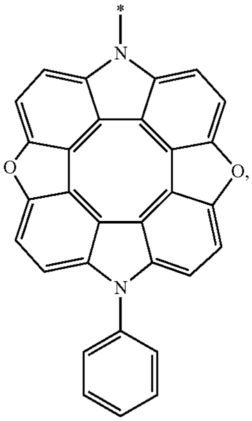
H-74
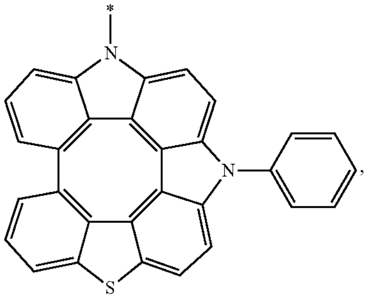

-continued

H-75

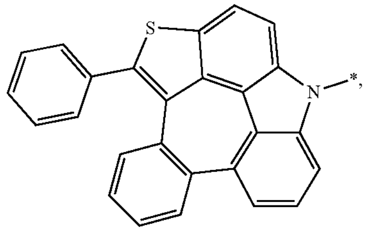

H-76

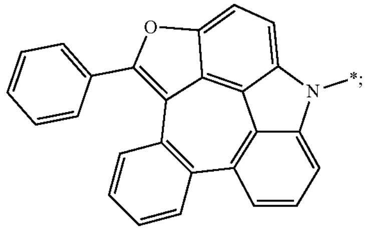

wherein optionally, hydrogen in the structures of H-1 to H-76 can be partially or fully substituted with deuterium.

6. The electroluminescent device according to claim 1, wherein in the first compound, the E has a structure represented by Formula E-a or Formula E-b:

Formula E-a

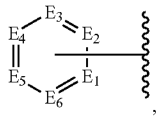

Formula E-b

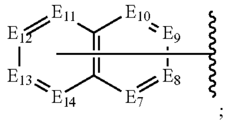

wherein in Formula E-a and Formula E-b, $E_1$ to $E_{14}$ are, at each occurrence identically or differently, selected from C, $CR_e$ or N;

$R_e$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_e$ can be optionally joined to form a ring.

7. The electroluminescent device according to claim 1, wherein in the first compound, the E has a structure represented by any one of Formula E-1 to Formula E-10:

Formula E-1

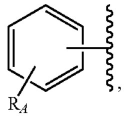

Formula E-2

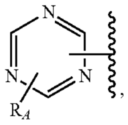

Formula E-3

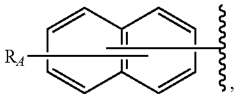

Formula E-4

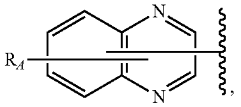

Formula E-5

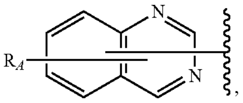

Formula E-6

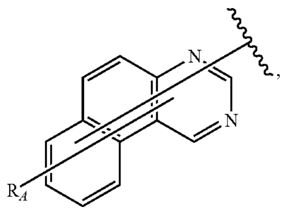

Formula E-7

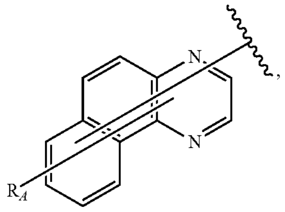

Formula E-8

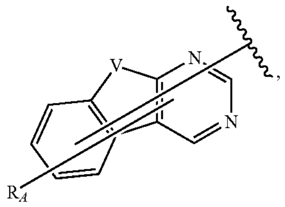

-continued

Formula E-9

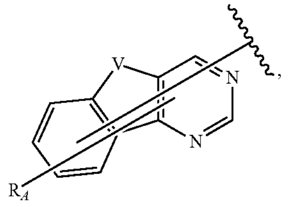

Formula E-10

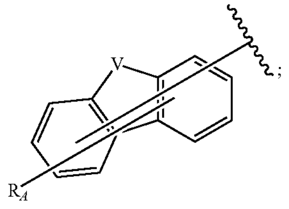

wherein in Formula E-1 to Formula E-10, $R_A$ represents, at each occurrence identically or differently, mono-substitution, multiple substitutions or non-substitution;

V is selected from O, S or Se;

$R_A$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_A$ can be optionally joined to form a ring.

8. The electroluminescent device according to claim 7, wherein in Formula E-1 to Formula E-21, the $R_A$ is, at each occurrence identically or differently, selected from the group consisting of: hydrogen, deuterium, halogen, a cyano group, a hydroxyl group, a sulfanyl group, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof;

adjacent substituents $R_A$ can be optionally joined to form a ring.

9. The electroluminescent device according to claim 7, wherein at least one $R_A$ is present in Formula E-1 to Formula E-21, and the $R_A$ is, at each occurrence identically or differently, selected from the group consisting of: deuterium, halogen, cyano, hydroxyl, a sulfanyl group, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof;

adjacent substituents $R_A$ can be optionally joined to form a ring.

10. The electroluminescent device according to claim 1, wherein in the first compound, the E is selected from the group consisting of the following structures:

E-1

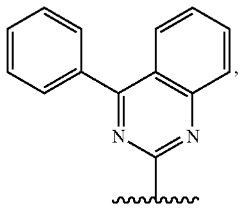

E-2

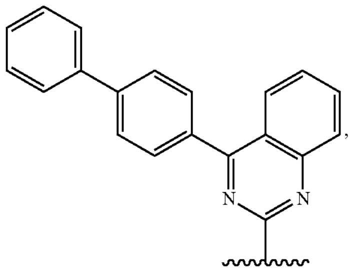

E-3

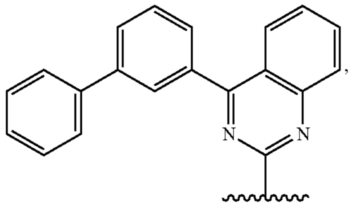

E-4

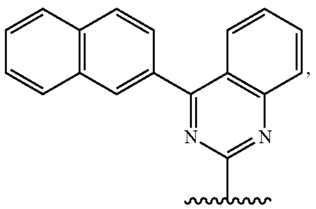

E-5

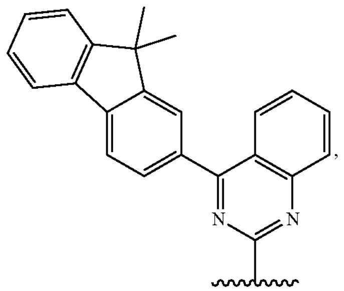

-continued
E-6
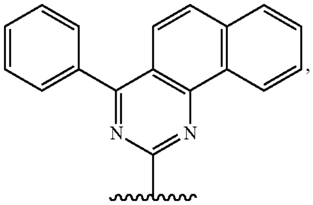
E-7
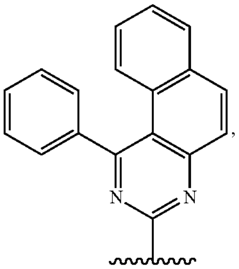
E-8
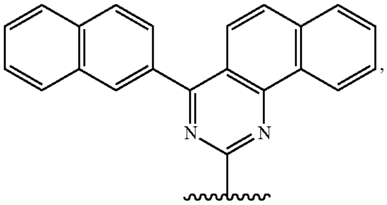
E-9
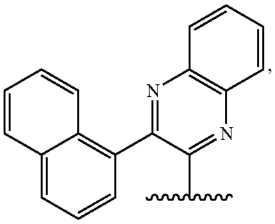
E-10
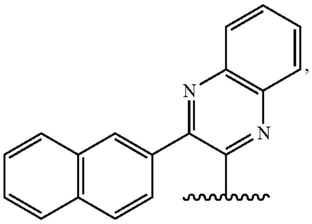
E-11
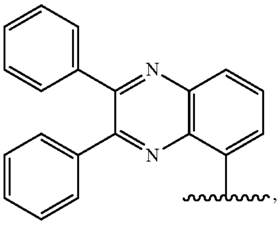
E-12
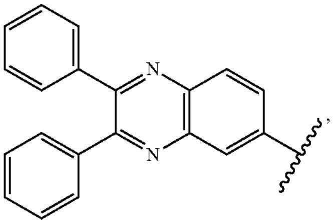
-continued
E-13
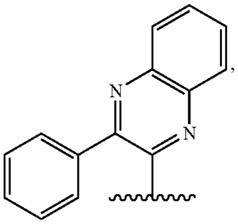
E-14
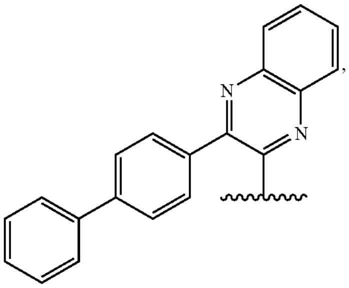
E-15
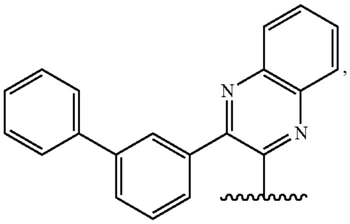
E-16
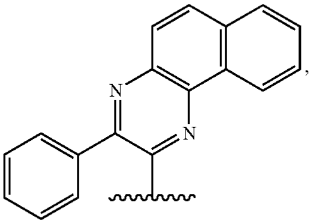
E-17
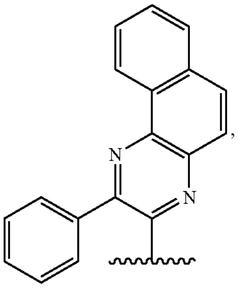
E-18
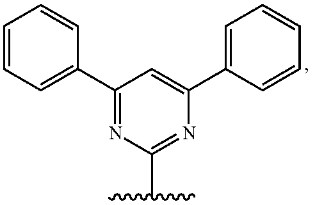

-continued
E-19
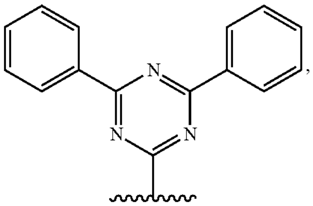,
E-20
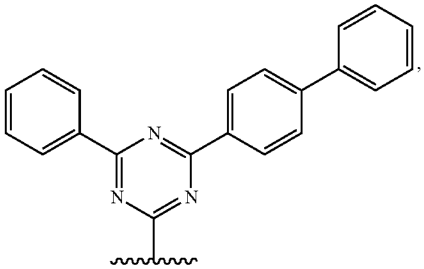,
E-21
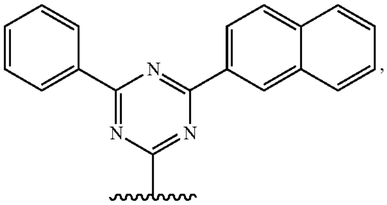,
E-22
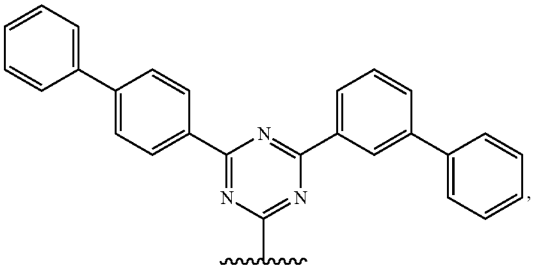,
E-23
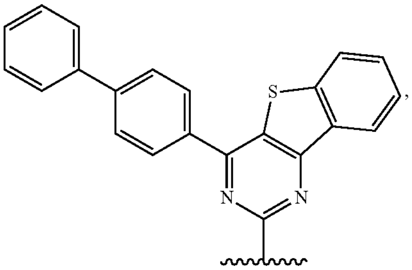,
E-24
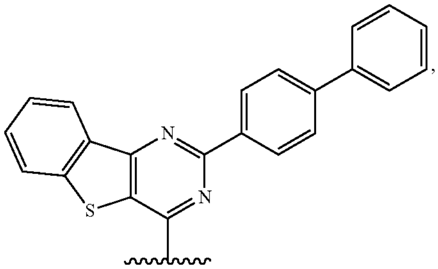,
-continued
E-25
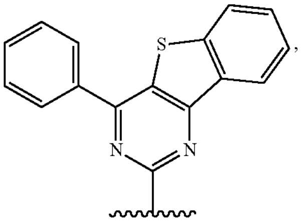,
E-26
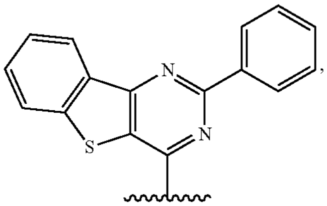,
E-27
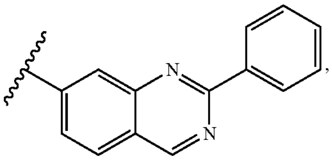,
E-28
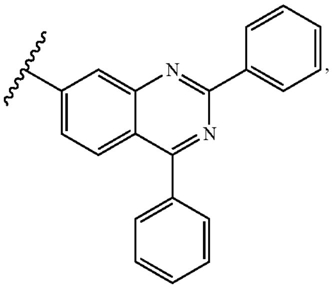,
E-29
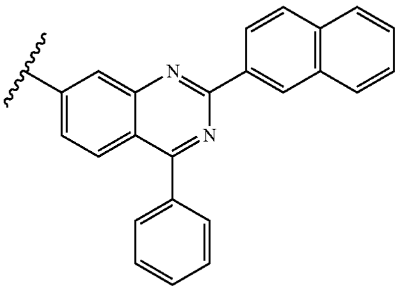,
E-30
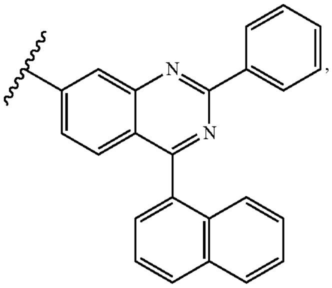, -continued
E-31
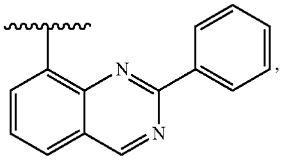
E-32
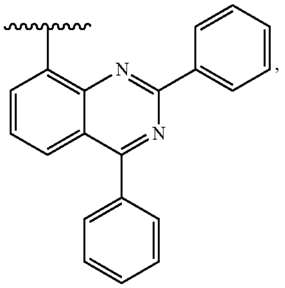
E-33
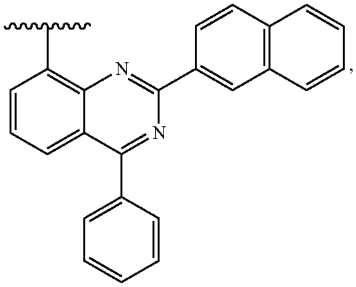
E-34
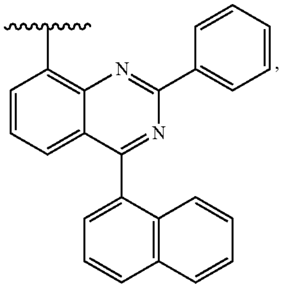
E-35
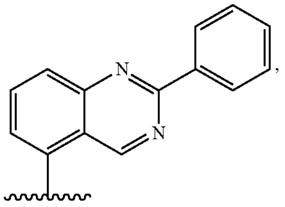
E-36
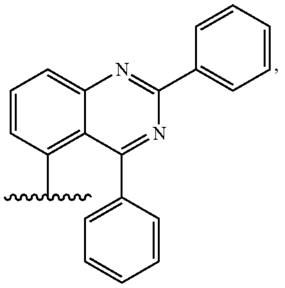
-continued
E-37
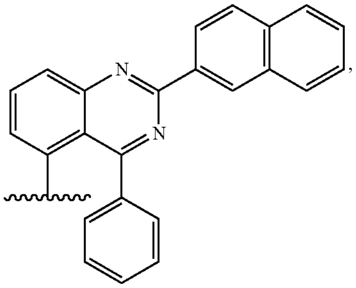
E-38
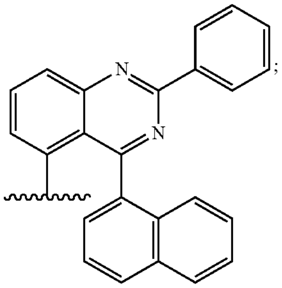
"" represents a position where the structure of E is joined to $L_1$.
11. The electroluminescent device according to claim 10, wherein the $L_1$ is selected from the group consisting of the following structures:
L-0
a single bond,
L-1
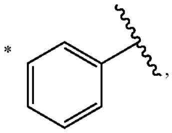
L-2
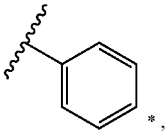
L-3
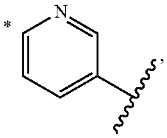
L-4
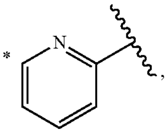
L-5
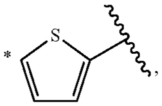

-continued

L-6

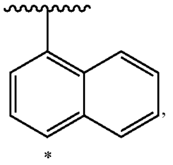

L-7

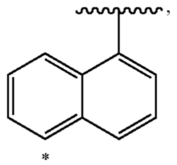

L-8

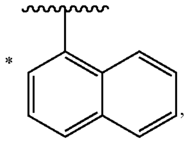

L-9

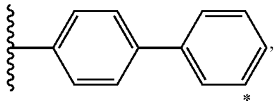

L-10

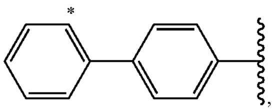

L-11

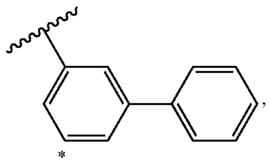

L-12

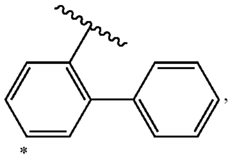

L-13

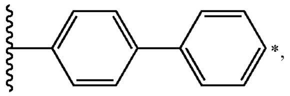

L-14

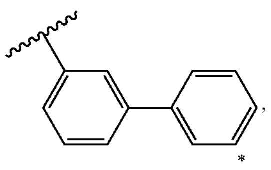

L-15

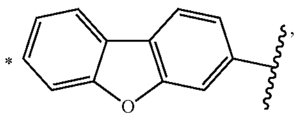

L-16

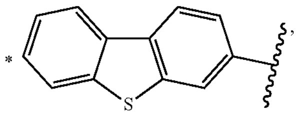

-continued

L-17

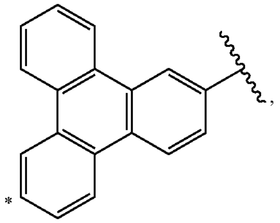

L-18

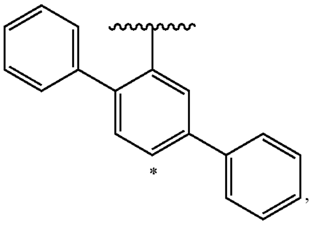

L-19

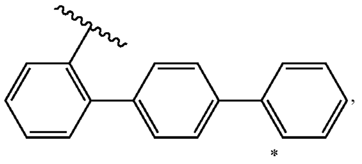

L-20

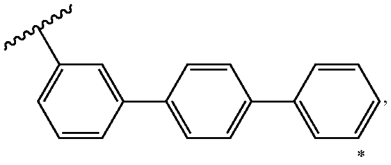

L-21

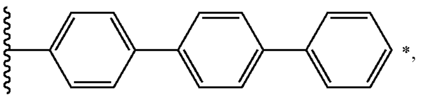

L-22

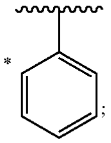

wherein "*" represents a position where the structure of $L_1$ is joined to Formula H, and "~~~" represents a position where the structure of $L_1$ is joined to E; and optionally, hydrogen in the above structures of L-1 to L-22 can be partially or fully substituted with deuterium.

12. The electroluminescent device according to claim 11, wherein the first compound has the structure of H-$L_1$-E, wherein the H is selected from any one of the group consisting of H-1 to H-76, the $L_1$ is selected from any one of the group consisting of L-0 to L-22, and the E is selected from any one of the group consisting of E-1 to E-38; optionally, hydrogen in the structure of the first compound can be partially or fully substituted with deuterium.

13. The electroluminescent device according to claim 1, wherein in Formula 1-1-1, Formula 1-1-3, Formula 1-1-4, Formula 1-2-5, and Formula 1-4 to Formula 1-14, $X_1$ to $X_6$ are, at each occurrence identically or differently, selected from $CR_x$, and $Y_1$ to $Y_6$ are, at each occurrence identically or differently, selected from C or $CR_y$.

14. The electroluminescent device according to claim 1, wherein in Formula 1-1-3, Formula 1-1-4, Formula 1-2-5, Formula 1-4 to Formula 1-14, at least one of $X_1$ to $X_6$ is selected from N.

15. The electroluminescent device according to claim 1, wherein in Formula 1-1-1, Formula 1-1-3, Formula 1-1-4, Formula 1-2-5, and Formula 1-4 to Formula 1-14, at least two adjacent substituents $R_y$ in $Y_1$ to $Y_6$ are joined to form a ring.

16. The electroluminescent device according to claim 1, wherein the $L_a$ is, at each occurrence identically or differently, selected from a structure represented by any one of Formula 1-1-1, Formula 1-1-4, Formula 1-2-5, Formula 1-5, and Formula 1-6 to Formula 1-8.

17. The electroluminescent device according to claim 1, wherein the $L_a$ is, at each occurrence identically or differently, selected from any one of the group consisting of Formula 1-1-1, Formula 1-1-3, Formula 1-1-4, Formula 1-2-5, Formula 1-5-1 to Formula 1-5-4, Formula 1-6-1, Formula 1-6-2, Formula 1-7-1, Formula 1-7-2, Formula 1-8-1, Formula 1-9-1 to Formula 1-9-3, Formula 1-10-1 to Formula 1-10-3, and Formula 1-12-1 to Formula 1-12-3:

Formula 1-1-1

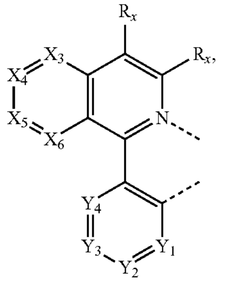

Formula 1-1-3

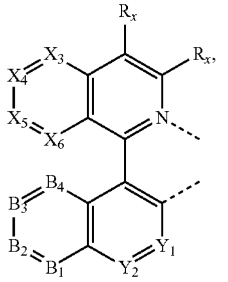

Formula 1-1-4

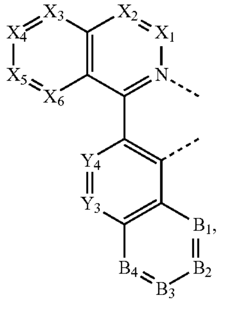

-continued

Formula 1-2-5

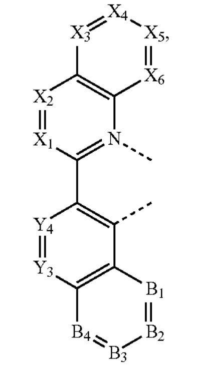

Formula 1-5-1

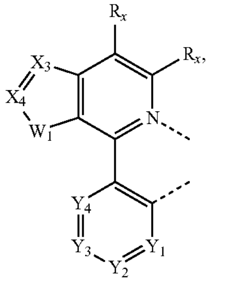

Formula 1-5-2

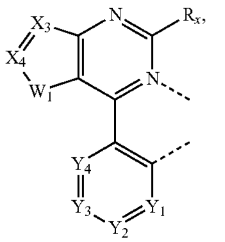

Formula 1-5-3

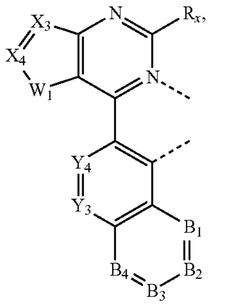

Formula 1-5-4

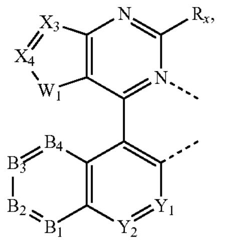

-continued
Formula 1-6-1
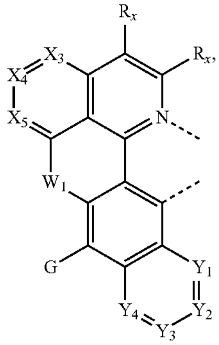
Formula 1-6-2
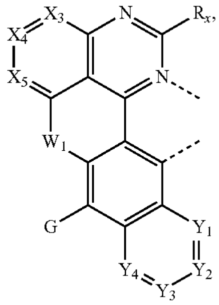
Formula 1-7-1
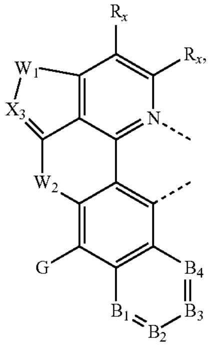
Formula 1-7-2
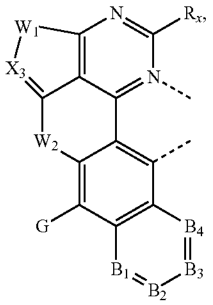
Formula 1-8-1
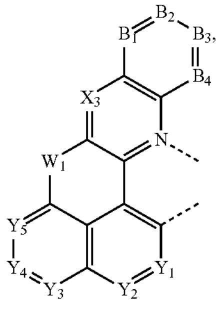
-continued
Formula 1-9-1
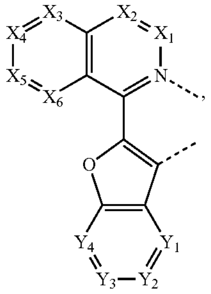
Formula 1-9-2
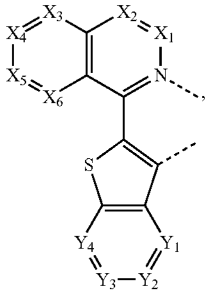
Formula 1-9-3
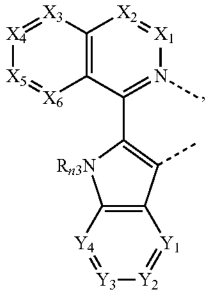
Formula 1-10-1
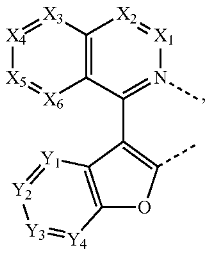
Formula 1-10-2
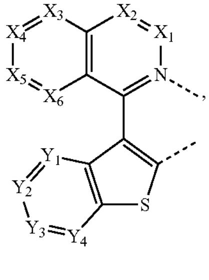

-continued

Formula 1-10-3

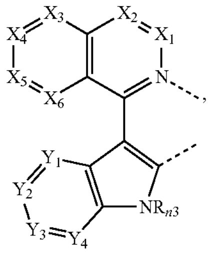

Formula 1-12-1

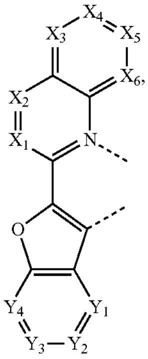

Formula 1-12-2

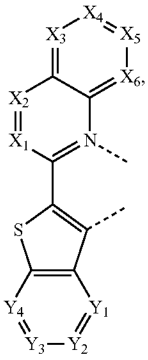

Formula 1-12-3

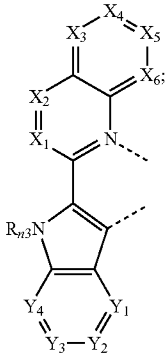

wherein in Formula 1-1-1, $X_3$ to $X_6$ are, at each occurrence identically or differently, selected from $CR_x$;

in Formula 1-1-3, Formula 1-1-4, Formula 1-2-5, Formula 1-5-1 to Formula 1-5-4, Formula 1-6-1 to Formula 1-6-2, Formula 1-7-1 to Formula 1-7-2, Formula 1-8-1, Formula 1-9-1 to Formula 1-9-3, Formula 1-10-1 to Formula 1-10-3, Formula 1-12-1 to Formula 1-12-3, $X_1$ to $X_6$ are, at each occurrence identically or differently, selected from $CR_x$ or N;

$Y_1$ to $Y_5$ are, at each occurrence identically or differently, selected from $CR_y$ or N;

$B_1$ to $B_4$ are, at each occurrence identically or differently, selected from $CR_b$ or N;

$W_1$ and $W_2$ are, at each occurrence identically or differently, selected from $SiR_wR_w$, $GeR_wR_w$, $PR_w$, O, S or Se; wherein when two $R_w$ are present at the same time, the two $R_w$ may be identical or different;

G, $R_x$, $R_y$, $R_w$, $R_b$ and $R_{n3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

in Formula 1-1-1, Formula 1-2-5, Formula 1-5-1 to Formula 1-5-4, Formula 1-6-1, Formula 1-6-2, Formula 1-7-1 and Formula 1-7-2, at least one of $X_3$ to $X_n$ is selected from $CR_x$, wherein the $X_n$ corresponds to one of $X_3$ to $X_6$ that has the largest number in any one of Formula 1-1-1, Formula 1-2-5, Formula 1-5-1 to Formula 1-5-4, Formula 1-6-1, Formula 1-6-2, Formula 1-7-1 and Formula 1-7-2, and the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, cyano, isocyano and combinations thereof;

in Formula 1-6-1 and Formula 1-7-1, G is, at each occurrence identically or differently, selected from the group consisting of: NRR, OR and SR; wherein the R is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted aryl having 6 to 30 carbon atoms, substituted or unsubstituted heteroaryl having 3 to 30 carbon atoms and combinations thereof;

adjacent substituents G, $R_x$, $R_y$, $R_b$, $R_w$, $R_{n3}$, R can be optionally joined to form a ring.

18. The electroluminescent device according to claim 1, wherein in Formula 1-1-1, Formula 1-1-3, Formula 1-1-4, Formula 1-2-5, and Formula 1-4 to Formula 1-14, at least one or two of $X_1$ to $X_6$ are, at each occurrence identically or differently, selected from $CR_x$, and/or at least one or two of $Y_1$ to $Y_6$ are, at each occurrence identically or differently, selected from $CR_y$, wherein the $R_x$ and $R_y$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

19. The electroluminescent device according to claim 1, wherein $W_1$ is, at each occurrence identically or differently, selected from O or S.

20. The electroluminescent device according to claim 1, wherein $L_a$ is, at each occurrence identically or differently, selected from the group consisting of the following structures:

$L_{a139}$

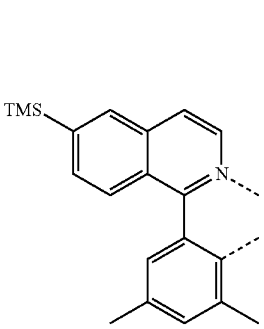

,

-continued $L_{a140}$

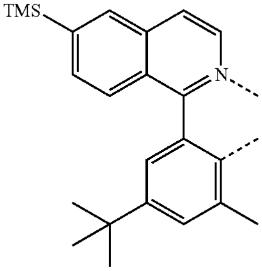

, $L_{a141}$

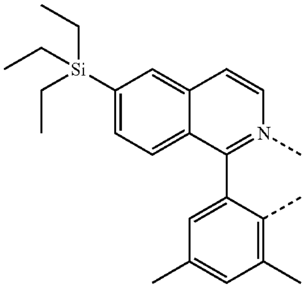

, $L_{a142}$

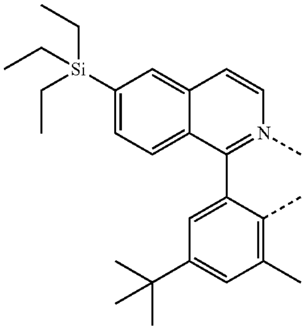

, $L_{a143}$

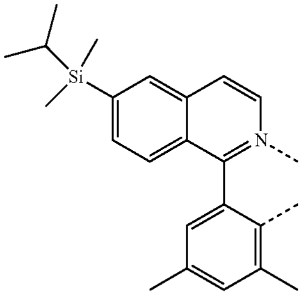

, $L_{a144}$

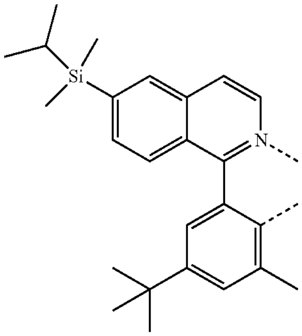

,

-continued
$L_{a145}$
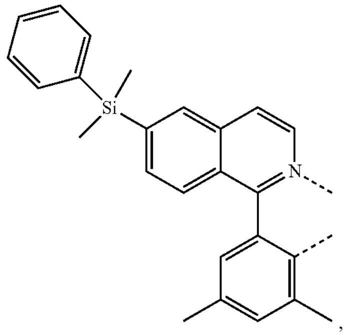
$L_{a146}$
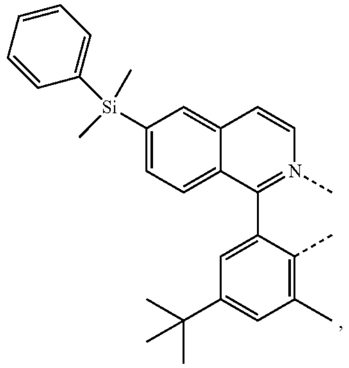
$L_{a147}$
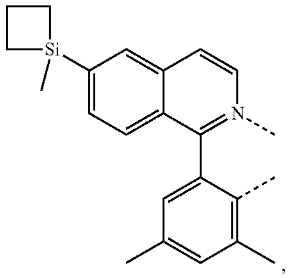
$L_{a148}$
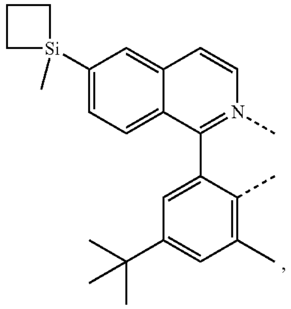
$L_{a149}$
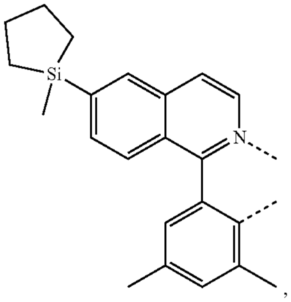
-continued
$L_{a150}$
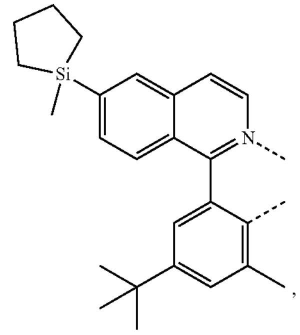
$L_{a151}$
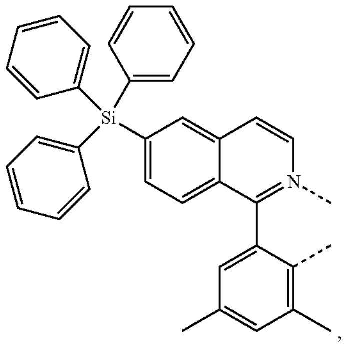
$L_{a152}$
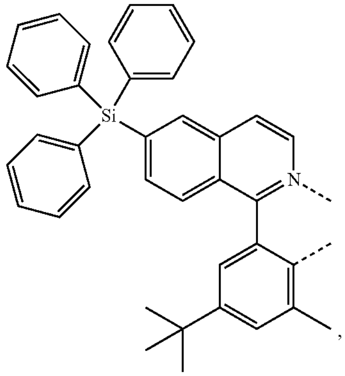
$L_{a153}$
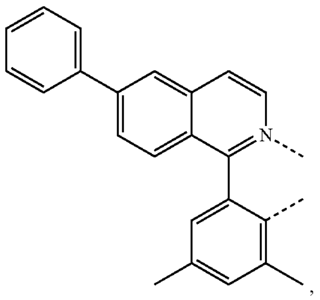

L$_{a154}$
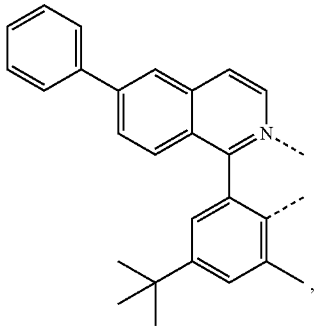
L$_{a155}$
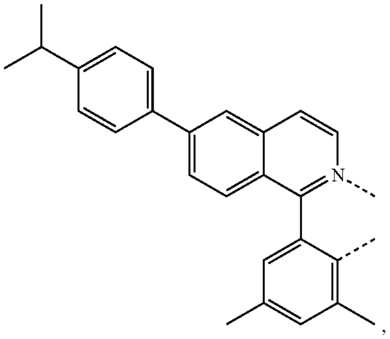
L$_{a156}$
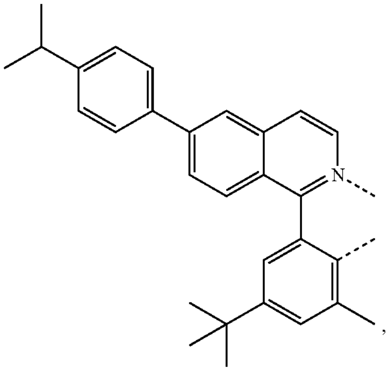
L$_{a157}$
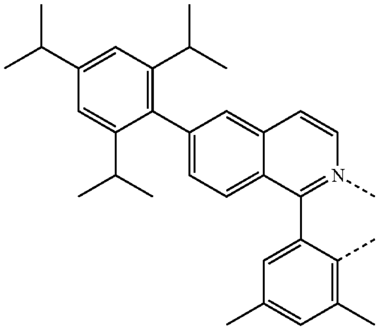
L$_{a158}$
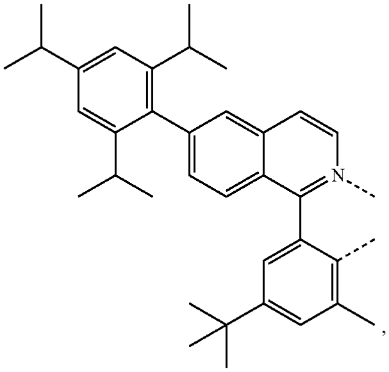
L$_{a159}$
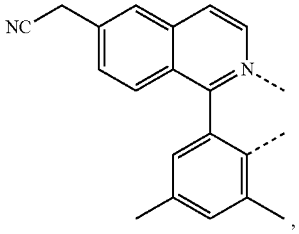
L$_{a160}$
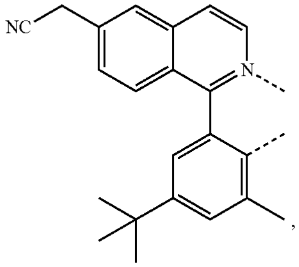
L$_{a161}$
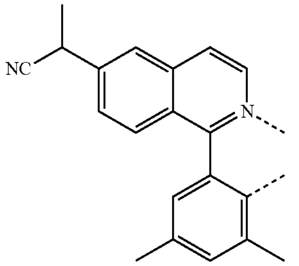
L$_{a162}$
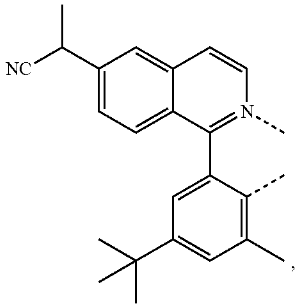

L$_{a163}$
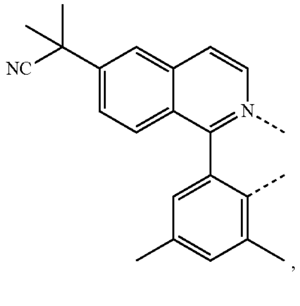
L$_{a164}$
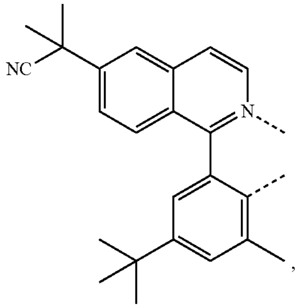
L$_{a165}$
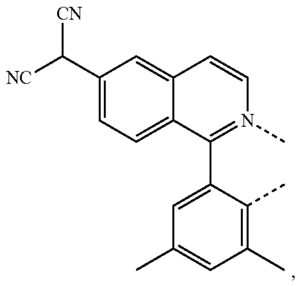
L$_{a166}$
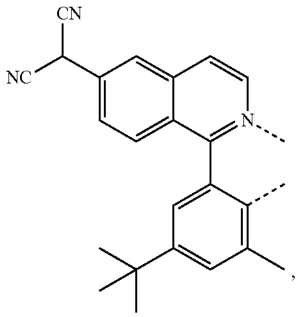
L$_{a167}$
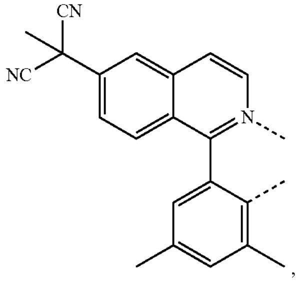
L$_{a168}$
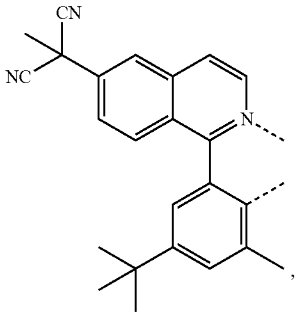
L$_{a169}$
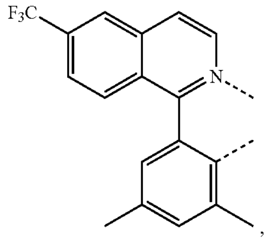
L$_{a170}$
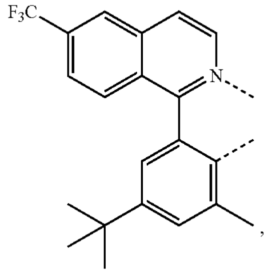
L$_{a171}$
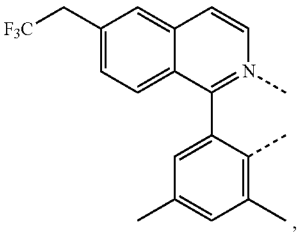
L$_{a172}$
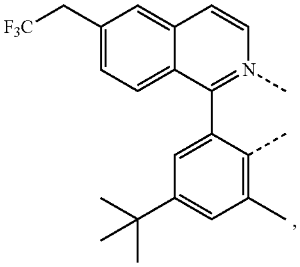

-continued
$L_{a173}$
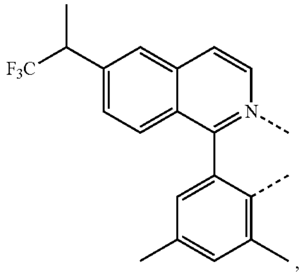
$L_{a174}$
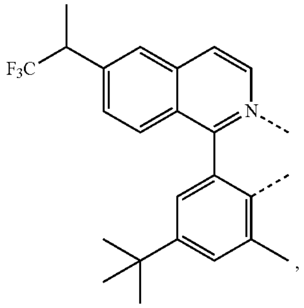
$L_{a175}$
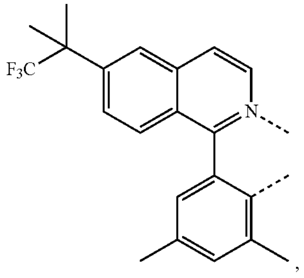
$L_{a176}$
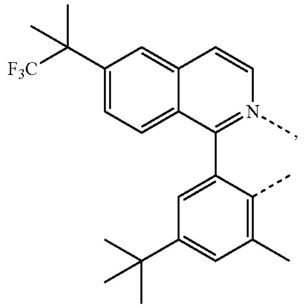
$L_{a177}$
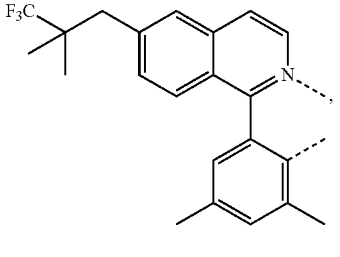
-continued
$L_{a178}$
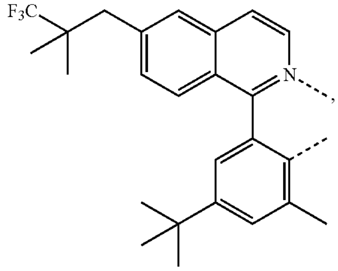
$L_{a179}$
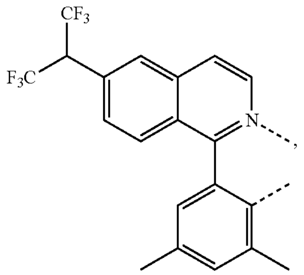
$L_{a180}$
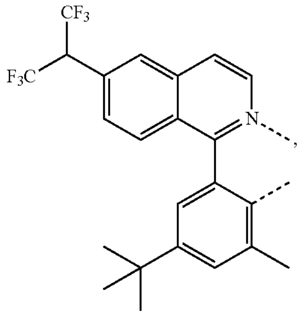
$L_{a181}$
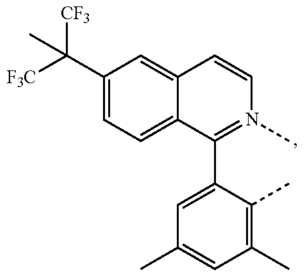
$L_{a182}$
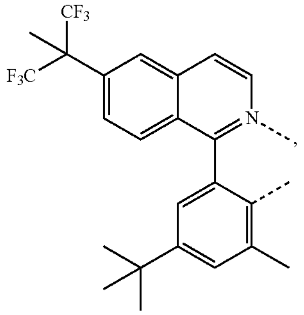

-continued
$L_{a217}$
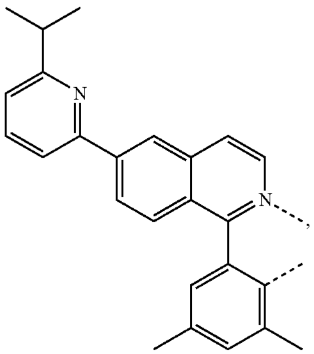
$L_{a218}$
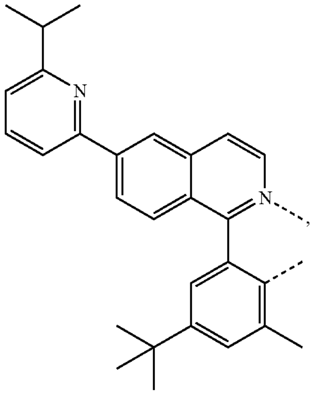
$L_{a219}$
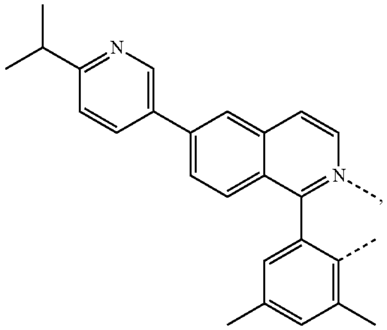
$L_{a220}$
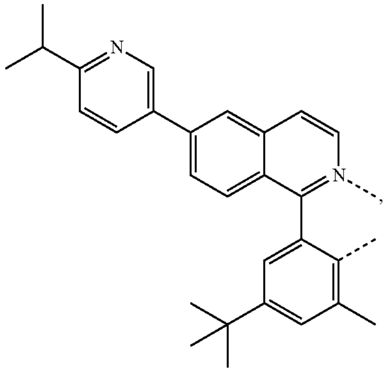
-continued
$L_{a221}$
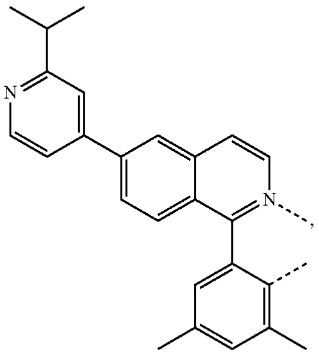
$L_{a222}$
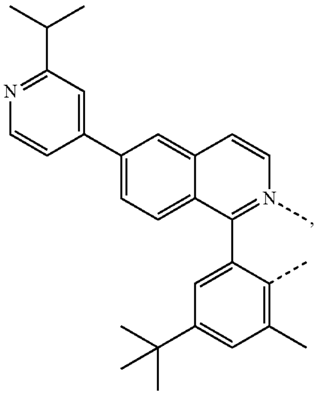
$L_{a223}$
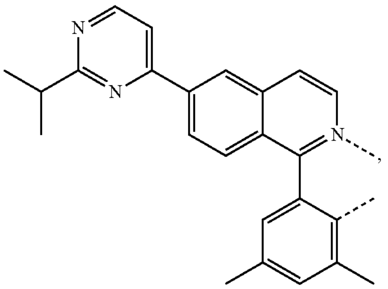
$L_{a224}$
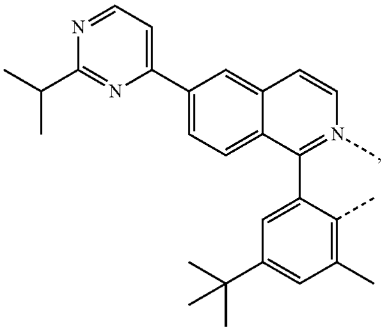

-continued
La225
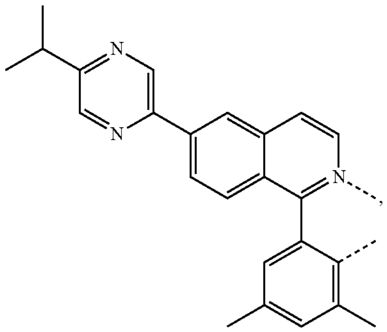
La226
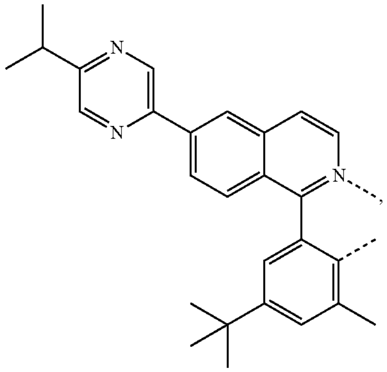
La227
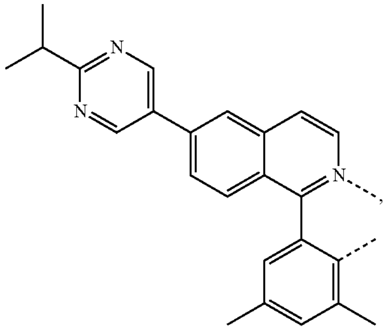
La228
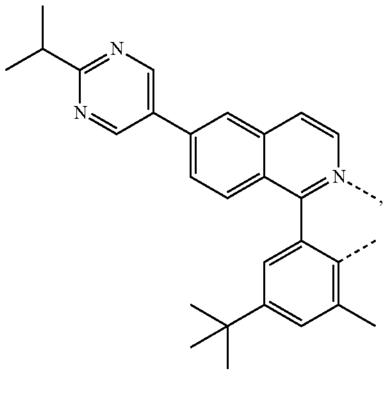
-continued
La229
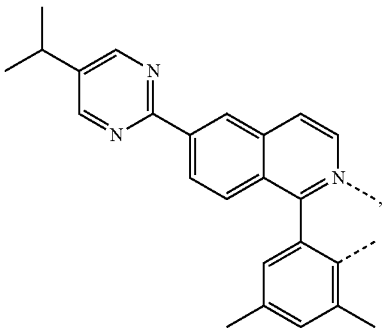
La230
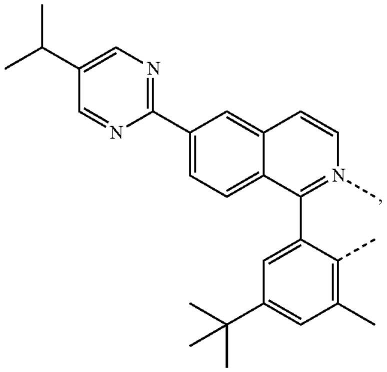
La231
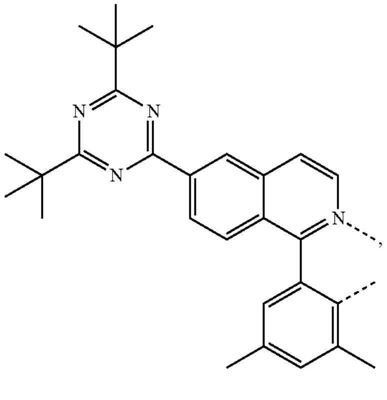
La232
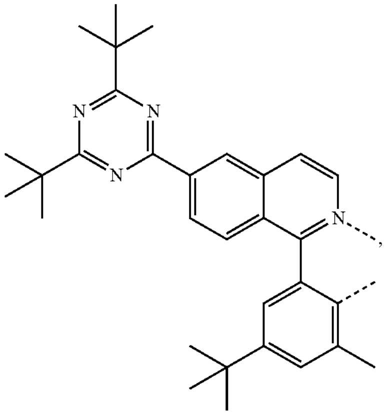

-continued
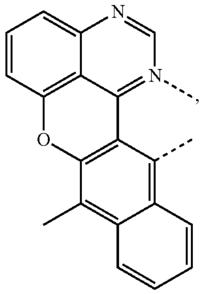
$L_{a263}$
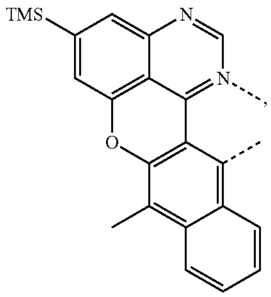
$L_{a264}$
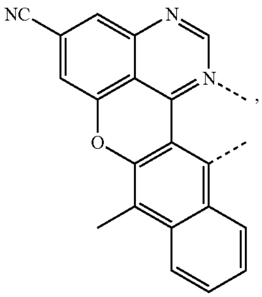
$L_{a265}$
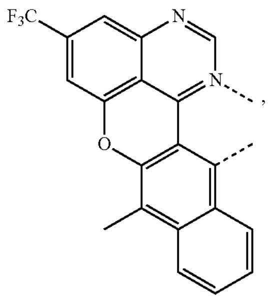
$L_{a266}$
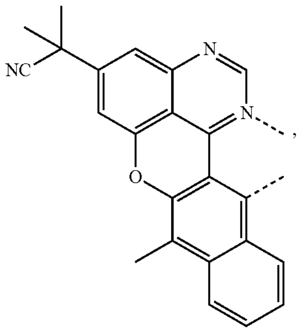
$L_{a267}$
-continued
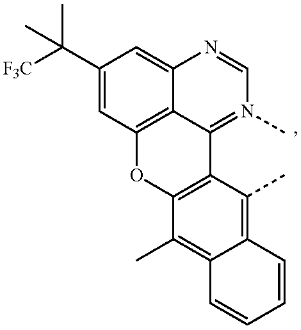
$L_{a268}$
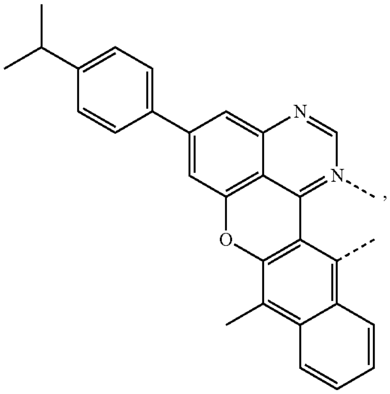
$L_{a269}$
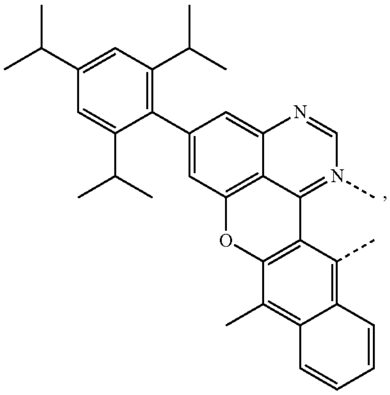
$L_{a270}$
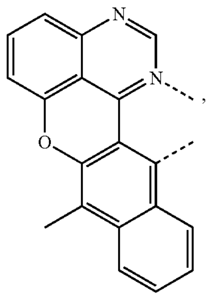
$L_{a271}$ -continued
$L_{a272}$
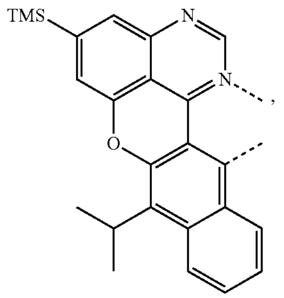
$L_{a273}$
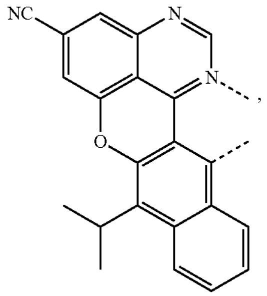
$L_{a274}$
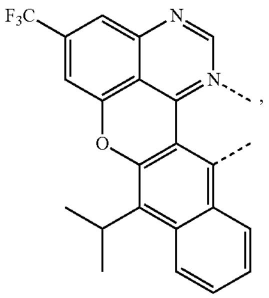
$L_{a275}$
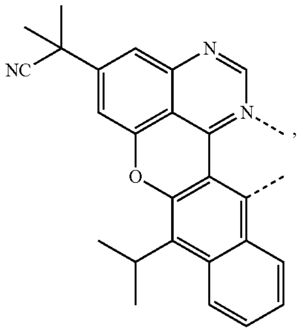
$L_{a276}$
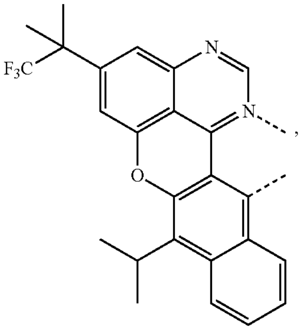
-continued
$L_{a277}$
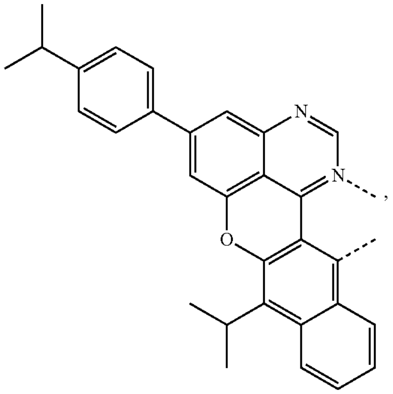
$L_{a278}$
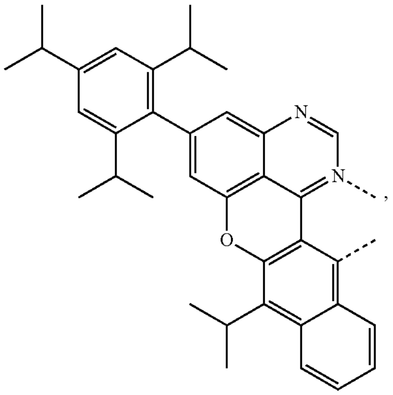
$L_{a279}$
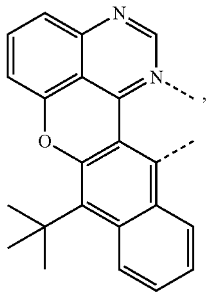
$L_{a280}$
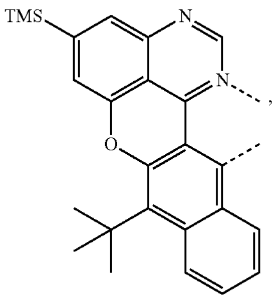

-continued
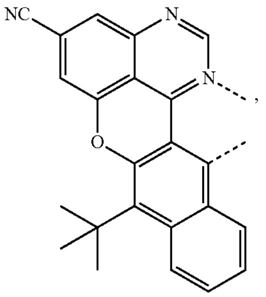
$L_{a281}$
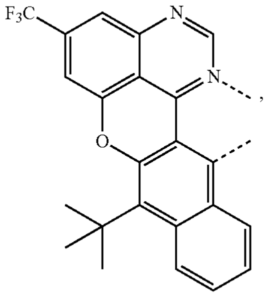
$L_{a282}$
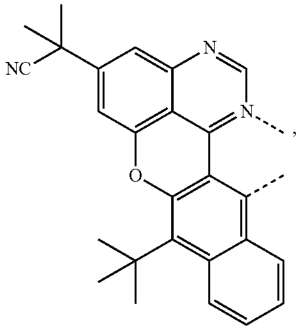
$L_{a283}$
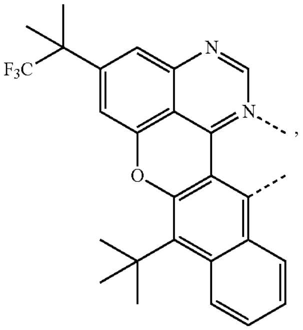
$L_{a284}$
-continued
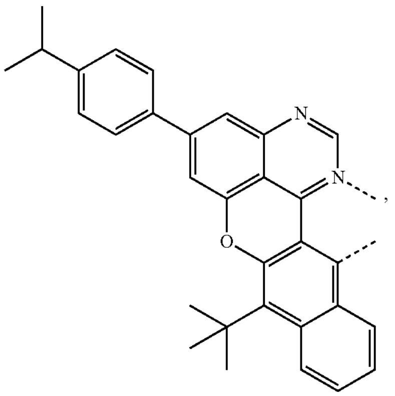
$L_{a285}$
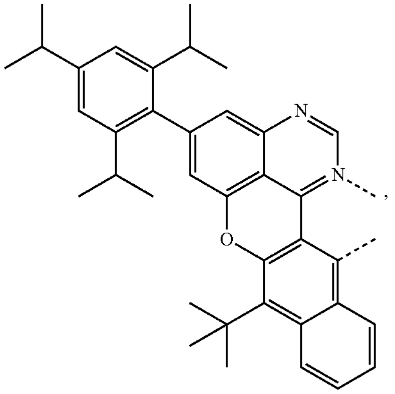
$L_{a286}$
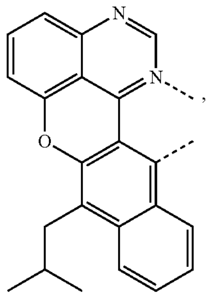
$L_{a287}$
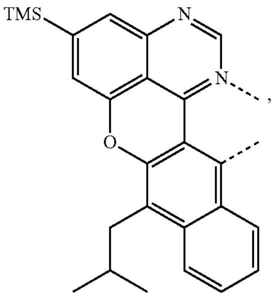
$L_{a288}$ -continued
$L_{a289}$
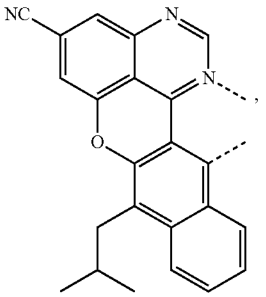
$L_{a290}$
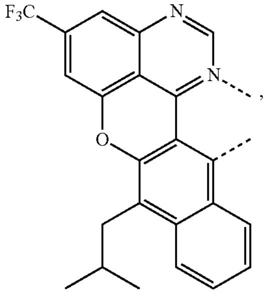
$L_{a291}$
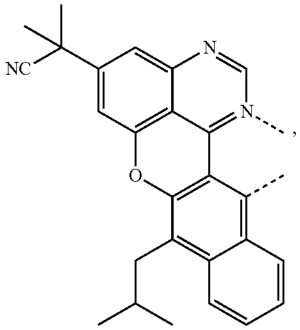
$L_{a292}$
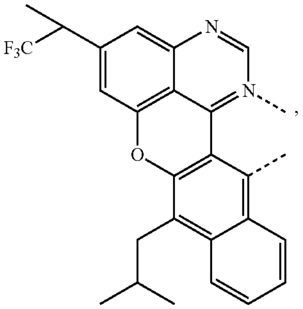
-continued
$L_{a293}$
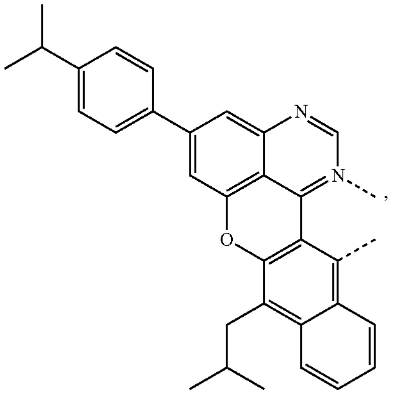
$L_{a294}$
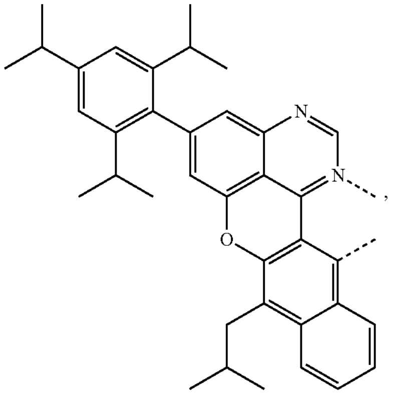
$L_{a295}$
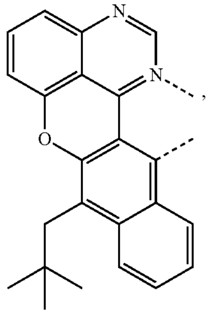
$L_{a296}$
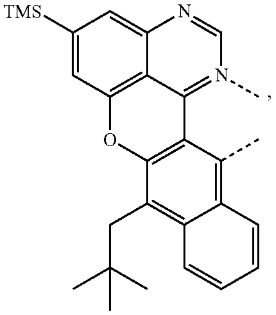

-continued
$L_{a297}$
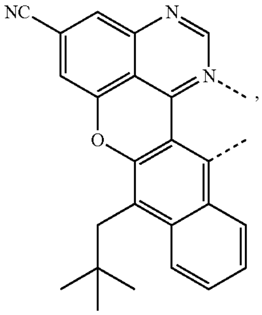
$L_{a298}$
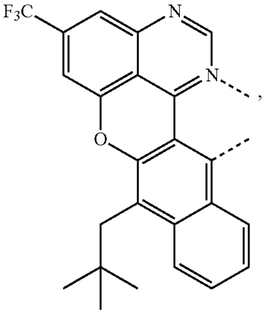
$L_{a299}$
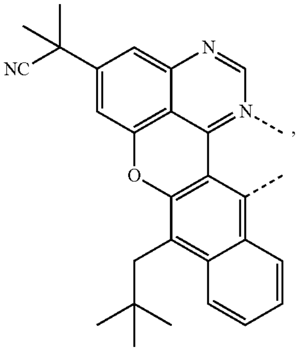
$L_{a300}$
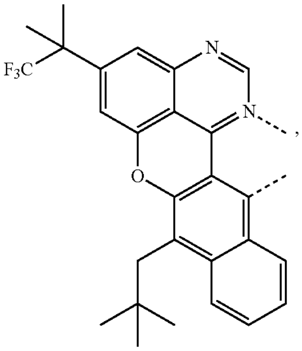
-continued
$L_{a301}$
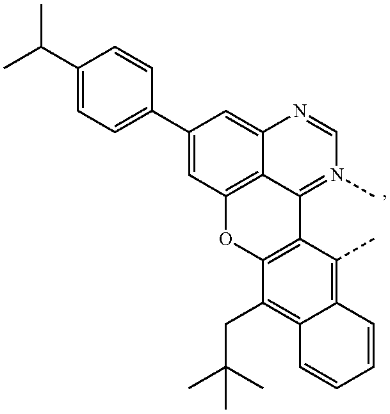
$L_{a302}$
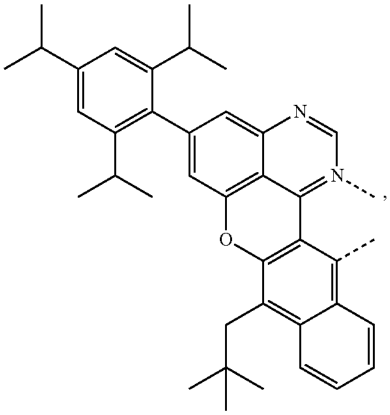
$L_{a303}$
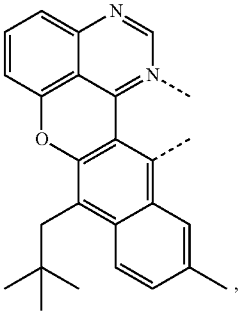
$L_{a304}$
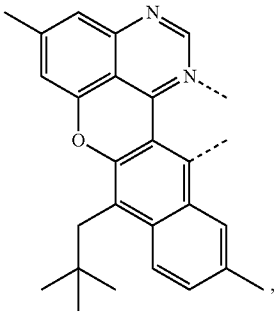

-continued
$L_{a305}$
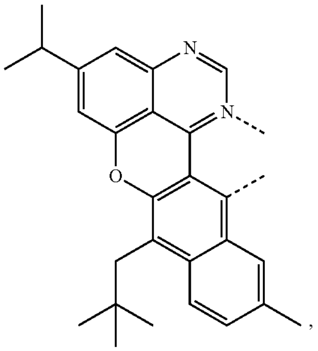
$L_{a306}$
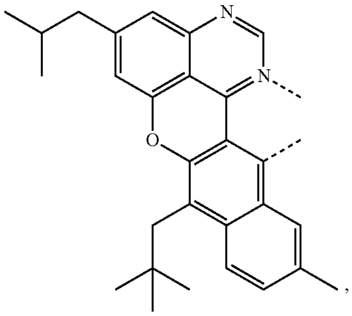
$L_{a307}$
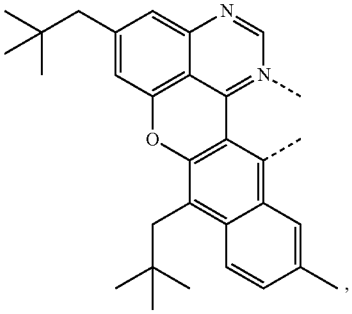
$L_{a308}$
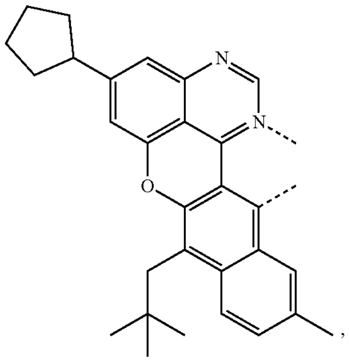
-continued
$L_{a309}$
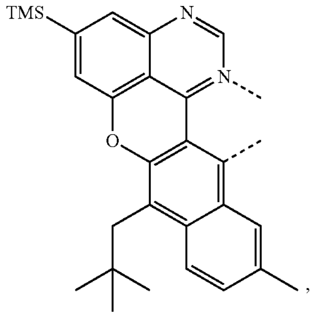
$L_{a310}$
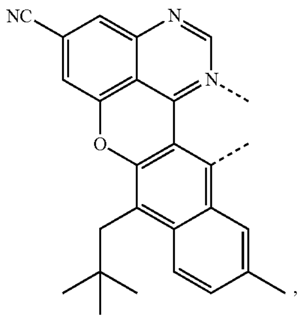
$L_{a311}$
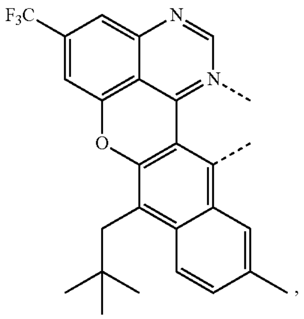
$L_{a312}$
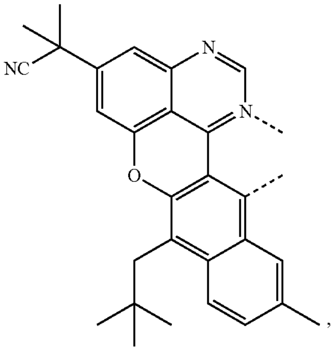

-continued
L$_{a313}$
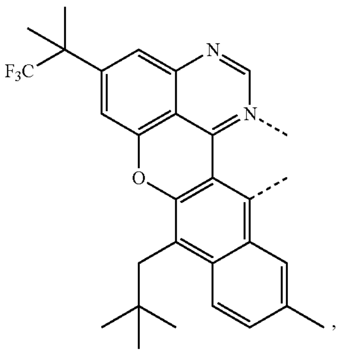
L$_{a314}$
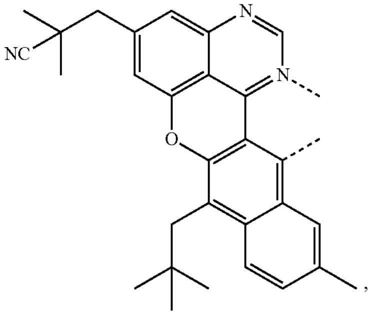
L$_{a315}$
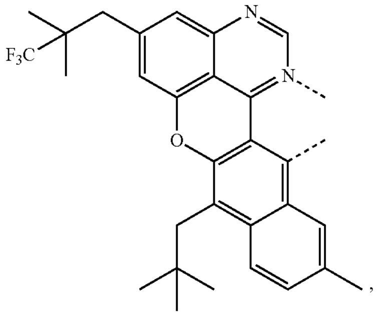
L$_{a316}$
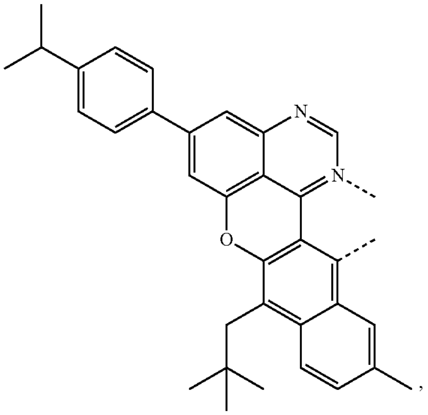
-continued
L$_{a317}$
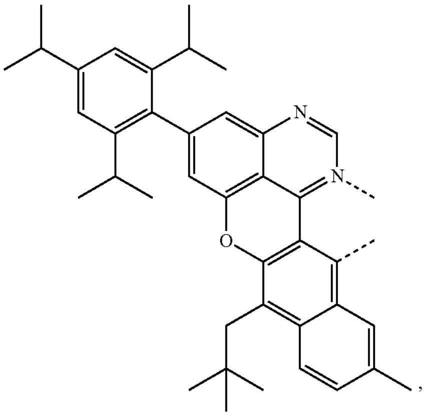
L$_{a318}$
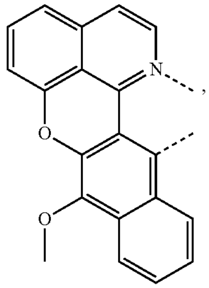
L$_{a319}$
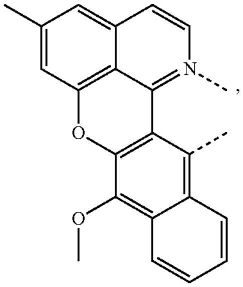
L$_{a320}$
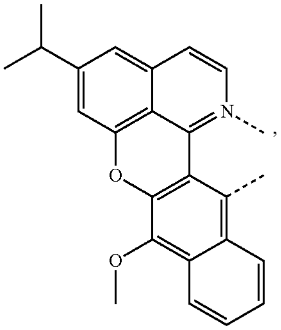
L$_{a321}$
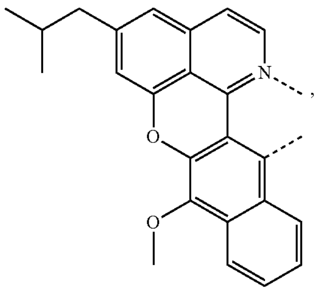

-continued
$L_{a322}$
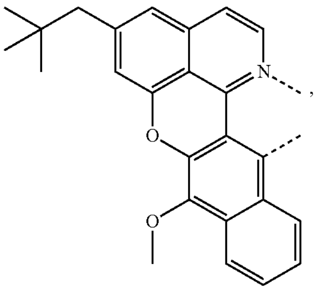
$L_{a323}$
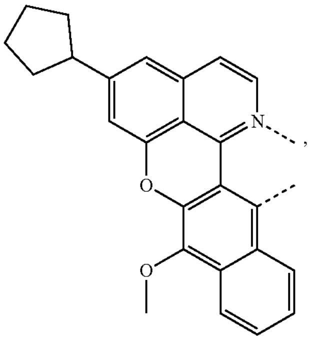
$L_{a324}$
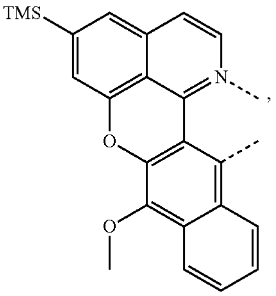
$L_{a325}$
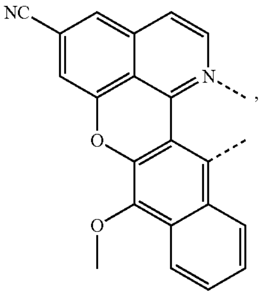
$L_{a326}$
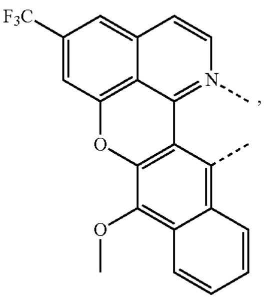
-continued
$L_{a327}$
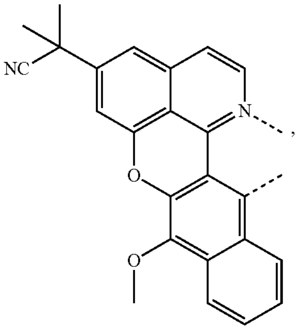
$L_{a328}$
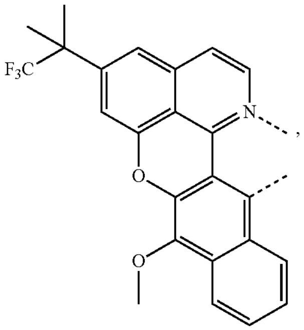
$L_{a329}$
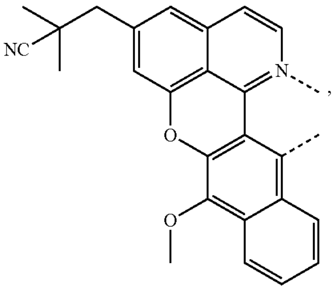
$L_{a330}$
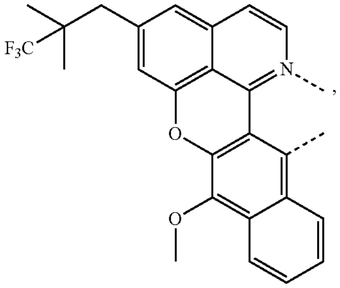
$L_{a331}$
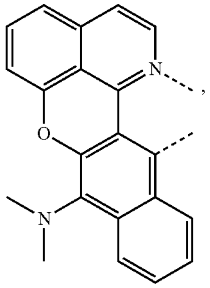

-continued
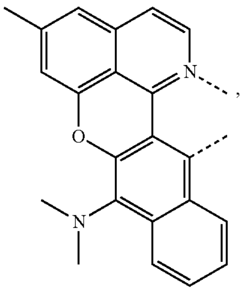
$L_{a332}$
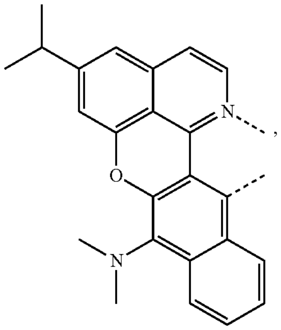
$L_{a333}$
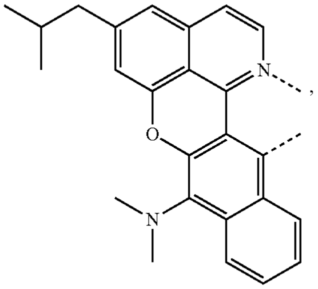
$L_{a334}$
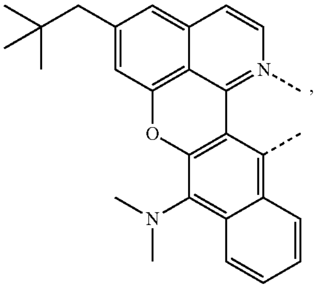
$L_{a335}$
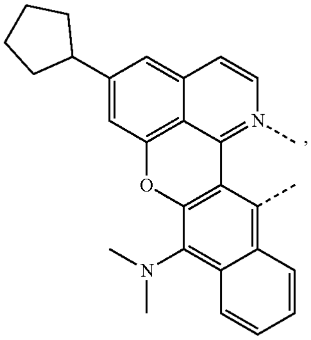
$L_{a336}$
-continued
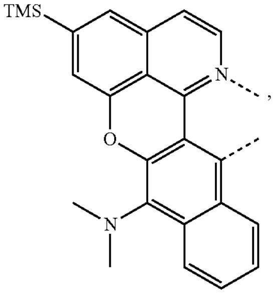
$L_{a337}$
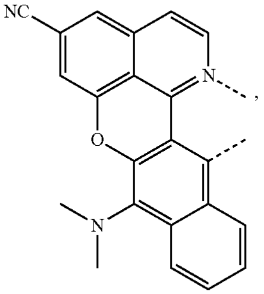
$L_{a338}$
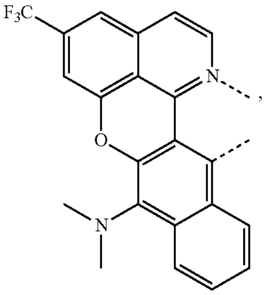
$L_{a339}$
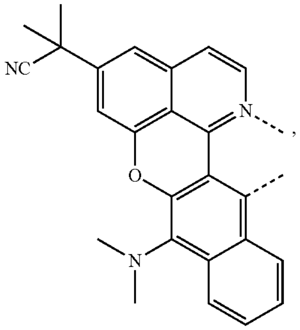
$L_{a340}$
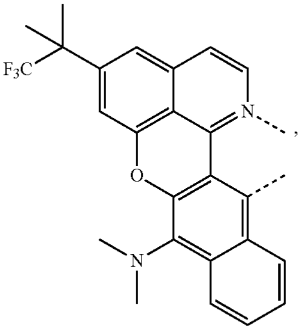
$L_{a341}$ -continued
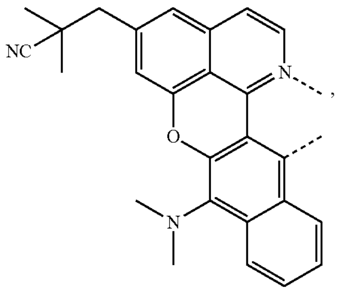
$L_{a342}$
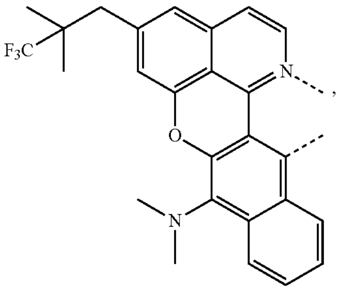
$L_{a343}$
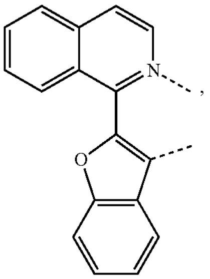
$L_{a344}$
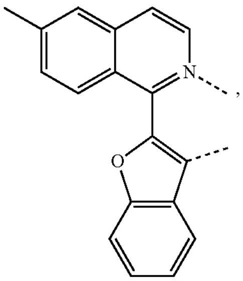
$L_{a345}$
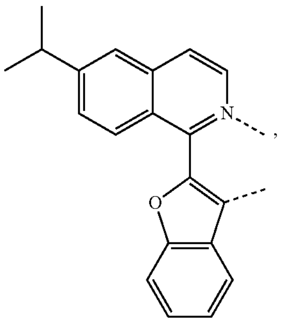
$L_{a346}$
-continued
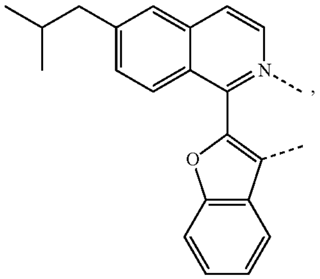
$L_{a347}$
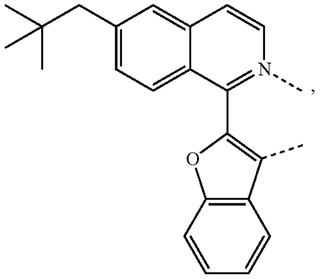
$L_{a348}$
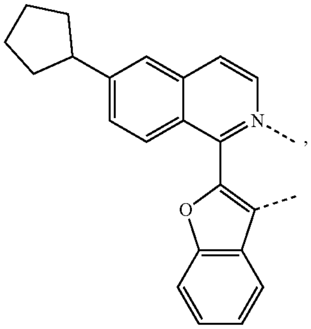
$L_{a349}$
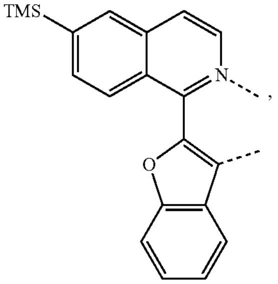
$L_{a350}$
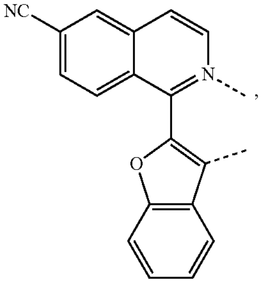
$L_{a351}$ -continued
$L_{a352}$
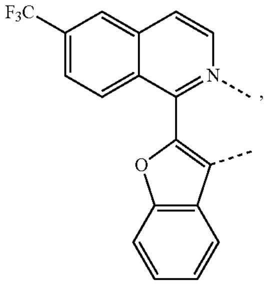
$L_{a353}$
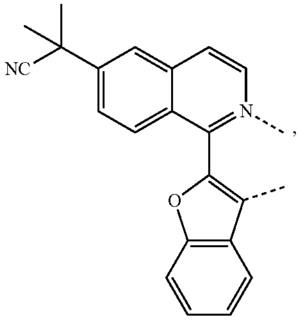
$L_{a354}$
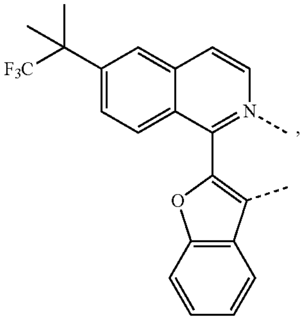
$L_{a355}$
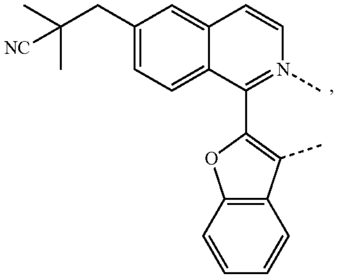
$L_{a356}$
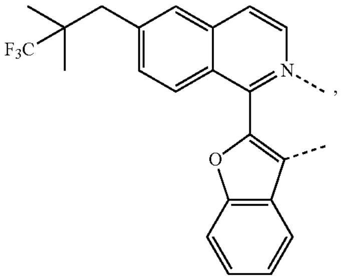
-continued
$L_{a357}$
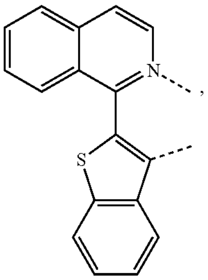
$L_{a358}$
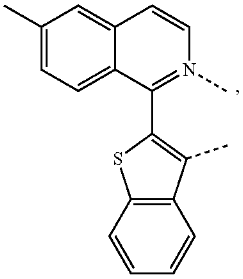
$L_{a359}$
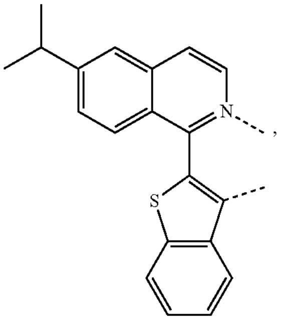
$L_{a360}$
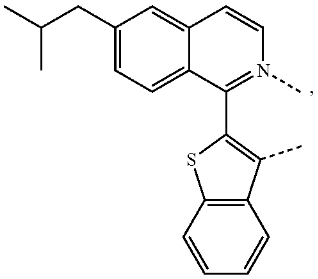
$L_{a361}$
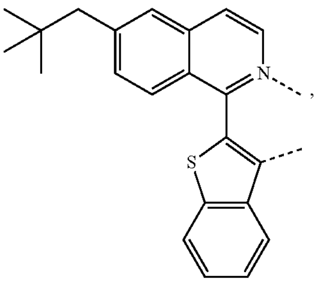

-continued
$L_{a362}$
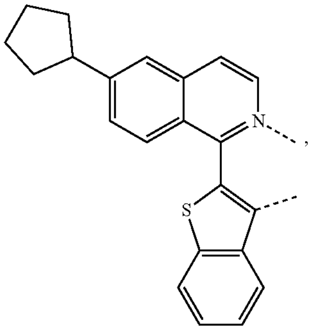
$L_{a363}$
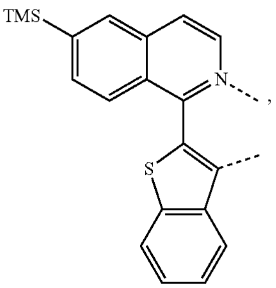
$L_{a364}$
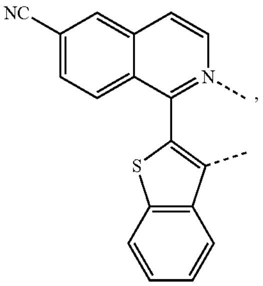
$L_{a365}$
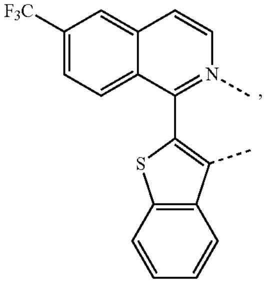
$L_{a366}$
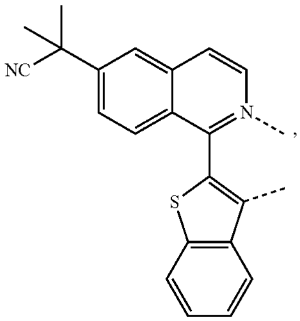
-continued
$L_{a367}$
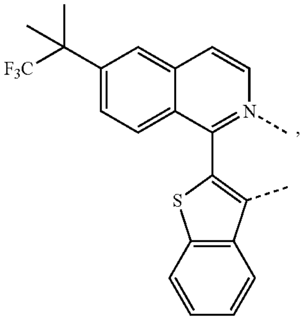
$L_{a368}$
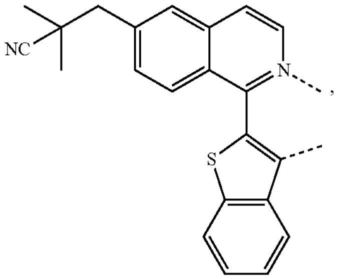
$L_{a369}$
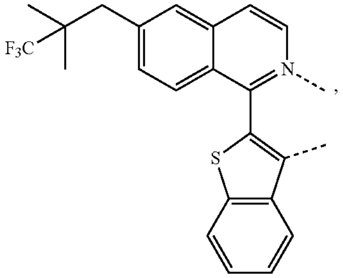
$L_{a370}$
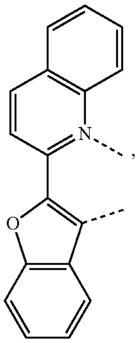
$L_{a371}$
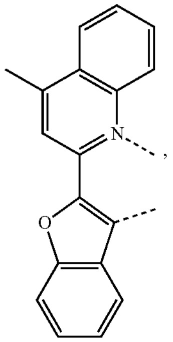

-continued
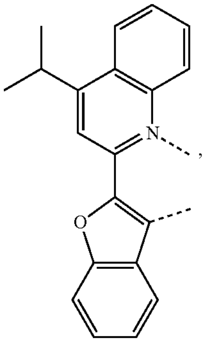
$L_{a372}$
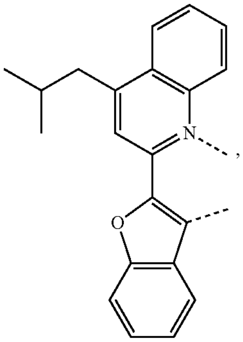
$L_{a373}$
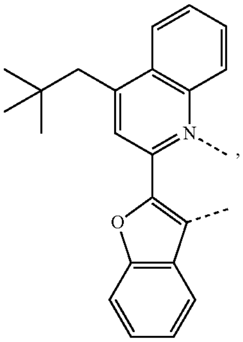
$L_{a374}$
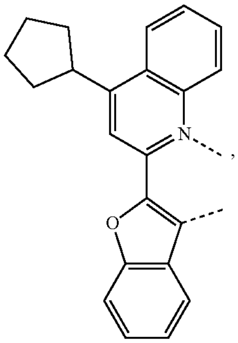
$L_{a375}$
-continued
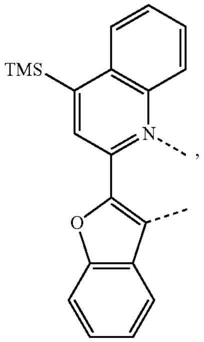
$L_{a376}$
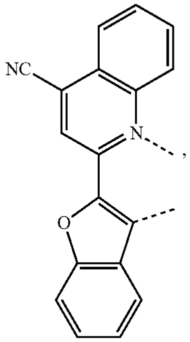
$L_{a377}$
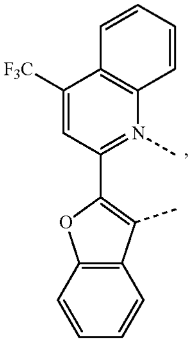
$L_{a378}$
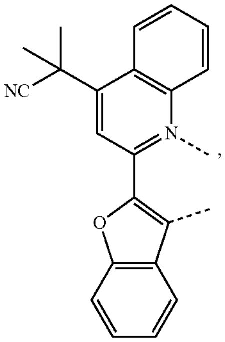
$L_{a379}$ $L_{a380}$
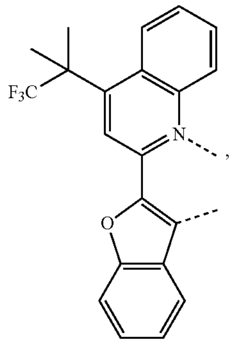
$L_{a381}$
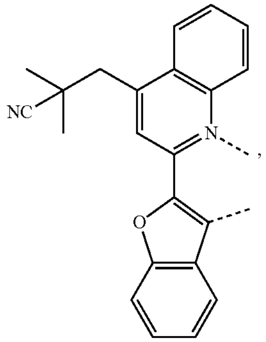
$L_{a382}$
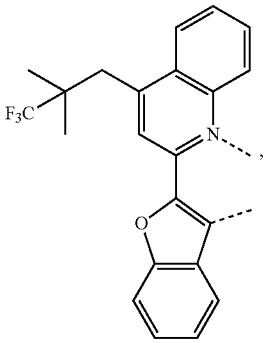
$L_{a383}$
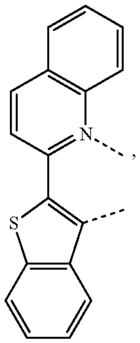
$L_{a384}$
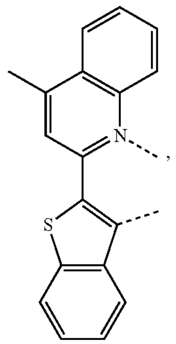
$L_{a385}$
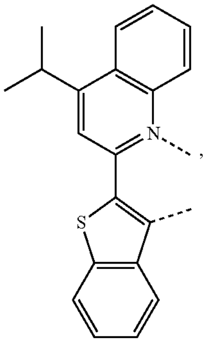
$L_{a386}$
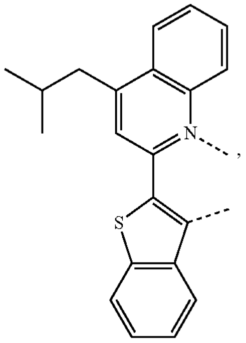
$L_{a387}$
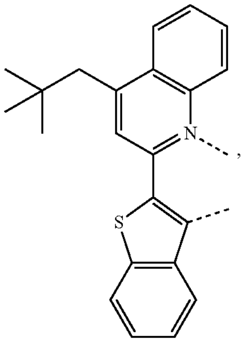

192
-continued
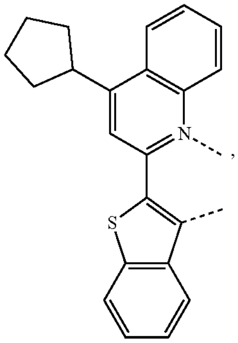
$L_{a388}$
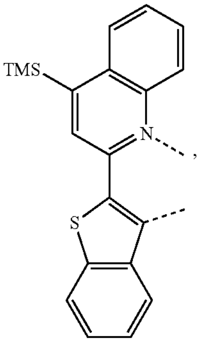
$L_{a389}$
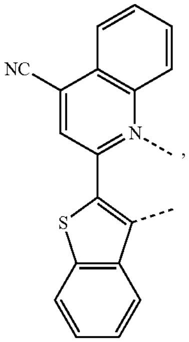
$L_{a390}$
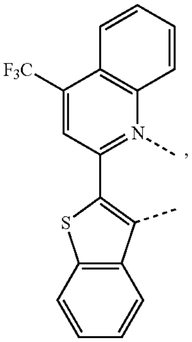
$L_{a391}$
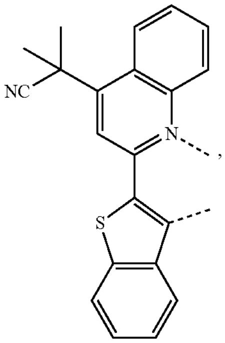
$L_{a392}$
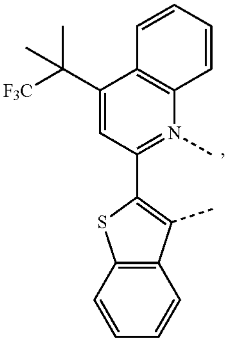
$L_{a393}$
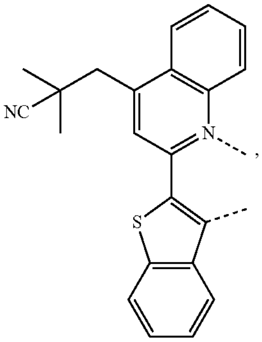
$L_{a394}$
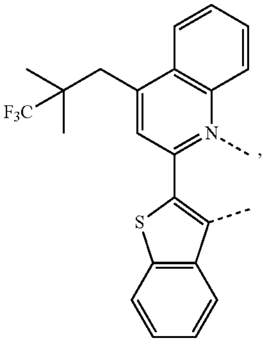
$L_{a395}$ -continued
$L_{a396}$
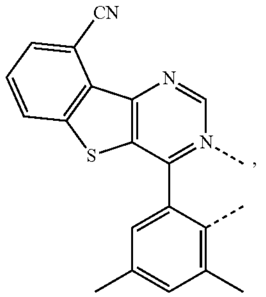
$L_{a397}$
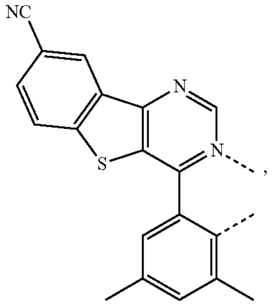
$L_{a398}$
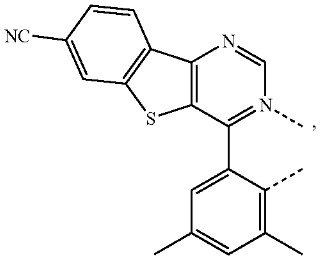
$L_{a399}$
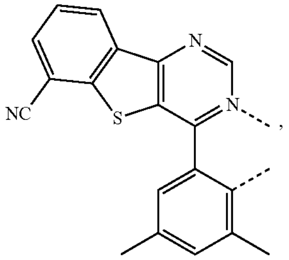
$L_{a400}$
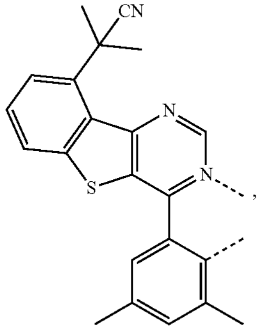
-continued
$L_{a401}$
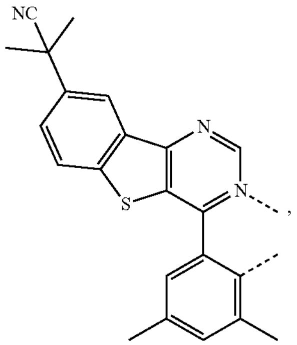
$L_{a402}$
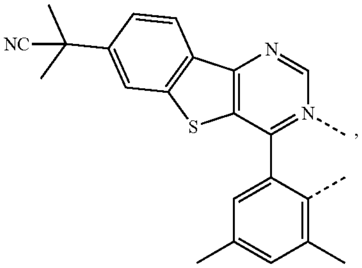
$L_{a403}$
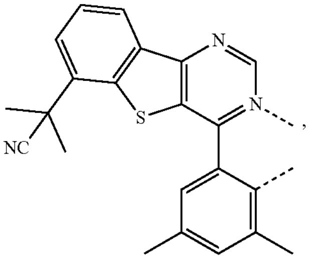
$L_{a404}$
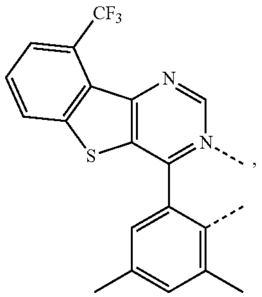
$L_{a405}$
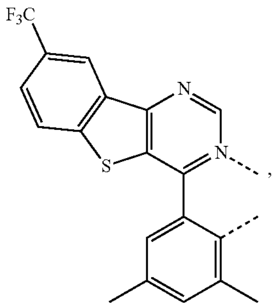

-continued
$L_{a406}$
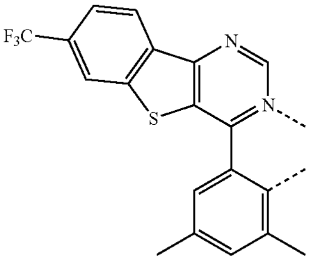
,
$L_{a407}$
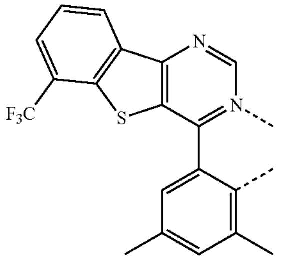
,
$L_{a408}$
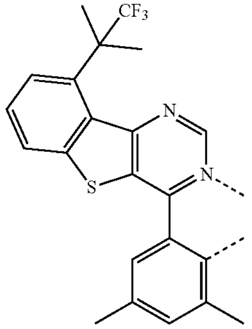
,
$L_{a409}$
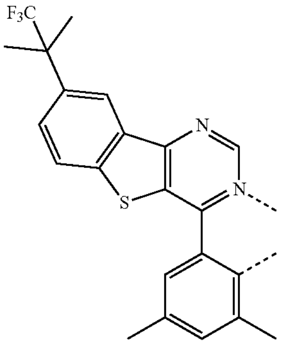
,
$L_{a410}$
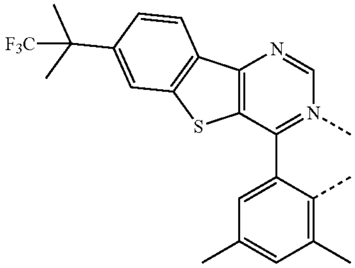
,
$L_{a411}$
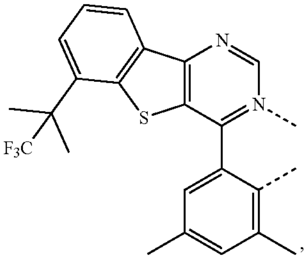
,
$L_{a412}$
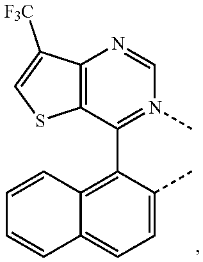
,
$L_{a413}$
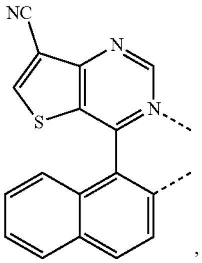
,
$L_{a414}$
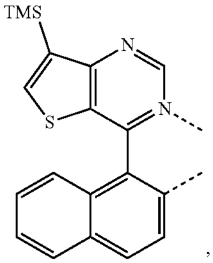
,
$L_{a415}$
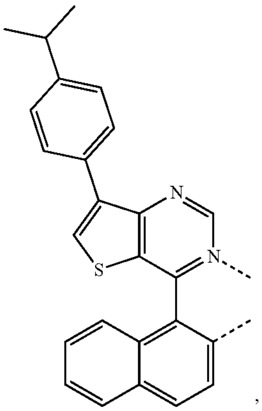
, -continued
$L_{a416}$
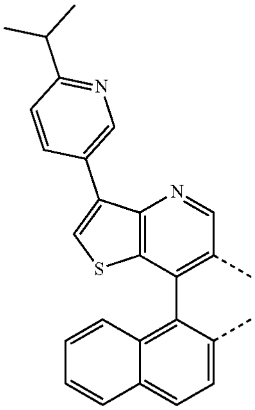
,
$L_{a417}$
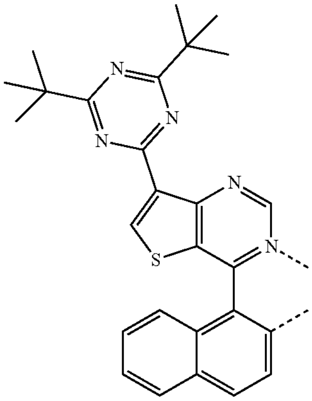
,
$L_{a418}$
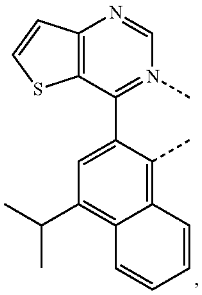
,
$L_{a419}$
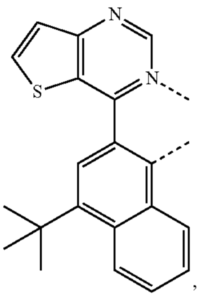
,
-continued
$L_{a420}$
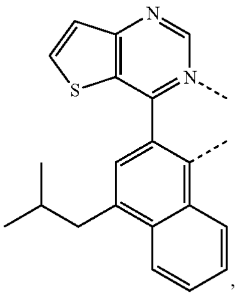
,
$L_{a421}$
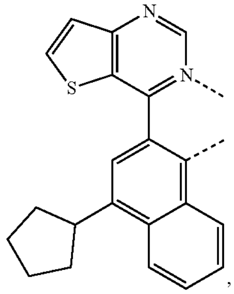
,
$L_{a422}$
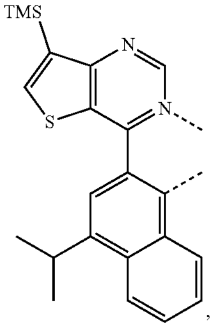
,
$L_{a423}$
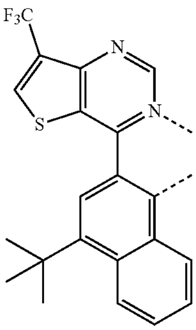
, -continued
$L_{a424}$
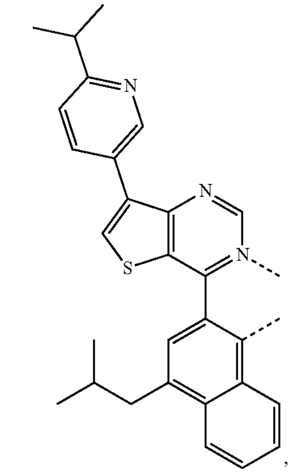
,
$L_{a425}$
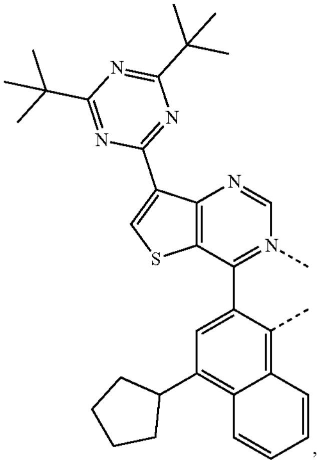
,
$L_{a426}$
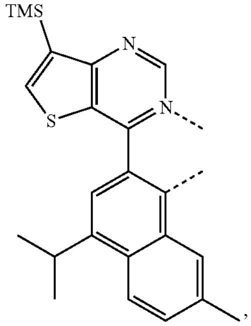
,
$L_{a427}$
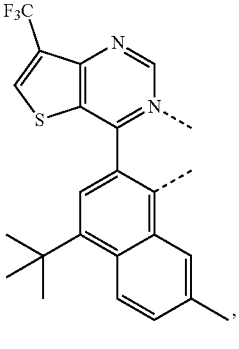
,
-continued
$L_{a428}$
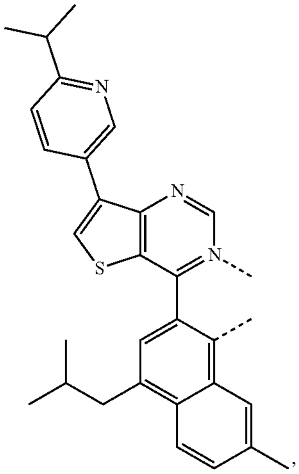
,
$L_{a429}$
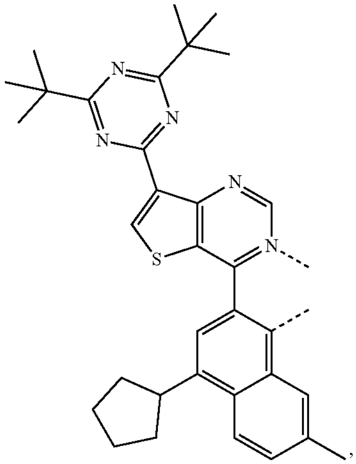
,
$L_{a430}$
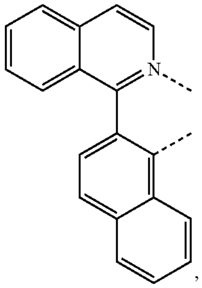
,
$L_{a431}$
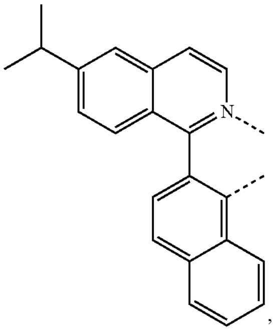
, -continued
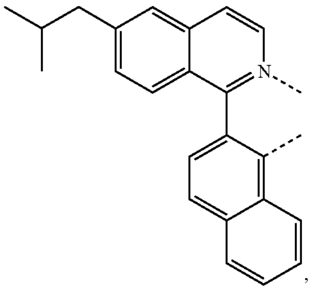
$L_{a432}$
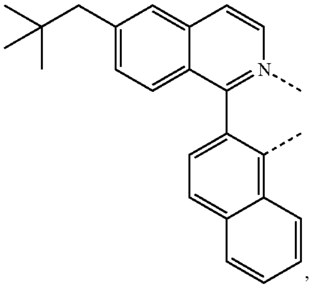
$L_{a433}$
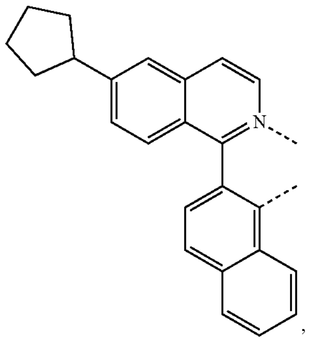
$L_{a434}$
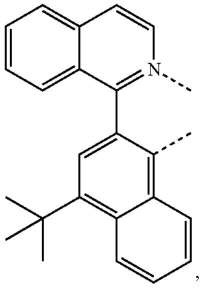
$L_{a435}$
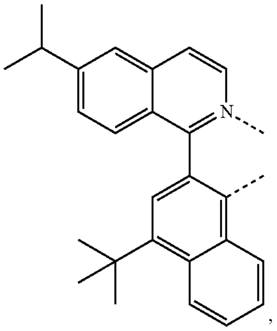
$L_{a436}$
-continued
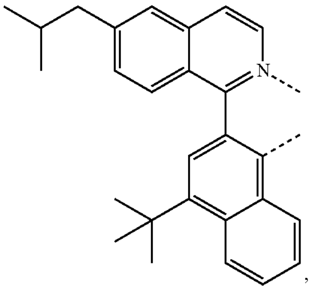
$L_{a437}$
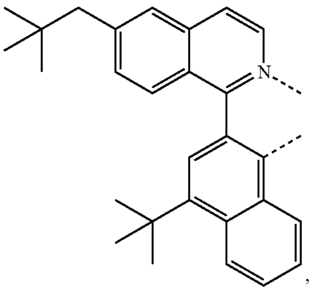
$L_{a438}$
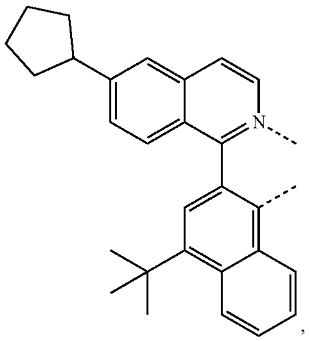
$L_{a439}$
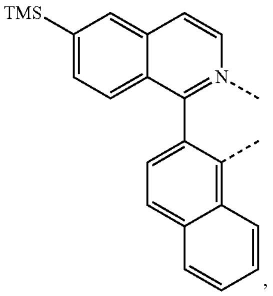
$L_{a440}$
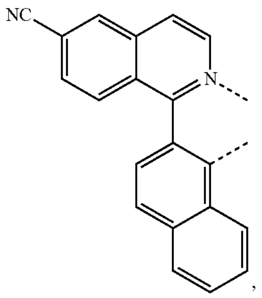
$L_{a441}$ -continued
$L_{a442}$
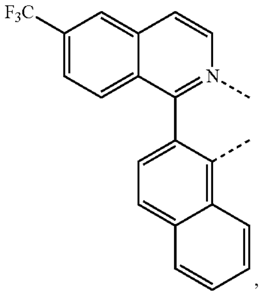
$L_{a443}$
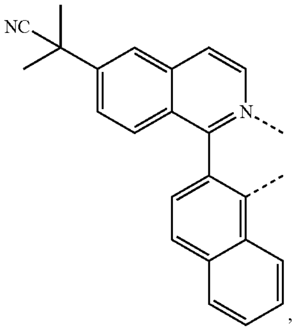
$L_{a444}$
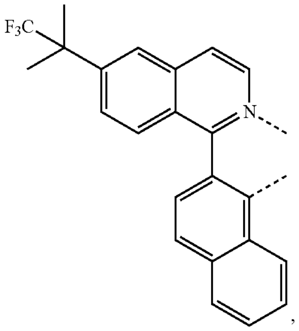
$L_{a445}$
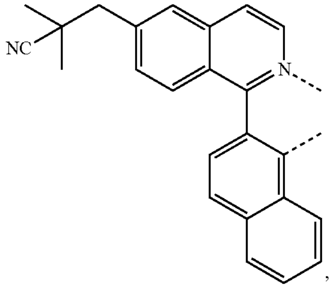
$L_{a446}$
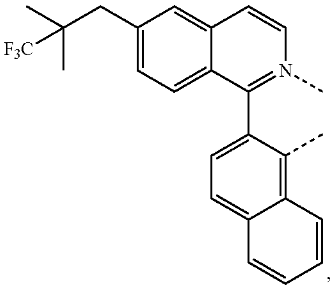
-continued
$L_{a447}$
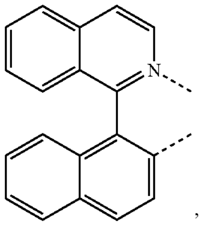
$L_{a448}$
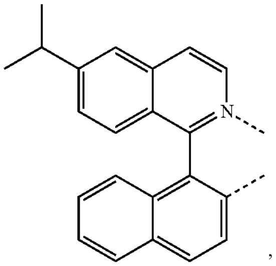
$L_{a449}$
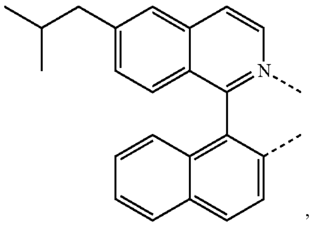
$L_{a450}$
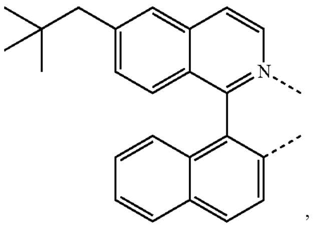
$L_{a451}$
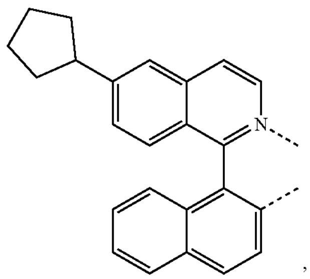
$L_{a452}$
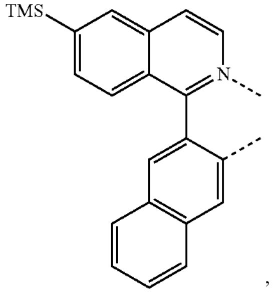

-continued
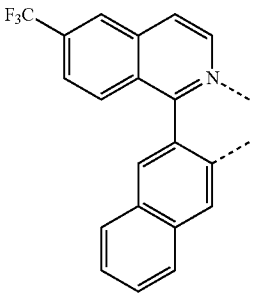
$L_{a453}$
,
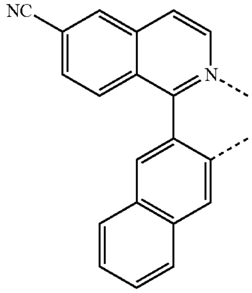
$L_{a454}$
,
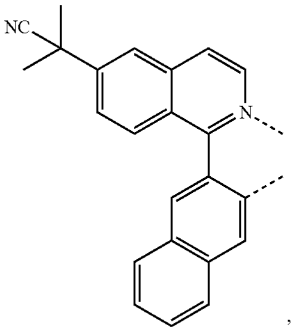
$L_{a455}$
,
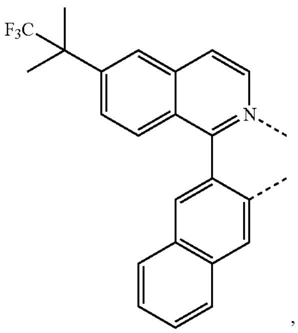
$L_{a456}$
,
-continued
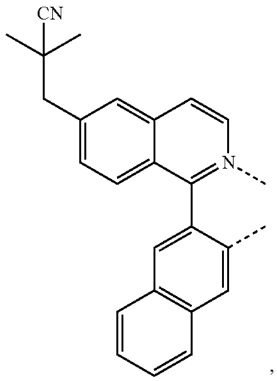
$L_{a457}$
,
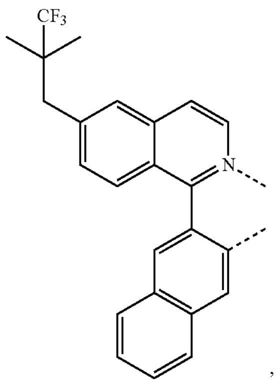
$L_{a458}$
,
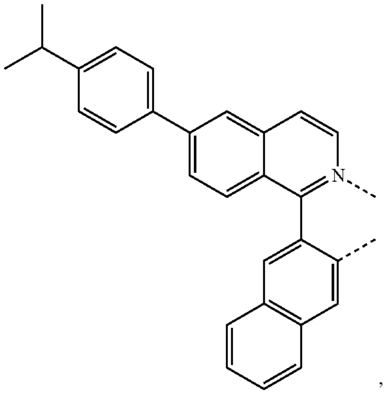
$L_{a459}$
,
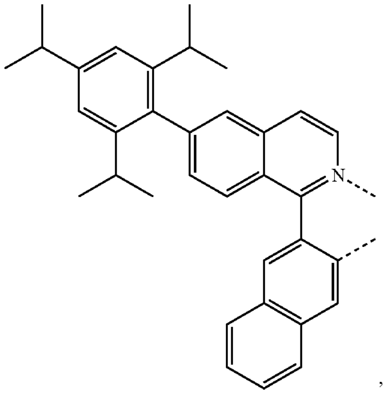
$L_{a460}$
, -continued
$L_{a461}$
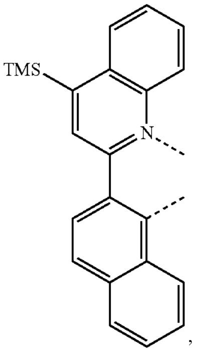
$L_{a462}$
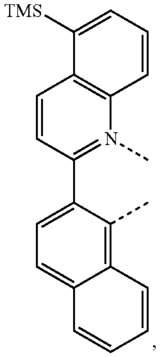
$L_{a463}$
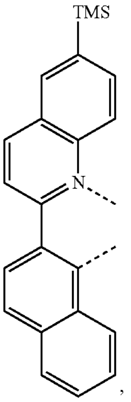
$L_{a464}$
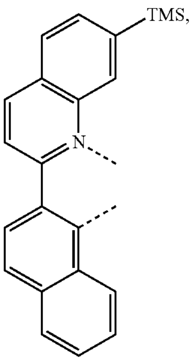
-continued
$L_{a465}$
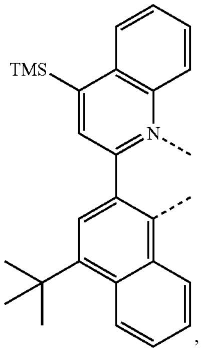
$L_{a466}$
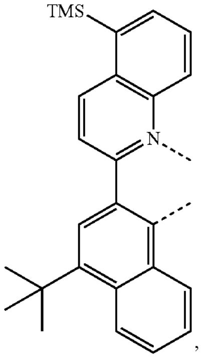
$L_{a467}$
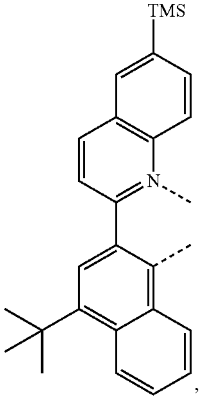
$L_{a468}$
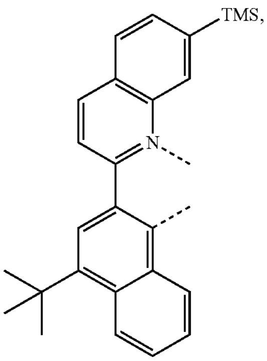

-continued
$L_{a469}$
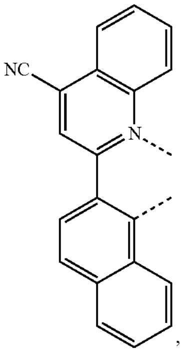
$L_{a470}$
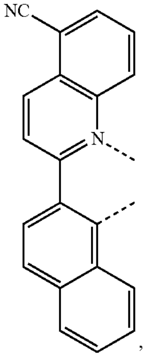
$L_{a471}$
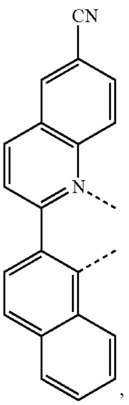
$L_{a472}$
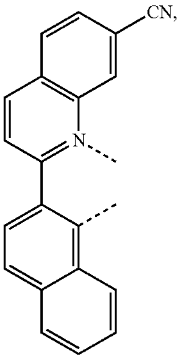
-continued
$L_{a473}$
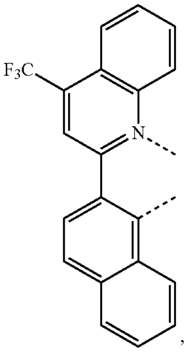
$L_{a474}$
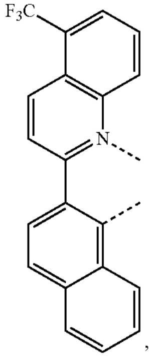
$L_{a475}$
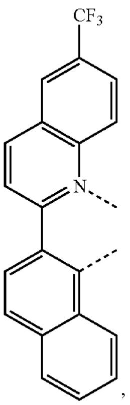
$L_{a476}$
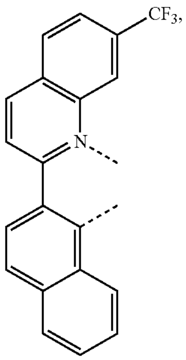

-continued
$L_{a477}$
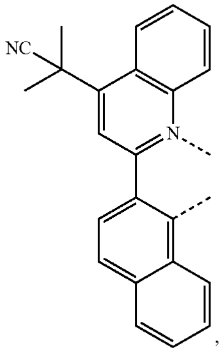
,
$L_{a478}$
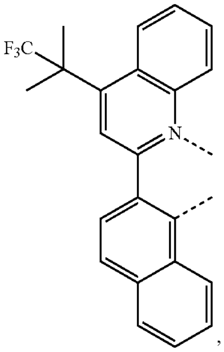
,
$L_{a479}$
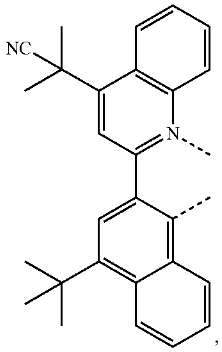
,
$L_{a480}$
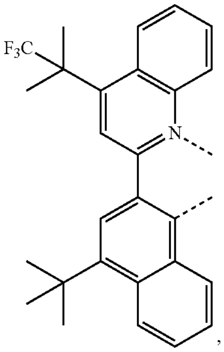
,
-continued
$L_{a525}$
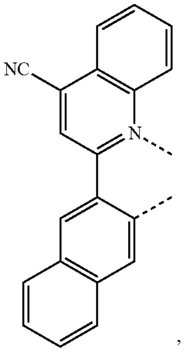
,
$L_{a526}$
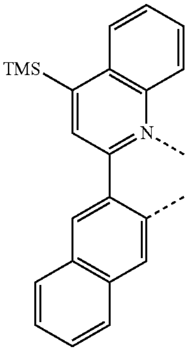
,
$L_{a527}$
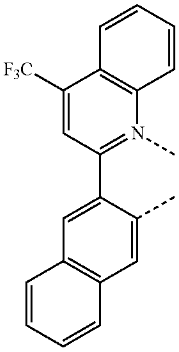
,
$L_{a528}$
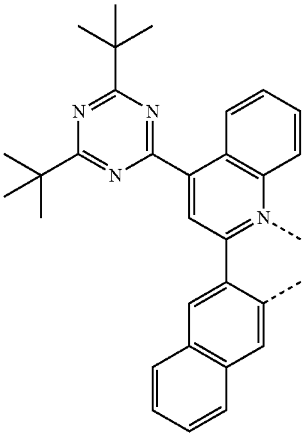
, -continued
$L_{a529}$
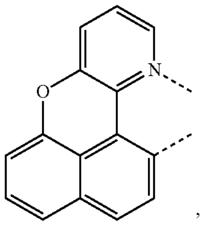
,
$L_{530}$
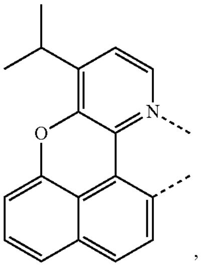
,
$L_{a531}$
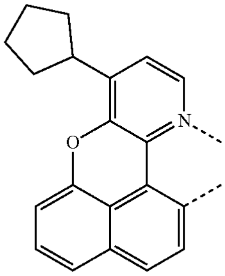
,
$L_{a532}$
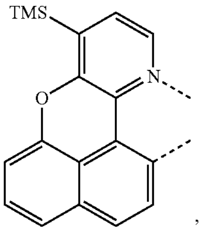
,
$L_{a533}$
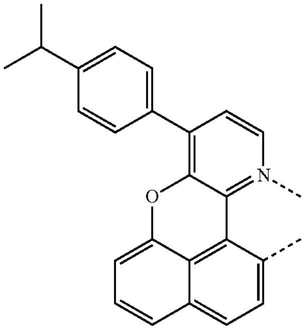
,
-continued
$L_{a534}$
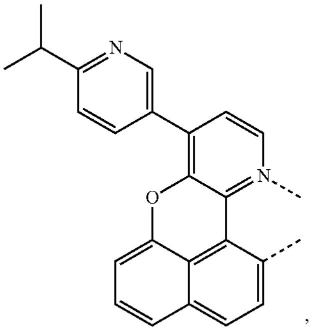
,
$L_{a535}$
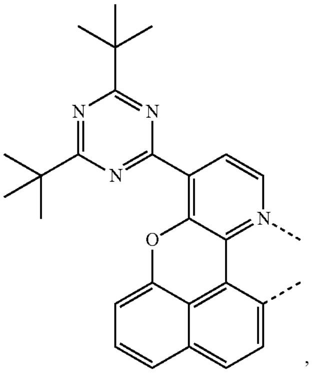
,
$L_{a536}$
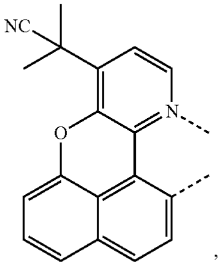
,
$L_{a537}$
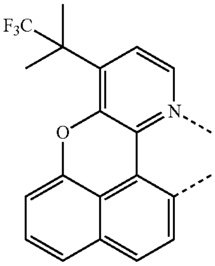
,
$L_{a538}$
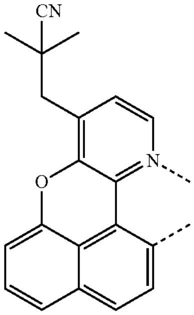
, -continued
$L_{a539}$
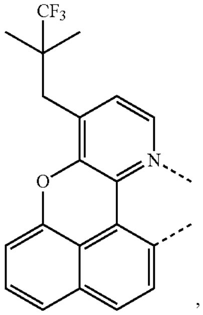
,
$L_{a540}$
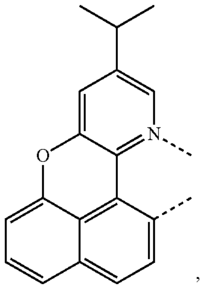
,
$L_{a541}$
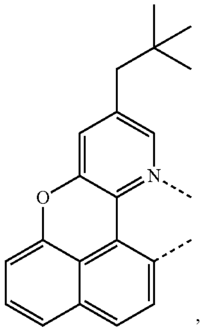
,
$L_{a542}$
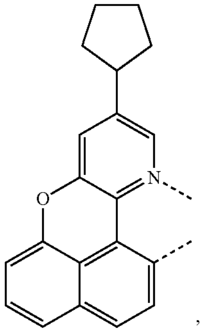
,
$L_{a543}$
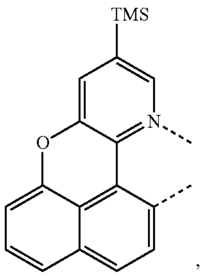
,
-continued
$L_{a544}$
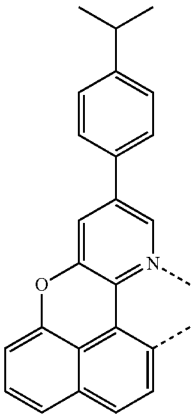
,
$L_{a545}$
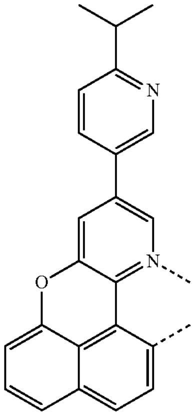
,
$L_{a546}$
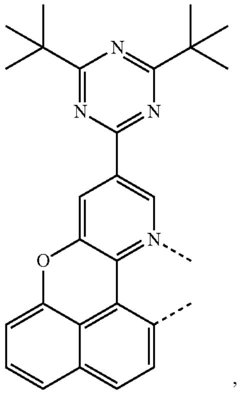
,
$L_{a547}$
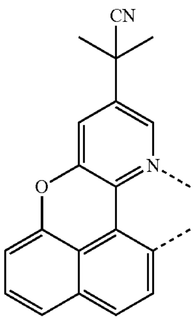
, -continued
$L_{a548}$
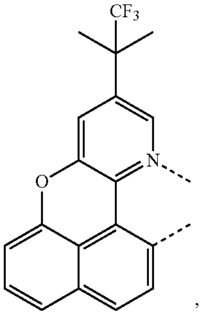
,
$L_{a549}$
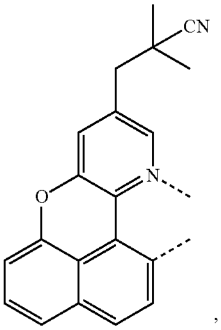
,
$L_{a550}$
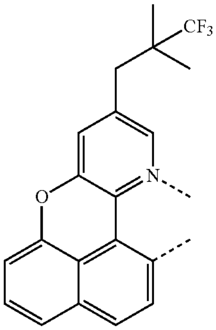
,
$L_{a551}$
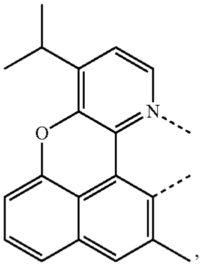
,
$L_{a552}$
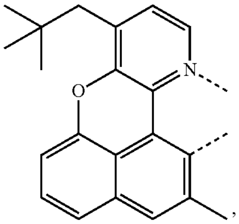
,
-continued
$L_{a553}$
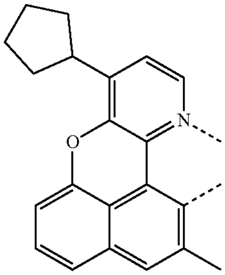
,
$L_{a554}$
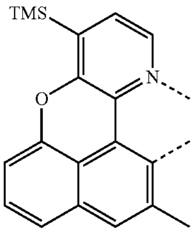
,
$L_{a555}$
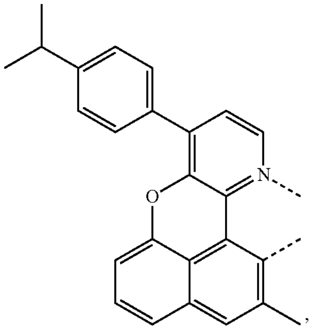
,
$L_{a556}$
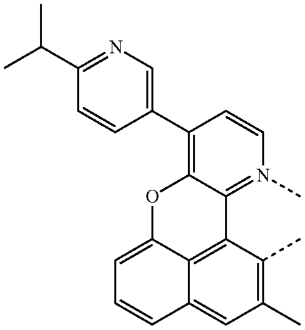
,
$L_{a557}$
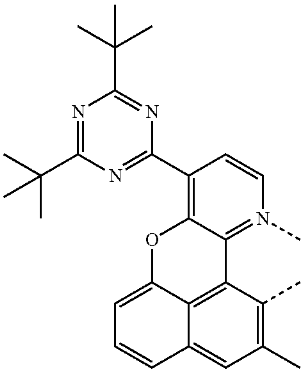
, L$_{a558}$
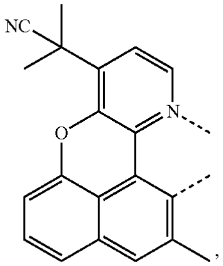
L$_{a559}$
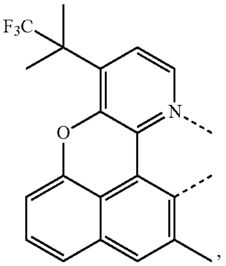
L$_{a560}$
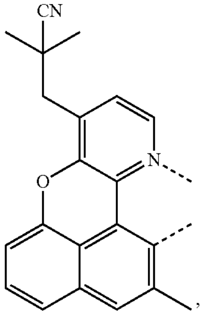
L$_{a561}$
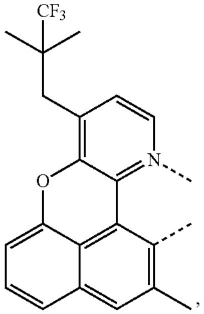
L$_{a562}$
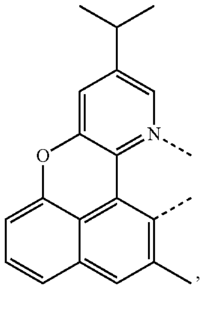
L$_{a563}$
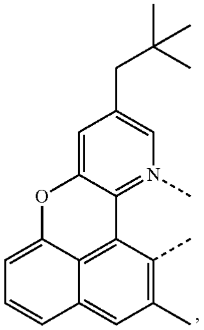
L$_{a564}$
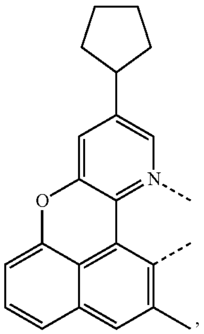
L$_{a565}$
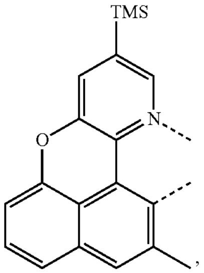
L$_{a566}$
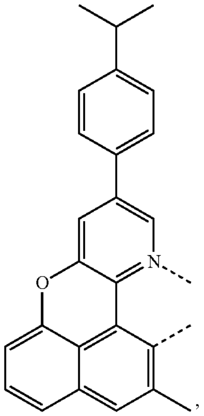

-continued
$L_{a567}$
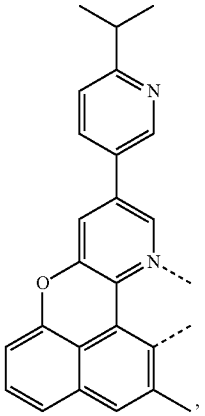
$L_{a568}$
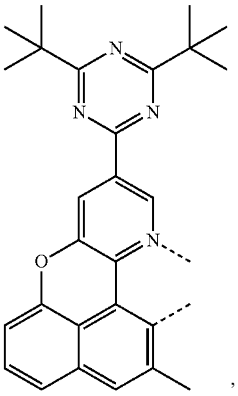
$L_{a569}$
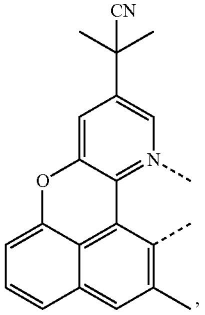
$L_{a570}$
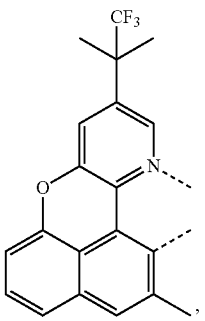
-continued
$L_{a571}$
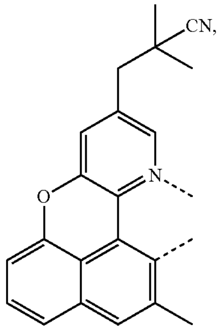
$L_{a572}$
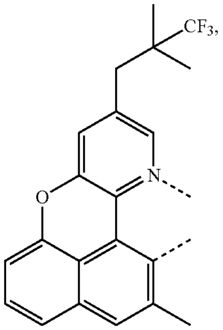
$L_{a573}$
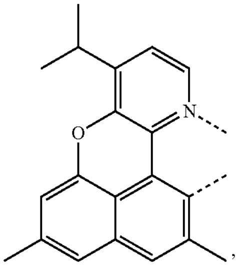
$L_{a574}$
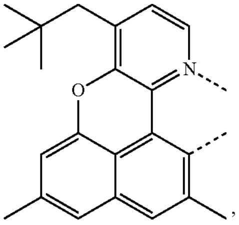
$L_{a575}$
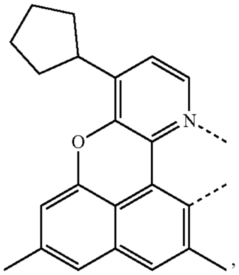

-continued
$L_{a576}$
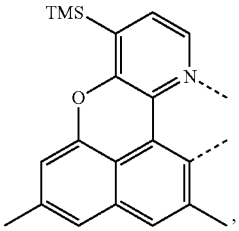
$L_{a577}$
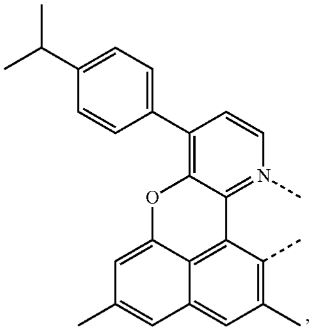
$L_{a578}$
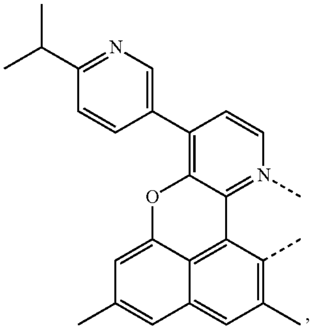
$L_{a579}$
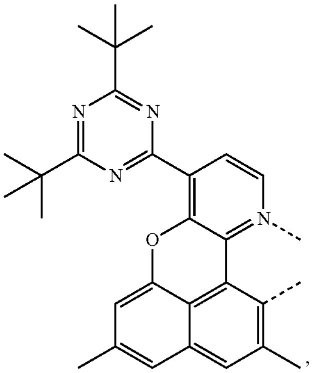
$L_{a580}$
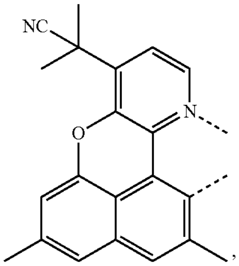
-continued
$L_{a581}$
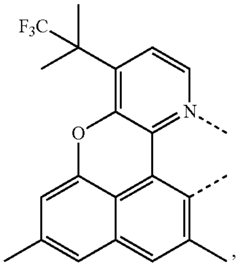
$L_{a582}$
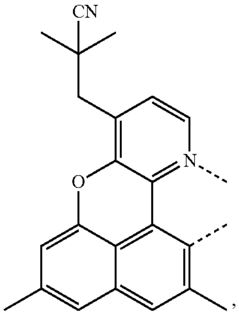
$L_{a583}$
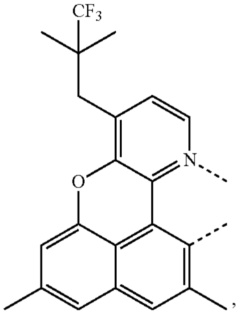
$L_{a584}$
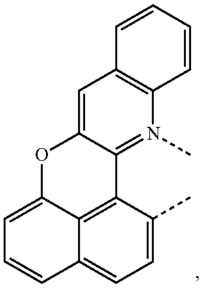
$L_{a585}$
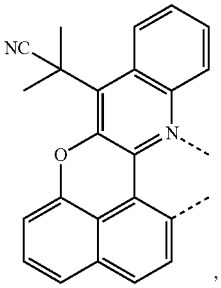

-continued
$L_{a586}$
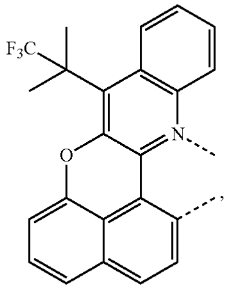
$L_{a587}$
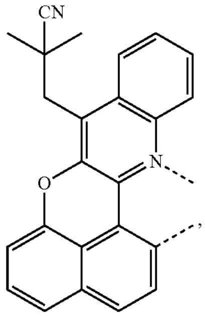
$L_{a588}$
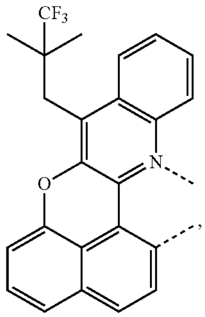
$L_{a589}$
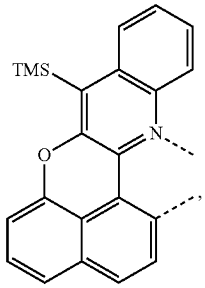
$L_{a590}$
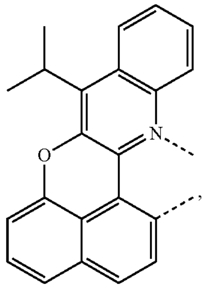
$L_{a591}$
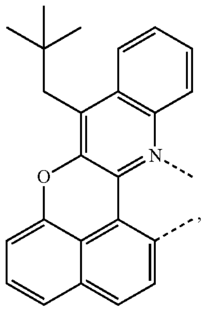
$L_{a592}$
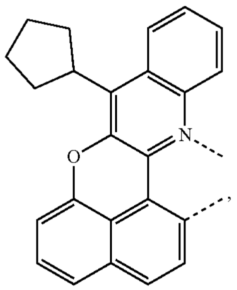
$L_{a593}$
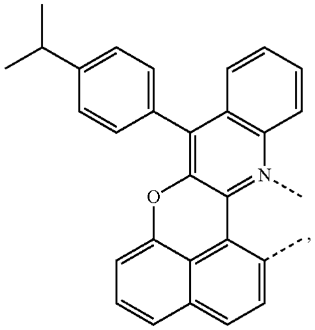
$L_{a594}$
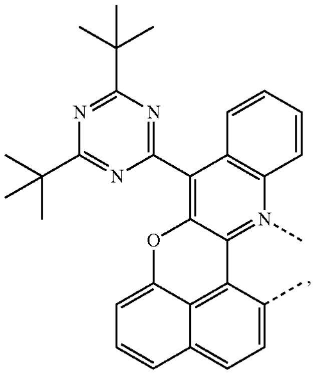

$L_{a595}$
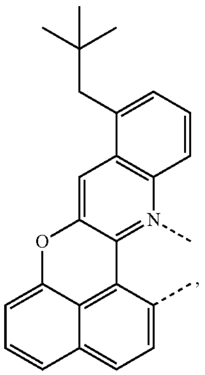
$L_{a596}$
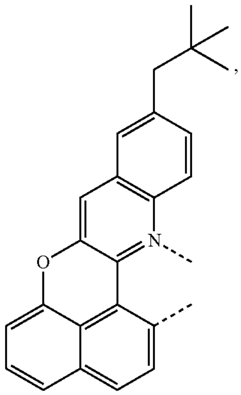
$L_{a597}$
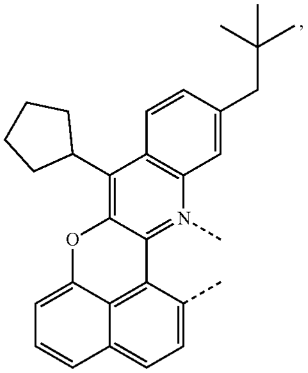
$L_{a598}$
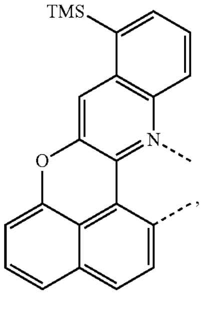
$L_{a599}$
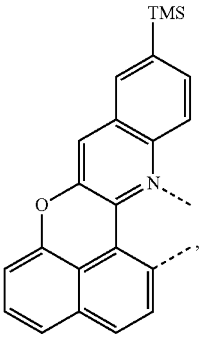
$L_{a600}$
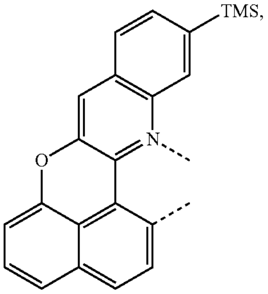
$L_{a601}$
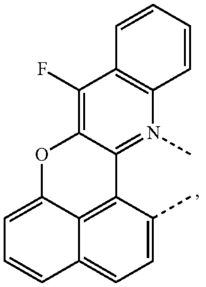
$L_{a602}$
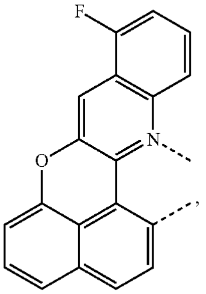
$L_{a603}$
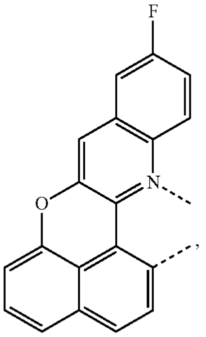

$L_{a604}$
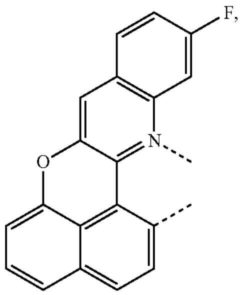
$L_{a605}$
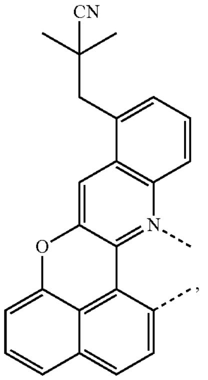
$L_{a606}$
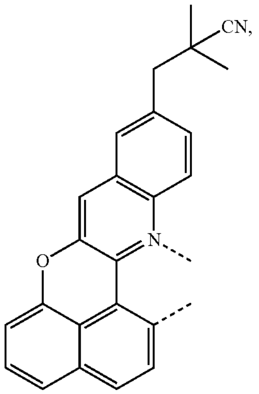
$L_{a607}$
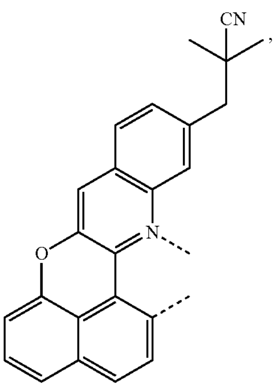
$L_{a608}$
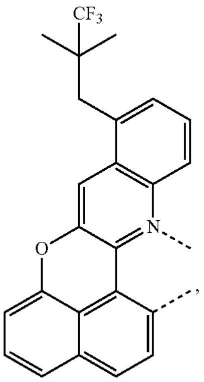
$L_{a609}$
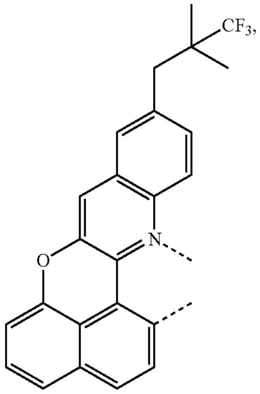
$L_{a610}$
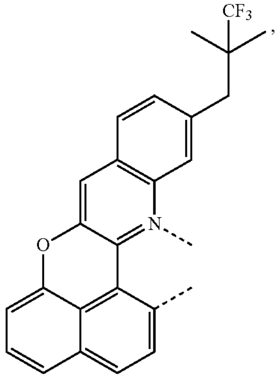
$L_{a611}$
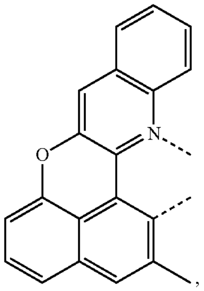

$L_{a612}$
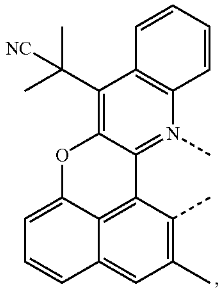
$L_{a613}$
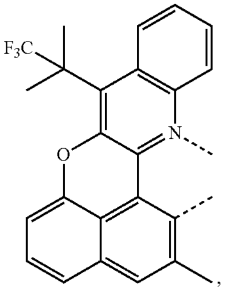
$L_{a614}$
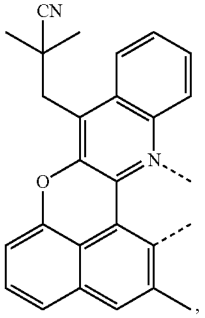
$L_{a615}$
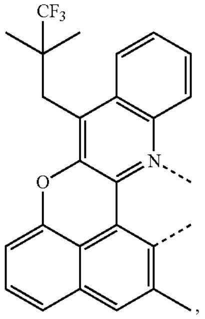
$L_{a616}$
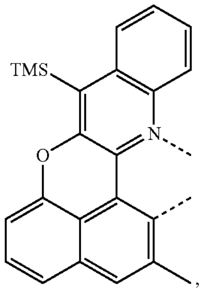
$L_{a617}$
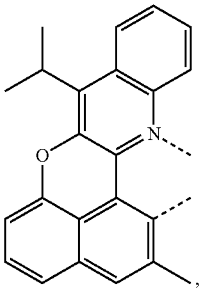
$L_{a618}$
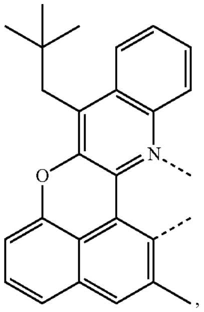
$L_{a619}$
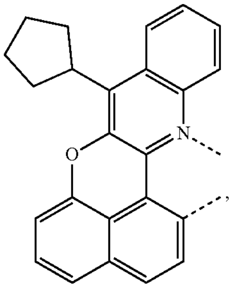
$L_{a620}$
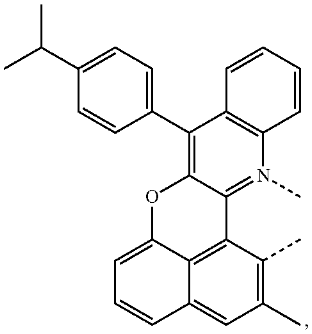

$L_{a621}$
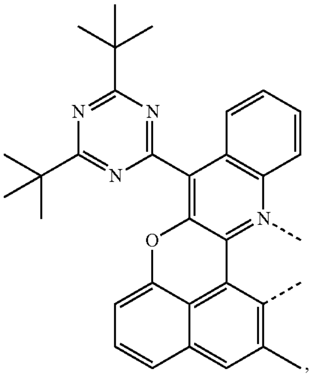
$L_{a622}$
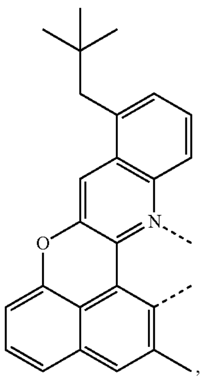
$L_{a623}$
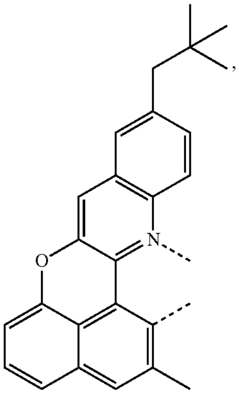
$L_{a624}$
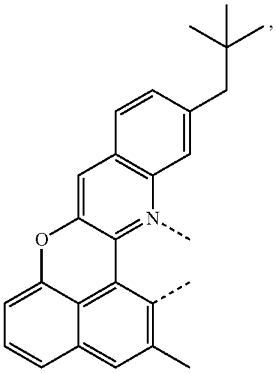
$L_{a625}$
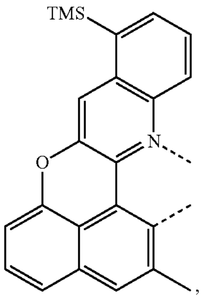
$L_{a626}$
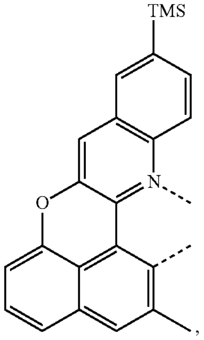
$L_{a627}$
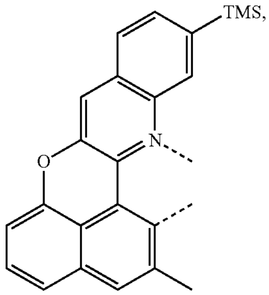
$L_{a628}$
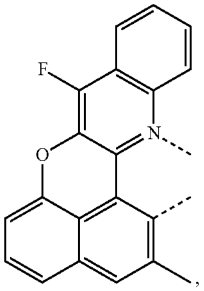
$L_{a629}$
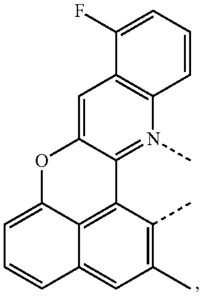

-continued
$L_{a630}$
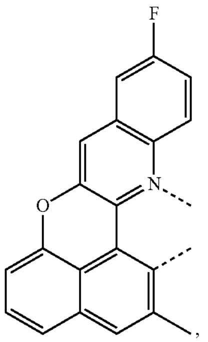
$L_{a631}$
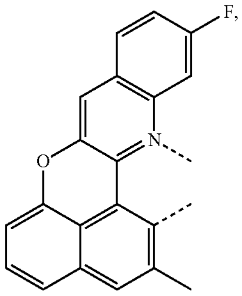
$L_{a632}$
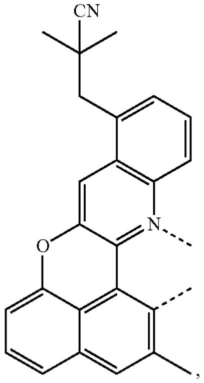
$L_{a633}$
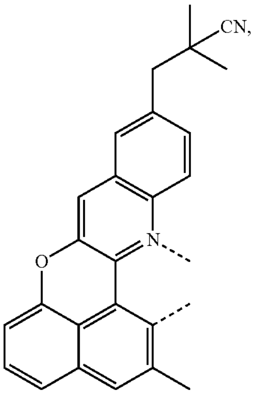
-continued
$L_{a634}$
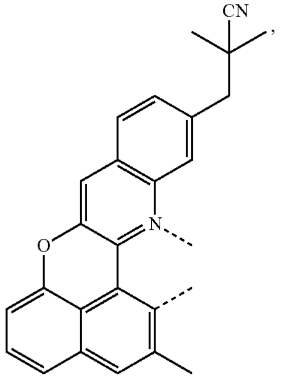
$L_{a635}$
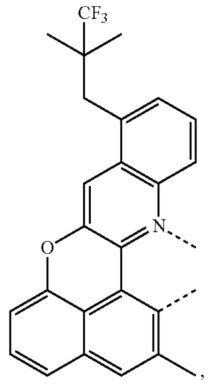
$L_{a636}$
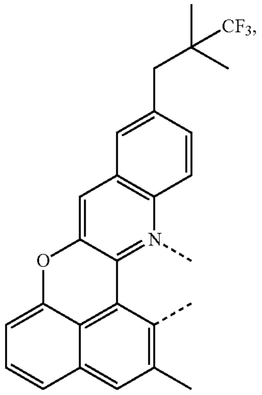
$L_{a637}$
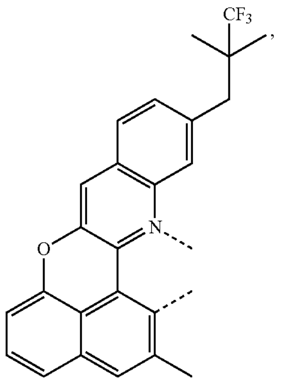

-continued
$L_{a638}$
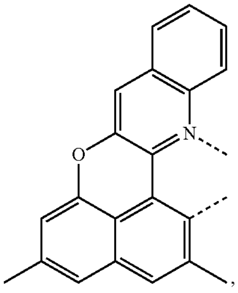
$L_{a639}$
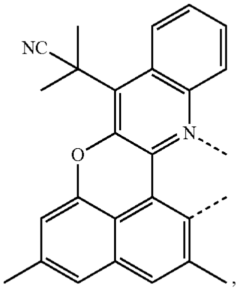
$L_{a640}$
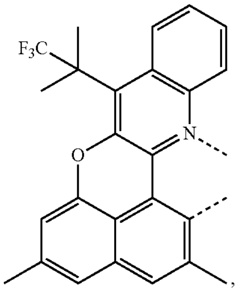
$L_{a641}$
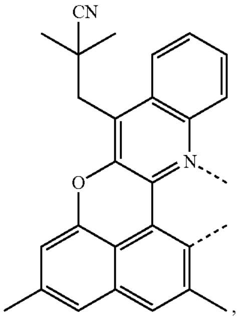
$L_{a642}$
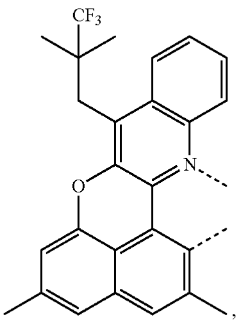
-continued
$L_{a643}$
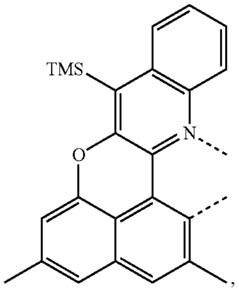
$L_{a644}$
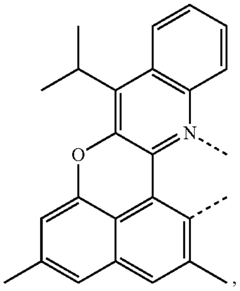
$L_{a645}$
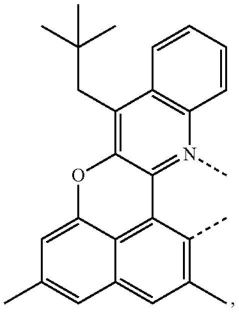
$L_{a646}$
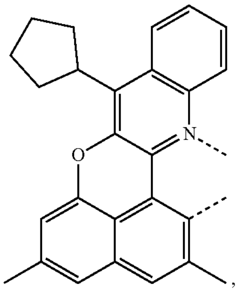
$L_{a647}$
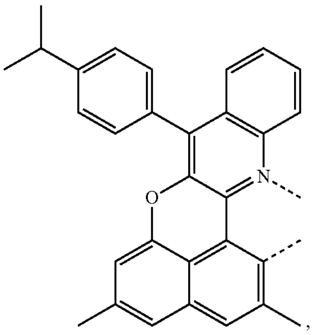

-continued
$L_{a648}$
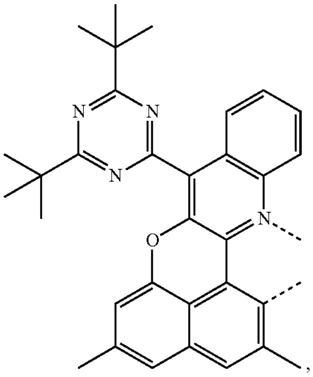
$L_{a649}$
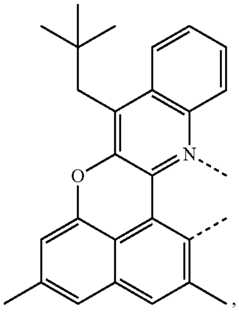
$L_{a650}$
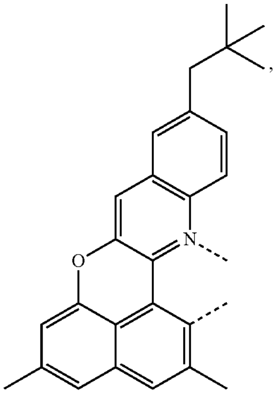
$L_{a651}$
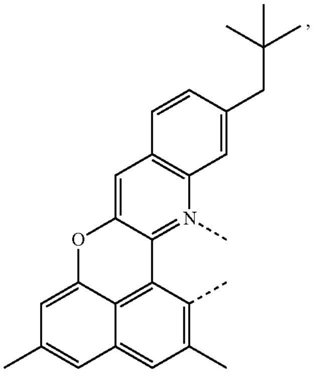
-continued
$L_{a652}$
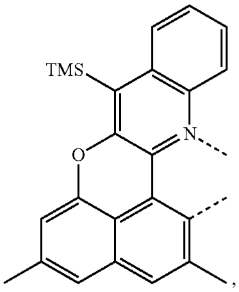
$L_{a653}$
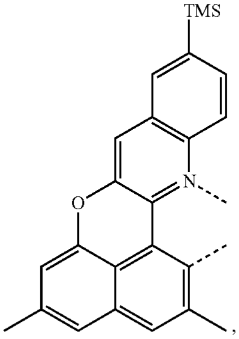
$L_{a654}$
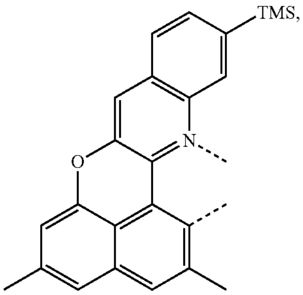
$L_{a655}$
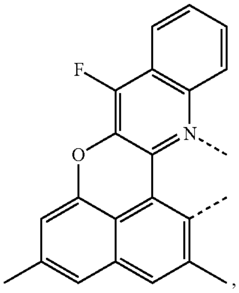
$L_{a656}$
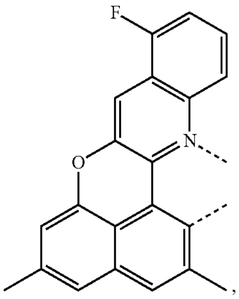

-continued
$L_{a657}$
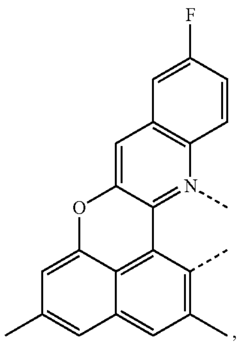
$L_{a658}$
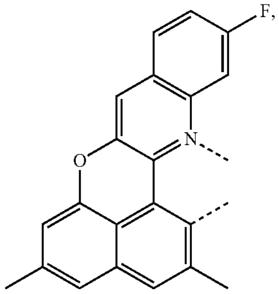
$L_{a659}$
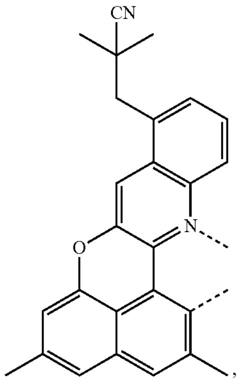
$L_{a660}$
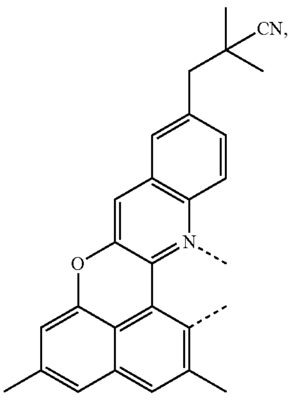
-continued
$L_{a661}$
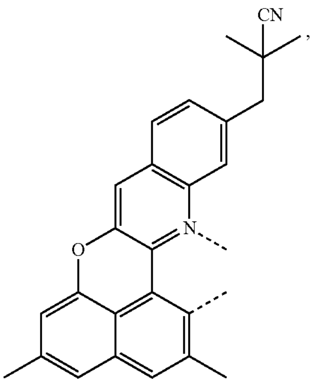
$L_{a662}$
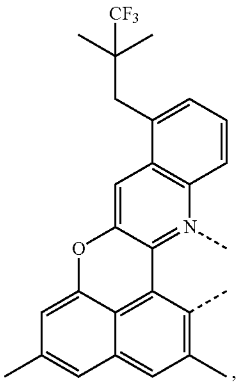
$L_{a663}$
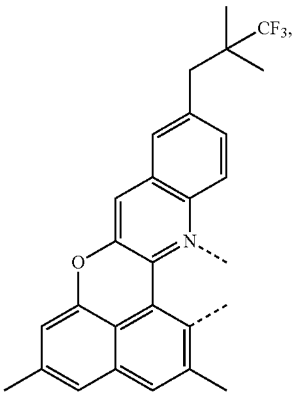
$L_{a664}$
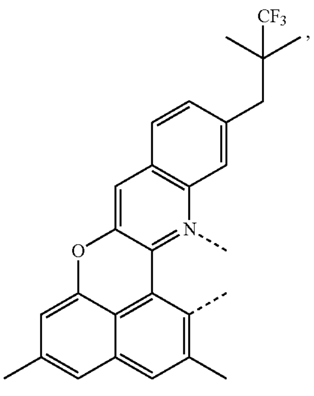

-continued $L_{a665}$

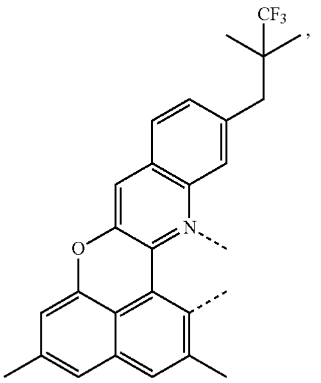

$L_{a666}$

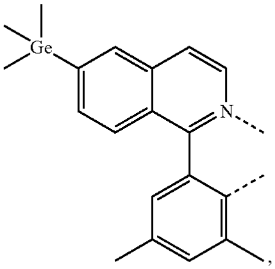

$L_{a667}$

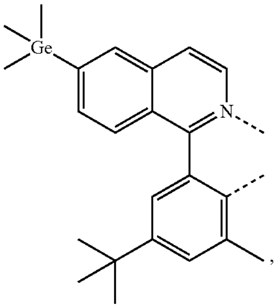

$L_{a668}$

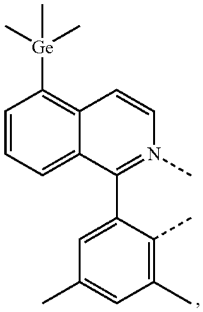

$L_{a669}$

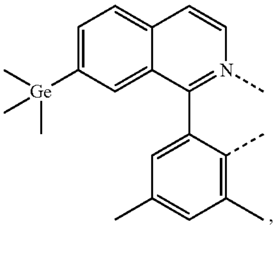

-continued $L_{a670}$

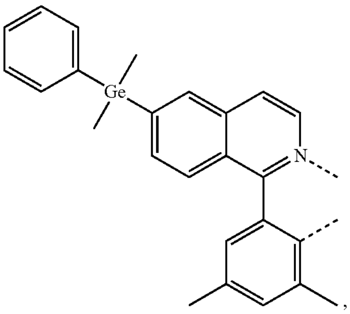

$L_{a671}$

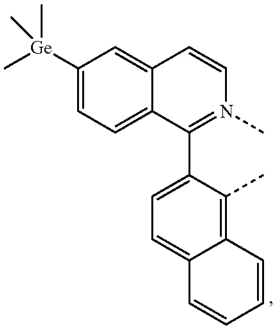

$L_{a672}$

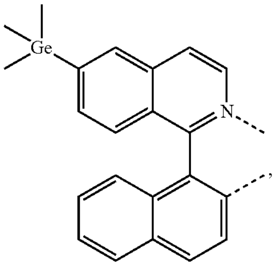

$L_{a673}$

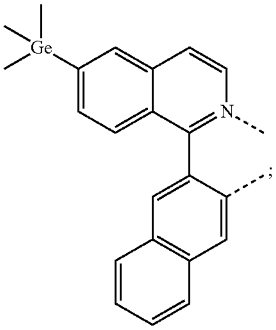

wherein in the above structures, TMS is trimethylsilyl; and optionally, hydrogen in the above structures can be partially or fully substituted with deuterium.

21. The electroluminescent device according to claim 1, wherein the metal M is selected from Ir, Rh, Re, Os, Pt, Au or Cu.

22. The electroluminescent device according to claim 1, wherein the $L_b$ has the following structure:

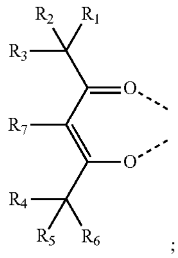

;

$R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

adjacent substituents $R_1$, $R_2$, $R_3$, $R_4$, $R_5$, $R_6$, $R_7$ can be optionally joined to form a ring.

23. The electroluminescent device according to claim 20, wherein $L_b$ is, at each occurrence identically or differently, selected from the group consisting of the following structures:

$L_{b1}$

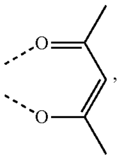

$L_{b2}$

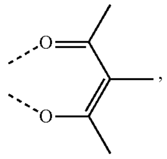

$L_{b3}$

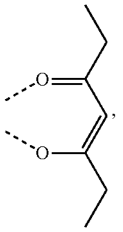

-continued $L_{b4}$

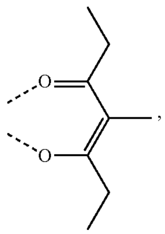

$L_{b5}$

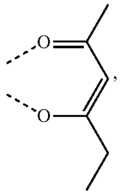

$L_{b6}$

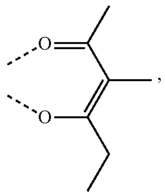

$L_{b7}$

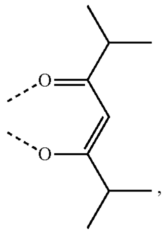

$L_{b8}$

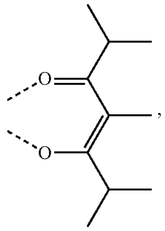

$L_{b9}$

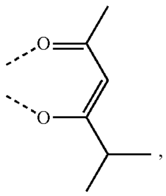

$L_{b10}$

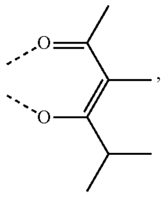

-continued
$L_{b11}$
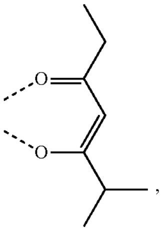
,
$L_{b12}$
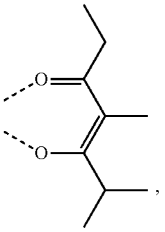
,
$L_{b13}$
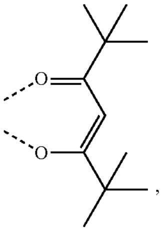
,
$L_{b14}$
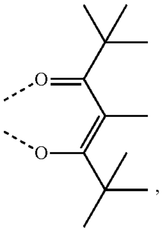
,
$L_{b15}$
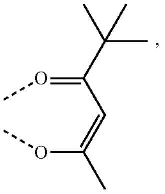
$L_{b16}$
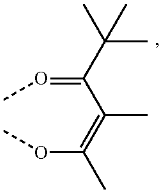
$L_{b17}$
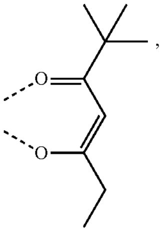
-continued
$L_{b18}$
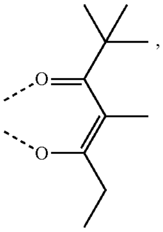
$L_{b19}$
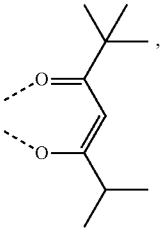
$L_{b20}$
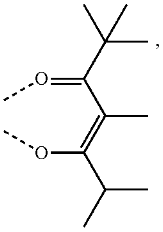
$L_{b21}$
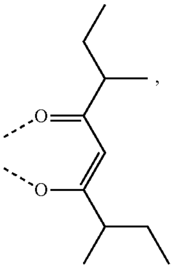
$L_{b22}$
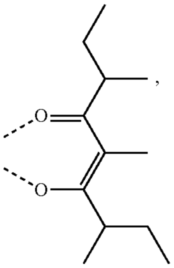
$L_{b23}$
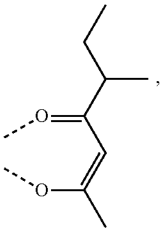

-continued
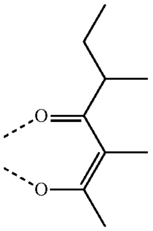,
$L_{b24}$
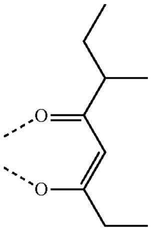,
$L_{b25}$
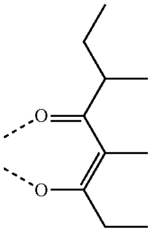,
$L_{b26}$
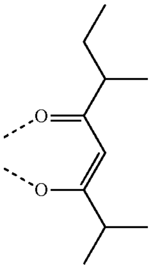,
$L_{b27}$
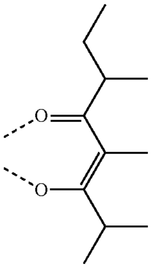,
$L_{b28}$
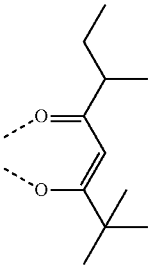,
$L_{b29}$
-continued
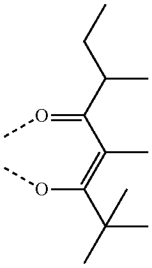,
$L_{b30}$
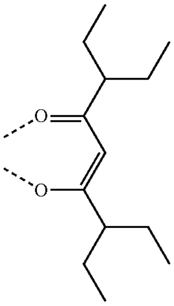,
$L_{b31}$
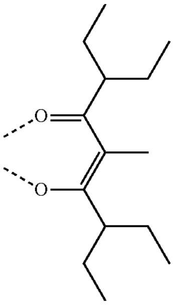,
$L_{b32}$
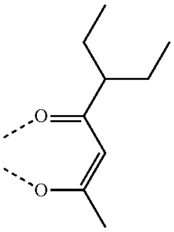,
$L_{b33}$
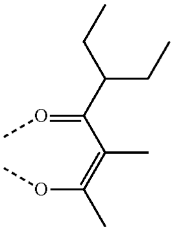,
$L_{b34}$
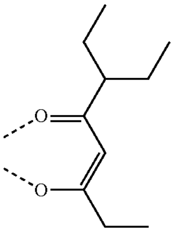,
$L_{b35}$ -continued
$L_{b36}$
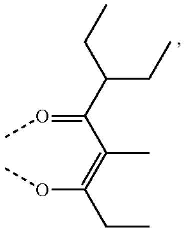
$L_{b37}$
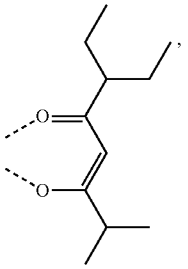
$L_{b38}$
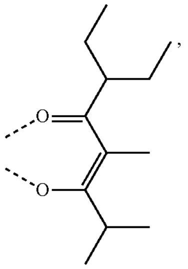
$L_{b39}$
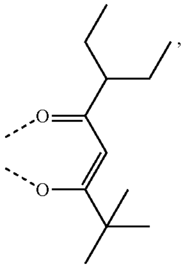
$L_{b40}$
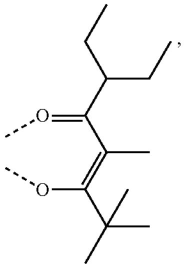
$L_{b41}$
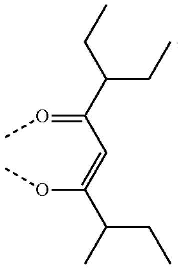
-continued
$L_{b42}$
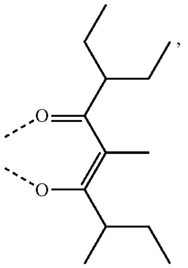
Lb43
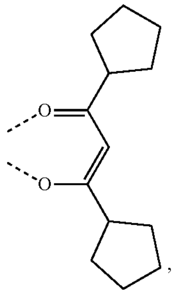
Lb44
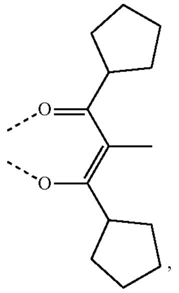
Lb45
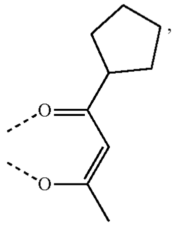
$L_{b46}$
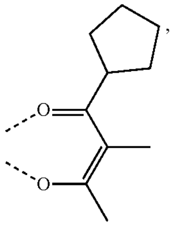
$L_{b47}$
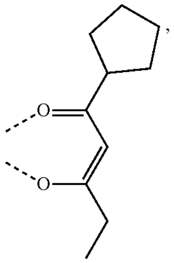

-continued
$L_{b48}$
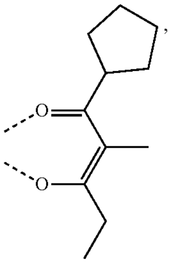
$L_{b49}$
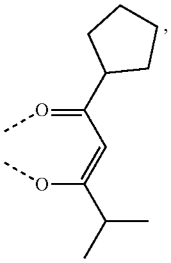
$L_{b50}$
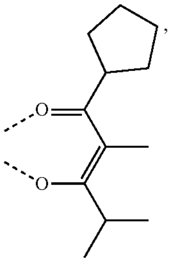
$L_{b51}$
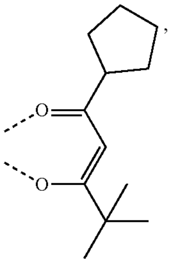
$L_{b52}$
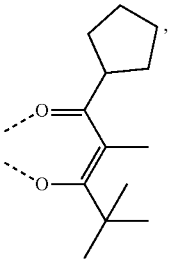
$L_{b53}$
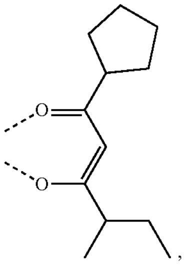
-continued
$L_{b54}$
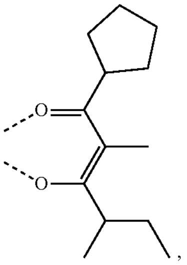
$L_{b55}$
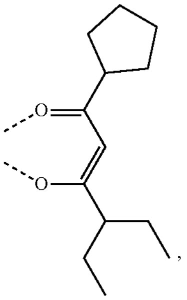
$L_{b56}$
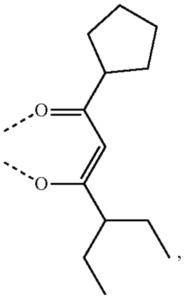
$L_{b57}$
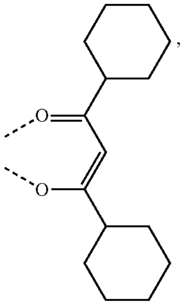
$L_{b58}$
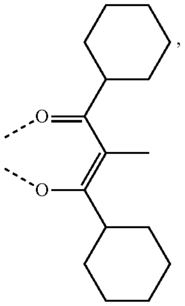

-continued
Lb59
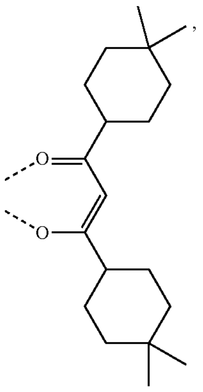
Lb60
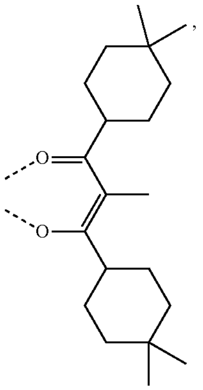
Lb61
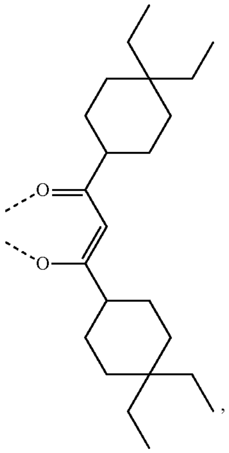
-continued
Lb62
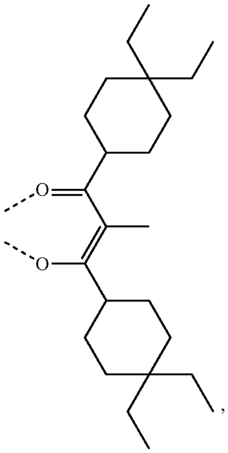
Lb63
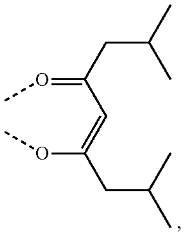
Lb64
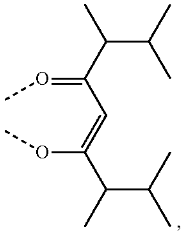
Lb65
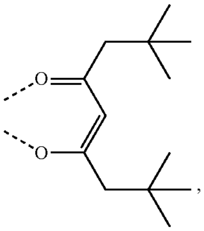
Lb66
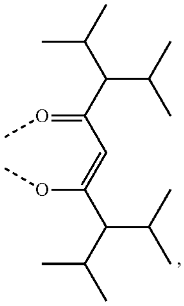

-continued
$L_{b67}$
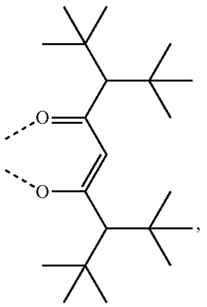
$L_{b68}$
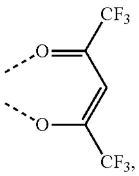
$L_{b69}$
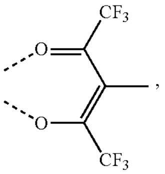
$L_{b70}$
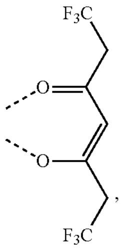
$L_{b71}$
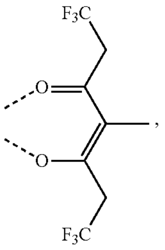
$L_{b72}$
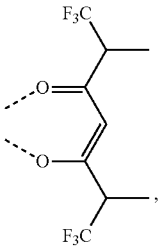
-continued
$L_{b73}$
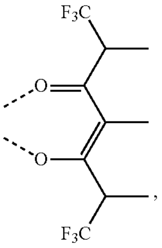
$L_{b74}$
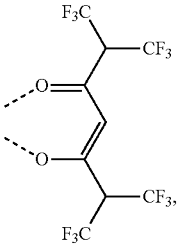
$L_{b75}$
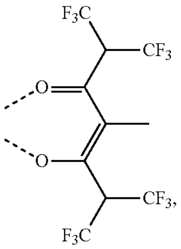
$L_{b76}$
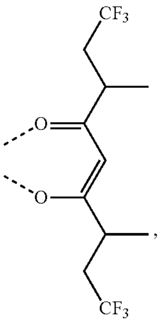
$L_{b77}$
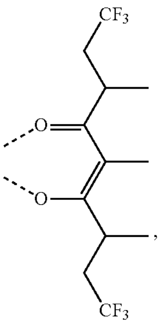

$L_{b78}$
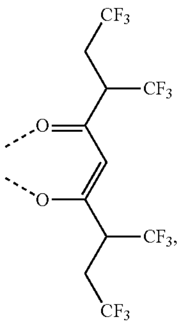
$L_{b79}$
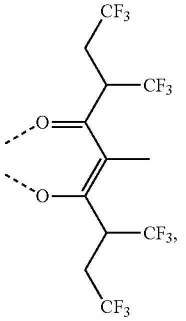
$L_{b80}$
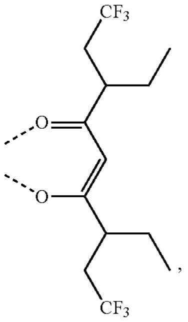
$L_{b81}$
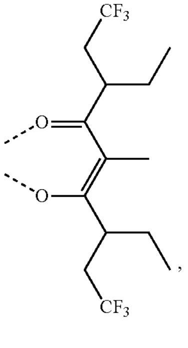
$L_{b82}$
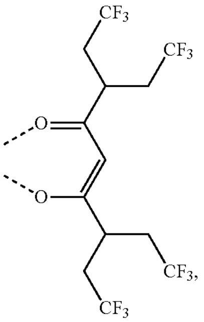
$L_{b83}$
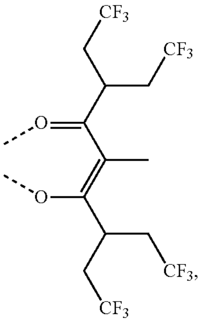
$L_{b84}$
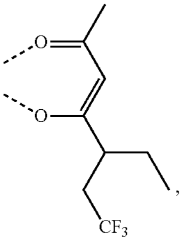
$L_{b85}$
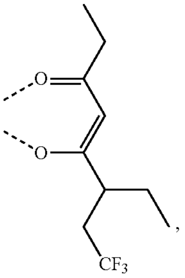
$L_{b86}$
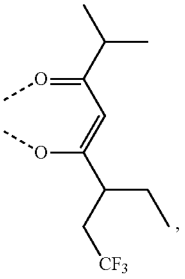

-continued
$L_{b87}$
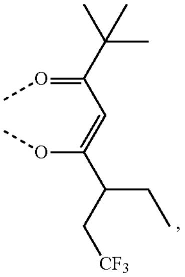
,
$L_{b88}$
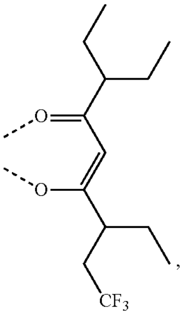
,
$L_{b89}$
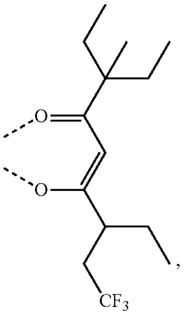
,
$L_{b90}$
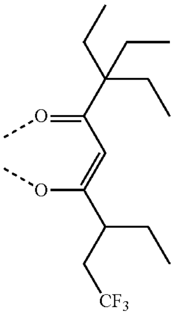
,
$L_{b91}$
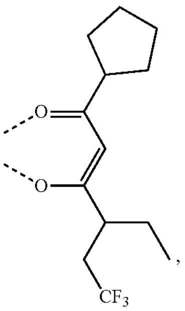
,
-continued
$L_{b92}$
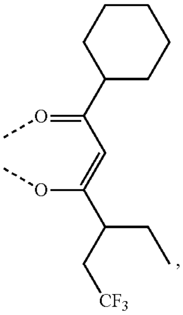
,
$L_{b93}$
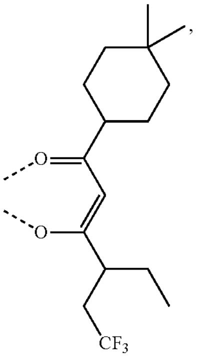
,
$L_{b94}$
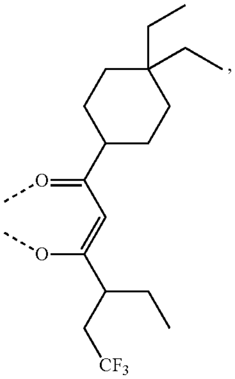
,
$L_{b95}$
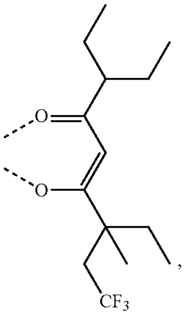
, -continued
$L_{b96}$
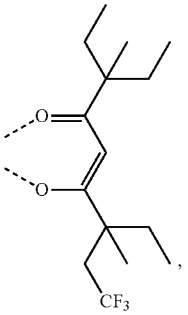
$L_{b97}$
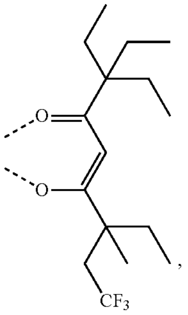
$L_{b98}$
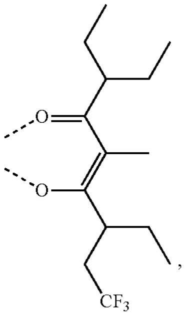
$L_{b99}$
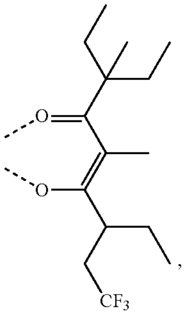
$L_{b100}$
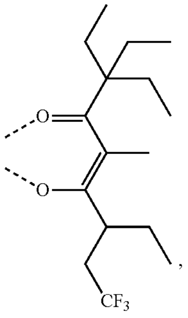
-continued
$L_{b101}$
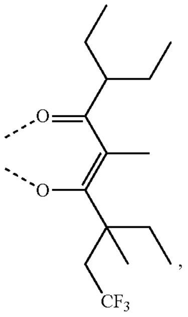
$L_{b102}$
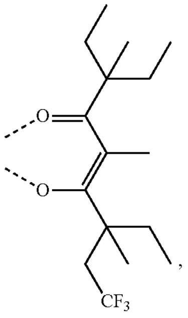
$L_{b103}$
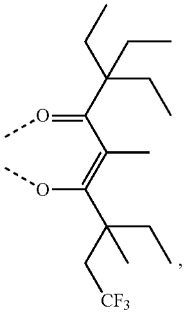
$L_{b104}$
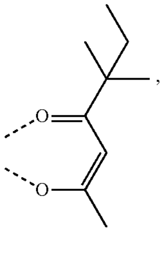
$L_{b105}$
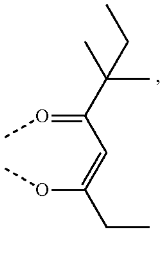

-continued
$L_{b106}$
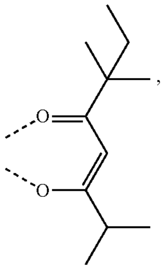
$L_{b107}$
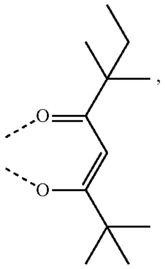
$L_{b108}$
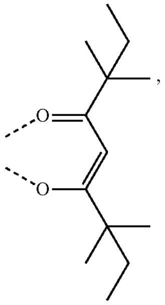
$L_{b109}$
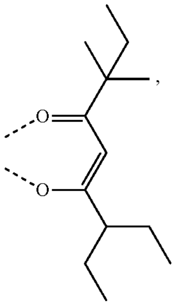
$L_{b110}$
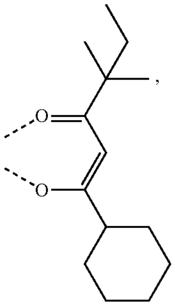
-continued
$L_{b111}$
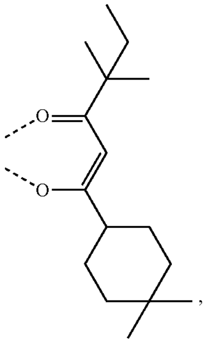
$L_{b112}$
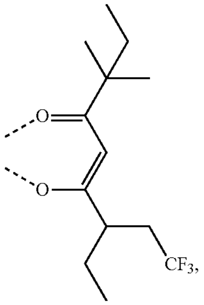
$L_{b113}$
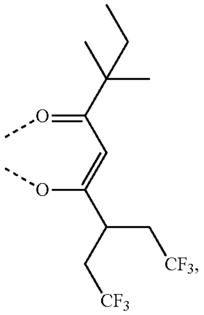
$L_{b114}$
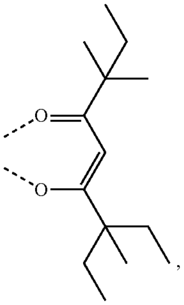
$L_{b115}$
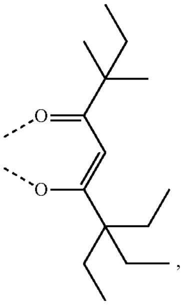

-continued
$L_{b116}$
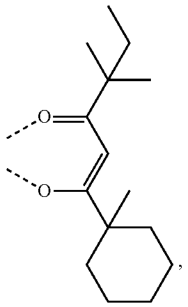
$L_{b117}$
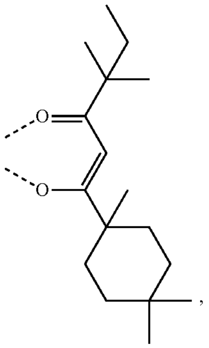
$L_{b118}$
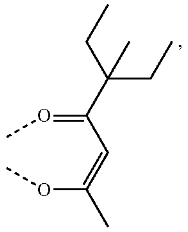
$L_{b119}$
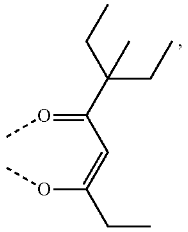
$L_{b120}$
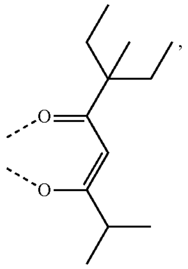
$L_{b121}$
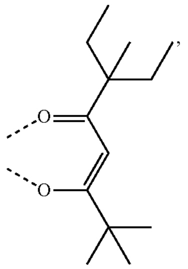
$L_{b122}$
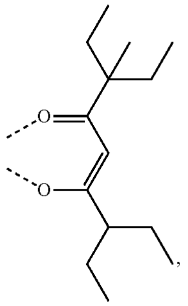
$L_{b123}$
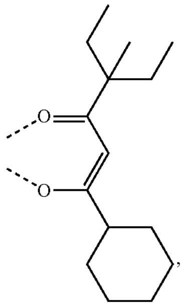
$L_{b124}$
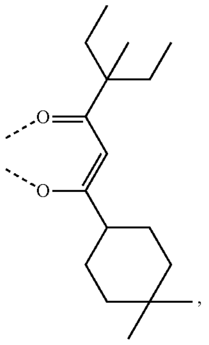
$L_{b125}$
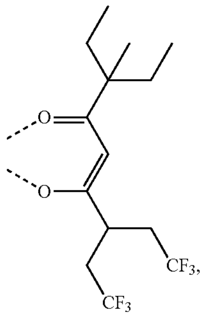

-continued
$L_{b126}$
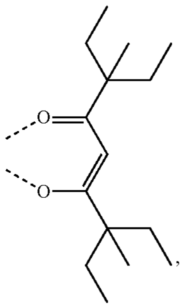
$L_{b127}$
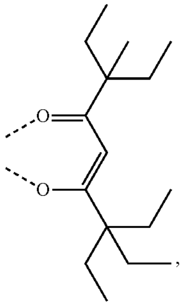
$L_{b128}$
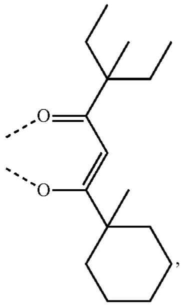
$L_{b129}$
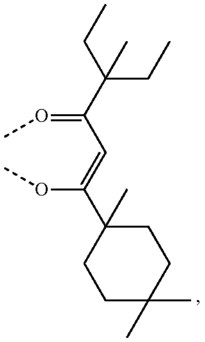
$L_{b130}$
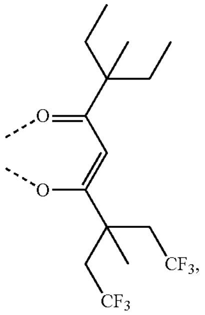
-continued
$L_{b131}$
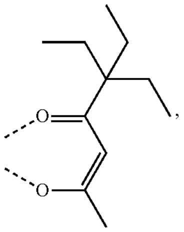
$L_{b132}$
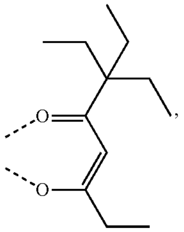
$L_{b133}$
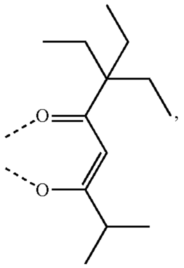
$L_{b134}$
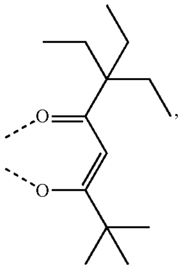
$L_{b135}$
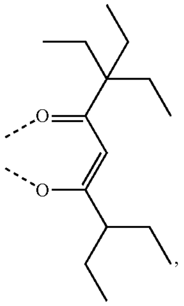

L$_{b136}$
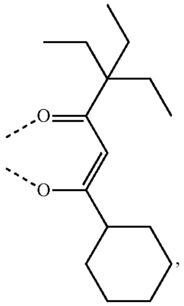
L$_{b137}$
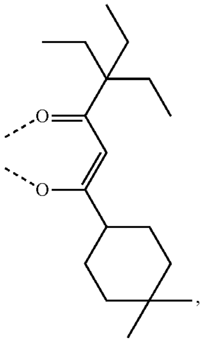
L$_{b138}$
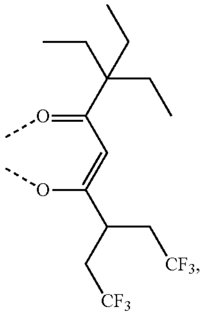
L$_{b139}$
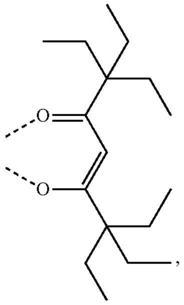
L$_{b140}$
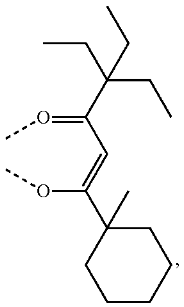
L$_{b141}$
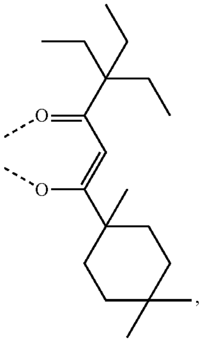
L$_{b142}$
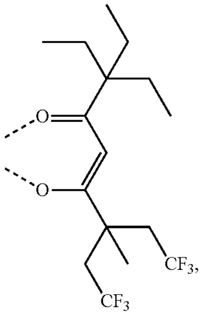
L$_{b143}$
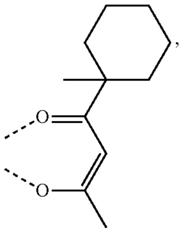
L$_{b144}$
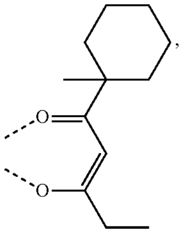
L$_{b145}$
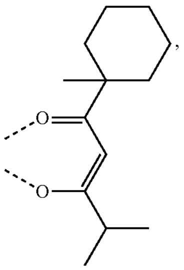

-continued
$L_{b146}$
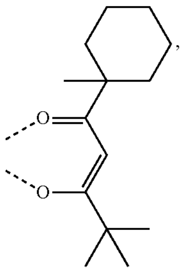
$L_{b147}$
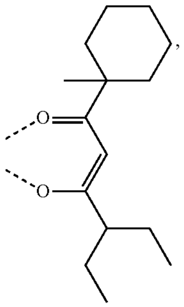
$L_{b148}$
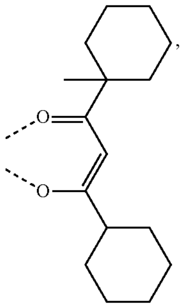
$L_{b149}$
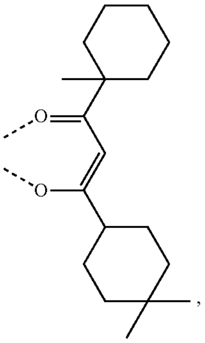
$L_{b150}$
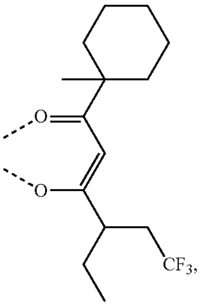
-continued
$L_{b151}$
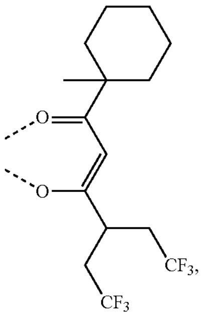
$L_{b152}$
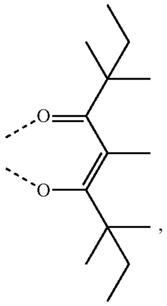
$L_{b153}$
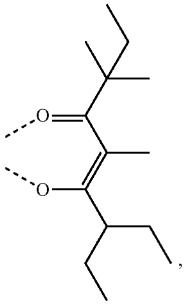
$L_{b154}$
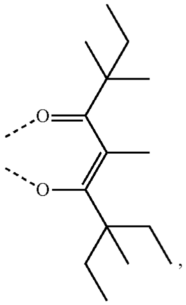
$L_{b155}$
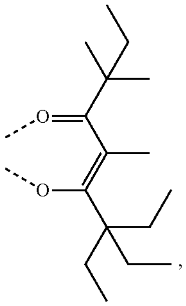

-continued
$L_{b156}$
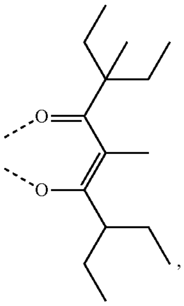
$L_{b157}$
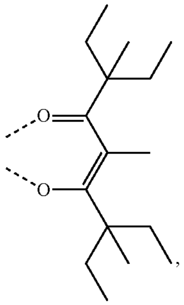
$L_{b158}$
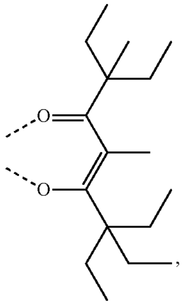
$L_{b159}$
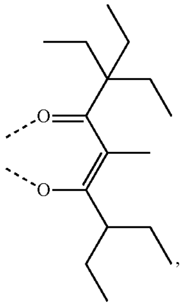
$L_{b160}$
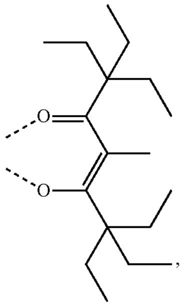
-continued
$L_{b161}$
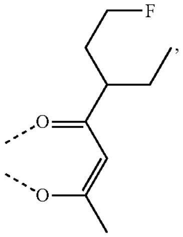
$L_{b162}$
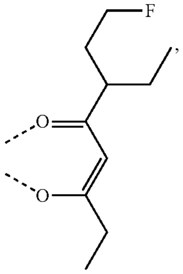
$L_{b163}$
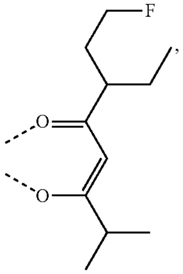
$L_{b164}$
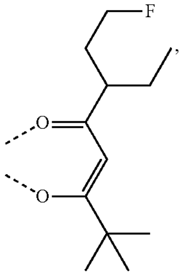
$L_{b165}$
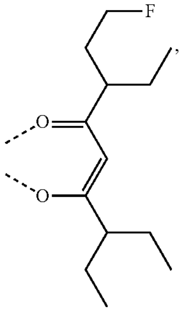

-continued
$L_{b166}$
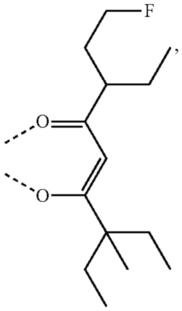
$L_{b167}$
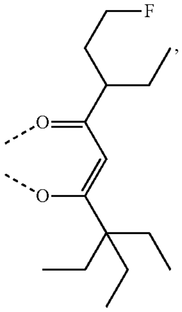
$L_{b168}$
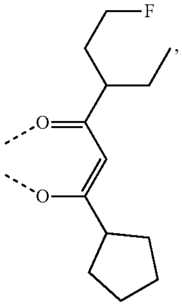
$L_{b169}$
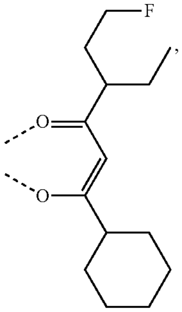
$L_{b170}$
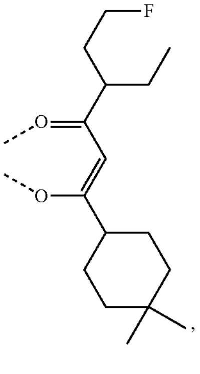
-continued
$L_{b171}$
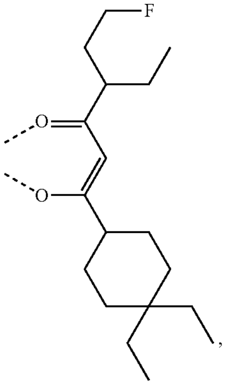
$L_{b172}$
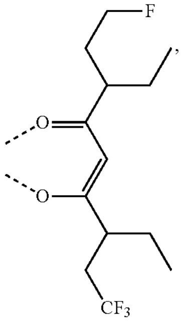
$L_{b173}$
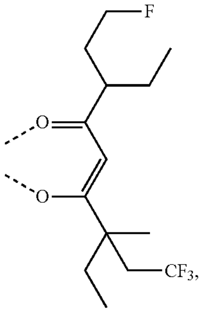
$L_{b174}$
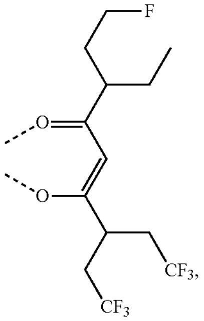

-continued
$L_{b175}$
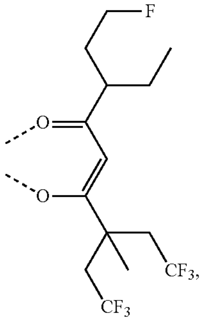
$L_{b176}$
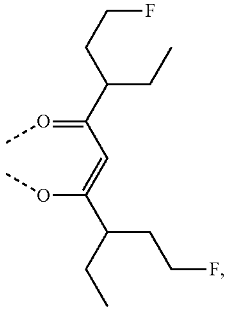
$L_{b177}$
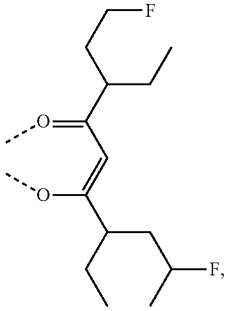
$L_{b178}$
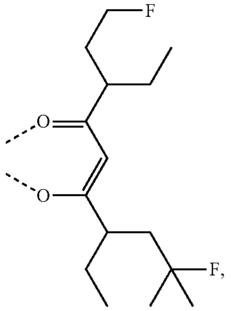
$L_{b179}$
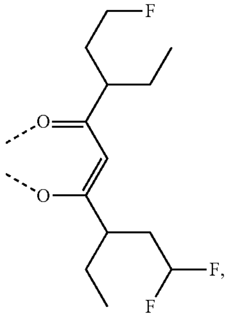
-continued
$L_{b180}$
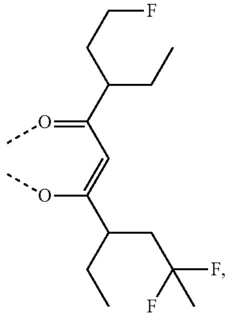
$L_{b181}$
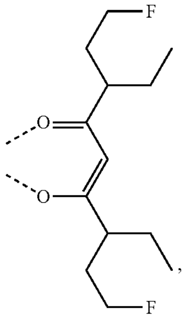
$L_{b182}$
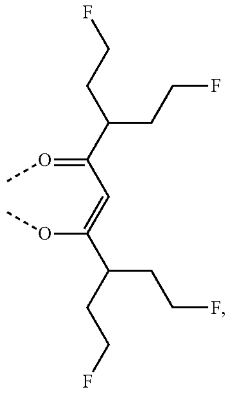
$L_{b183}$
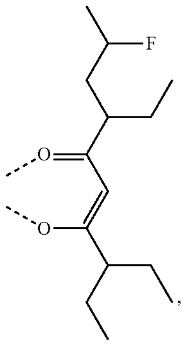

-continued
$L_{b184}$
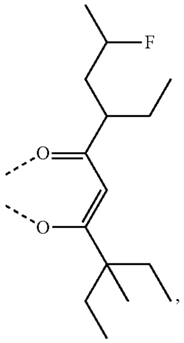
$L_{b185}$
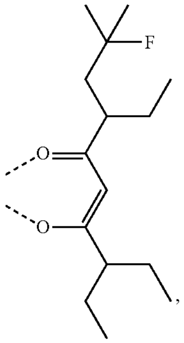
$L_{b186}$
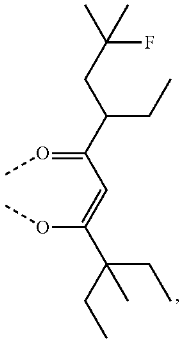
$L_{b187}$
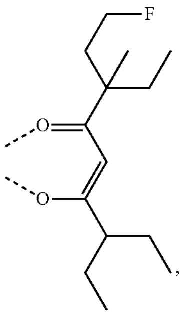
$L_{b188}$
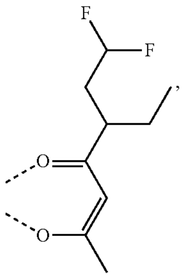
-continued
$L_{b189}$
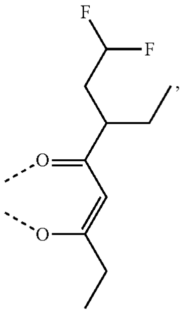
$L_{b190}$
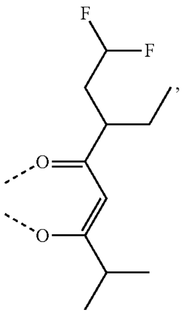
$L_{b191}$
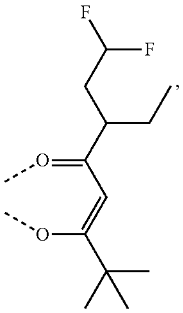
$L_{b192}$
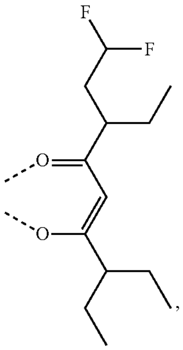

-continued
$L_{b193}$
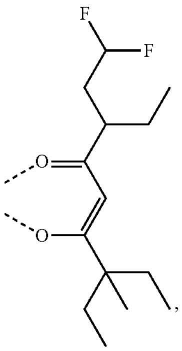
$L_{b194}$
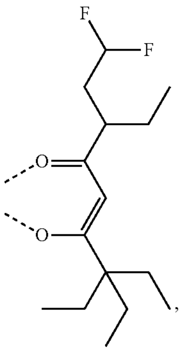
$L_{b195}$
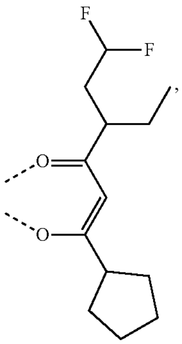
$L_{b196}$
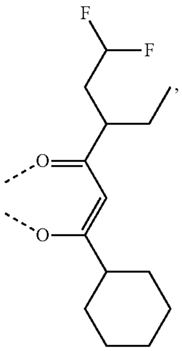
-continued
$L_{b197}$
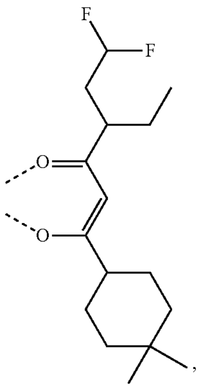
$L_{b198}$
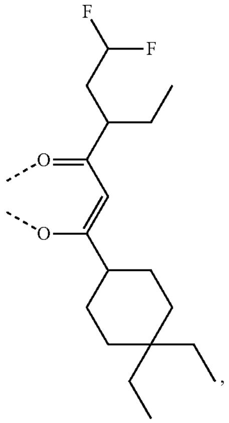
$L_{b199}$
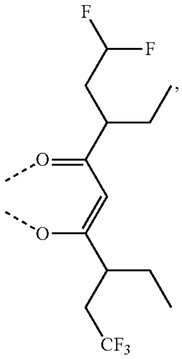
$L_{b200}$
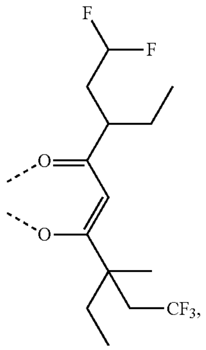

-continued
$L_{b201}$
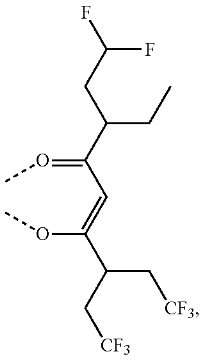
$L_{b202}$
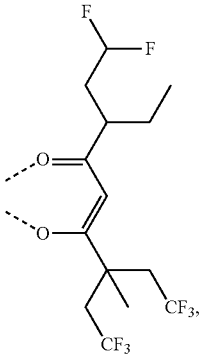
$L_{b203}$
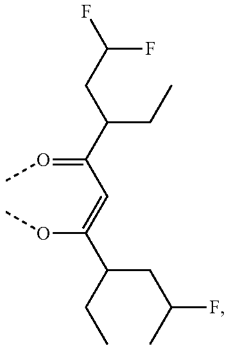
$L_{b204}$
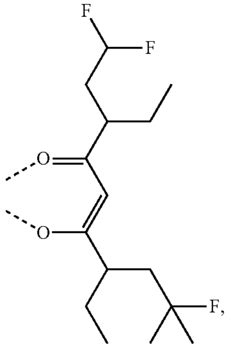
-continued
$L_{b205}$
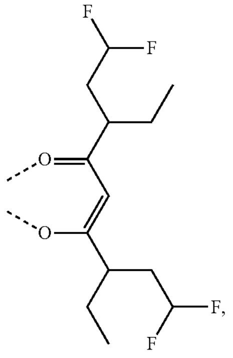
$L_{b206}$
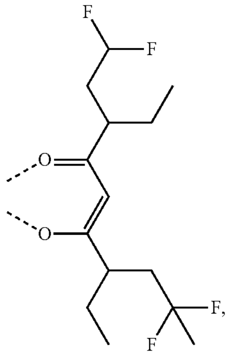
$L_{b207}$
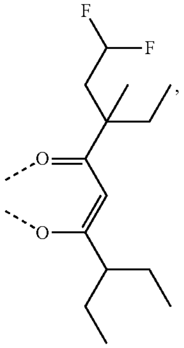
$L_{b208}$
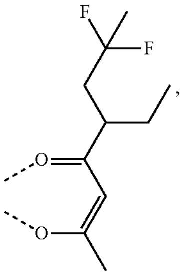

-continued
L$_{b209}$
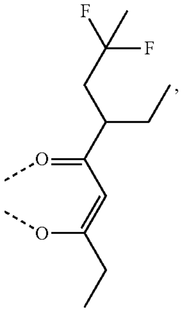
L$_{b210}$
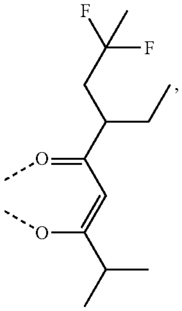
L$_{b211}$
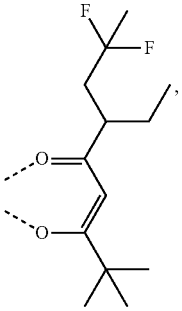
L$_{b212}$
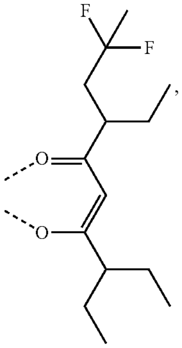
-continued
L$_{b213}$
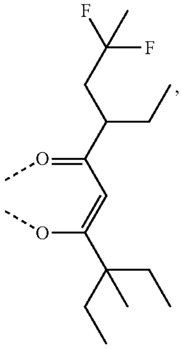
L$_{b214}$
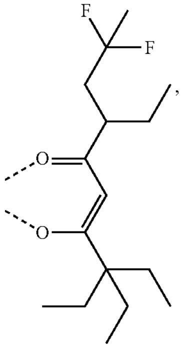
L$_{b215}$
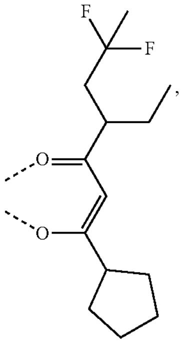
L$_{b216}$
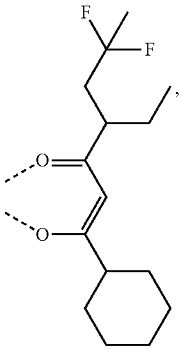

-continued
$L_{b217}$
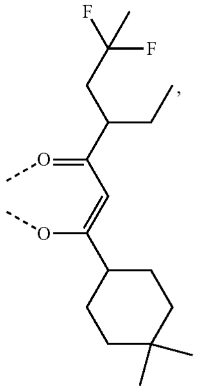
$L_{b218}$
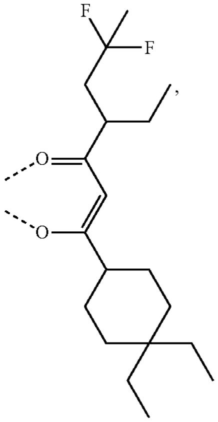
$L_{b219}$
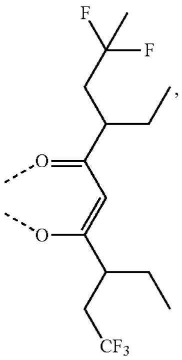
$L_{b220}$
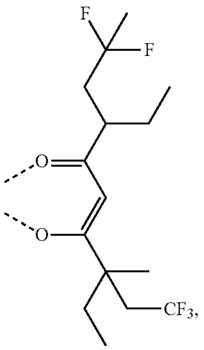
-continued
$L_{b221}$
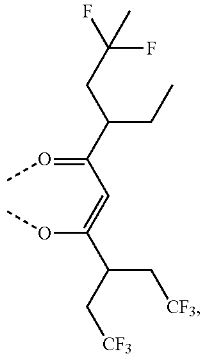
$L_{b222}$
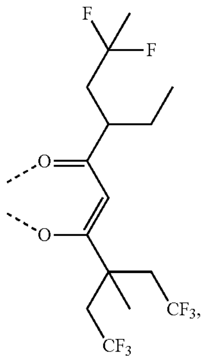
$L_{b223}$
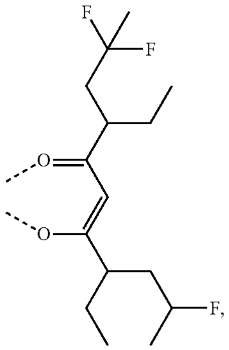
$L_{b224}$
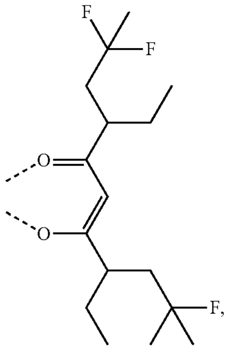

-continued
$L_{b225}$
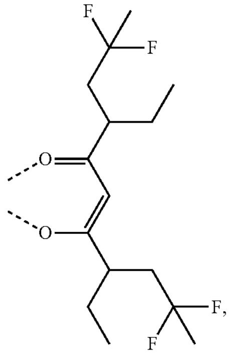
$L_{b226}$
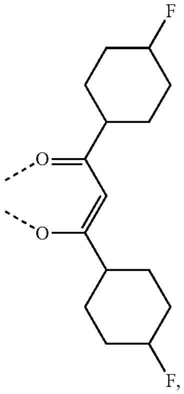
$L_{b227}$
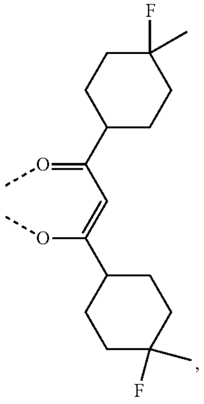
$L_{b228}$
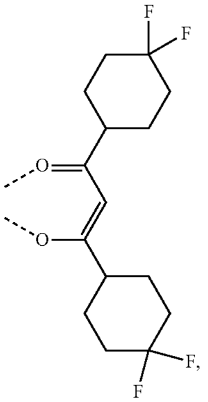
-continued
$L_{b229}$
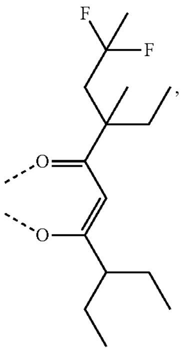
$L_{b230}$
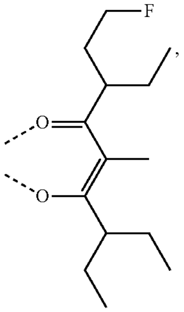
$L_{b231}$
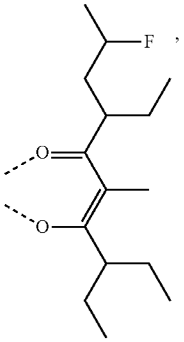
$L_{b232}$
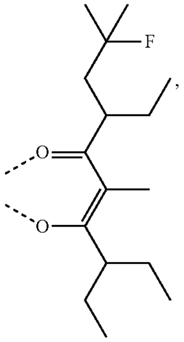

-continued
$L_{b233}$
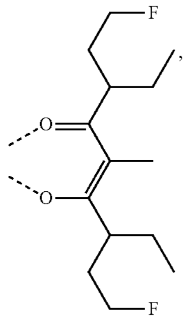
$L_{b234}$
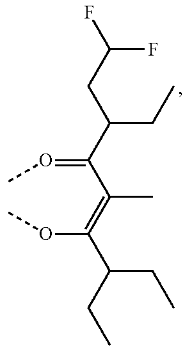
$L_{b235}$
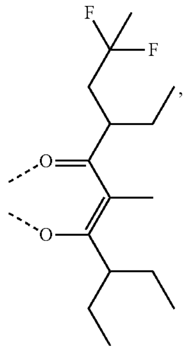
$L_{b236}$
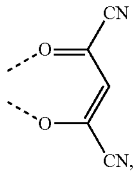
$L_{b237}$
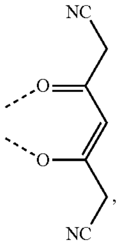
-continued
$L_{b238}$
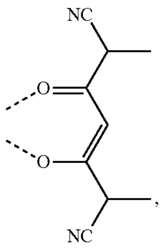
$L_{b239}$
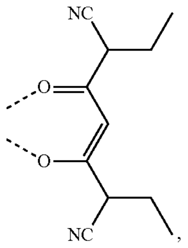
$L_{b240}$
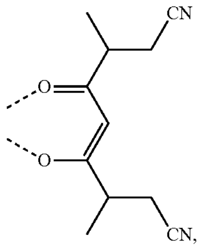
$L_{b241}$
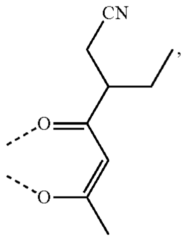
$L_{b242}$
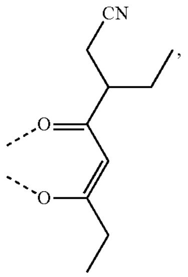
$L_{b243}$
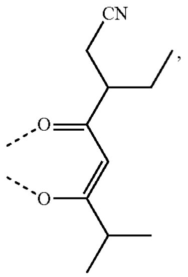

-continued
$L_{b244}$
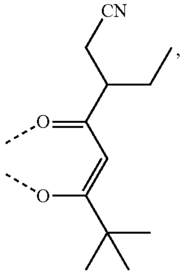
,
$L_{b245}$
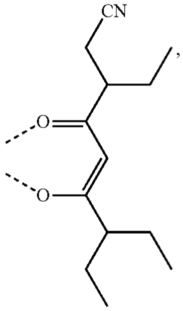
,
$L_{b246}$
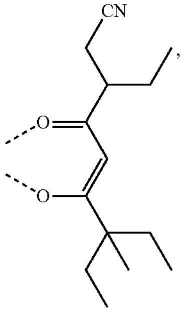
,
$L_{b247}$
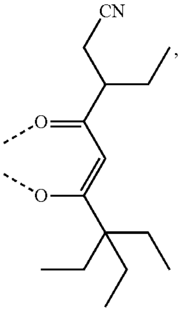
,
$L_{b248}$
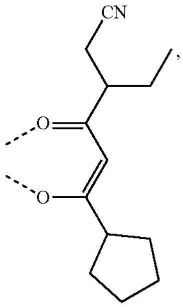
,
-continued
$L_{b249}$
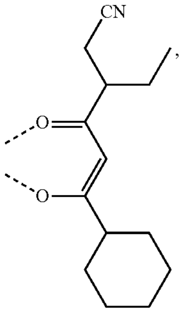
,
$L_{b250}$
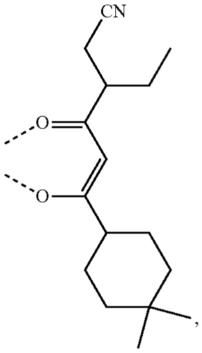
,
$L_{b251}$
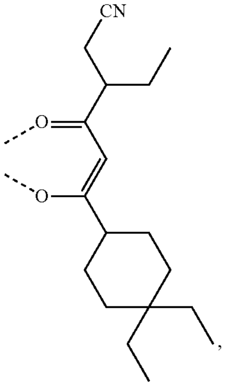
,
$L_{b252}$
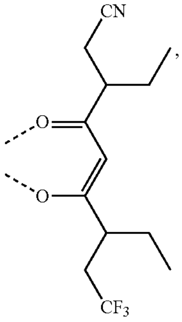
, -continued
$L_{b253}$
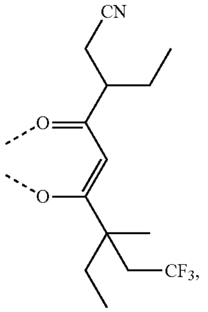
$L_{b254}$
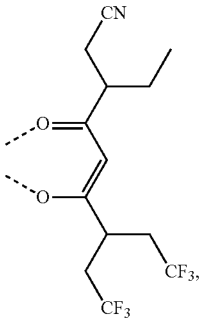
$L_{b255}$
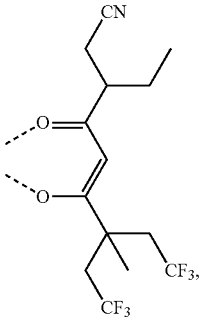
$L_{b256}$
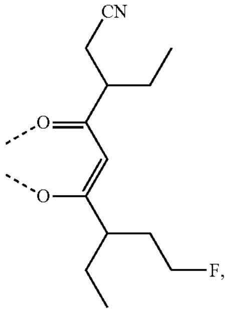
$L_{b257}$
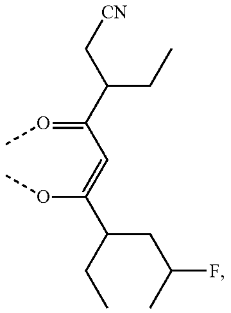
-continued
$L_{b258}$
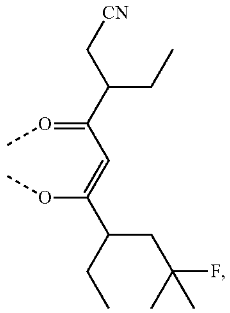
$L_{b259}$
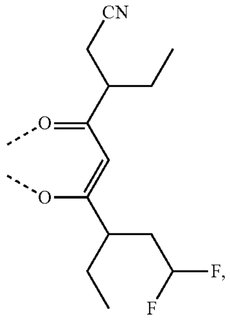
$L_{b260}$
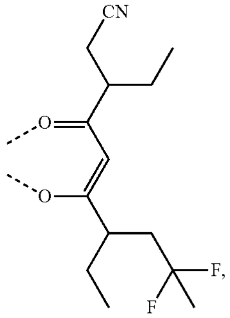
$L_{b261}$
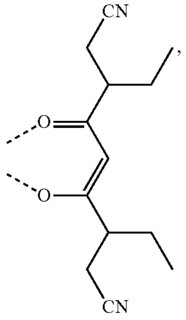
$L_{b262}$
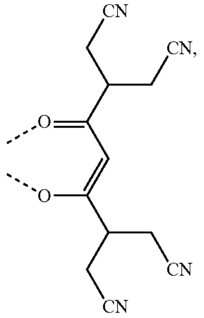

-continued
$L_{b263}$
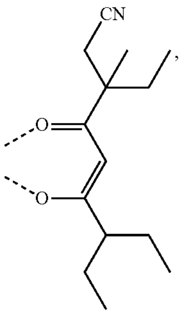
$L_{b264}$
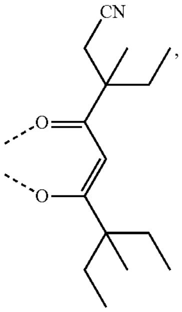
$L_{b265}$
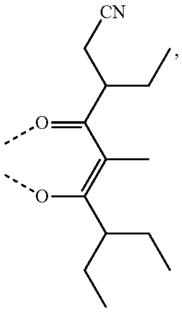
$L_{b266}$
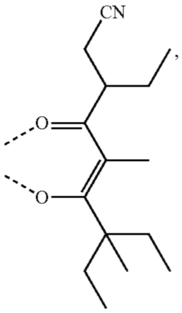
$L_{b267}$
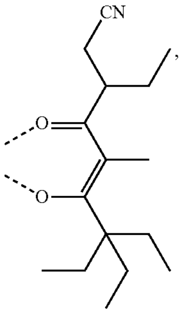
-continued
$L_{b268}$
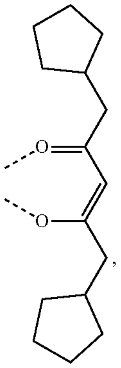
$L_{b269}$
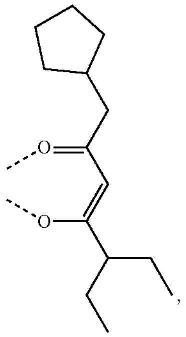
$L_{b270}$
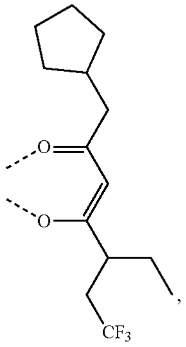
$L_{b271}$
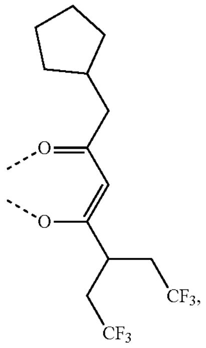

-continued
$L_{b272}$
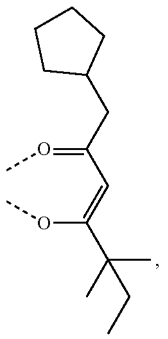
$L_{b273}$
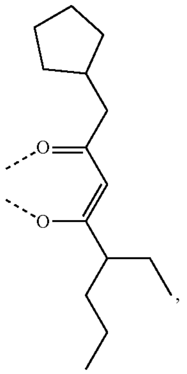
$L_{b274}$
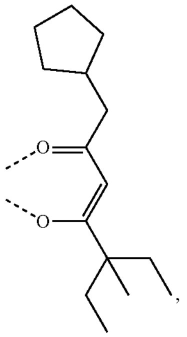
$L_{b275}$
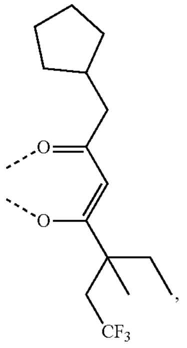
-continued
$L_{b276}$
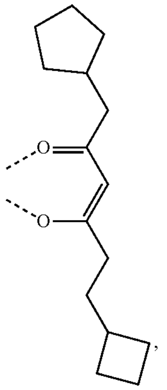
$L_{b277}$
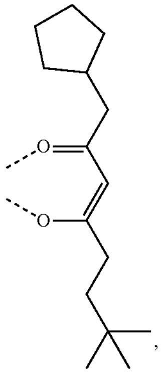
$L_{b278}$
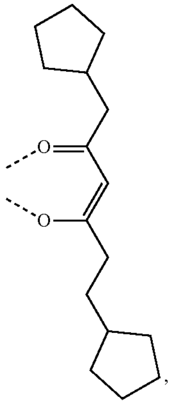
$L_{b279}$
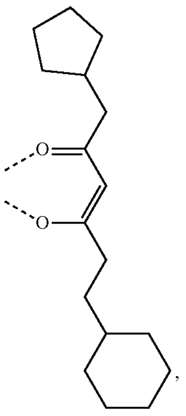

-continued
$L_{b280}$
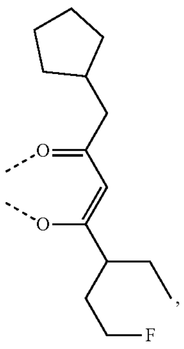
$L_{b281}$
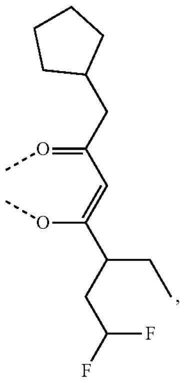
$L_{b282}$
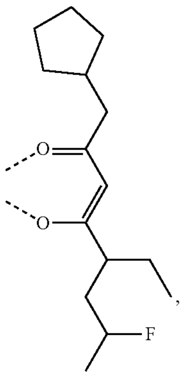
$L_{b283}$
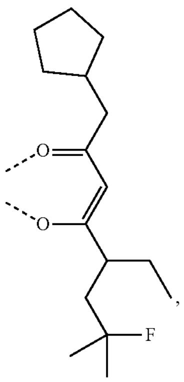
-continued
$L_{b284}$
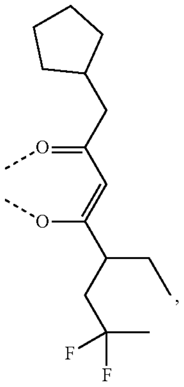
$L_{b285}$
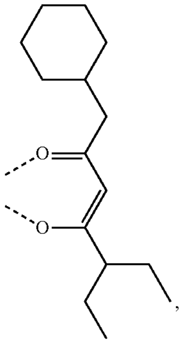
$L_{b286}$
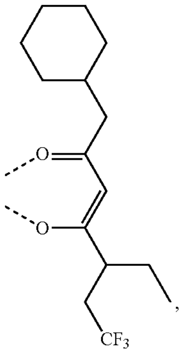
$L_{b287}$
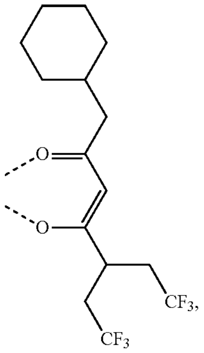

-continued
L$_{b288}$
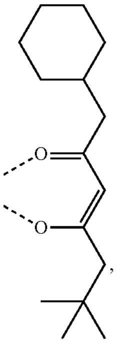
L$_{b289}$
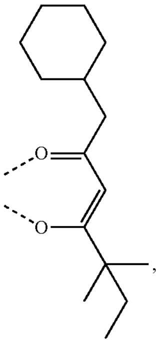
L$_{b290}$
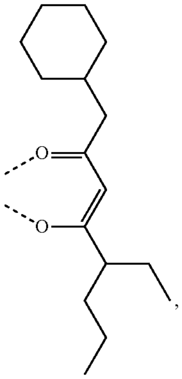
L$_{b291}$
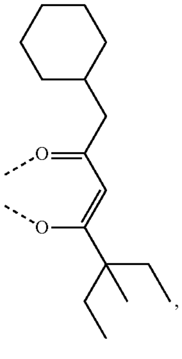
-continued
L$_{b292}$
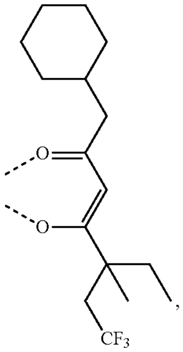
L$_{b293}$
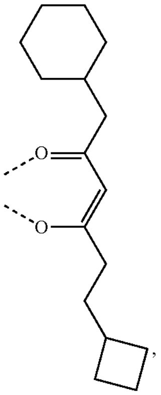
L$_{b294}$
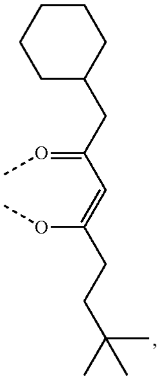
L$_{b295}$
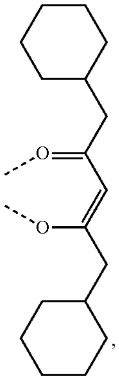

L$_{b296}$
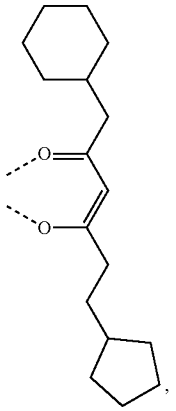
L$_{b297}$
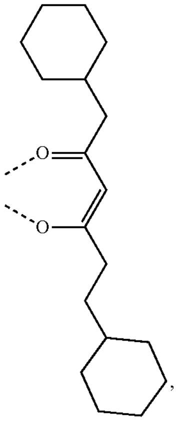
L$_{b298}$
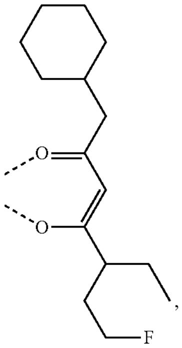
L$_{b299}$
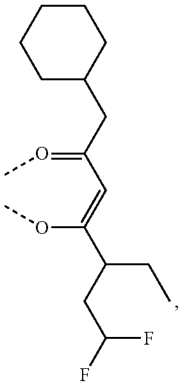
L$_{b300}$
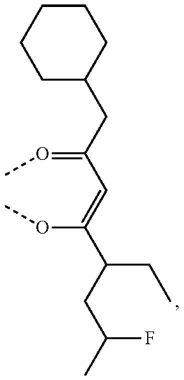
L$_{b301}$
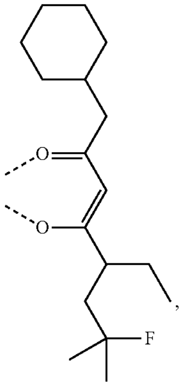
L$_{b302}$
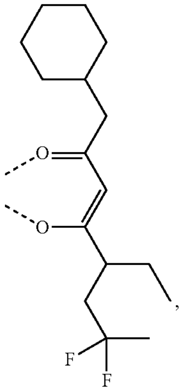
L$_{b303}$
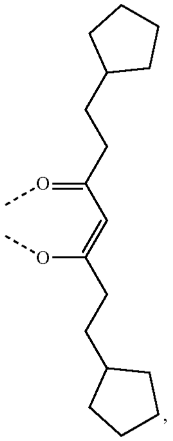

-continued
Lb304
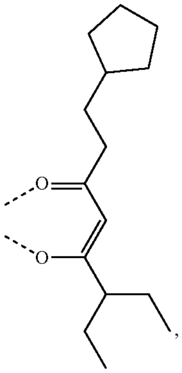
Lb305
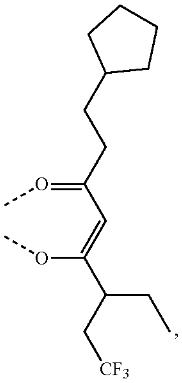
Lb306
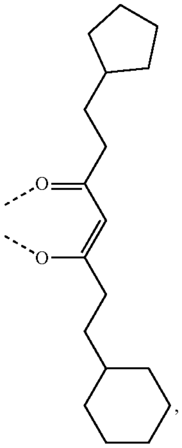
Lb307
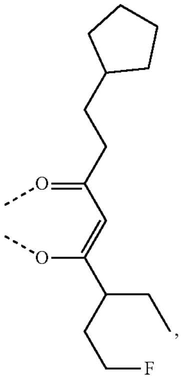
-continued
Lb308
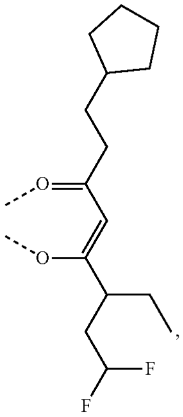
Lb309
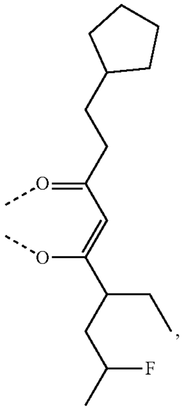
Lb310
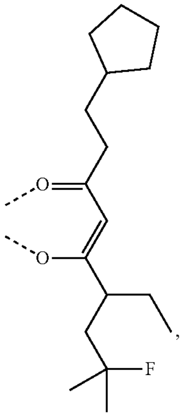

-continued
$L_{b311}$
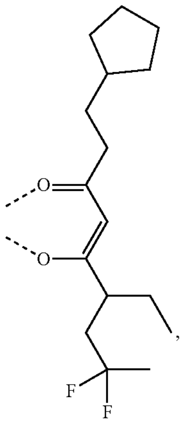
$L_{b312}$
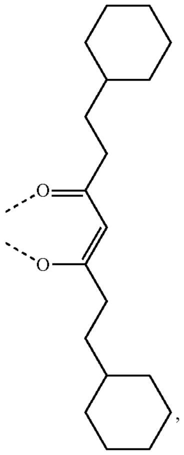
$L_{b313}$
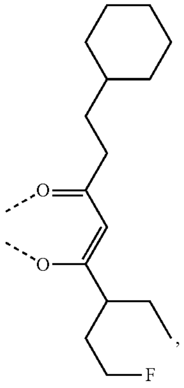
-continued
$L_{b314}$
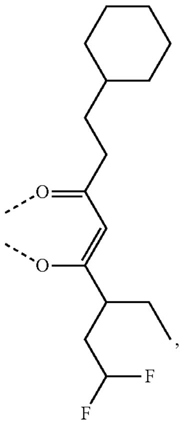
$L_{b315}$
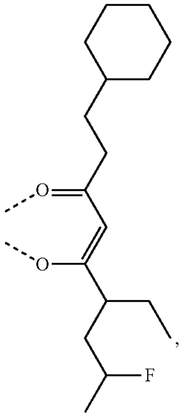
$L_{b316}$
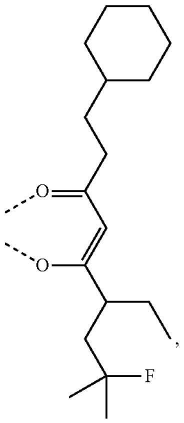

-continued $L_{b317}$

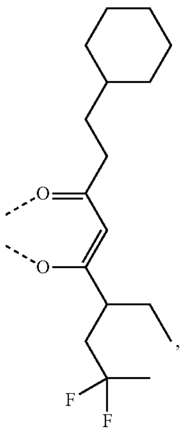

$L_{b318}$

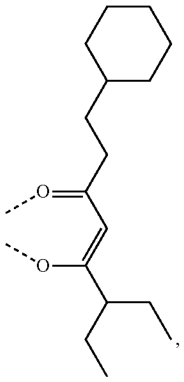

$L_{b319}$

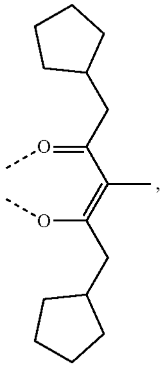

$L_{b320}$

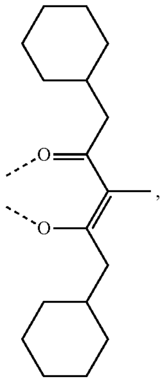

-continued $L_{b321}$

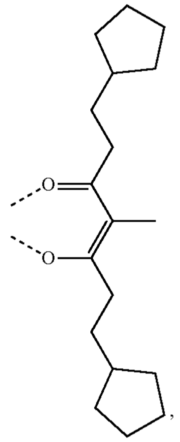

$L_{b322}$

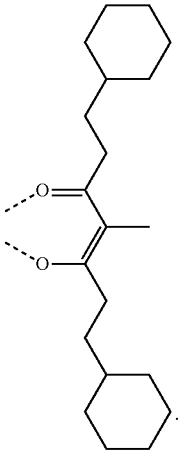

24. The electroluminescent device according to claim 23, wherein the second compound is an Ir complex and has a structure represented by any one of $Ir(L_a)_2(L_b)$, when the second compound has a structure of $Ir(L_a)_2L_b$, the $L_a$ is selected from any one or two of the group consisting of $L_{a139}$ to $L_{a152}$, $L_{a159}$ to $L_{a168}$, $L_{a263}$ to $L_{a452}$, $L_{a455}$, $L_{a457}$, $L_{a462}$ to $L_{a464}$, $L_{a466}$ to $L_{a468}$, $L_{a529}$ to $L_{a673}$, and the $L_b$ is selected from any one of the group consisting of $L_{b1}$ to $L_{b322}$.

25. The electroluminescent device according to claim 1, wherein the organic layer is a light-emitting layer, the first compound is a host material, and the second compound is a light-emitting material.

26. The electroluminescent device according to claim 1, wherein the device emits red light or white light.

27. A display assembly, comprising the electroluminescent device according to claim 1.

28. The electroluminescent device according to claim 1, the two substituents $R_{z2}$ in $Z_4$ and $Z_5$ are joined to form a ring, and the ring has at least seven ring atoms.

29. The electroluminescent device according to claim 6, wherein in Formula E-a, at least two of $E_1$ to $E_6$ are N; in Formula E-b, at least two of $E_7$ to $E_{14}$ are N.

30. The electroluminescent device according to claim 1, wherein in the first compound, the E has a structure represented by any one of Formula E-11 to Formula E-21:

Formula E-11

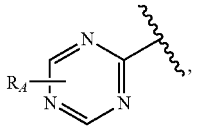

Formula E-12

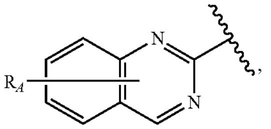

Formula E-13

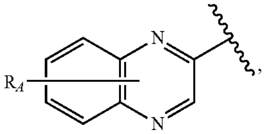

Formula E-14

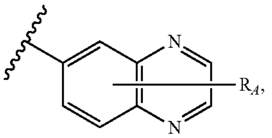

Formula E-15

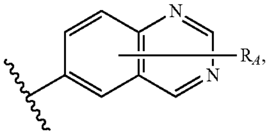

Formula E-16

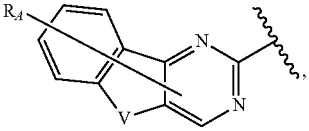

Formula E-17

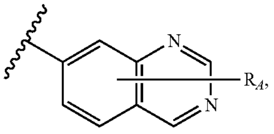

Formula E-18

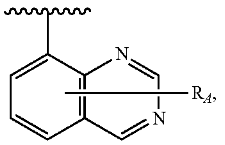

Formula E-19

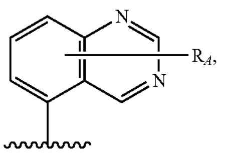

Formula E-20

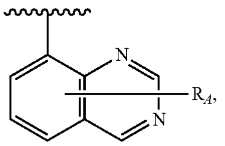

-continued

Formula E-21

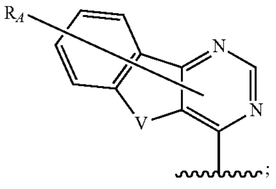

wherein in Formula E-11 to Formula E-21, $R_A$ represents, at each occurrence identically or differently, mono-substitution, multiple substitutions or non-substitution;

V is selected from O, S or Se;

$R_A$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group, a hydroxyl group, a sulfanyl group and combinations thereof; and adjacent substituents $R_A$ can be optionally joined to form a ring.

31. The electroluminescent device according to claim 11, wherein the first compound is selected from the group consisting of the following structures:

1-1

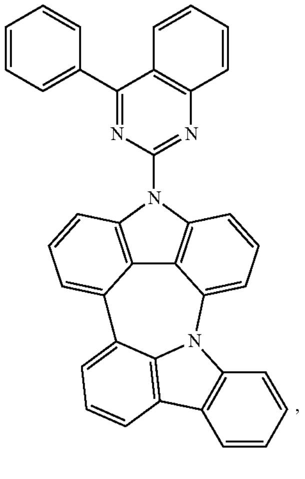

-continued
1-2
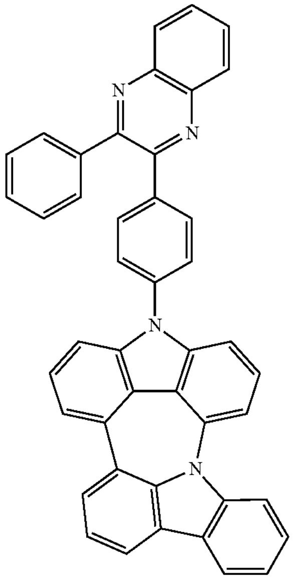
,
1-3
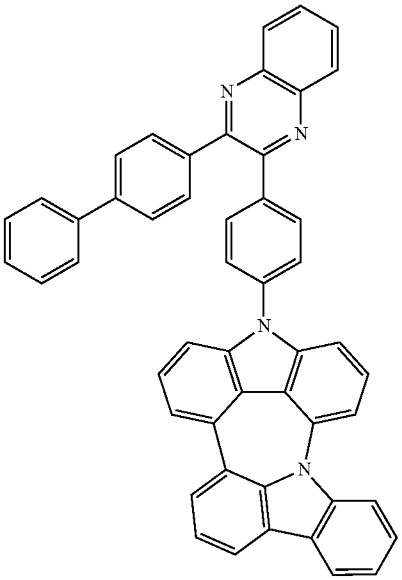
,
1-4
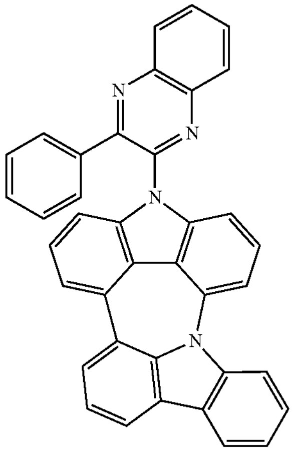
,
-continued
1-5
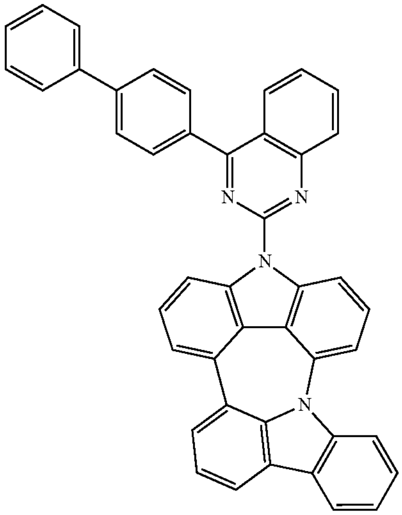
,
1-6
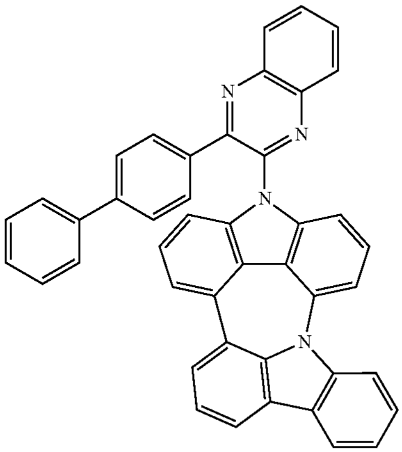
,
1-7
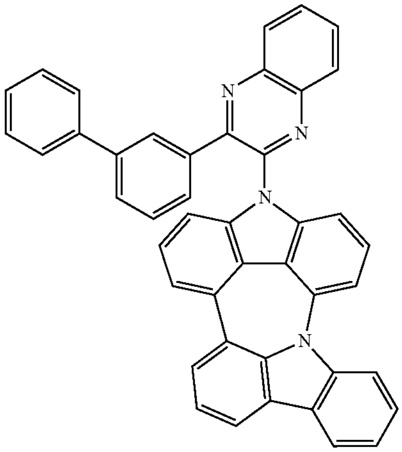
, -continued
1-8
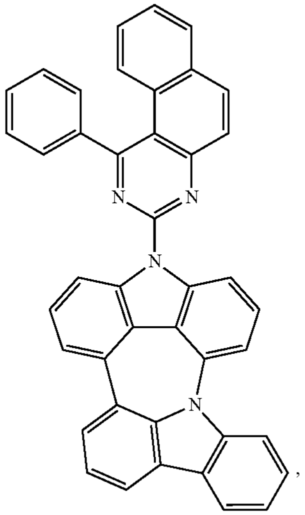
1-9
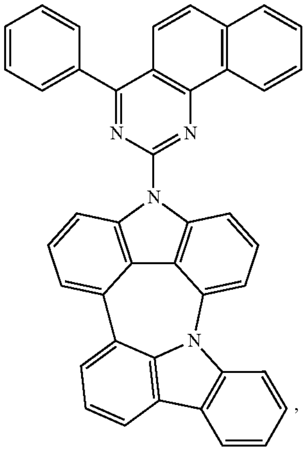
1-10
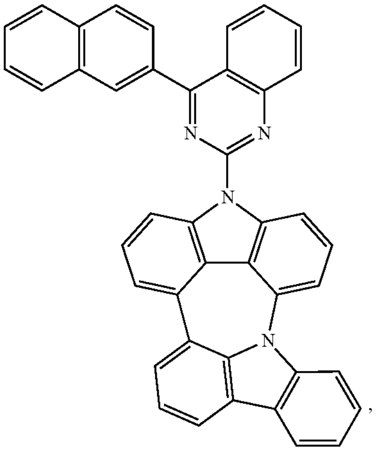
-continued
1-11
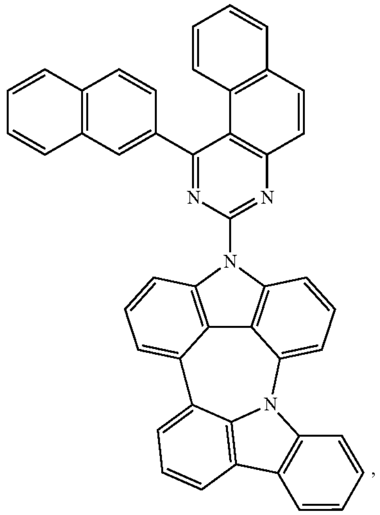
1-12
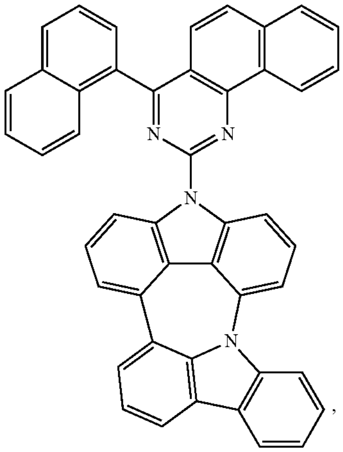
1-13
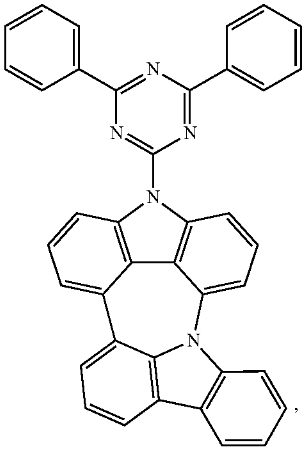

-continued
1-14
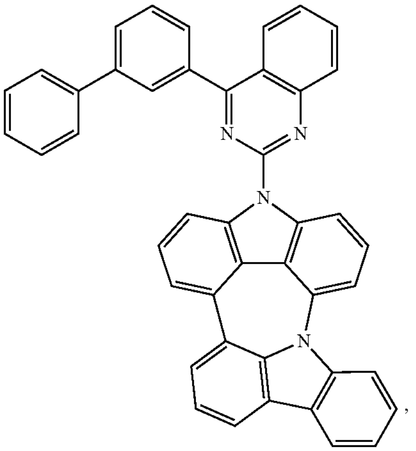
1-15
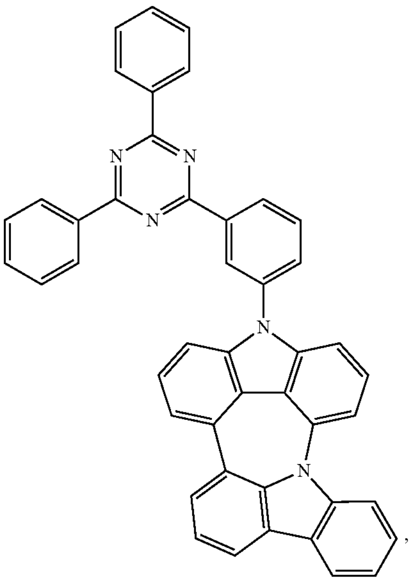
1-16
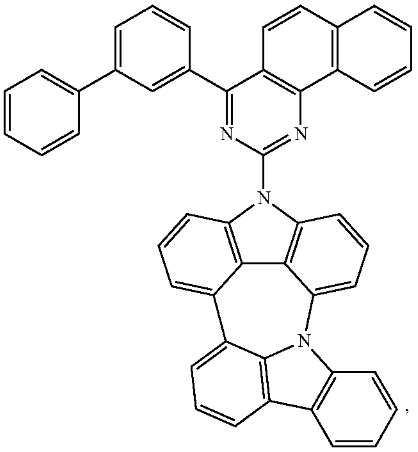
-continued
1-17
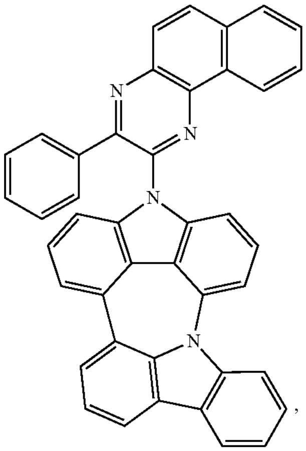
1-18
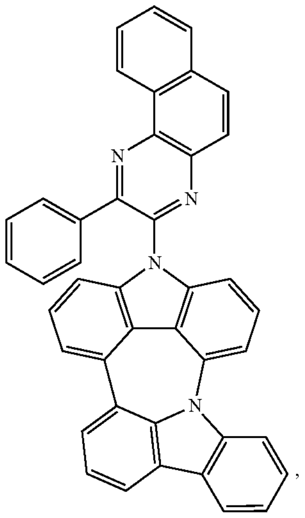
1-19
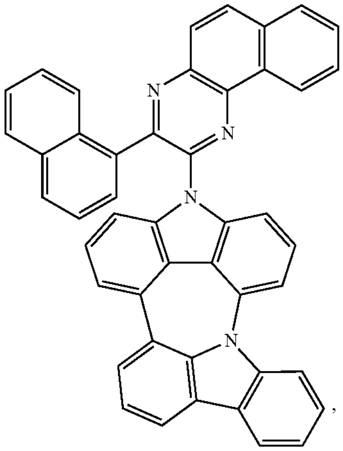

-continued
120
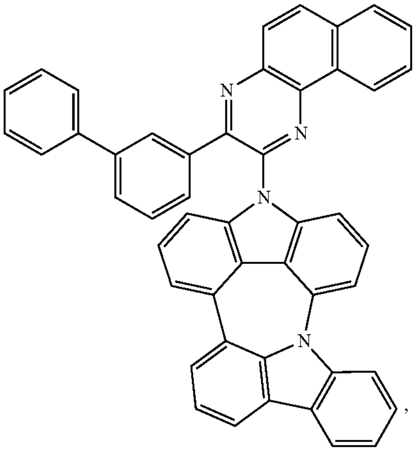,
1-21
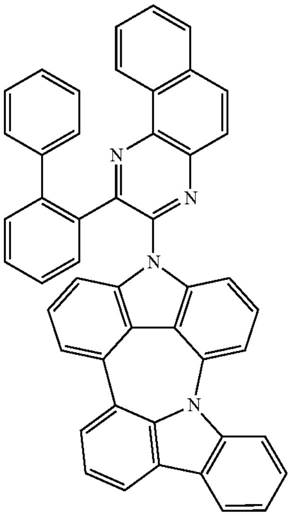,
1-22
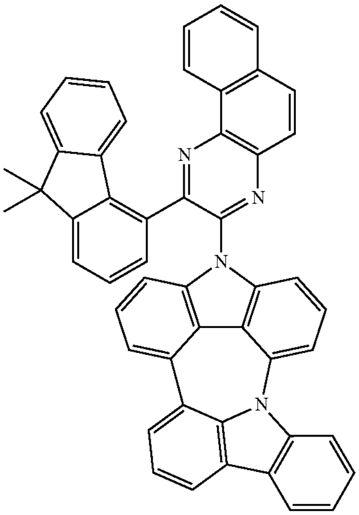,
-continued
1-23
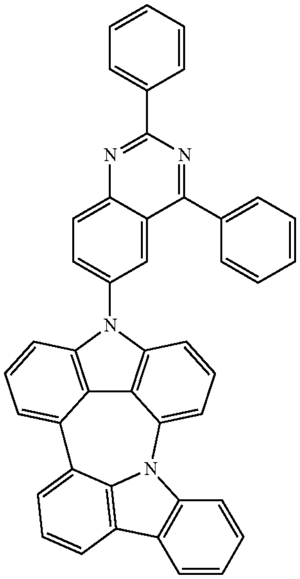,
1-24
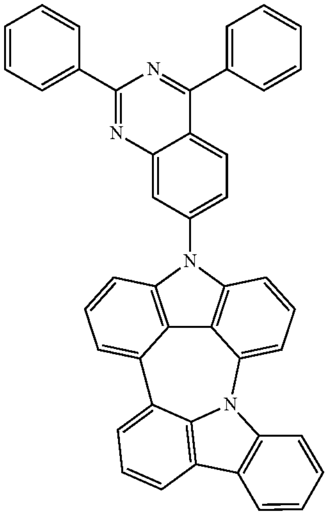
1-25
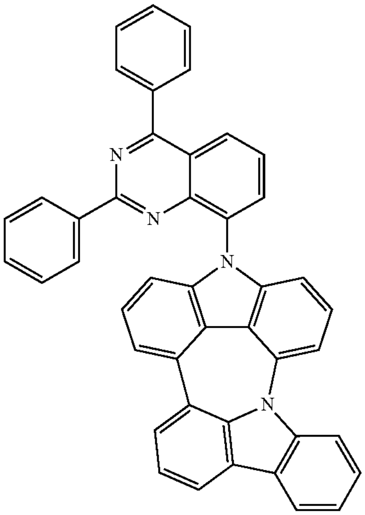, -continued
1-26
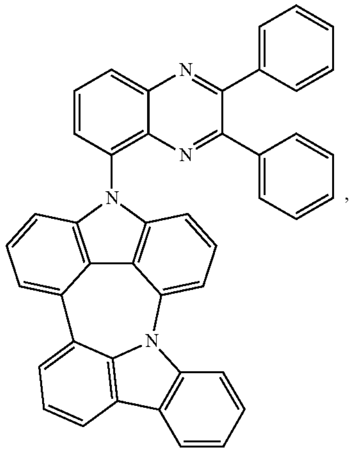
1-27
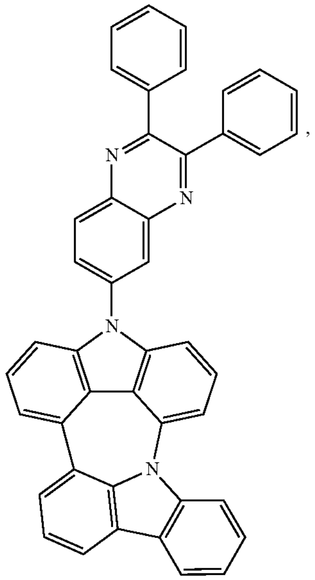
1-28
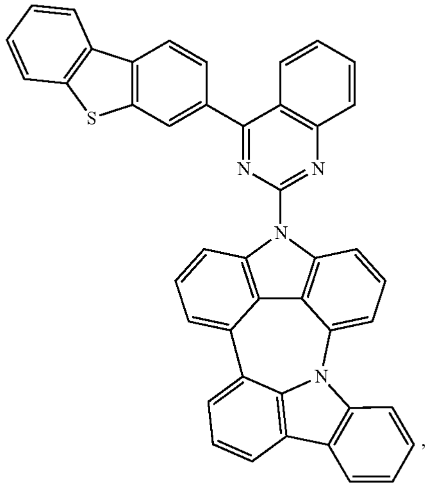
-continued
1-29
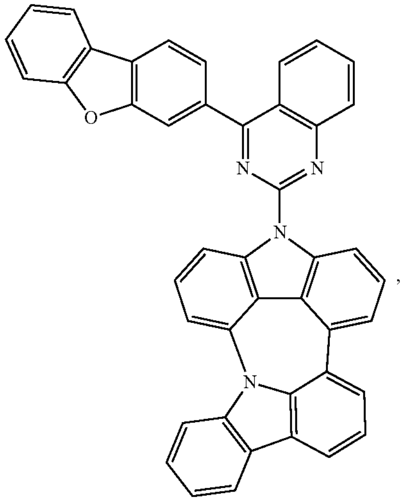
1-30
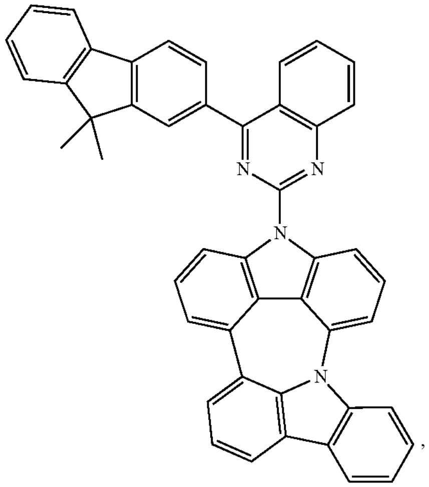
1-31
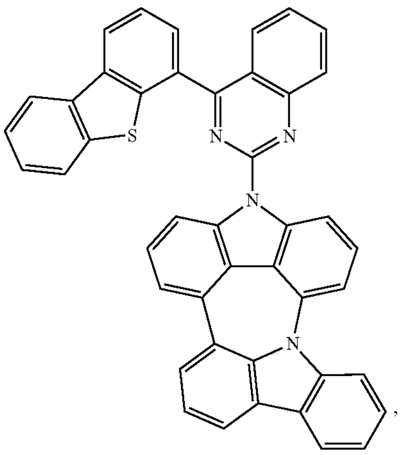

-continued
1-32
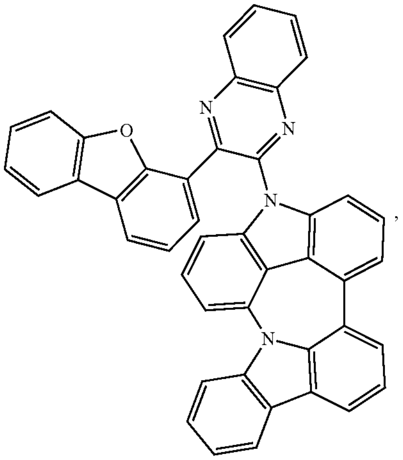
1-33
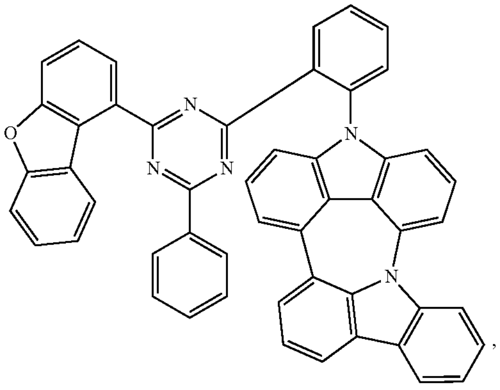
1-34
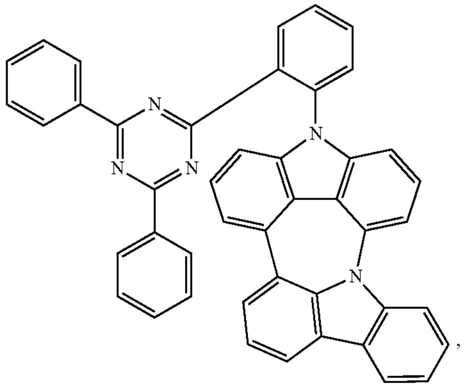
-continued
1-35
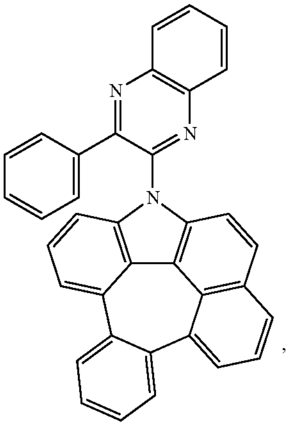
1-36
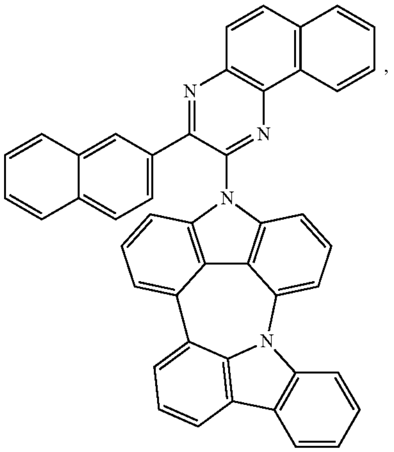
1-37
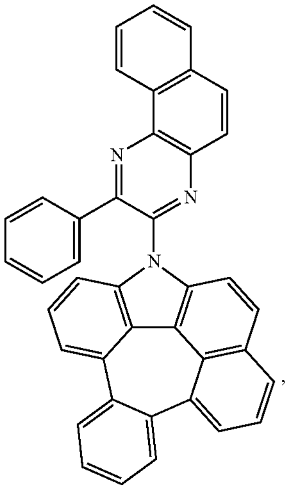

-continued
1-38
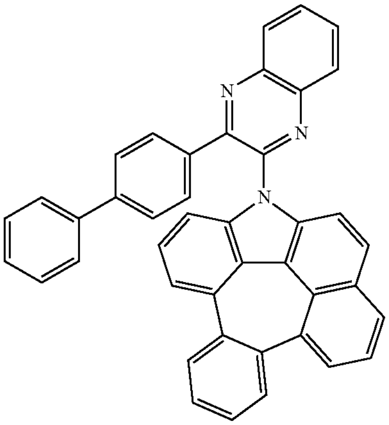
,
1-39
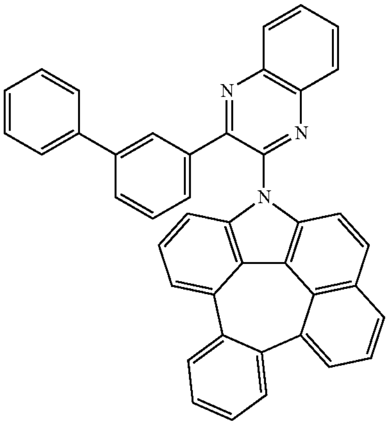
,
1-40
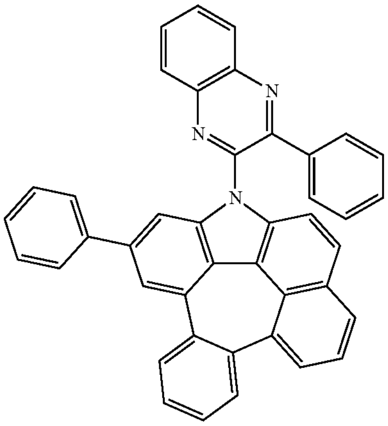
,
-continued
1-41
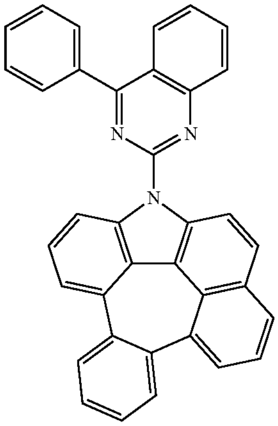
,
1-42
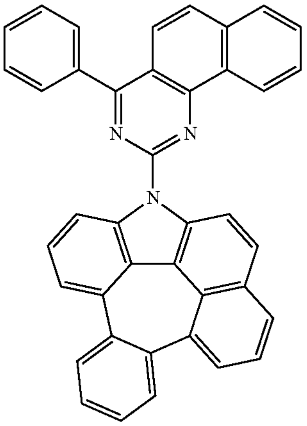
,
1-43
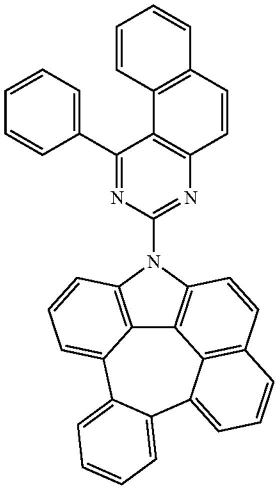
, -continued
1-44
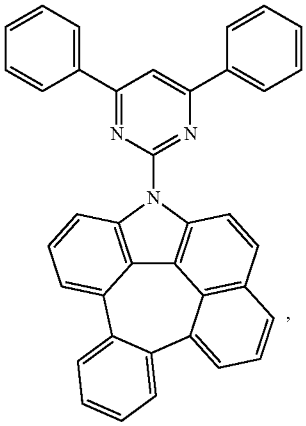
,
1-45
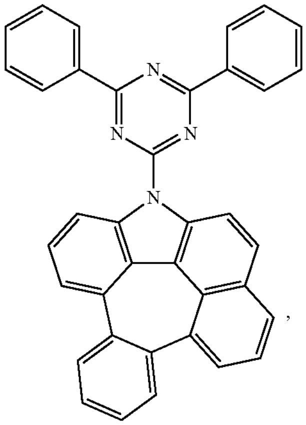
,
1-46
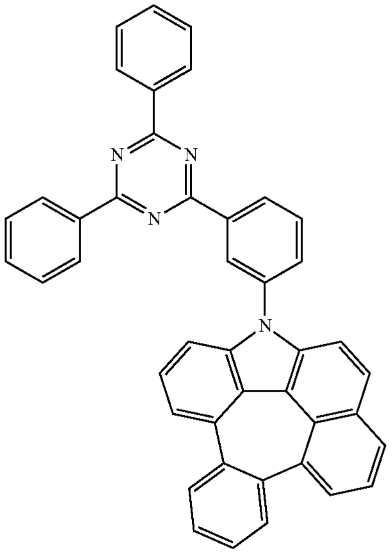
,
-continued
1-47
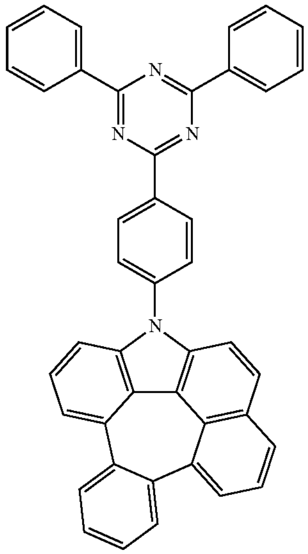
,
1-48
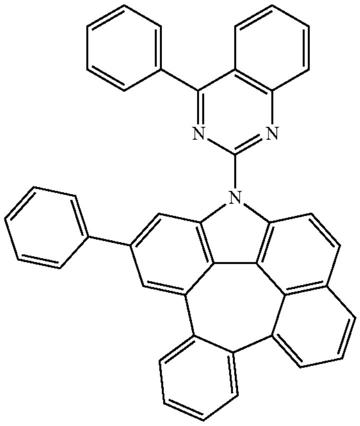
,
1-49
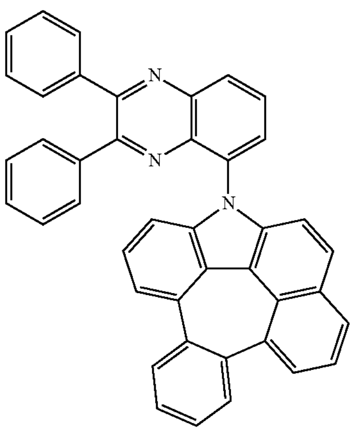
, -continued
1-50
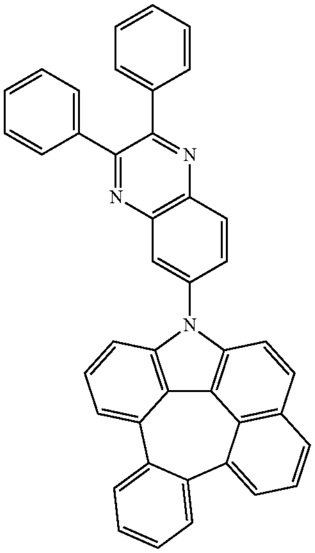
,
1-51
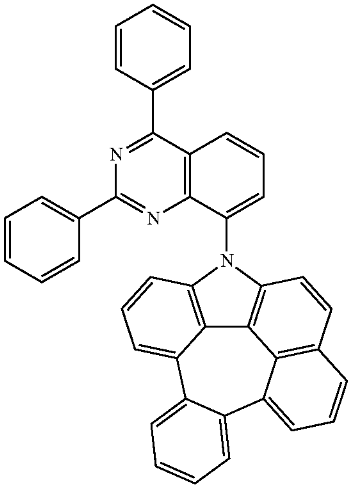
,
1-52
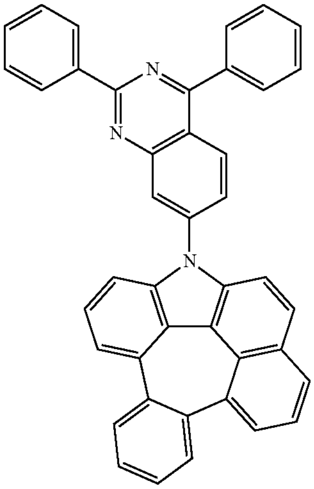
,
-continued
1-53
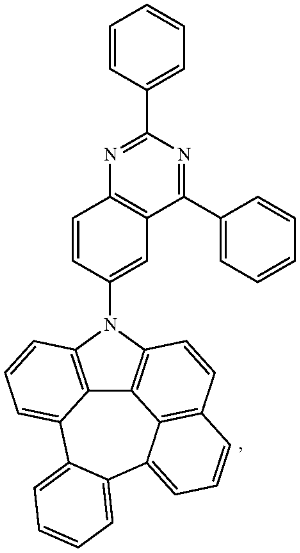
,
1-54
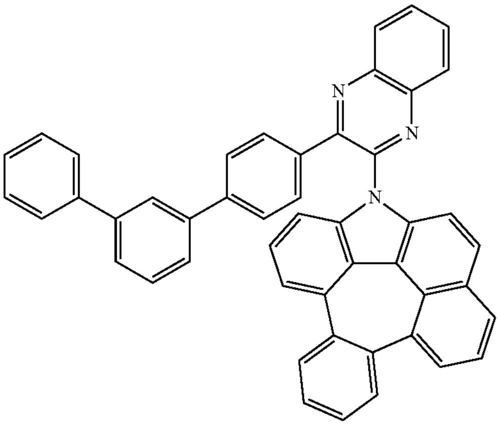
,
1-55
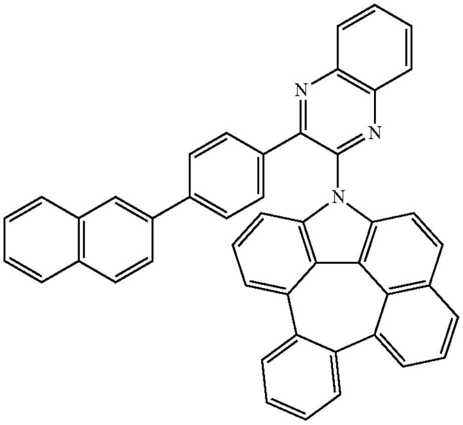
, -continued
1-56
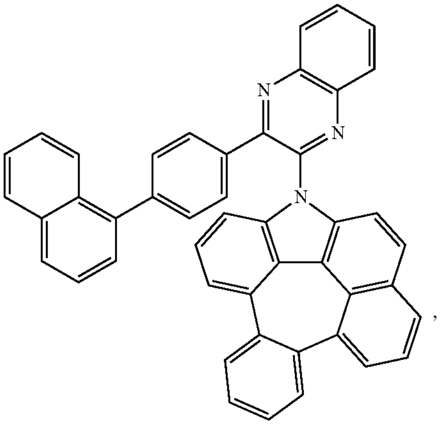
1-57
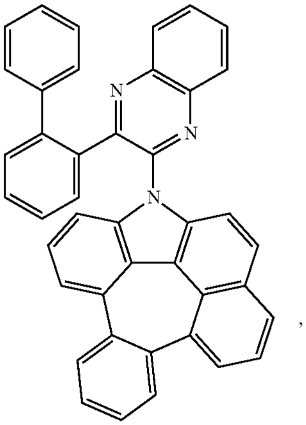
1-58
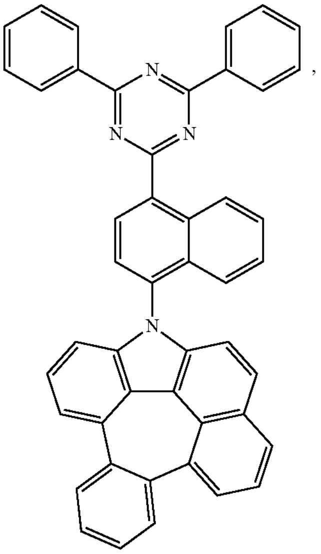
-continued
1-59
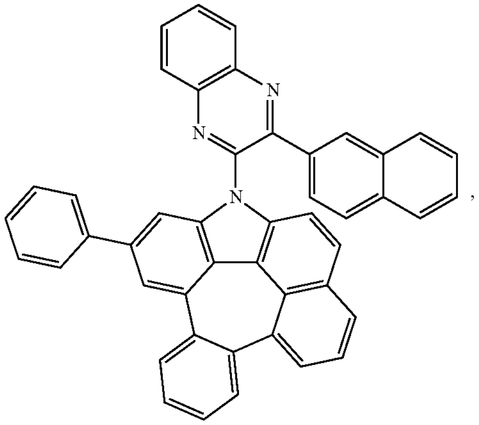
1-60
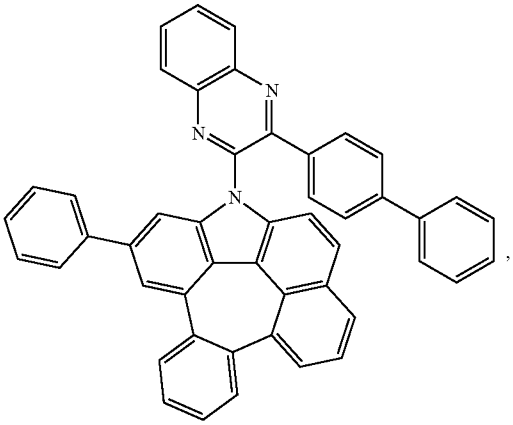
1-61
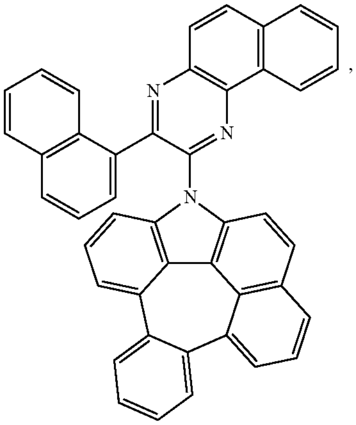

-continued
1-62
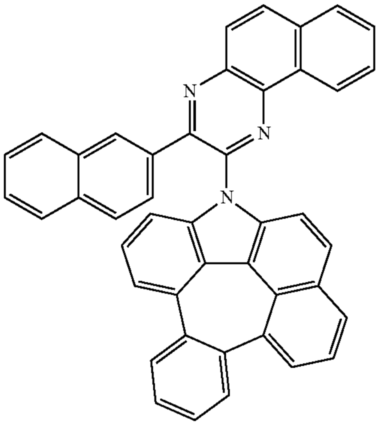
,
1-63
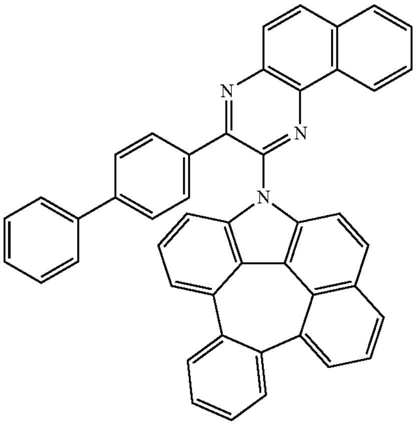
,
1-64
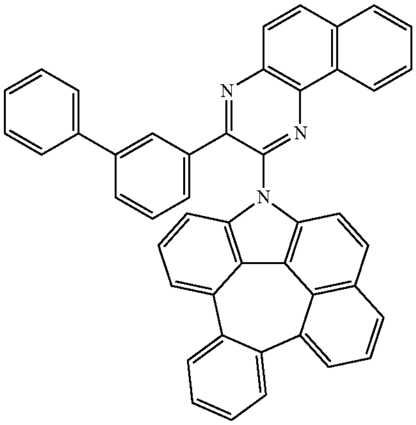
,
-continued
1-65
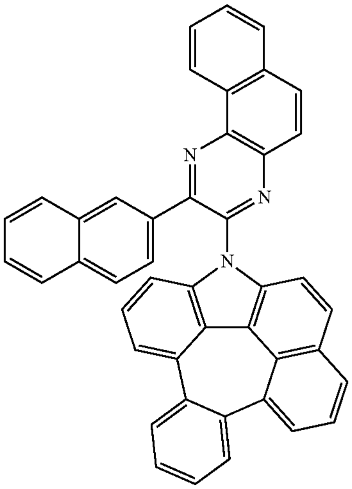
,
1-66
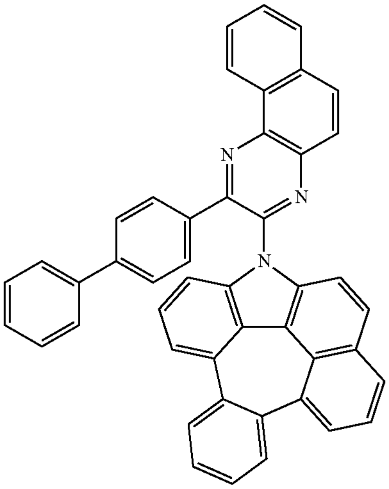
,
1-67
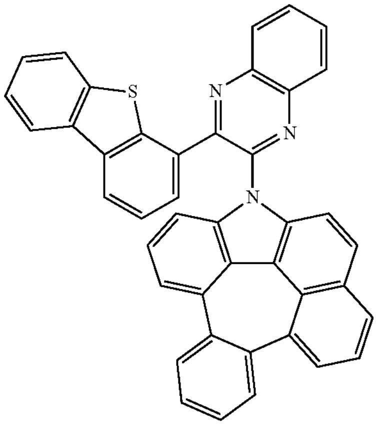
, -continued
1-68
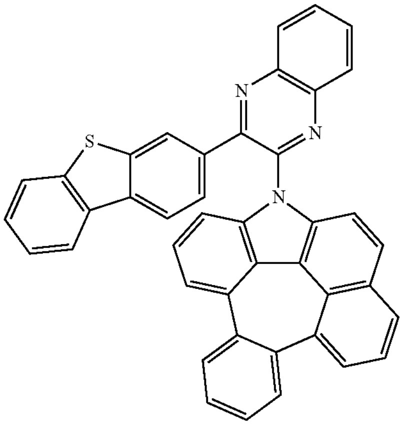
,
1-69
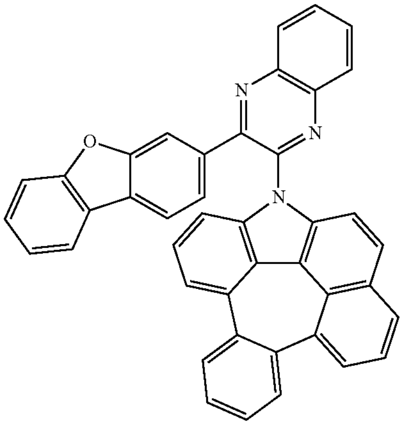
,
1-70
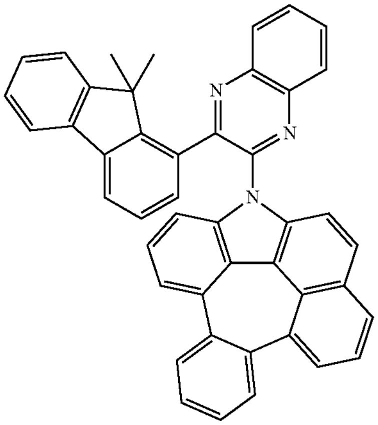
,
-continued
1-71
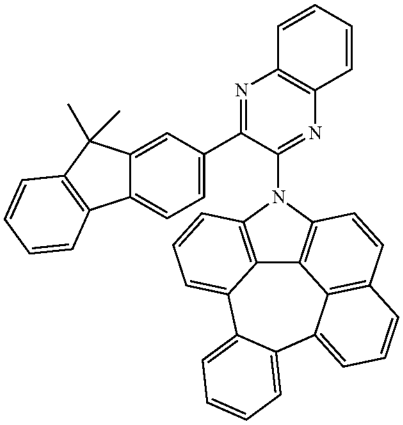
,
1-72
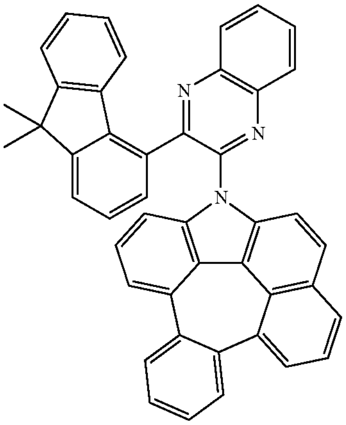
,
1-73
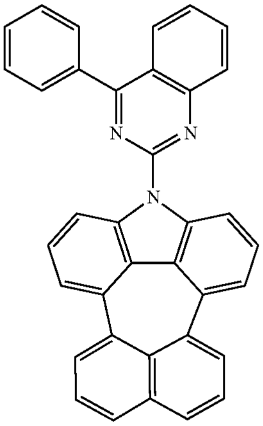
, -continued
1-74
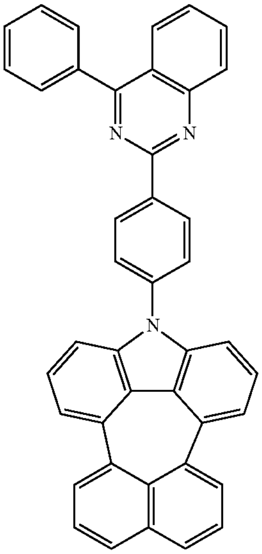
,
1-75
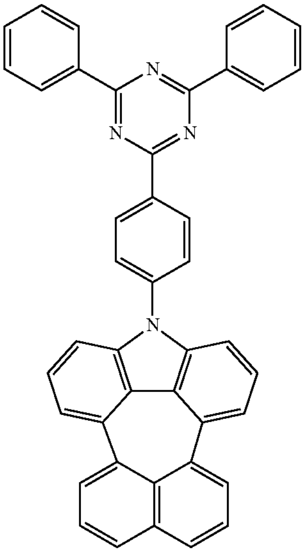
,
1-76
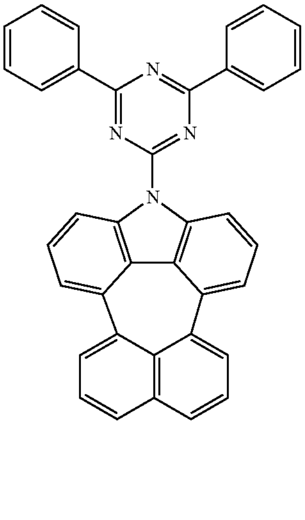
,
-continued
1-77
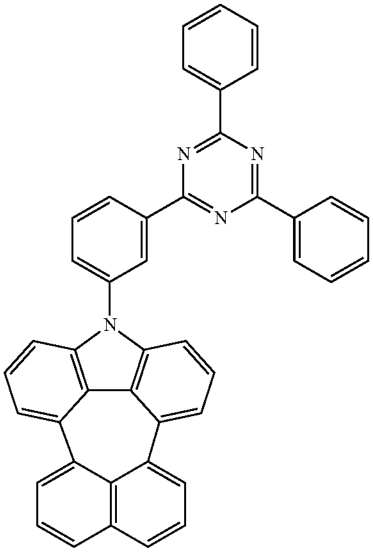
,
1-78
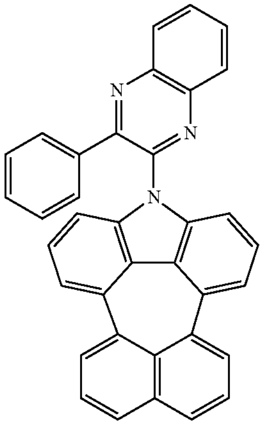
,
1-79
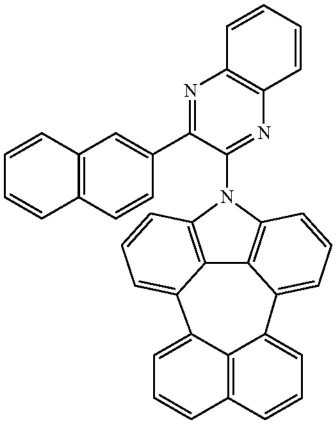
, -continued
1-80
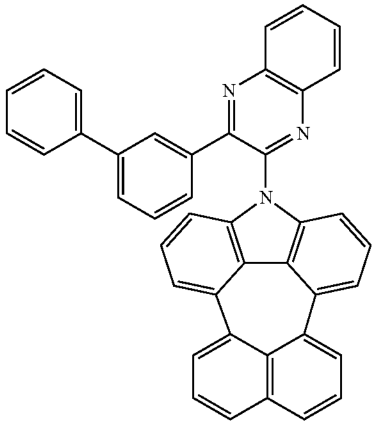
,
1-81
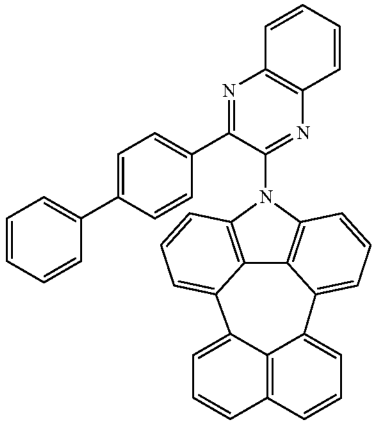
,
1-82
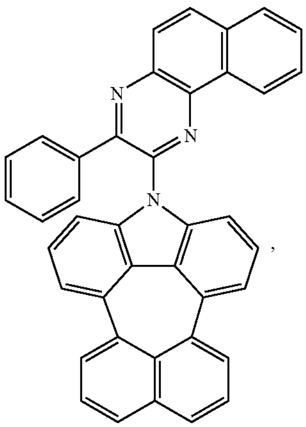
,
-continued
1-83
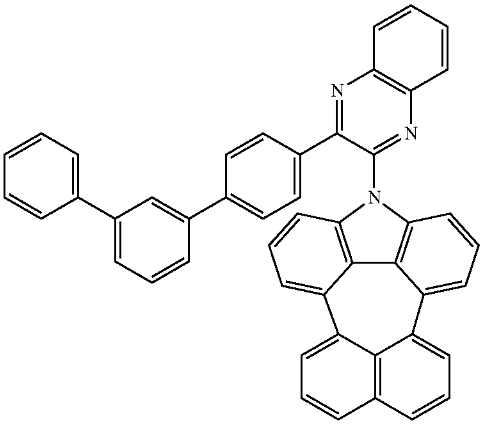
,
1-84
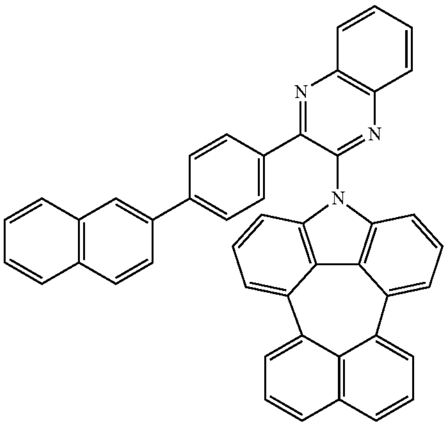
,
1-85
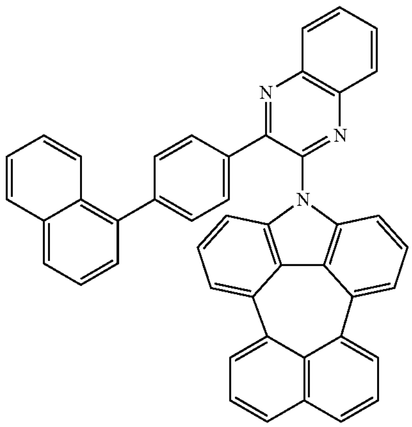
, -continued
1-86
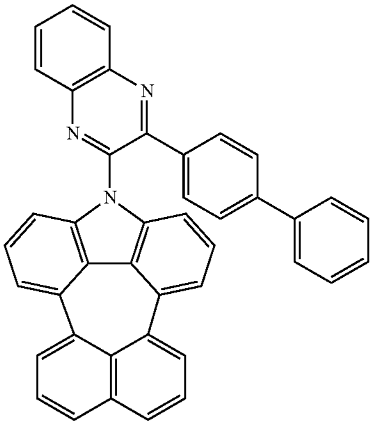
,
1-87
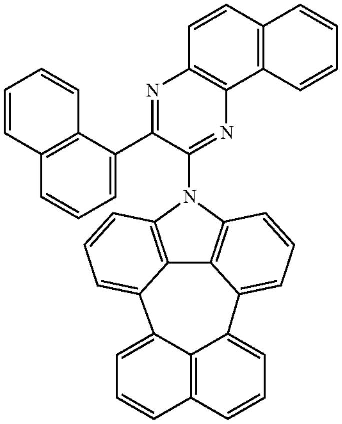
,
1-88
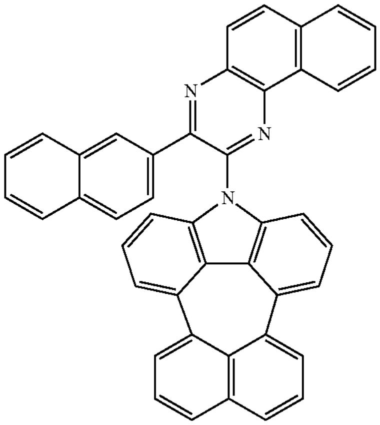
,
-continued
1-89
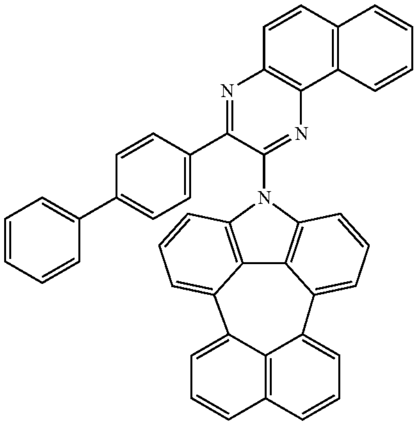
,
1-90
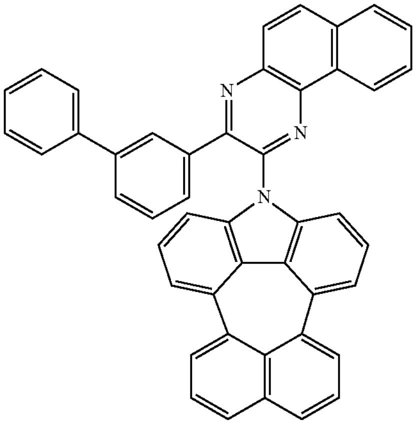
,
1-91
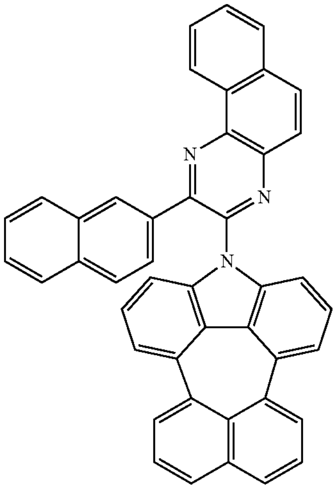
, -continued
1-92
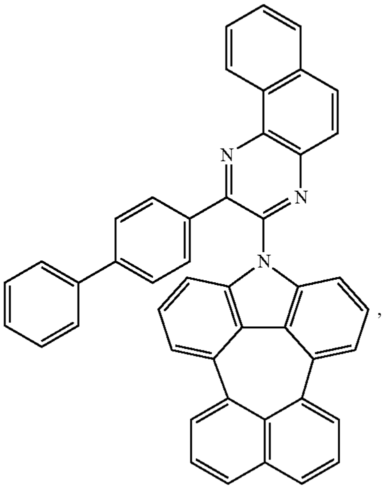
1-93
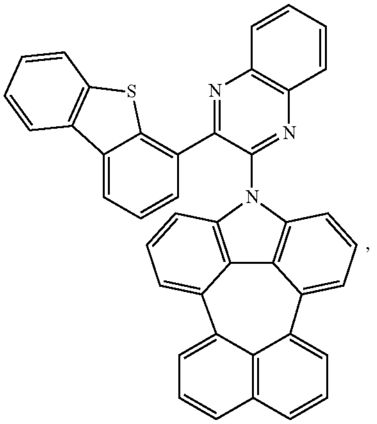
1-94
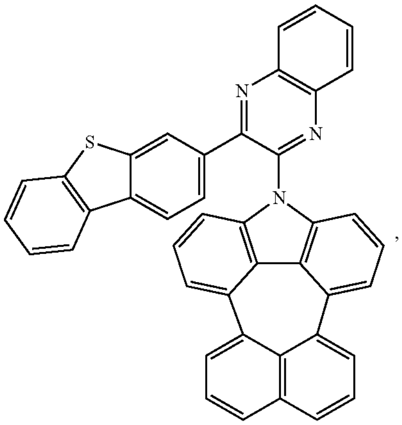
-continued
1-95
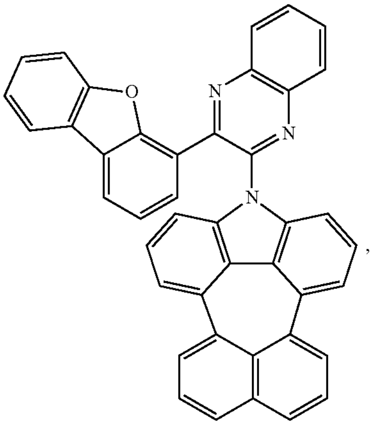
1-96
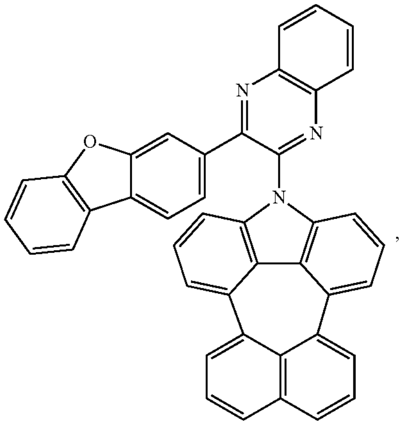
1-97
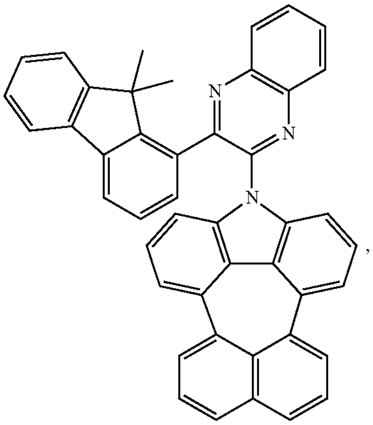

-continued
1-98
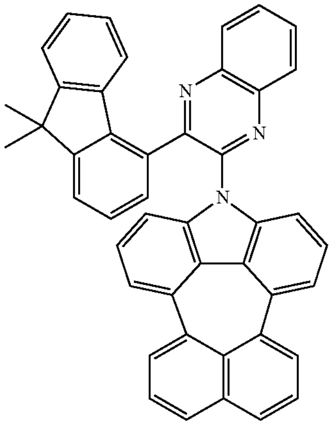
,
1-99
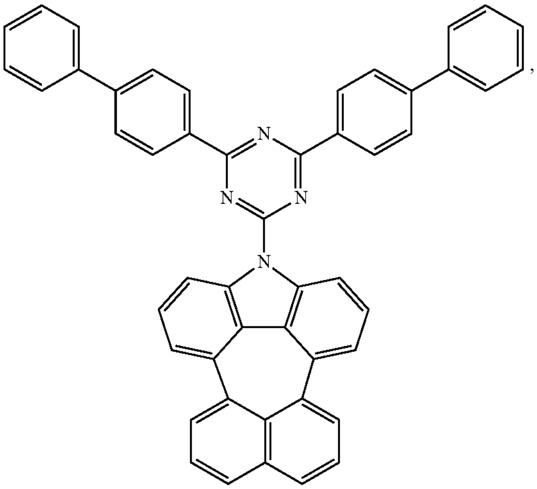
,
1-100
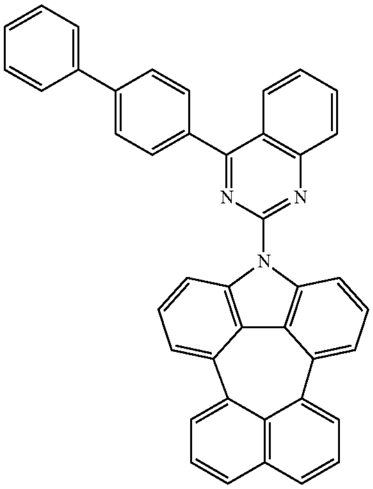
,
-continued
1-101
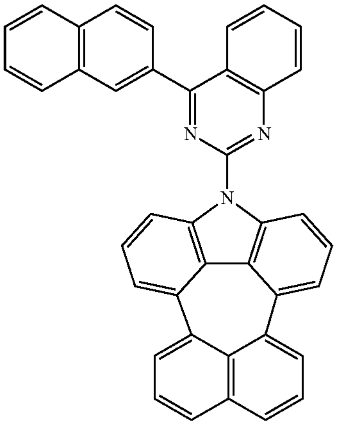
,
1-102
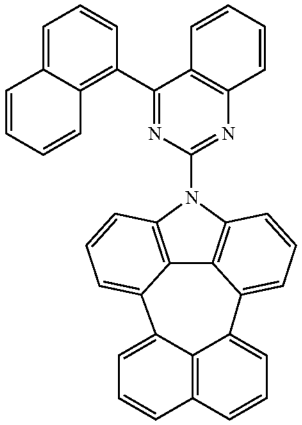
,
1-103
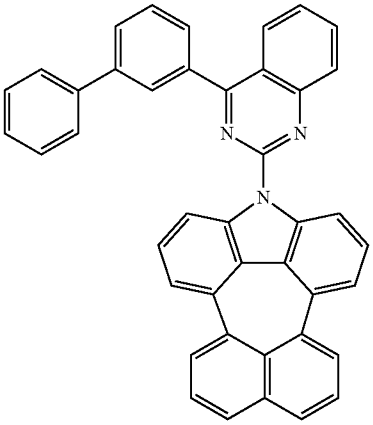
, -continued
1-104
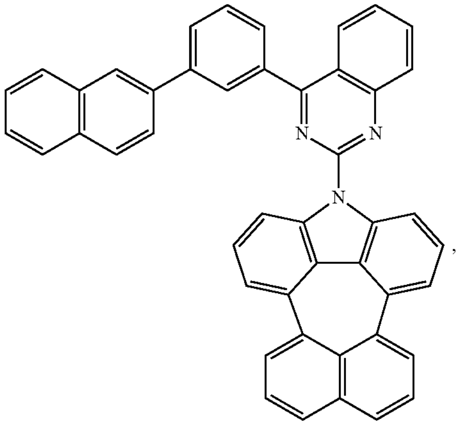
,
1-105
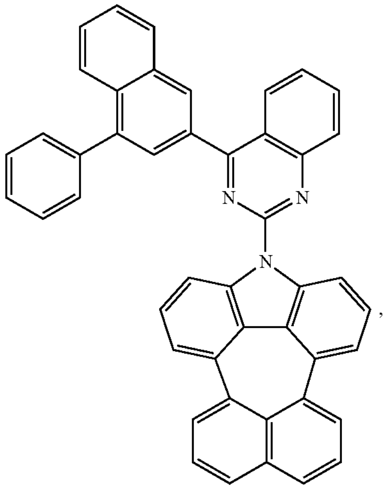
,
1-106
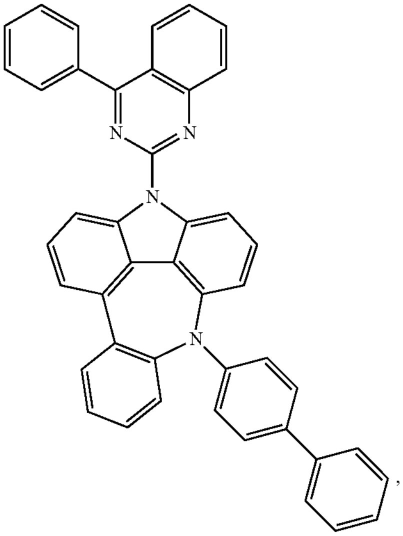
,
-continued
1-107
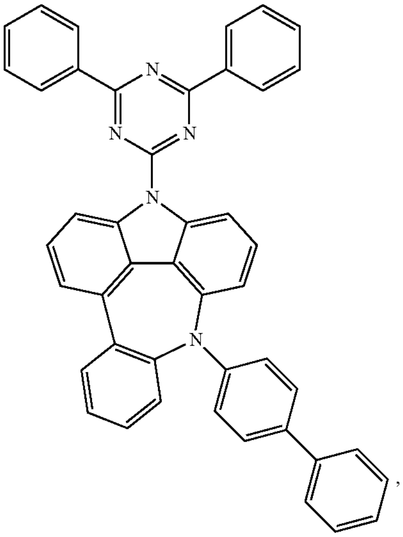
,
1-108
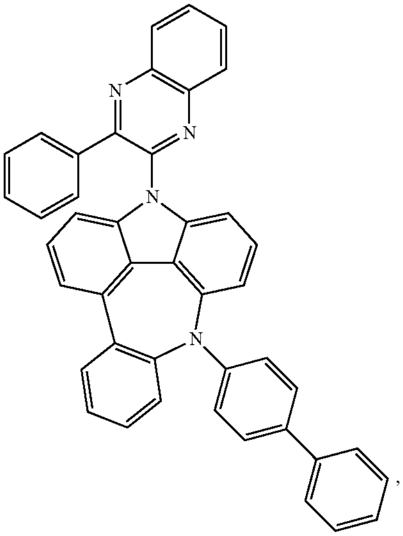
, -continued
1-109
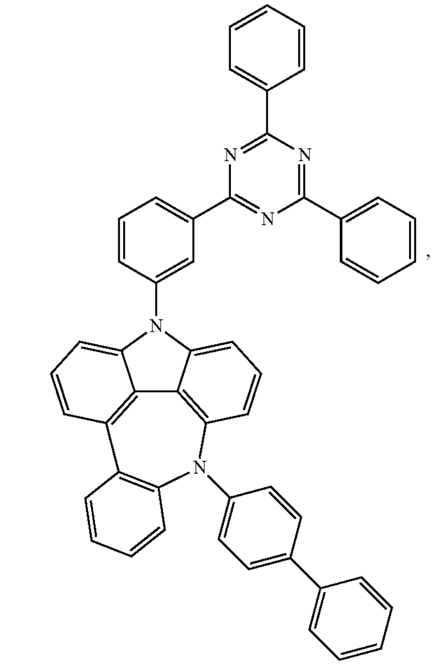
,
1-110
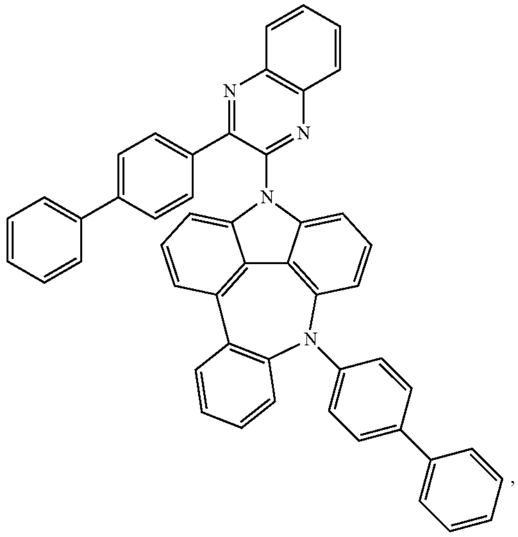
,
-continued
1-111
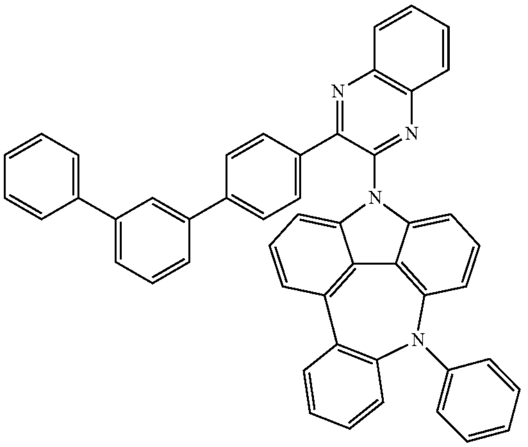
,
1-112
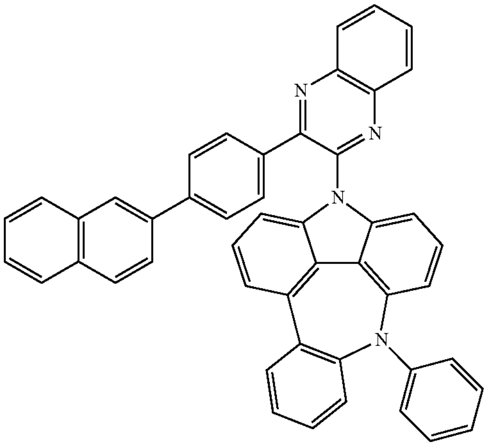
,
1-113
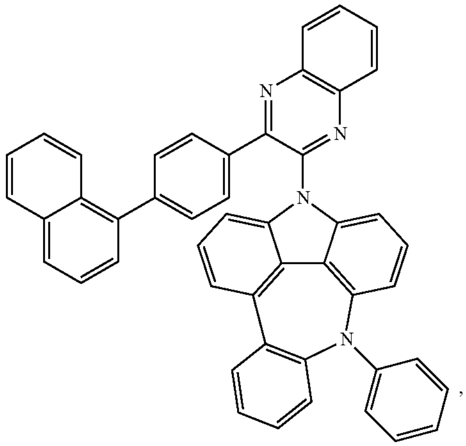
, -continued
1-114
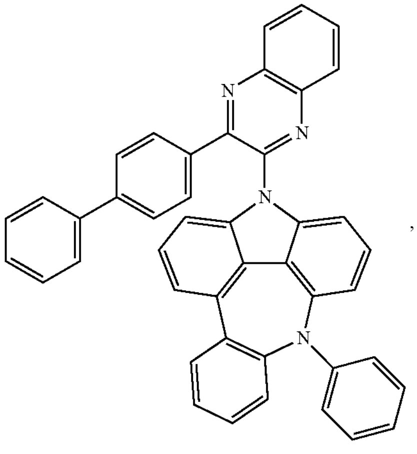
,
1-115
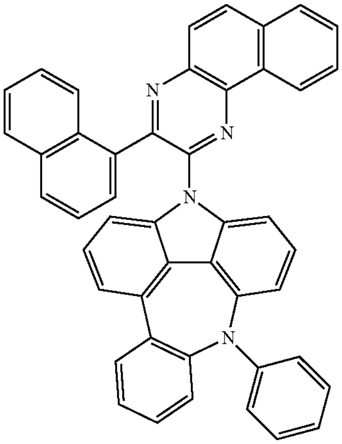
,
1-116
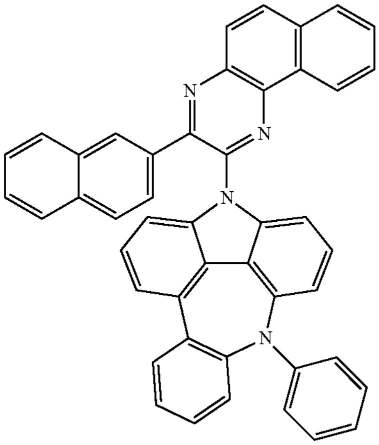
,
1-117
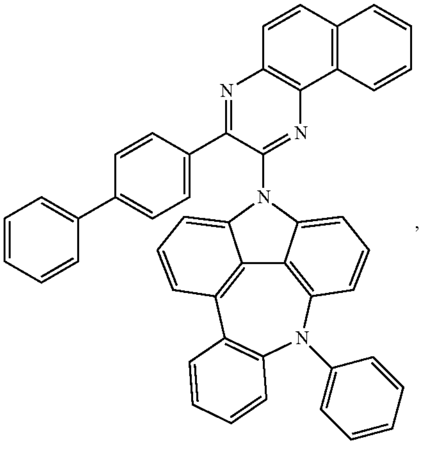
,
1-118
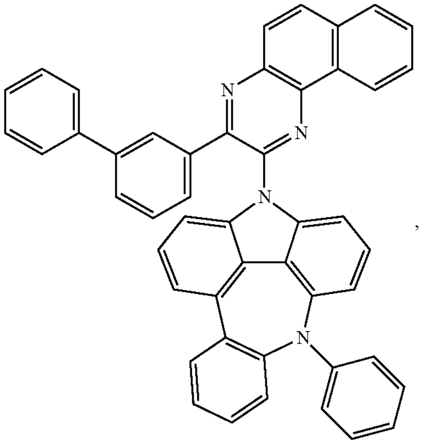
,
1-119
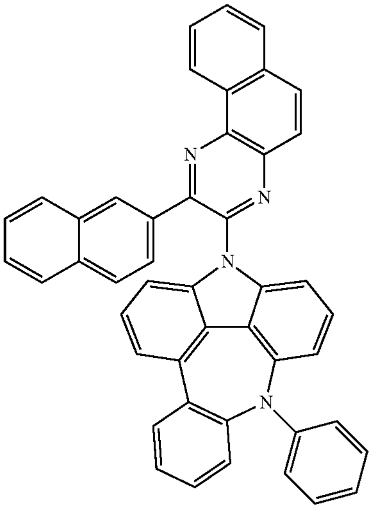
, -continued
1-120
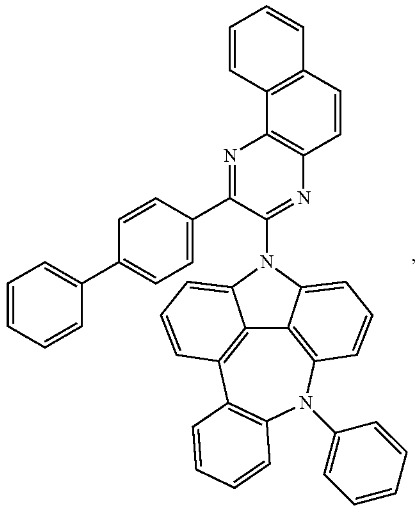
,
1-121
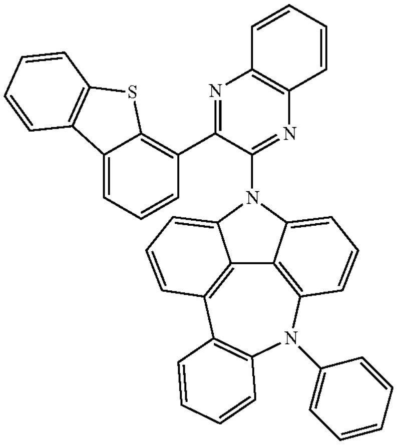
,
1-122
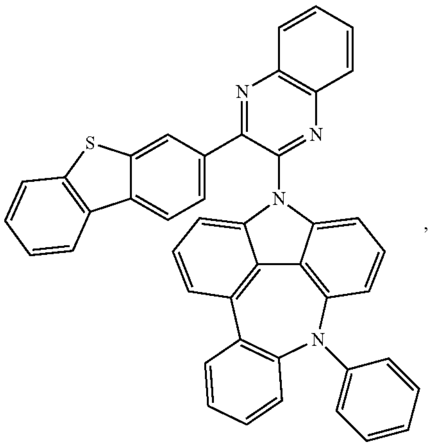
,
-continued
1-123
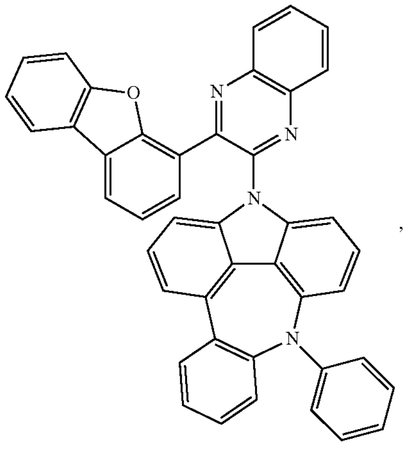
,
1-124
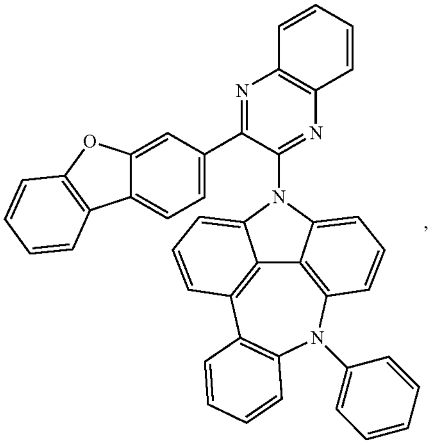
,
1-125
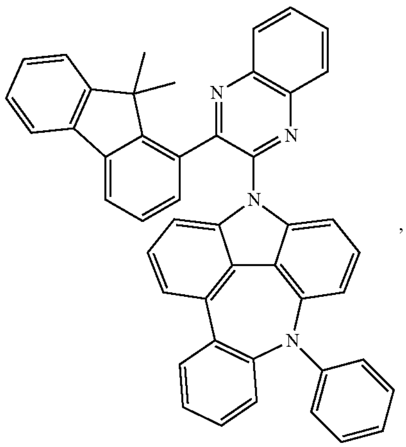
, -continued
1-126
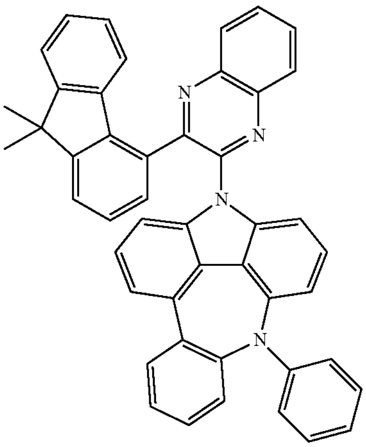
,
1-127
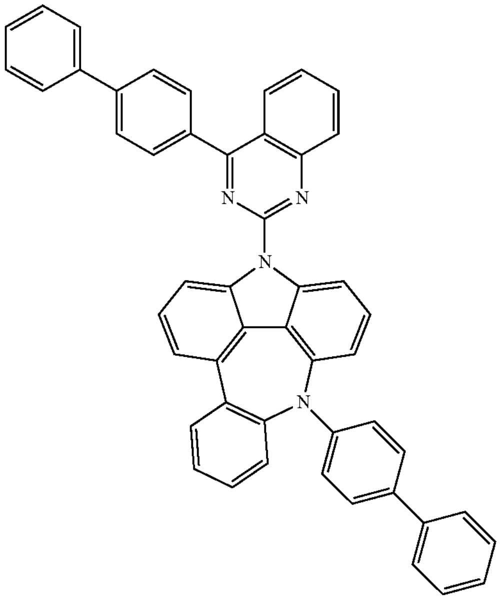
,
1-128
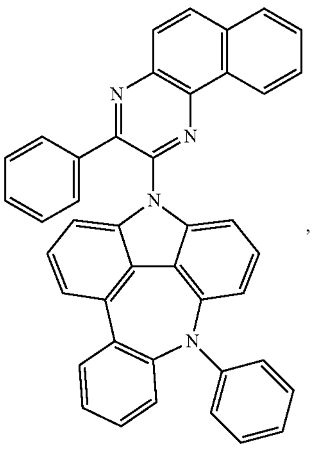
,
-continued
1-129
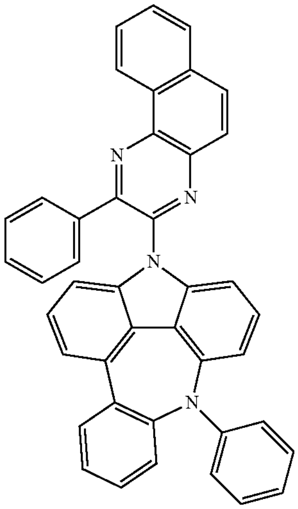
,
1-130
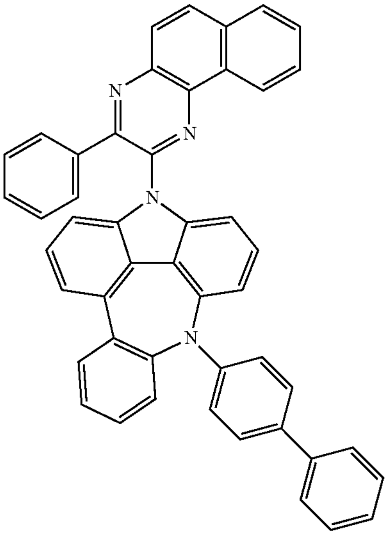
,
1-131
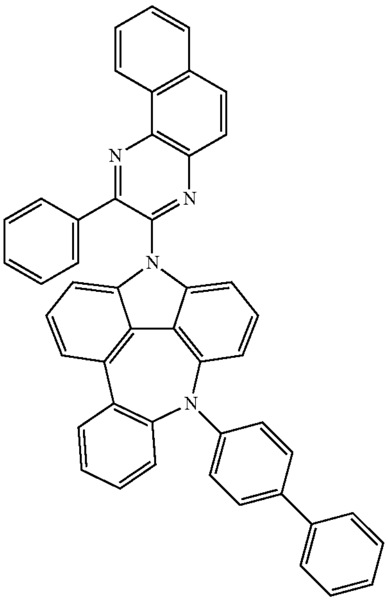
, 1-132
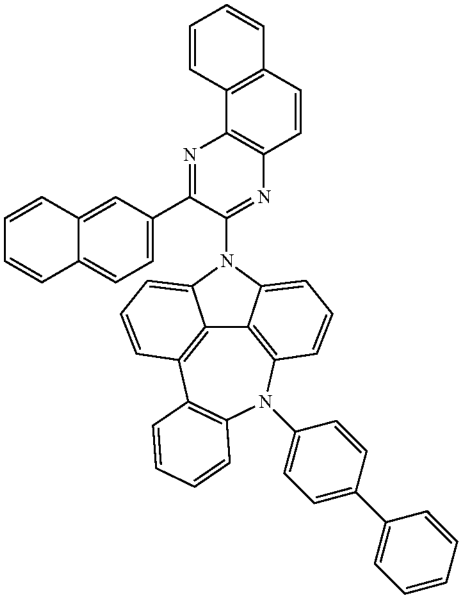
,
1-133
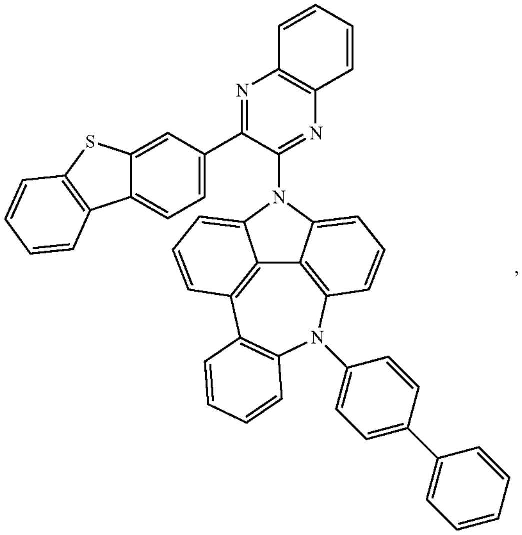
,
1-134
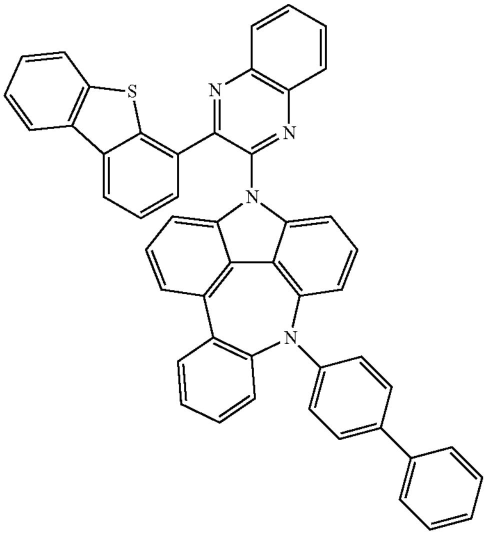
,
1-135
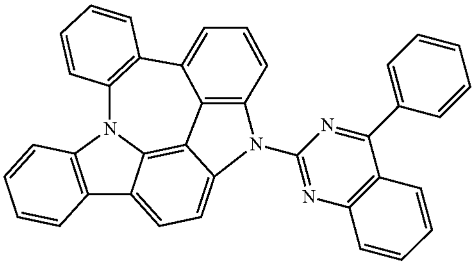
,
1-136
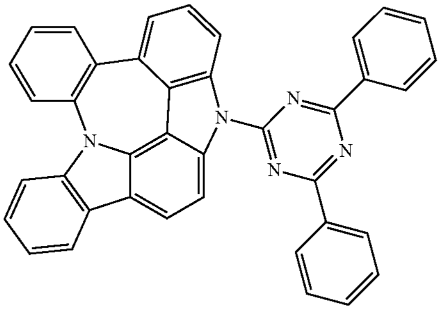
,
1-137
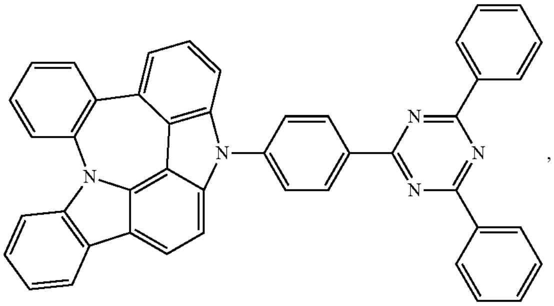
, -continued
1-138
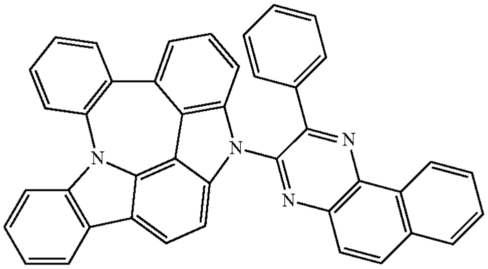
,
1-139
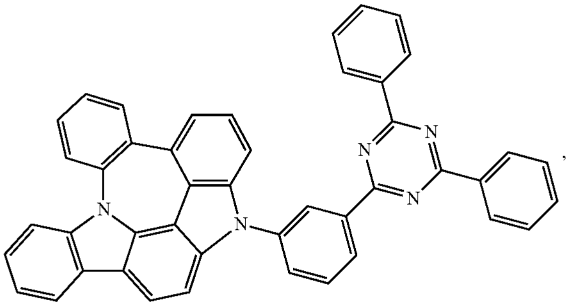
,
1-140
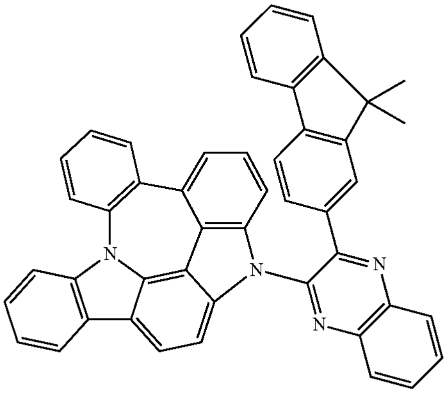
,
1-141
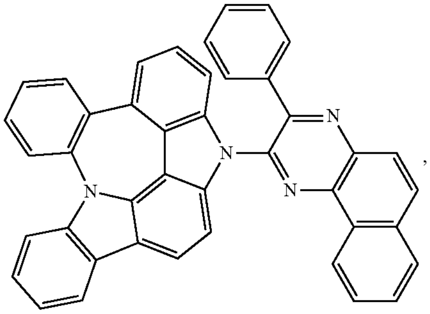
,
-continued
1-142
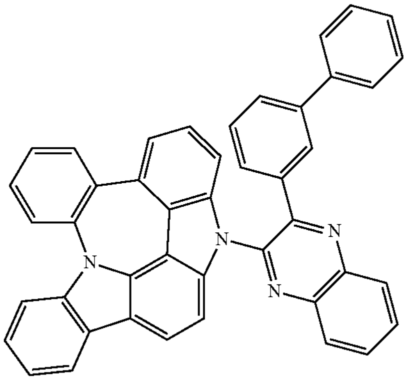
,
1-143
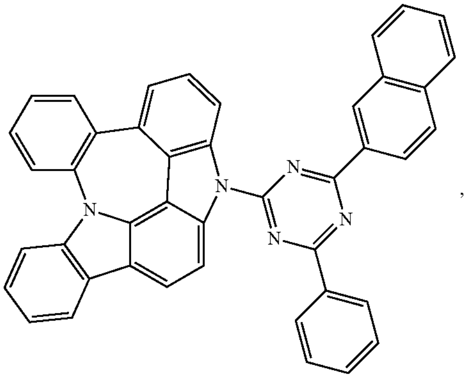
,
1-144
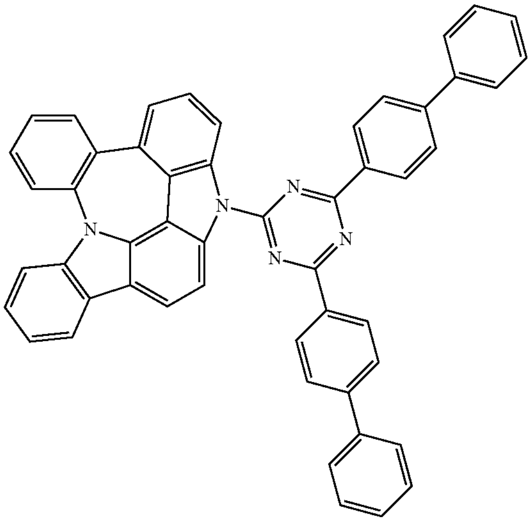
, -continued
1-145
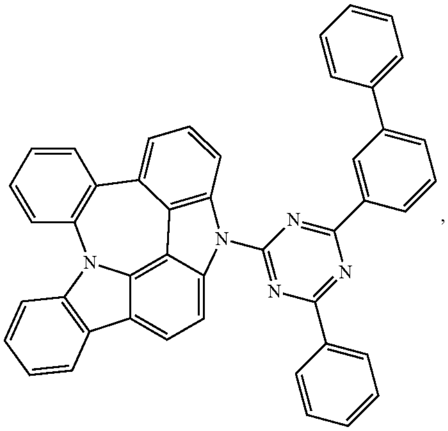
,
1-146
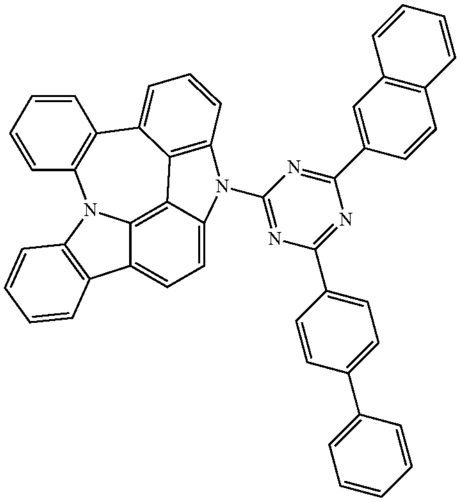
,
1-147
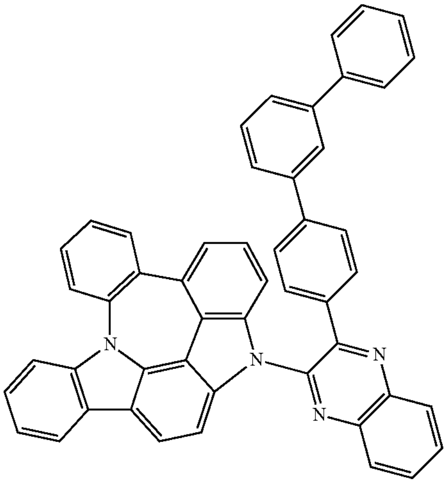
,
-continued
1-148
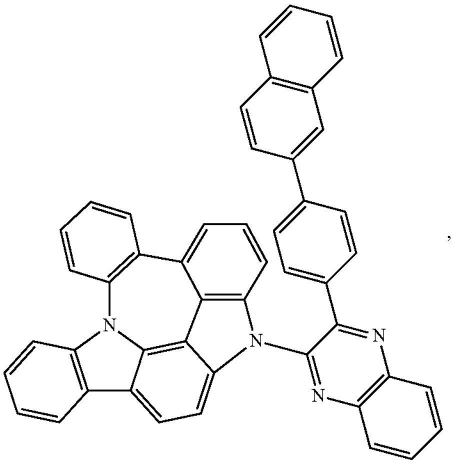
,
1-149
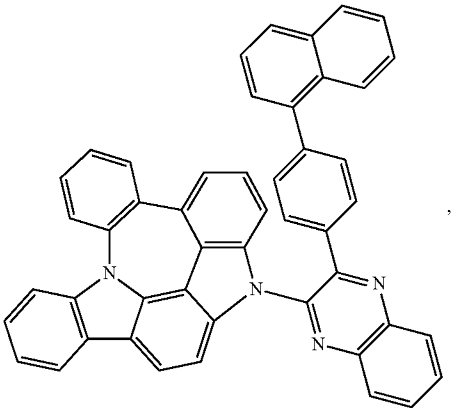
,
1-150
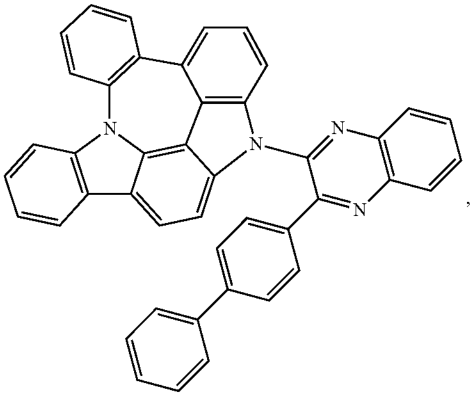
,
1-151
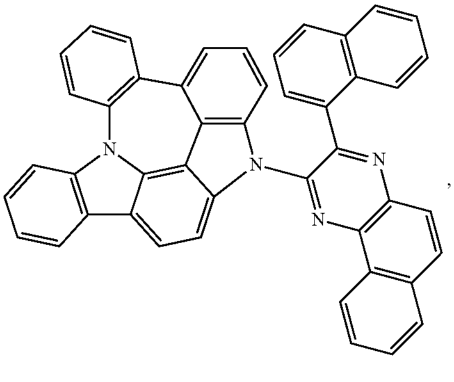
, -continued
1-152
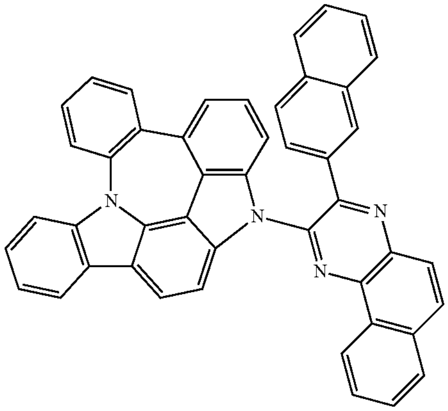
,
1-153
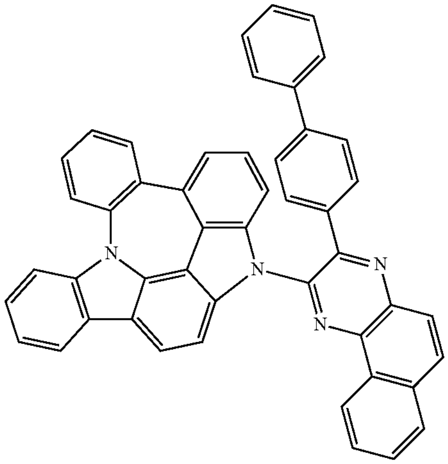
,
1-154
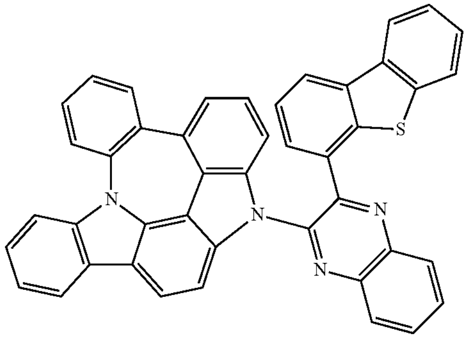
,
1-155
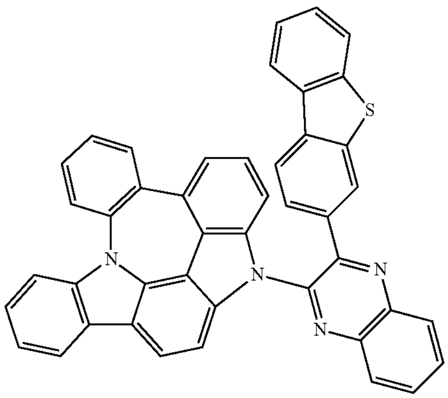
,
-continued
1-156
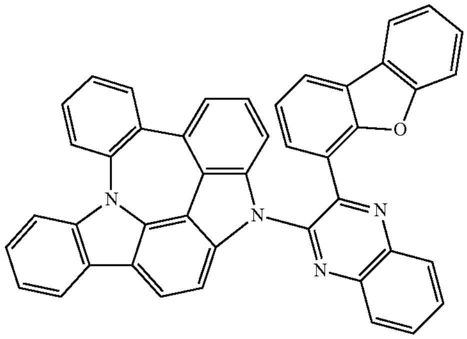
,
1-157
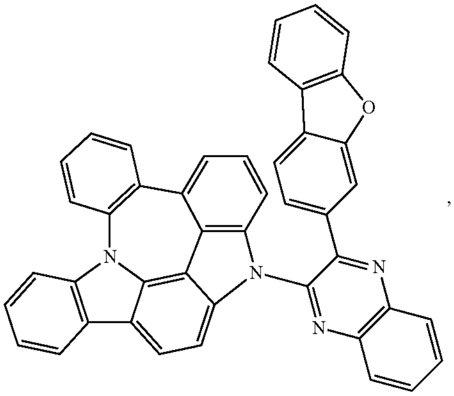
,
1-158
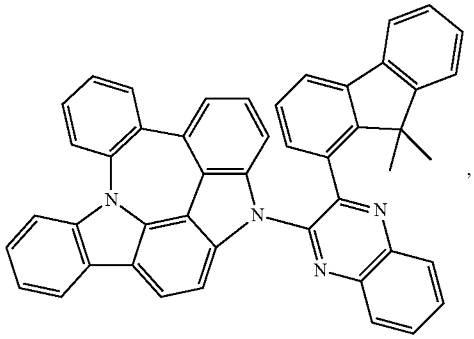
,
1-159
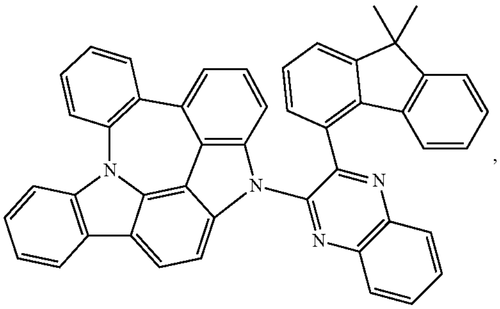
, -continued
1-160
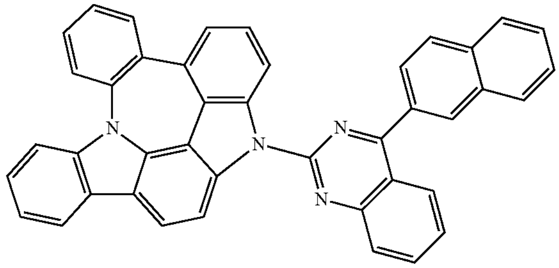
,
1-161
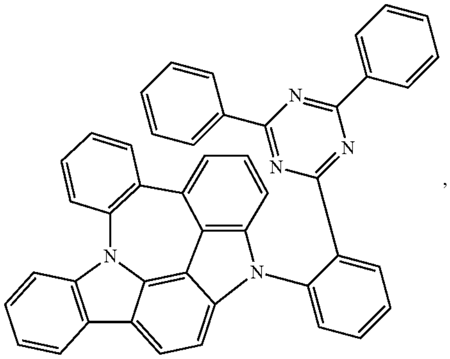
,
1-162
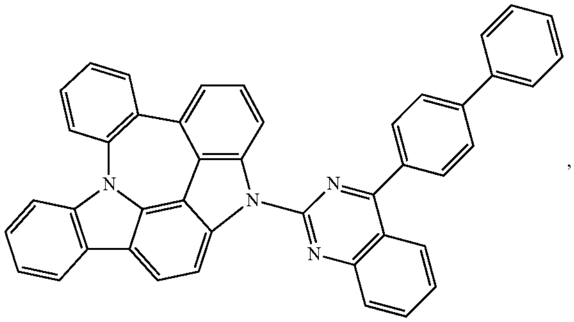
,
1-163
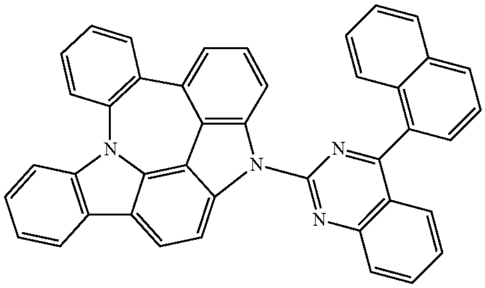
,
1-164
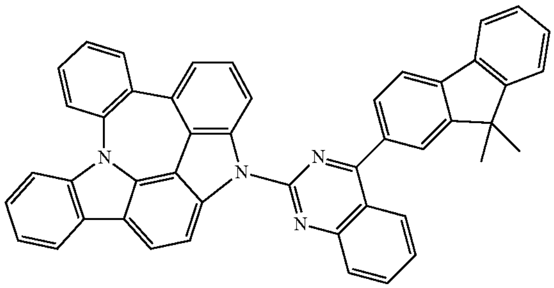
,
-continued
1-165
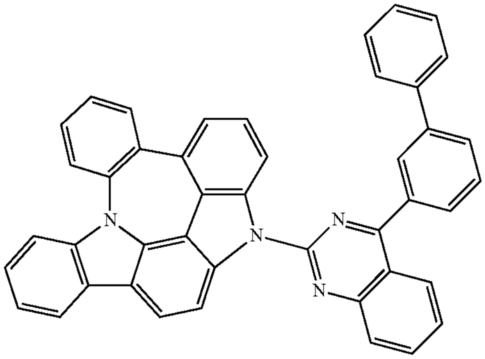
,
1-166
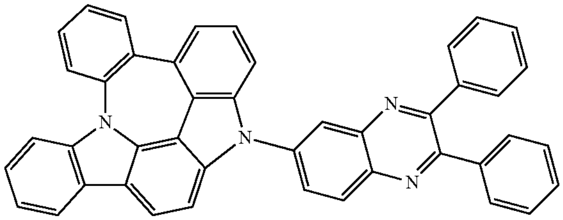
,
1-167
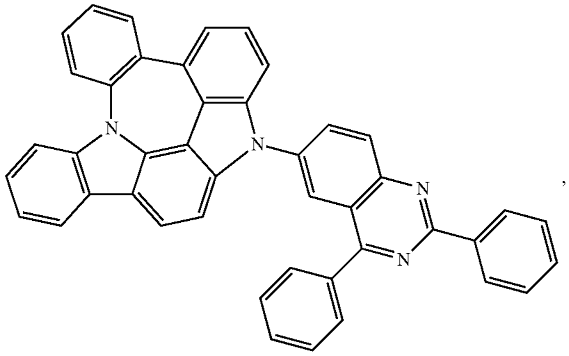
,
1-168
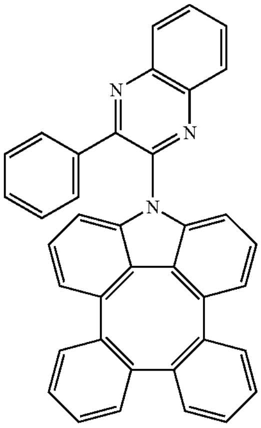
, -continued
1-169
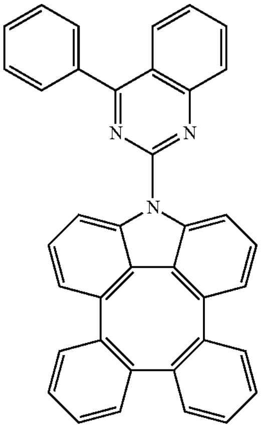
,
1-170
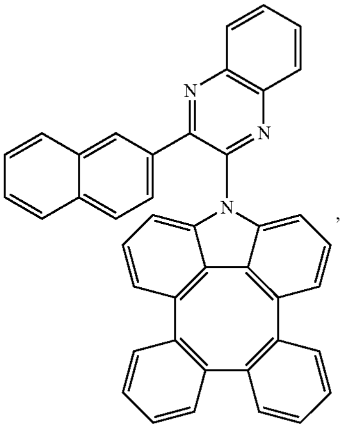
,
1-171
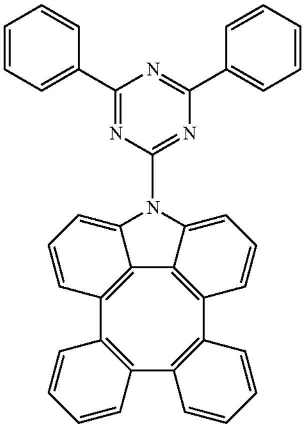
,
1-172
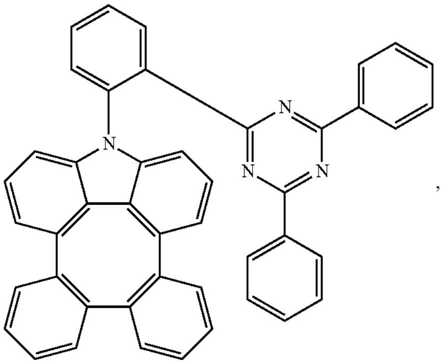
,
-continued
1-173
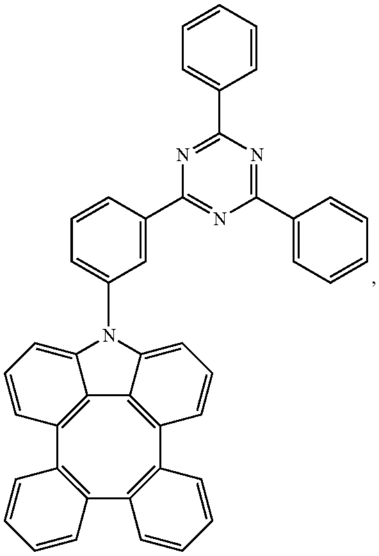
,
1-174
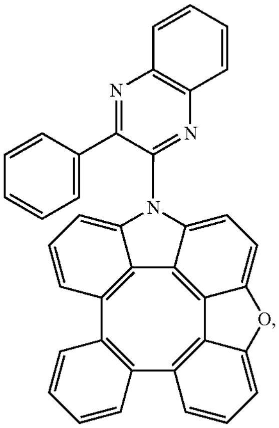
,
1-175
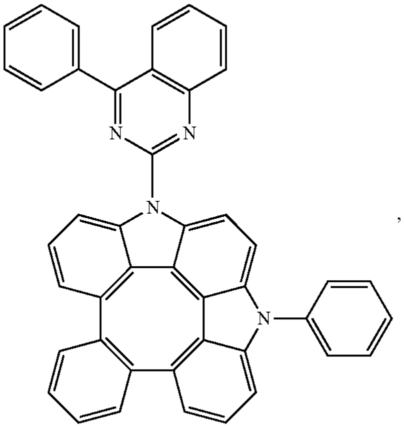
, -continued
1-176
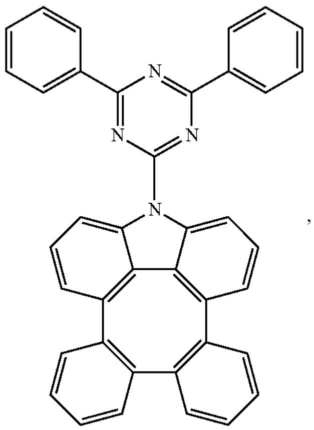
,
1-177
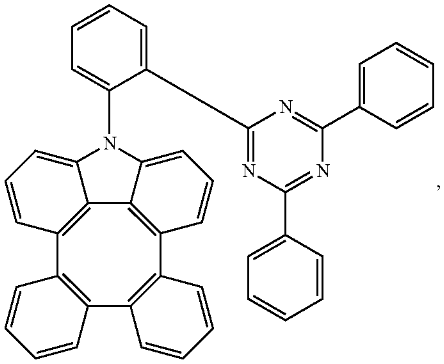
,
1-178
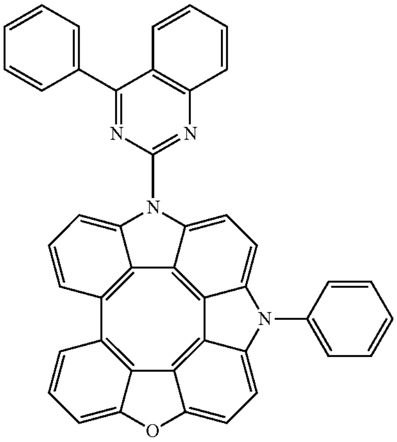
,
-continued
1-179
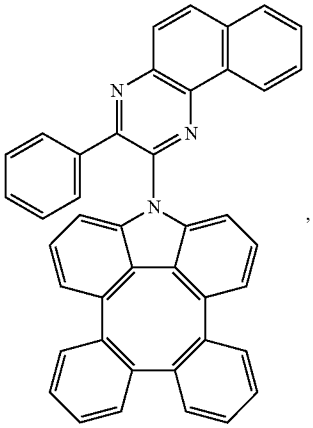
,
1-180
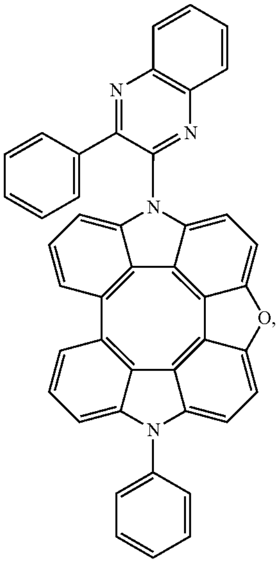
1-181
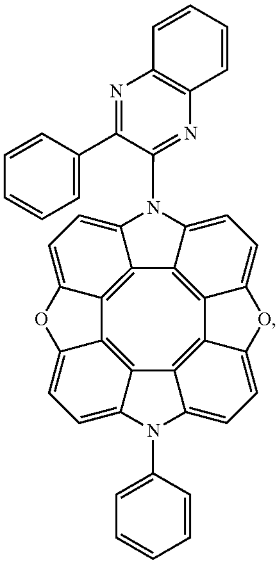

-continued
1-182
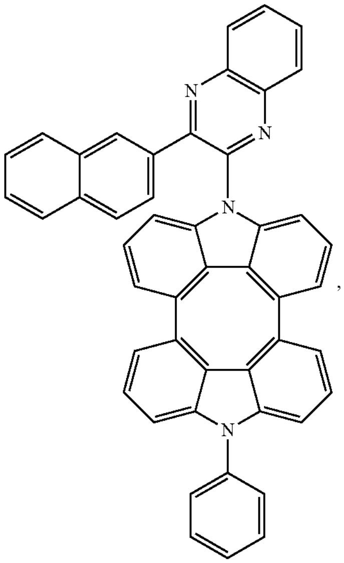
,
1-183
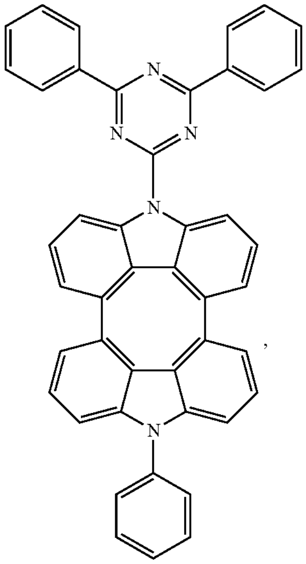
,
1-184
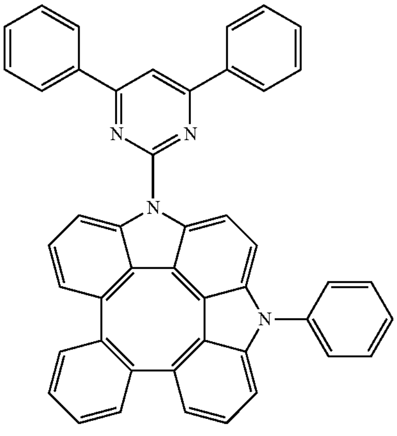
,
-continued
1-185
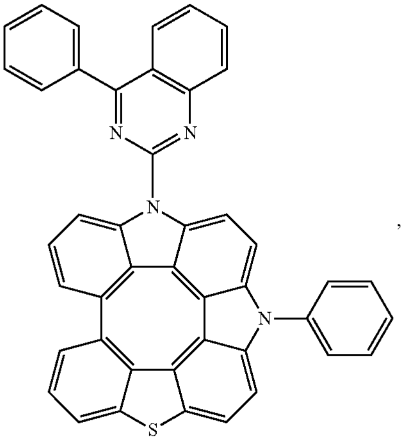
,
1-186
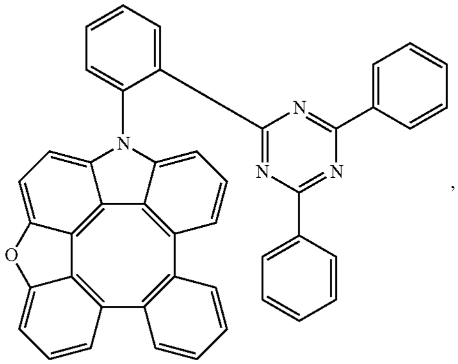
,
1-187
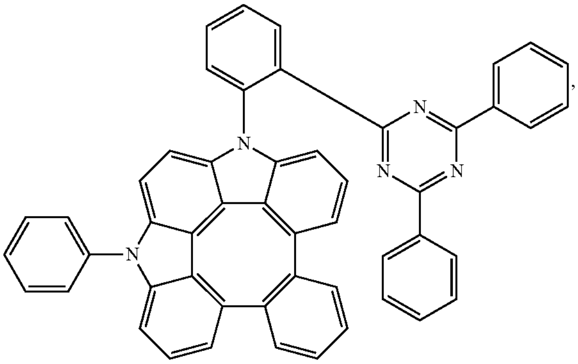
,
1-188
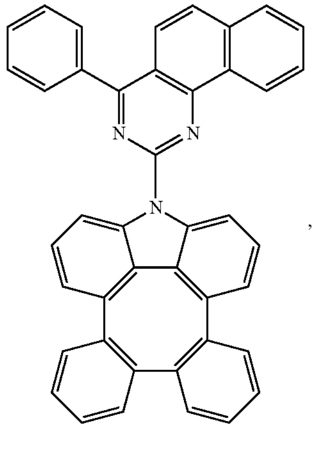
, -continued
1-189
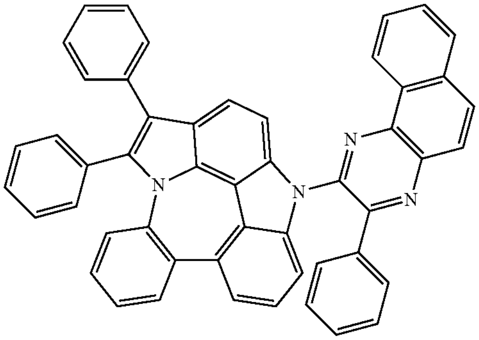
,
1-190
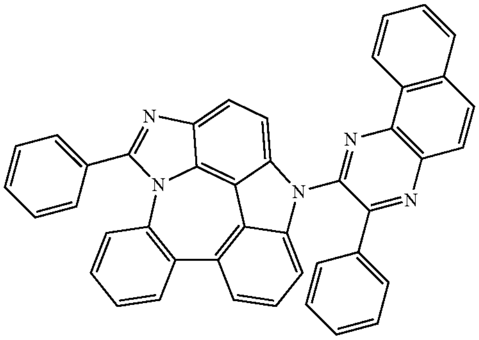
,
1-191
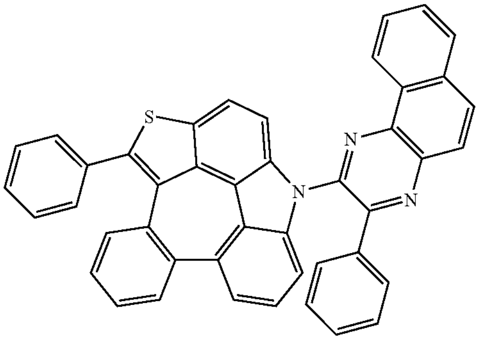
,
1-192
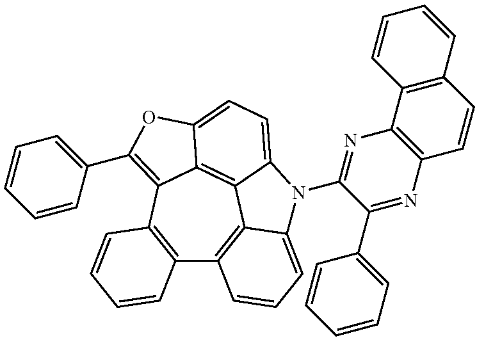
,
-continued
1-193
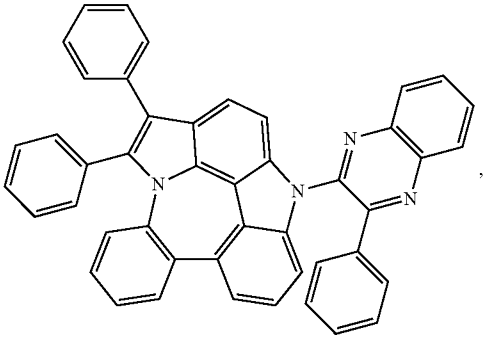
,
1-194
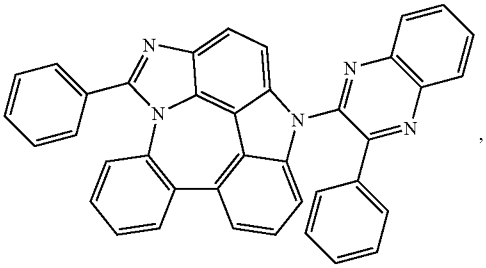
,
1-195
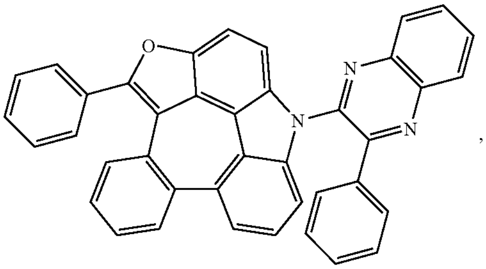
,
1-196
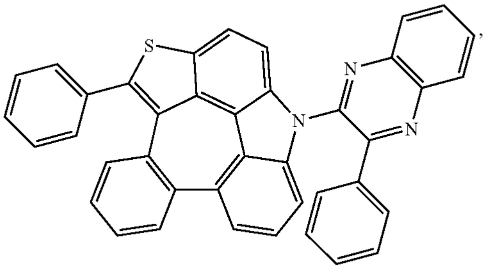
,
1-197
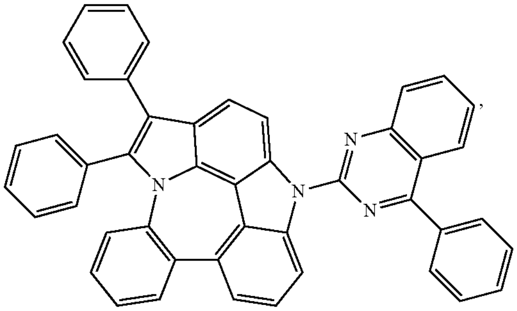
, -continued
1-198
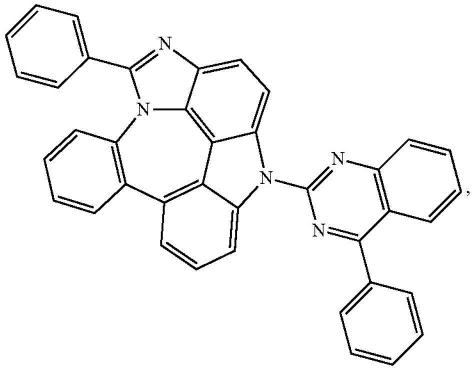
,
1-199
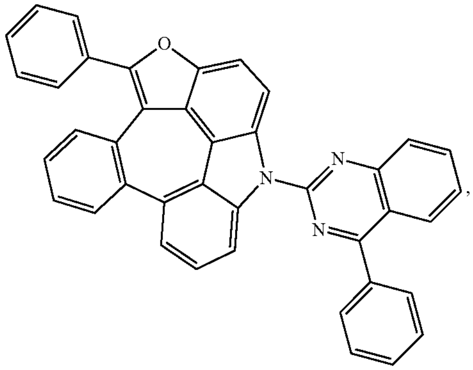
,
1-200
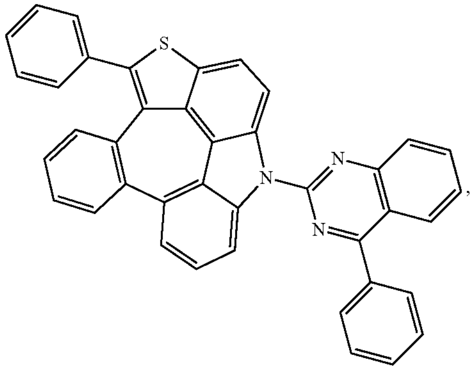
,
1-201
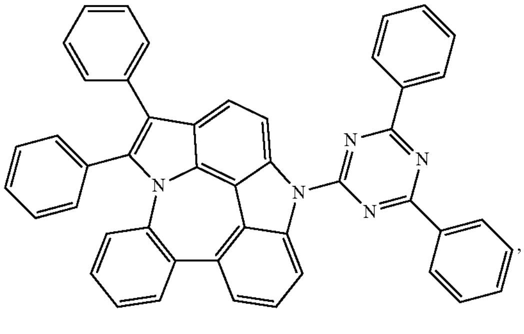
,
-continued
1-202
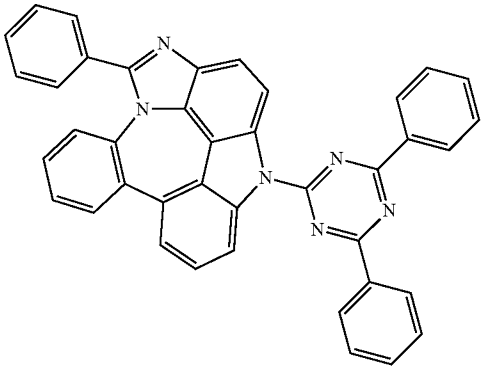
,
1-203
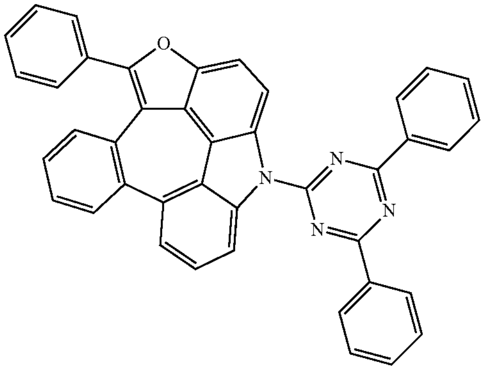
,
1-204
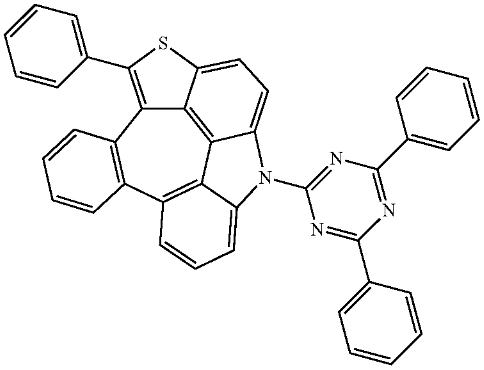
,
1-205
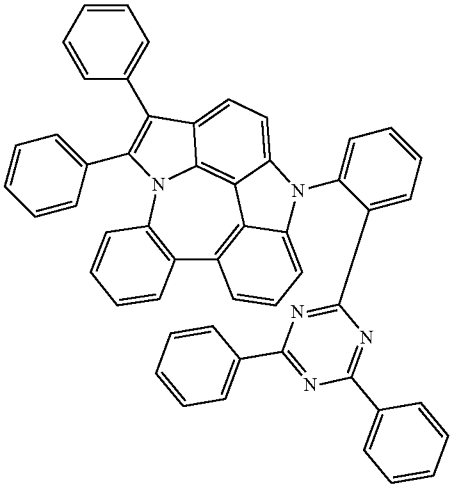

-continued
1-206
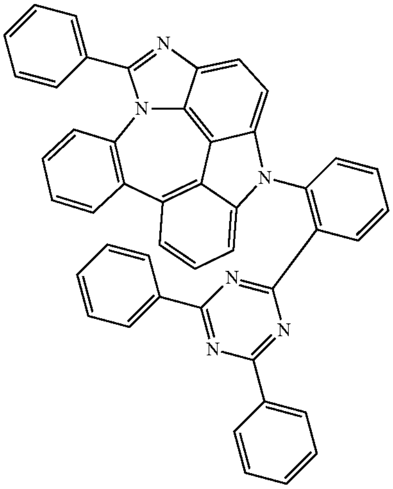
,
1-207
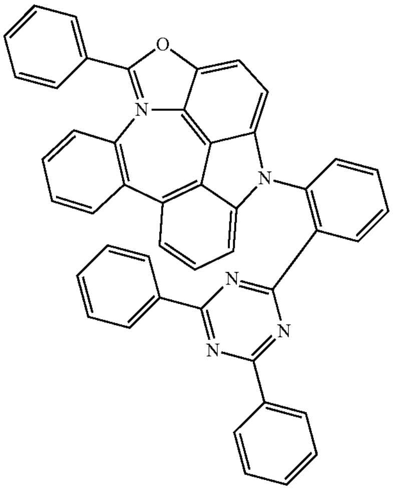
,
1-208
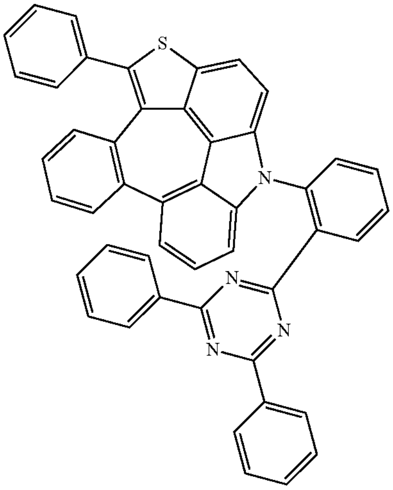
,
-continued
1-209
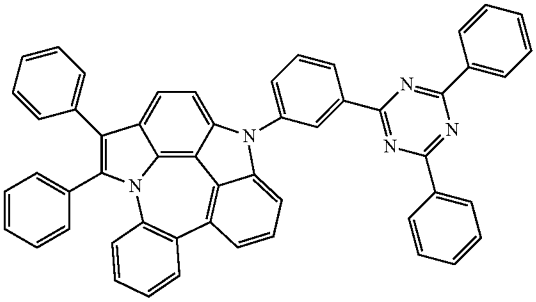
,
1-210
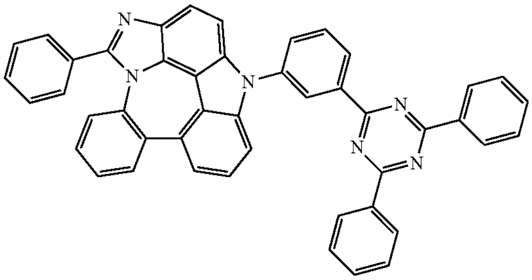
,
1-211
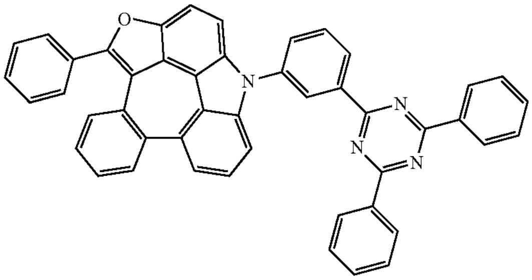
,
1-212
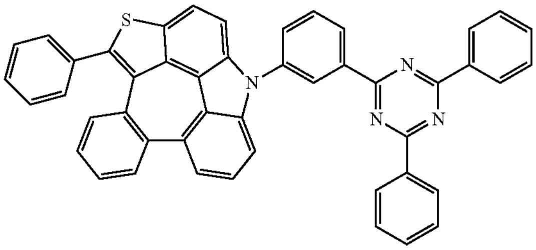
, -continued
1-213
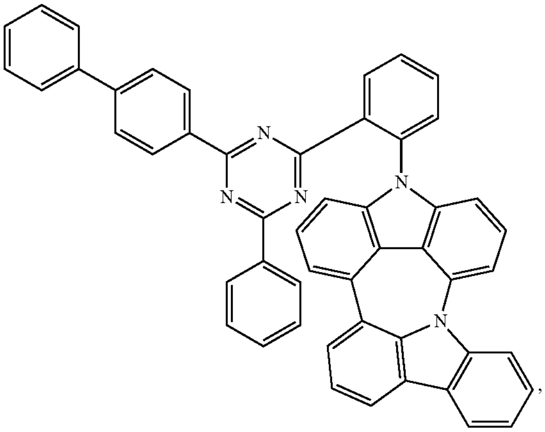
,
1-214
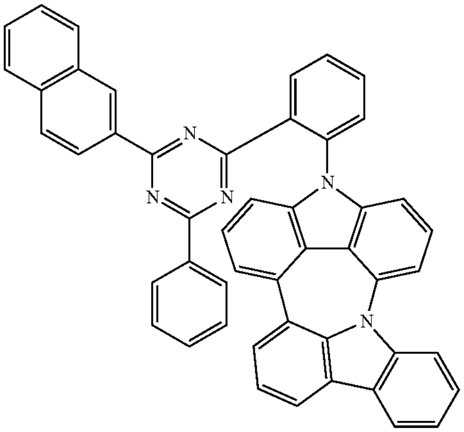
,
1-215
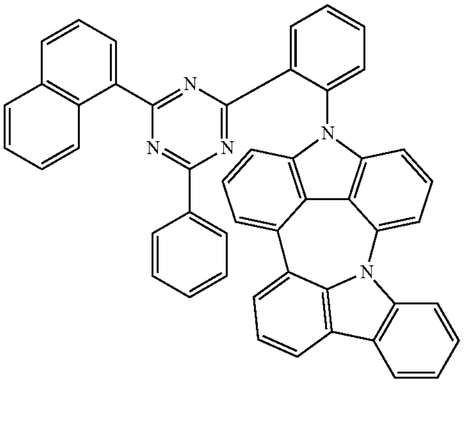
,
-continued
1-216
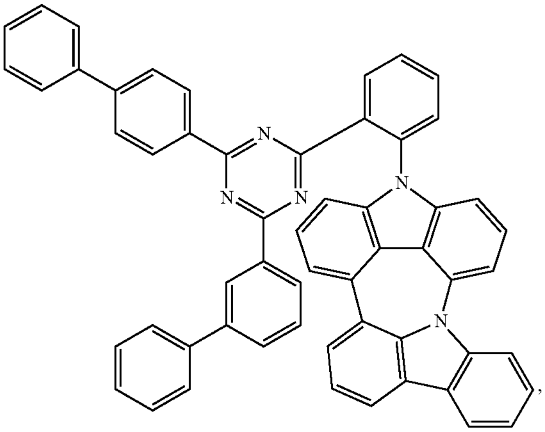
,
1-217
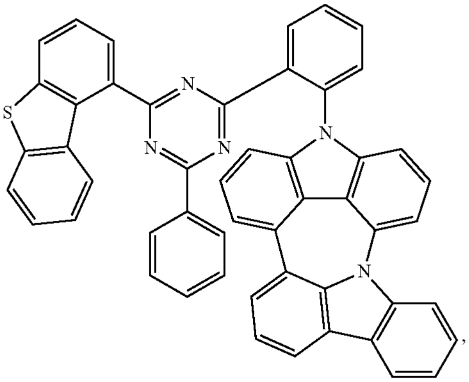
,
1-218
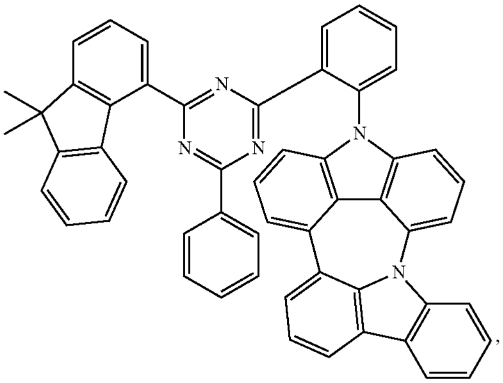
,
1-219
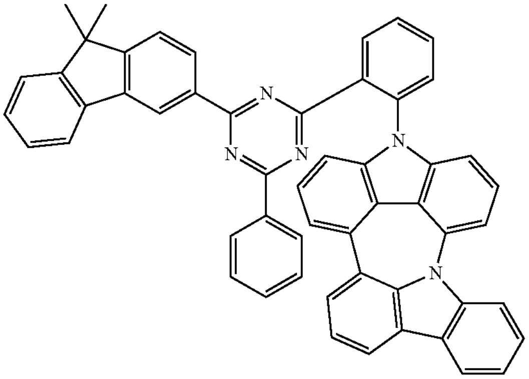
, -continued
1-220
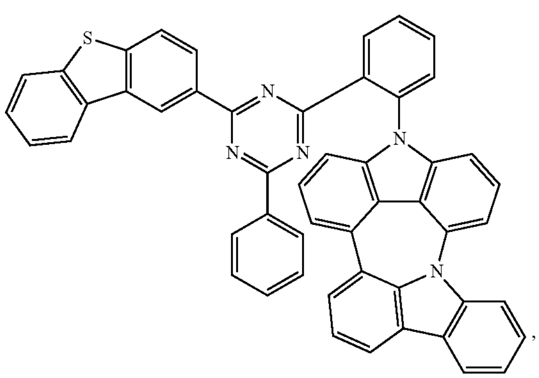
,
1-221
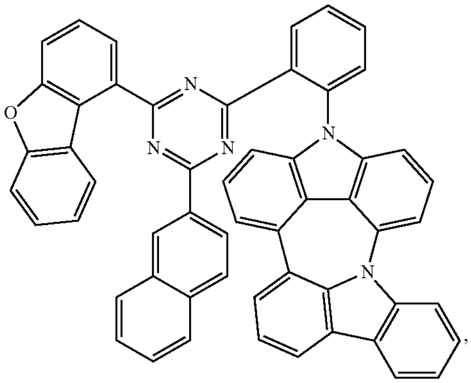
,
1-222
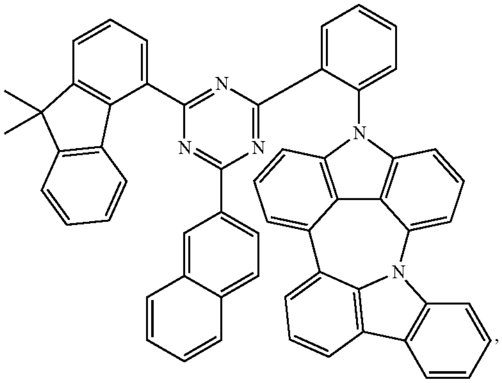
,
1-223
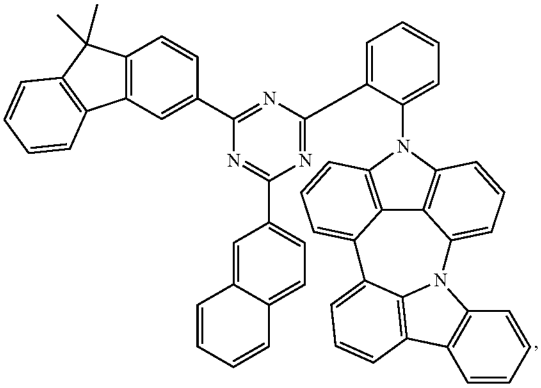
,
-continued
1-224
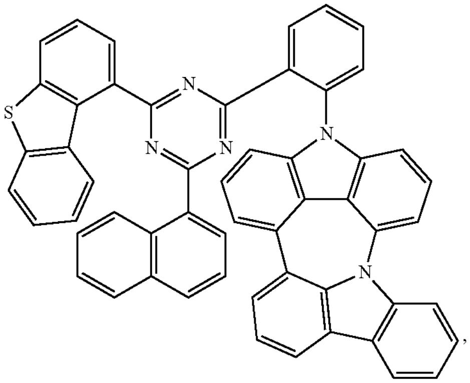
,
1-225
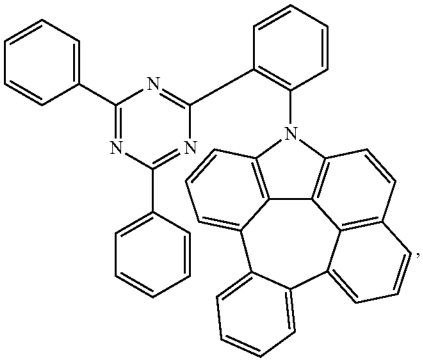
,
1-226
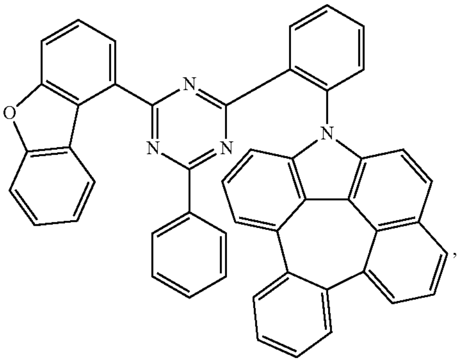
,
1-227
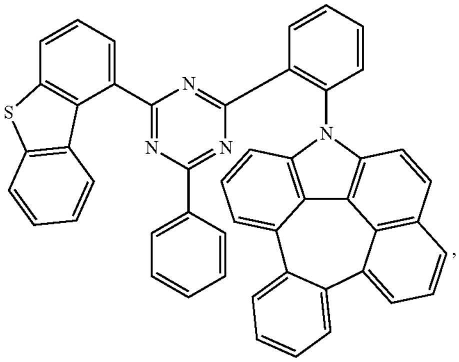
, -continued
1-228
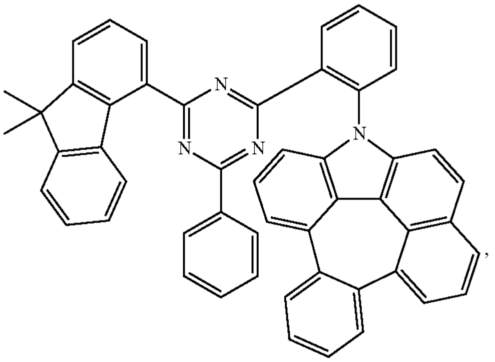
1-229
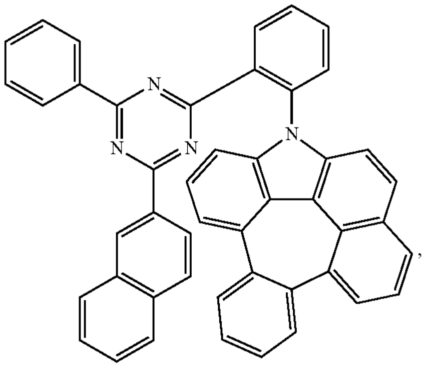
1-230
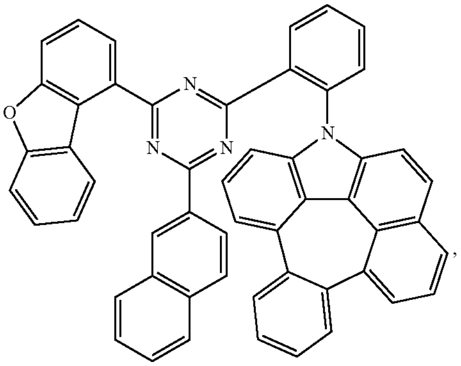
1-231
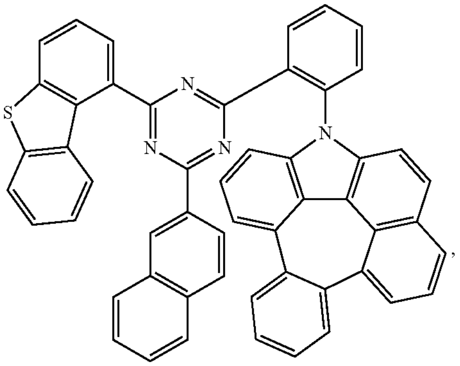
-continued
1-232
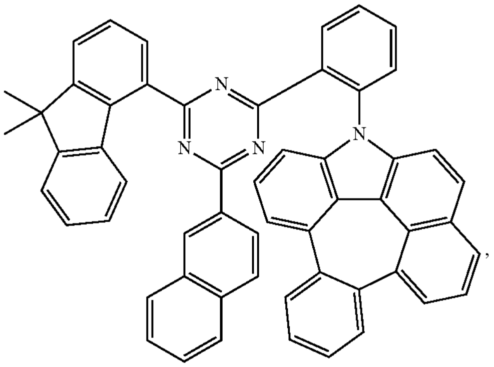
1-233
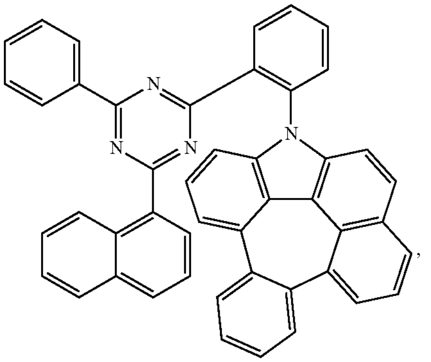
1-234
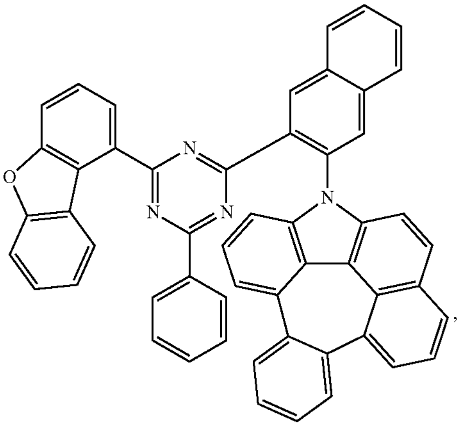
1-235
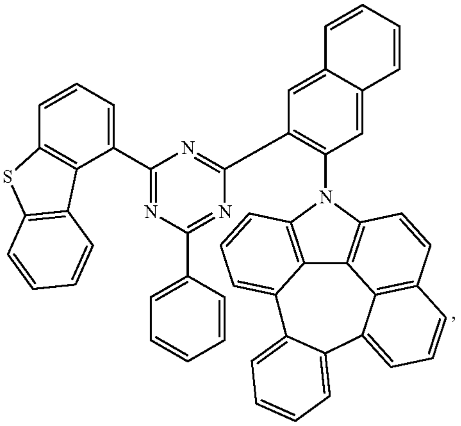

-continued
1-236
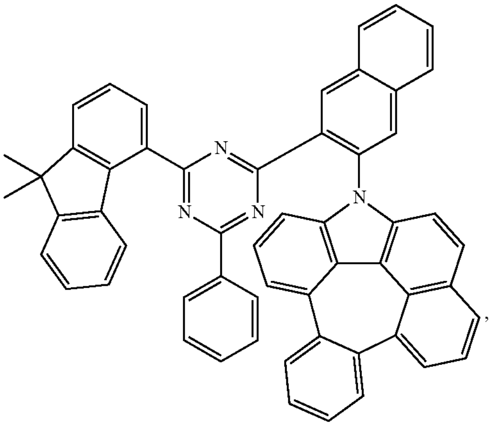
1-237
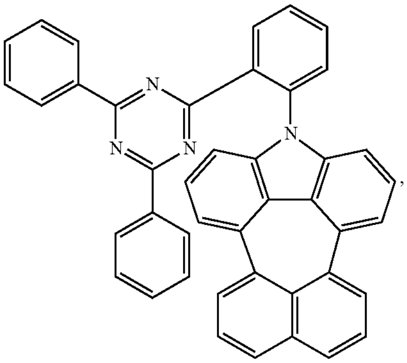
1-238
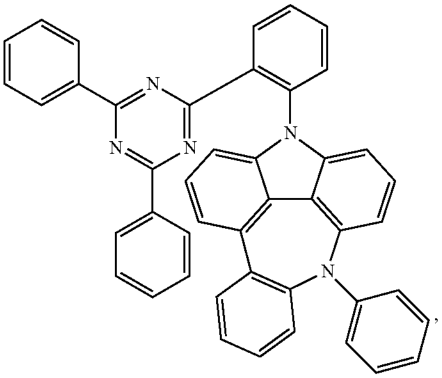
1-239
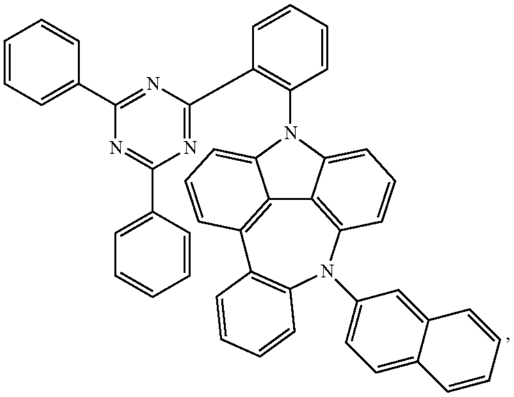
-continued
1-240
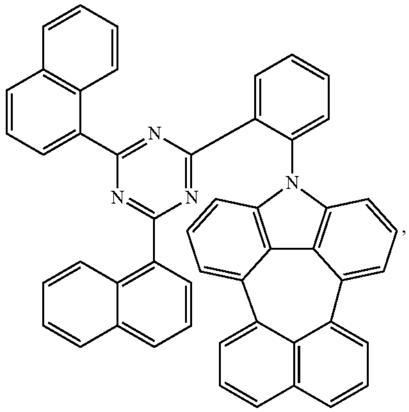
1-241
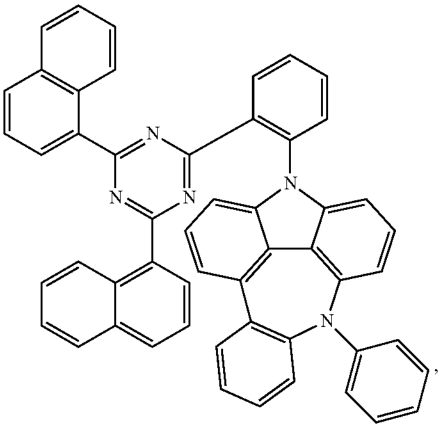
1-242
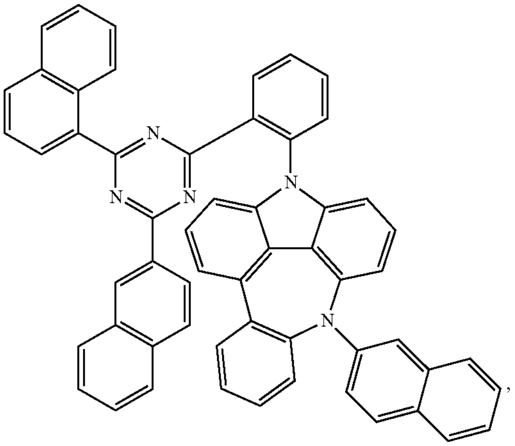

-continued 1-243

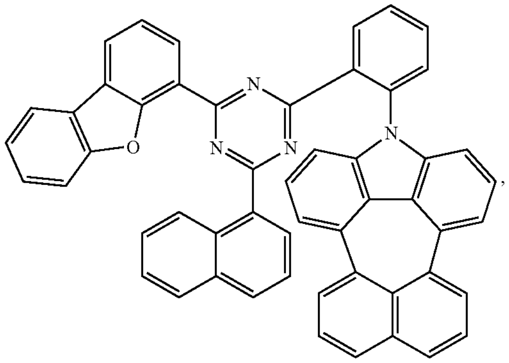

, 1-244

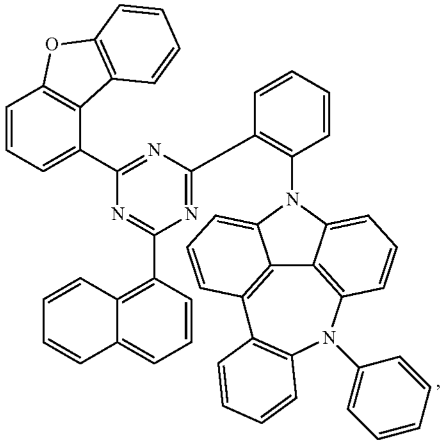

, 1-245

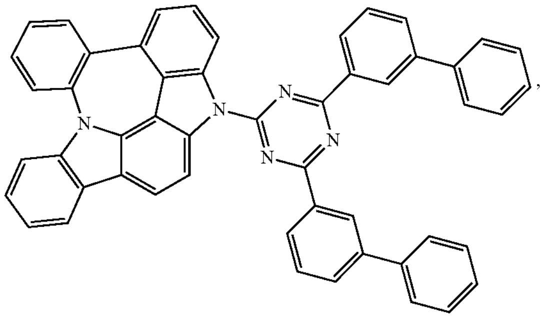

, 1-246

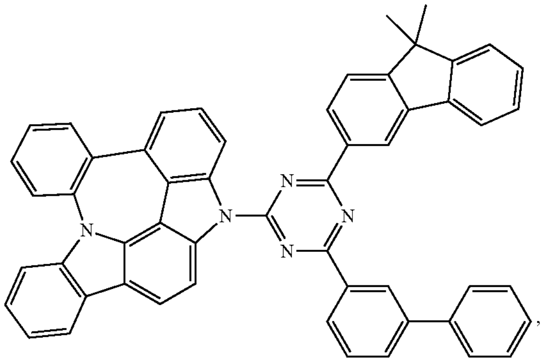

,

-continued 1-247

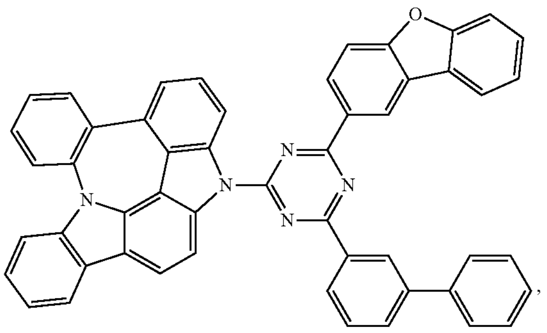

, 1-248

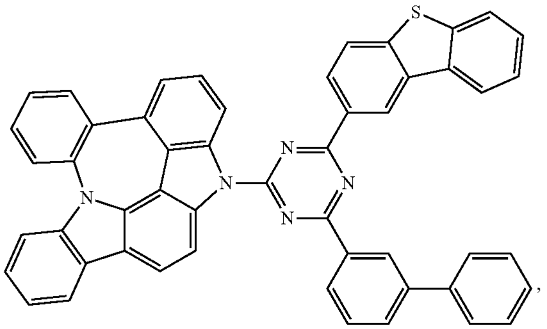

, 1-249

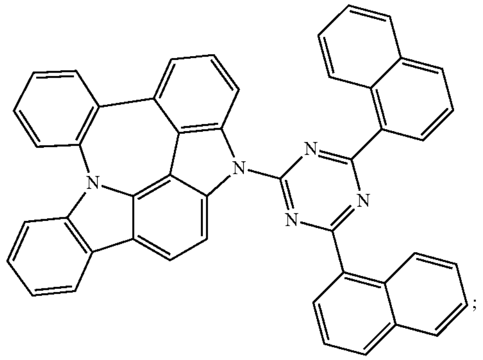

;

wherein optionally, hydrogen in the above structures can be partially or fully substituted with deuterium.

32. The electroluminescent device according to claim 1, wherein the $L_a$ is, at each occurrence identically or differently, selected from a structure represented by any one of Formula 1-1-4, Formula 1-2-5 and Formula 1-6.

33. The electroluminescent device according to claim 17, wherein in Formula 1-5-1 to Formula 1-5-4, Formula 1-6-1, Formula 1-6-2, Formula 1-7-1 and Formula 1-7-2, at least one of $X_3$ to $X_n$ is selected from $CR_x$, wherein the $X_n$ corresponds to one of $X_3$ to $X_6$ that has the largest number in any one of Formula 1-5-1 to Formula 1-5-4, Formula 1-6-1, Formula 1-6-2, Formula 1-7-1 and Formula 1-7-2, and the $R_x$ is, at each occurrence identically or differently, selected from the group consisting of: halogen, cyano, alkyl having 1 to 20 carbon atoms substituted with at least one cyano or halogen, cycloalkyl having 3 to 20 ring carbon atoms substituted with at least one cyano or halogen, arylalkyl having 7 to 30 carbon atoms substituted with at least one cyano or halogen, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms and combinations thereof;

in Formula 1-6-1 and Formula 1-7-1, G is, at each occurrence identically or differently, selected from the group consisting of: NRR, OR and SR; wherein the R is, at each occurrence identically or differently, selected from the group consisting of: deuterium, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

34. The electroluminescent device according to claim 22, wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

35. The electroluminescent device according to claim 24, the second compound is selected from the group consisting of Compound 27 to Compound 34, Compound 45 to Compound 86, Compound 115 to Compound 122, Compound 133 to Compound 174, Compound 203 to Compound 210, Compound 221 to Compound 262, Compound 266, Compound 268, Compound 270, Compound 272, Compound 274, Compound 276, Compound 278, Compound 280, Compound 282, Compound 284, Compound 286, Compound 288, Compound 290 to Compound 298, Compound 300, Compound 302, Compound 304, Compound 306, and Compound 309 to Compound 330, and wherein Compound 27 to Compound 34, Compound 45 to Compound 86, Compound 115 to Compound 122, Compound 133 to Compound 174, Compound 203 to Compound 210, Compound 221 to Compound 262, Compound 266, Compound 268, Compound 270, Compound 272, Compound 274, Compound 276, Compound 278, Compound 280, Compound 282, Compound 284, Compound 286, Compound 288, Compound 290 to Compound 298, Compound 300, Compound 302, Compound 304, Compound 306, and Compound 309 to Compound 330 have a general formula of $Ir(L_a)_2(L_b)$, wherein the two $L_a$ are identical, and the $L_a$ and $L_b$ correspond to structures shown in the following table, respectively:

| Compound Number | $L_a$ | $L_b$ | Compound Number | $L_a$ | $L_b$ |
|---|---|---|---|---|---|
| 27 | $L_{a139}$ | $L_{b31}$ | 28 | $L_{a139}$ | $L_{b88}$ |
| 29 | $L_{a140}$ | $L_{b31}$ | 30 | $L_{a140}$ | $L_{b88}$ |
| 31 | $L_{a141}$ | $L_{b31}$ | 32 | $L_{a141}$ | $L_{b88}$ |
| 33 | $L_{a163}$ | $L_{b31}$ | 34 | $L_{a163}$ | $L_{b88}$ |
| 45 | $L_{a263}$ | $L_{b31}$ | 46 | $L_{a263}$ | $L_{b88}$ |
| 47 | $L_{a264}$ | $L_{b31}$ | 48 | $L_{a264}$ | $L_{b88}$ |
| 49 | $L_{a271}$ | $L_{b31}$ | 50 | $L_{a271}$ | $L_{b88}$ |
| 51 | $L_{a272}$ | $L_{b31}$ | 52 | $L_{a272}$ | $L_{b88}$ |
| 53 | $L_{a276}$ | $L_{b31}$ | 54 | $L_{a276}$ | $L_{b88}$ |
| 55 | $L_{a278}$ | $L_{b31}$ | 56 | $L_{a278}$ | $L_{b88}$ |
| 57 | $L_{a296}$ | $L_{b31}$ | 58 | $L_{a296}$ | $L_{b88}$ |
| 59 | $L_{a300}$ | $L_{b31}$ | 60 | $L_{a300}$ | $L_{b88}$ |

-continued

| Compound Number | $L_a$ | $L_b$ | Compound Number | $L_a$ | $L_b$ |
|---|---|---|---|---|---|
| 61 | $L_{a302}$ | $L_{b31}$ | 62 | $L_{a302}$ | $L_{b88}$ |
| 63 | $L_{a307}$ | $L_{b31}$ | 64 | $L_{a307}$ | $L_{b88}$ |
| 65 | $L_{a322}$ | $L_{b31}$ | 66 | $L_{a322}$ | $L_{b88}$ |
| 67 | $L_{a334}$ | $L_{b31}$ | 68 | $L_{a334}$ | $L_{b88}$ |
| 69 | $L_{a337}$ | $L_{b31}$ | 70 | $L_{a337}$ | $L_{b88}$ |
| 71 | $L_{a347}$ | $L_{b31}$ | 72 | $L_{a347}$ | $L_{b88}$ |
| 73 | $L_{a347}$ | $L_{b31}$ | 74 | $L_{a347}$ | $L_{b88}$ |
| 75 | $L_{a360}$ | $L_{b31}$ | 76 | $L_{a360}$ | $L_{b88}$ |
| 77 | $L_{a361}$ | $L_{b31}$ | 78 | $L_{a361}$ | $L_{b88}$ |
| 79 | $L_{a374}$ | $L_{b31}$ | 80 | $L_{a374}$ | $L_{b88}$ |
| 81 | $L_{a433}$ | $L_{b31}$ | 82 | $L_{a433}$ | $L_{b88}$ |
| 83 | $L_{a440}$ | $L_{b31}$ | 84 | $L_{a440}$ | $L_{b88}$ |
| 85 | $L_{a450}$ | $L_{b31}$ | 86 | $L_{a450}$ | $L_{b88}$ |
| 115 | $L_{a139}$ | $L_{b122}$ | 116 | $L_{a139}$ | $L_{b126}$ |
| 117 | $L_{a140}$ | $L_{b122}$ | 118 | $L_{a140}$ | $L_{b126}$ |
| 119 | $L_{a141}$ | $L_{b122}$ | 120 | $L_{a141}$ | $L_{b126}$ |
| 121 | $L_{a163}$ | $L_{b122}$ | 122 | $L_{a163}$ | $L_{b126}$ |
| 133 | $L_{a263}$ | $L_{b122}$ | 134 | $L_{a263}$ | $L_{b126}$ |
| 135 | $L_{a264}$ | $L_{b122}$ | 136 | $L_{a264}$ | $L_{b126}$ |
| 137 | $L_{a271}$ | $L_{b122}$ | 138 | $L_{a271}$ | $L_{b126}$ |
| 139 | $L_{a272}$ | $L_{b122}$ | 140 | $L_{a272}$ | $L_{b126}$ |
| 141 | $L_{a276}$ | $L_{b122}$ | 142 | $L_{a276}$ | $L_{b126}$ |
| 143 | $L_{a278}$ | $L_{b122}$ | 144 | $L_{a278}$ | $L_{b126}$ |
| 145 | $L_{a296}$ | $L_{b122}$ | 146 | $L_{a296}$ | $L_{b126}$ |
| 147 | $L_{a300}$ | $L_{b122}$ | 148 | $L_{a300}$ | $L_{b126}$ |
| 149 | $L_{a302}$ | $L_{b122}$ | 150 | $L_{a302}$ | $L_{b126}$ |
| 151 | $L_{a307}$ | $L_{b122}$ | 152 | $L_{a307}$ | $L_{b126}$ |
| 153 | $L_{a322}$ | $L_{b122}$ | 154 | $L_{a322}$ | $L_{b126}$ |
| 155 | $L_{a334}$ | $L_{b122}$ | 156 | $L_{a334}$ | $L_{b126}$ |
| 157 | $L_{a337}$ | $L_{b122}$ | 158 | $L_{a337}$ | $L_{b126}$ |
| 159 | $L_{a347}$ | $L_{b122}$ | 160 | $L_{a347}$ | $L_{b126}$ |
| 161 | $L_{a347}$ | $L_{b122}$ | 162 | $L_{a347}$ | $L_{b126}$ |
| 163 | $L_{a360}$ | $L_{b122}$ | 164 | $L_{a360}$ | $L_{b126}$ |
| 165 | $L_{a361}$ | $L_{b122}$ | 166 | $L_{a361}$ | $L_{b126}$ |
| 167 | $L_{a374}$ | $L_{b122}$ | 168 | $L_{a374}$ | $L_{b126}$ |
| 169 | $L_{a433}$ | $L_{b122}$ | 170 | $L_{a433}$ | $L_{b126}$ |
| 171 | $L_{a440}$ | $L_{b122}$ | 172 | $L_{a440}$ | $L_{b126}$ |
| 173 | $L_{a450}$ | $L_{b122}$ | 174 | $L_{a450}$ | $L_{b126}$ |
| 203 | $L_{a139}$ | $L_{b135}$ | 204 | $L_{a139}$ | $L_{b139}$ |
| 205 | $L_{a140}$ | $L_{b135}$ | 206 | $L_{a140}$ | $L_{b139}$ |
| 207 | $L_{a141}$ | $L_{b135}$ | 208 | $L_{a141}$ | $L_{b139}$ |
| 209 | $L_{a163}$ | $L_{b135}$ | 210 | $L_{a163}$ | $L_{b139}$ |
| 221 | $L_{a263}$ | $L_{b135}$ | 222 | $L_{a263}$ | $L_{b139}$ |
| 223 | $L_{a264}$ | $L_{b135}$ | 224 | $L_{a264}$ | $L_{b139}$ |
| 225 | $L_{a271}$ | $L_{b135}$ | 226 | $L_{a271}$ | $L_{b139}$ |
| 227 | $L_{a272}$ | $L_{b135}$ | 228 | $L_{a272}$ | $L_{b139}$ |
| 229 | $L_{a276}$ | $L_{b135}$ | 230 | $L_{a276}$ | $L_{b139}$ |
| 231 | $L_{a278}$ | $L_{b135}$ | 232 | $L_{a278}$ | $L_{b139}$ |
| 233 | $L_{a296}$ | $L_{b135}$ | 234 | $L_{a296}$ | $L_{b139}$ |
| 235 | $L_{a300}$ | $L_{b135}$ | 236 | $L_{a300}$ | $L_{b139}$ |
| 237 | $L_{a302}$ | $L_{b135}$ | 238 | $L_{a302}$ | $L_{b139}$ |
| 239 | $L_{a307}$ | $L_{b135}$ | 240 | $L_{a307}$ | $L_{b139}$ |
| 241 | $L_{a322}$ | $L_{b135}$ | 242 | $L_{a322}$ | $L_{b139}$ |
| 243 | $L_{a334}$ | $L_{b135}$ | 244 | $L_{a334}$ | $L_{b139}$ |
| 245 | $L_{a337}$ | $L_{b135}$ | 246 | $L_{a337}$ | $L_{b139}$ |
| 247 | $L_{a347}$ | $L_{b135}$ | 248 | $L_{a347}$ | $L_{b139}$ |
| 249 | $L_{a347}$ | $L_{b135}$ | 250 | $L_{a347}$ | $L_{b139}$ |
| 251 | $L_{a360}$ | $L_{b135}$ | 252 | $L_{a360}$ | $L_{b139}$ |
| 253 | $L_{a361}$ | $L_{b135}$ | 254 | $L_{a361}$ | $L_{b139}$ |
| 255 | $L_{a374}$ | $L_{b135}$ | 256 | $L_{a374}$ | $L_{b139}$ |
| 257 | $L_{a433}$ | $L_{b135}$ | 258 | $L_{a433}$ | $L_{b139}$ |
| 259 | $L_{a440}$ | $L_{b135}$ | 260 | $L_{a440}$ | $L_{b139}$ |
| 261 | $L_{a450}$ | $L_{b135}$ | 262 | $L_{a450}$ | $L_{b139}$ |
| | | | 266 | $L_{a263}$ | $L_{b245}$ |
| | | | 268 | $L_{a264}$ | $L_{b245}$ |
| | | | 270 | $L_{a271}$ | $L_{b245}$ |
| | | | 272 | $L_{a272}$ | $L_{b245}$ |
| | | | 274 | $L_{a276}$ | $L_{b245}$ |
| | | | 276 | $L_{a278}$ | $L_{b245}$ |
| | | | 278 | $L_{a296}$ | $L_{b245}$ |
| | | | 280 | $L_{a300}$ | $L_{b245}$ |
| | | | 282 | $L_{a302}$ | $L_{b245}$ |
| | | | 284 | $L_{a307}$ | $L_{b245}$ |
| | | | 286 | $L_{a322}$ | $L_{b245}$ |
| | | | 288 | $L_{a334}$ | $L_{b245}$ |
| | | | 290 | $L_{a337}$ | $L_{b245}$ |

-continued

| Compound Number | $L_a$ | $L_b$ | Compound Number | $L_a$ | $L_b$ |
|---|---|---|---|---|---|
| 291 | $L_{a139}$ | $L_{b245}$ | 292 | $L_{a347}$ | $L_{b245}$ |
| 293 | $L_{a140}$ | $L_{b245}$ | 294 | $L_{a347}$ | $L_{b245}$ |
| 295 | $L_{a141}$ | $L_{b245}$ | 296 | $L_{a360}$ | $L_{b245}$ |
| 297 | $L_{a163}$ | $L_{b245}$ | 298 | $L_{a361}$ | $L_{b245}$ |
| | | | 300 | $L_{a374}$ | $L_{b245}$ |
| | | | 302 | $L_{a433}$ | $L_{b245}$ |
| | | | 304 | $L_{a440}$ | $L_{b245}$ |
| | | | 306 | $L_{a450}$ | $L_{b245}$ |
| 309 | $L_{a529}$ | $L_{b122}$ | 310 | $L_{a529}$ | $L_{b126}$ |
| 311 | $L_{a529}$ | $L_{b88}$ | 312 | $L_{a529}$ | $L_{b135}$ |
| 313 | $L_{a584}$ | $L_{b122}$ | 314 | $L_{a584}$ | $L_{b126}$ |
| 315 | $L_{a584}$ | $L_{b88}$ | 316 | $L_{a584}$ | $L_{b135}$ |
| 317 | $L_{a666}$ | $L_{b31}$ | 318 | $L_{a666}$ | $L_{b126}$ |
| 319 | $L_{a666}$ | $L_{b122}$ | 320 | $L_{a666}$ | $L_{b88}$ |
| 321 | $L_{a667}$ | $L_{b31}$ | 322 | $L_{a667}$ | $L_{b126}$ |
| 323 | $L_{a667}$ | $L_{b122}$ | 324 | $L_{a668}$ | $L_{b31}$ |
| 325 | $L_{a668}$ | $L_{b126}$ | 326 | $L_{a668}$ | $L_{b122}$ |
| 327 | $L_{a668}$ | $L_{b88}$ | 328 | $L_{a669}$ | $L_{b31}$ |
| 329 | $L_{a669}$ | $L_{b122}$ | 330 | $L_{a669}$ | $L_{b126}$. |

* * * * *